(12) United States Patent
Rosenbluth

(10) Patent No.: US 10,915,686 B2
(45) Date of Patent: Feb. 9, 2021

(54) TOOL TO PROVIDE INTEGRATED CIRCUIT MASKS WITH ACCURATE DIMENSIONAL COMPENSATION OF PATTERNS

(71) Applicant: International Business Machines Corporation, Armonk, NY (US)

(72) Inventor: Alan E. Rosenbluth, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/424,768

(22) Filed: May 29, 2019

(65) Prior Publication Data

US 2020/0074031 A1 Mar. 5, 2020

Related U.S. Application Data

(62) Division of application No. 15/420,246, filed on Jan. 31, 2017, now Pat. No. 10,437,950, which is a
(Continued)

(51) Int. Cl.
*G06F 17/50* (2006.01)
*G06F 30/367* (2020.01)
(Continued)

(52) U.S. Cl.
CPC .............. *G06F 30/367* (2020.01); *G03F 1/36* (2013.01); *G03F 7/705* (2013.01); *G03F 7/70091* (2013.01); *G03F 7/70283* (2013.01)

(58) Field of Classification Search
USPC .................................. 716/51, 52, 53, 54, 55
See application file for complete search history.

(56) References Cited

U.S. PATENT DOCUMENTS 6,223,139 B1 * 4/2001 Wong ...................... G03F 7/705
356/401
7,003,755 B2 * 2/2006 Pang ...................... G06T 7/0004
716/52
(Continued)

FOREIGN PATENT DOCUMENTS

EP           1810085 B1    3/2011
WO      2010117626 A2    3/2009

OTHER PUBLICATIONS

List of IBM Patents or Patent Applications Treated as Related, May 2019, 2 pgs.

*Primary Examiner* — Brian Ngo
(74) *Attorney, Agent, or Firm* — Harrington & Smith

(57) ABSTRACT

Disclosed are mask definition tools, apparatus, methods, systems and computer program products configured to process data representing a semiconductor fabrication mask. A non-limiting example of a method includes performing a decomposition process on a full Transmission Cross Coefficient (TCC) using coherent optimal coherent systems (OCS) kernels; isolating a residual TCC that remains after some number of coherent kernels are extracted from the full TCC; and performing at least one decomposition process on the residual TCC using at least one loxicoherent system. The loxicoherent system uses a plurality of distinct non-coherent kernel functions and is a compound system containing a paired coherent system and an incoherent system that act in sequence. An output of the coherent system is input as a self-luminous quantity to the incoherent system, and the output of the incoherent system is an output of the loxicoherent system.

16 Claims, 105 Drawing Sheets

$$\frac{\partial^2 TCC}{\partial \Delta f_x^2}\bigg|_{\Delta f_x \to 0} \approx -\delta(\Delta f_x) \int_{-NA}^{+NA} df'_y \left[ S\left(\bar{f}_x + \sqrt{NA^2 - f'^2_y}; f'_y\right) + S\left(\bar{f}_x - \sqrt{NA^2 - f'^2_y}; f'_y\right)\right]$$

$$= -\delta(\Delta f_x) \oint_{\text{Pupil Edge}} dl\, S\left(\bar{f}_x + f'_x; f'_y\right) |\cos\theta_f|$$

$$\lim_{\Delta f_x \to 0} \frac{\partial^2 TCC}{\partial \Delta f_x^2} = -\infty$$

where $\{f'_x, f'_y\} = \{NA\cos\theta_f, NA\sin\theta_f\}$

Related U.S. Application Data division of application No. 15/329,654, filed as application No. PCT/US2016/060462 on Nov. 4, 2016, now Pat. No. 10,394,984.

(60) Provisional application No. 62/393,866, filed on Sep. 13, 2016, provisional application No. 62/259,795, filed on Nov. 25, 2015.

(51) Int. Cl.
*G03F 7/20* (2006.01)
*G03F 1/36* (2012.01)

(56) References Cited

U.S. PATENT DOCUMENTS

| | | | |
|---|---|---|---|
| 7,472,372 B1 | 12/2008 | Fiskowsky et al. | |
| 7,788,628 B1* | 8/2010 | Wei | G03F 7/70558 716/51 |
| 7,921,383 B1* | 4/2011 | Wei | G03F 7/705 703/13 |
| 8,078,995 B2 | 12/2011 | Tirapu Azpiroz et al. | |
| 8,352,885 B2 | 1/2013 | Liu et al. | |
| 8,356,261 B1 | 1/2013 | Socha | |
| 8,434,031 B2 | 4/2013 | Granik | |
| 8,918,742 B2* | 12/2014 | Feng | G03F 7/706 716/51 |
| 2005/0015233 A1* | 1/2005 | Gordon | G03F 1/36 703/13 |
| 2005/0132310 A1* | 6/2005 | Gallatin | G03F 1/36 716/53 |
| 2005/0185159 A1* | 8/2005 | Rosenbluth | G03F 7/70441 355/53 |
| 2006/0150131 A1 | 7/2006 | Lai et al. | |
| 2006/0248497 A1 | 11/2006 | Huang et al. | |
| 2007/0028206 A1* | 2/2007 | Chou | G03F 1/36 716/51 |
| 2007/0218176 A1* | 9/2007 | Adam | G03F 7/705 426/489 |
| 2008/0127027 A1* | 5/2008 | Gallatin | G03F 1/36 716/52 |
| 2008/0170773 A1 | 7/2008 | Wihi et al. | |
| 2008/0175432 A1* | 7/2008 | Choi | G03F 1/36 382/100 |
| 2009/0123057 A1* | 5/2009 | Mukherjee | G03F 7/70441 382/144 |
| 2010/0141925 A1* | 6/2010 | Cao | G03F 7/705 355/77 |
| 2010/0251202 A1* | 9/2010 | Pierrat | G03F 7/70125 716/50 |
| 2011/0119643 A1 | 5/2011 | Adam | |
| 2011/0219342 A1* | 9/2011 | Socha | G06F 30/392 716/52 |
| 2013/0236083 A1* | 9/2013 | Wang | G06T 7/174 382/144 |
| 2013/0253325 A1 | 9/2013 | Call et al. | |
| 2015/0294053 A1* | 10/2015 | Tejnil | G03F 7/70 716/53 |
| 2017/0147733 A1* | 5/2017 | Rosenbluth | G03F 7/70283 |

* cited by examiner $$I(x) = \int_{-\infty}^{\infty}\!\!\int_{-\infty}^{\infty} dx_1\, dx_2\, tcc(x_1, x_2)\, m(x - x_1)\, m^*(x - x_2).$$

FIG. 1A

OCS / Mercer: $\quad tcc(x_1, x_2) \cong \sum_{j=1}^{N} t_{OCS,j}(x_1, x_2) \equiv \sum_{j=1}^{N} \psi_j(x_1)\, \psi_j^*(x_2)$

FIG. 1B

$$I(x) \cong \sum_{j=1}^{N} \underbrace{\left| \int dx_1\, \psi_j(x_1)\, m(x - x_1) \right|^2}_{\text{Frame}}. \quad \text{(Convolutions via FFTs are fast.)}$$

OCS kernels $\psi(x)$ are smooth functions.

FIG. 1C

PRIOR ART

$$I(x) = \int\int_{-\infty}^{\infty} df_1 df_2 \, TCC(f_1, f_2) M(f_1) M^*(f_2) e^{2\pi i (f_1 - f_2) x}$$

$$\cong \sum_{j=1}^{N} \left| \int_{-\infty}^{\infty} df \, \Psi_j(f) M(f) e^{2\pi i f x} \right|^2$$

FIG. 1D

OCS / Mercer in frequency domain: $\quad TCC(f_1, f_2) \cong \sum_{j=1}^{N} T_{OCS,j}(f_1, f_2) = \sum_{j=1}^{N} \Psi_j(f_1) \Psi_j^*(f_2)$

FIG. 1E

PRIOR ART

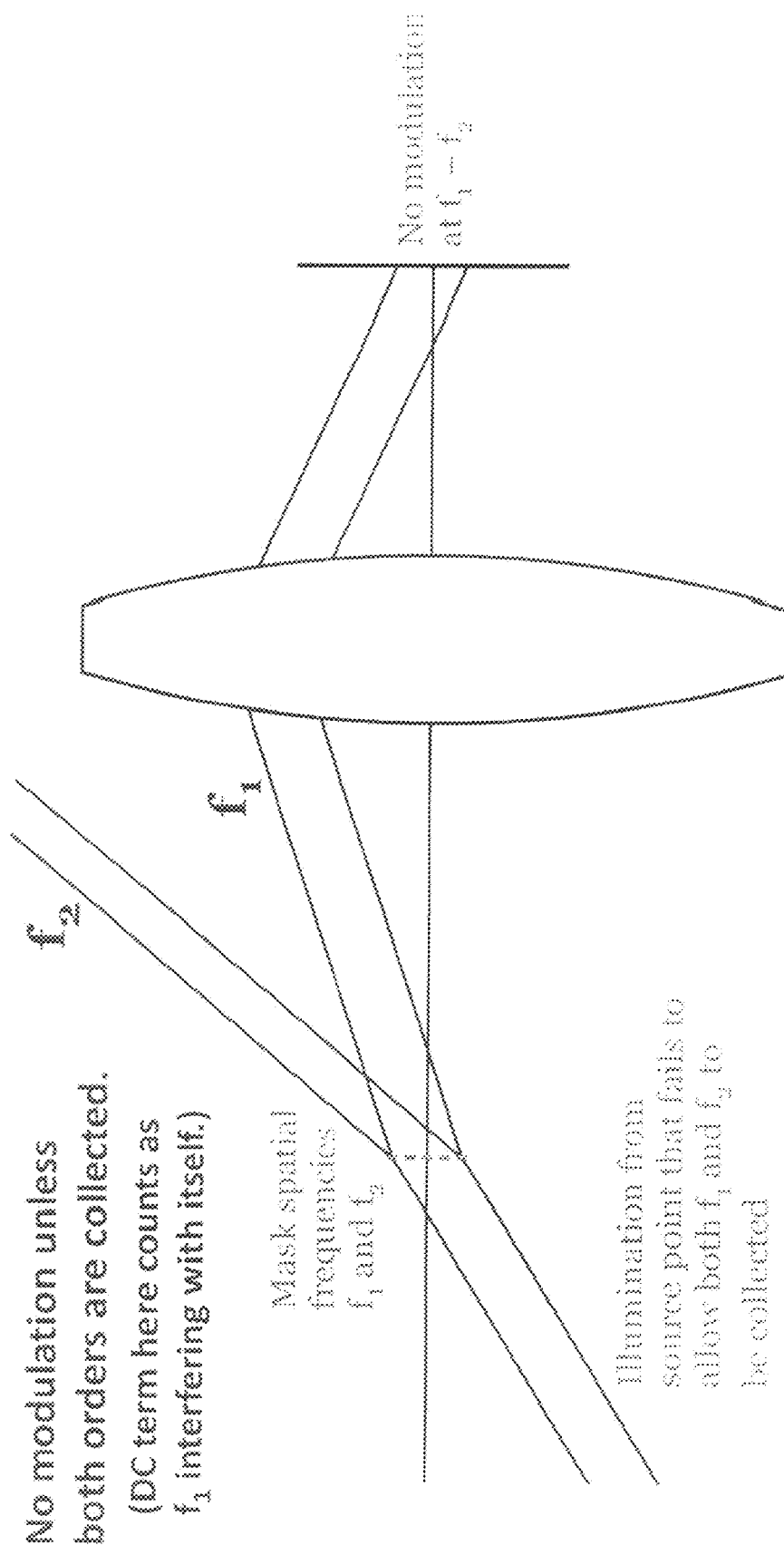

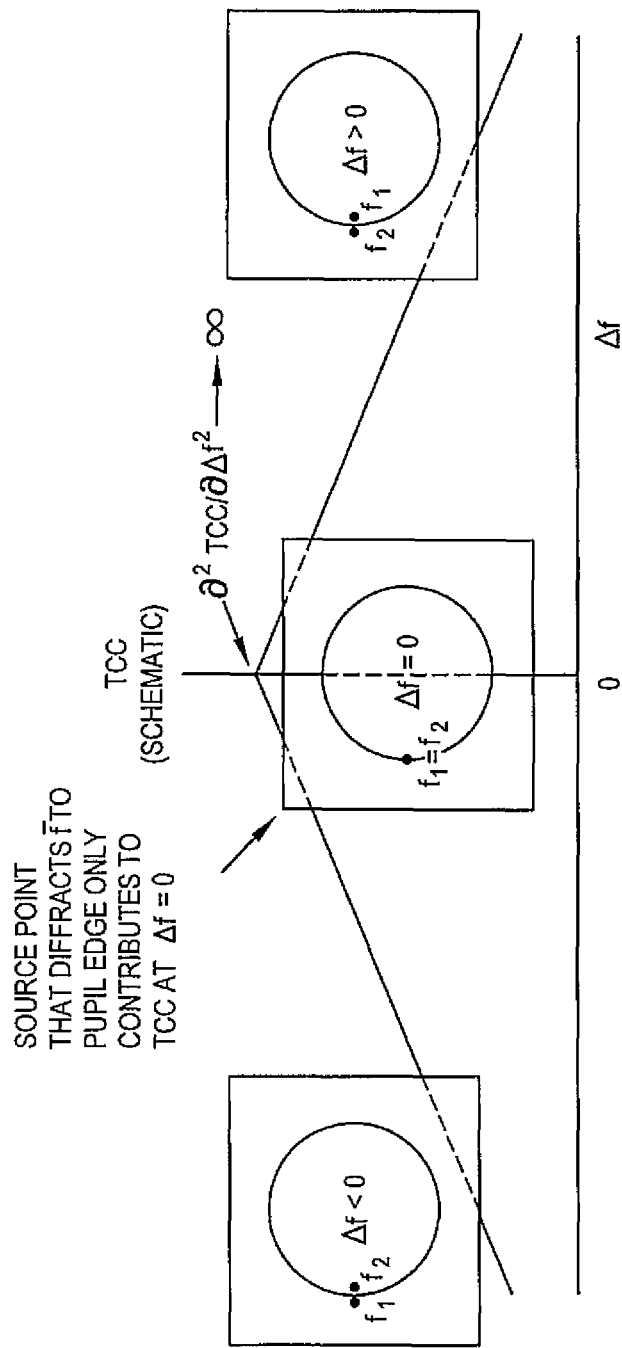

$$\left.\frac{\partial^2 TCC}{\partial \Delta f_x^2}\right|_{\Delta f_x \to 0} \approx -\delta(\Delta f_x) \int_{-NA}^{+NA} df'_y \left[ S\left(\bar{f}_x + \sqrt{NA^2 - f'^2_y}; f'_y\right) + S\left(\bar{f}_x - \sqrt{NA^2 - f'^2_y}; f'_y\right) \right]$$

$$= -\delta(\Delta f_x) \oint_{\substack{\text{Pupil} \\ \text{Edge}}} dl\, S(\bar{f}_x + f'_x; f'_y) |\cos\theta_{f'}|$$

where $\{f'_x, f'_y\} = \{NA\cos\theta_{f'}, NA\sin\theta_{f'}\}$

FIG. 5A

$$\lim_{\Delta f_x \to 0} \frac{\partial^2 TCC}{\partial \Delta f_x^2} = -\infty$$

FIG. 5B

$$\left.\frac{\partial^2 TCC}{\partial \bar{f}_x^2}\right|_{\Delta f_x \to 0} = \int_{-NA}^{+NA} df'_y \left[ \left.\frac{\partial S}{\partial f_x}\right|_{f_x = \bar{f}_x + \sqrt{NA^2 - f'^2_y}, f_y = f'_y} - \left.\frac{\partial S}{\partial f_x}\right|_{f_x = \bar{f}_x - \sqrt{NA^2 - f'^2_y}, f_y = f'_y} \right]$$

FIG. 5C

$$\left.\frac{\partial^2 T_{ocs}}{\partial \bar{f}^2}\right|_{f=f_1=f_2} = \left.\frac{\partial}{\partial \bar{f}}\left[\frac{\partial T_{ocs}}{\partial f_1}\frac{\partial f_1}{\partial \bar{f}} + \frac{\partial T_{ocs}}{\partial f_2}\frac{\partial f_2}{\partial \bar{f}}\right]\right|_{f=f_1=f_2} = 2\operatorname{Re}\left[\ddot{\Psi}(f)\Psi^*(f)\right]_{f=f_1=f_2} + 2|\dot{\Psi}(f)|^2\Big|_{f=f_1=f_2}$$

FIG. 7A

$$\left.\frac{\partial^2 T_{ocs}}{\partial \Delta f^2}\right|_{f=f_1=f_2} = \left.\frac{\partial}{\partial \Delta f}\left[\frac{\partial T_{ocs}}{\partial f_1}\frac{\partial f_1}{\partial \Delta f} + \frac{\partial T_{ocs}}{\partial f_2}\frac{\partial f_2}{\partial \Delta f}\right]\right|_{f=f_1=f_2} = \frac{1}{2}\operatorname{Re}\left[\ddot{\Psi}(f)\Psi^*(f)\right]_{f=f_1=f_2} - \frac{1}{2}|\dot{\Psi}(f)|^2\Big|_{f=f_1=f_2}$$

FIG. 7B

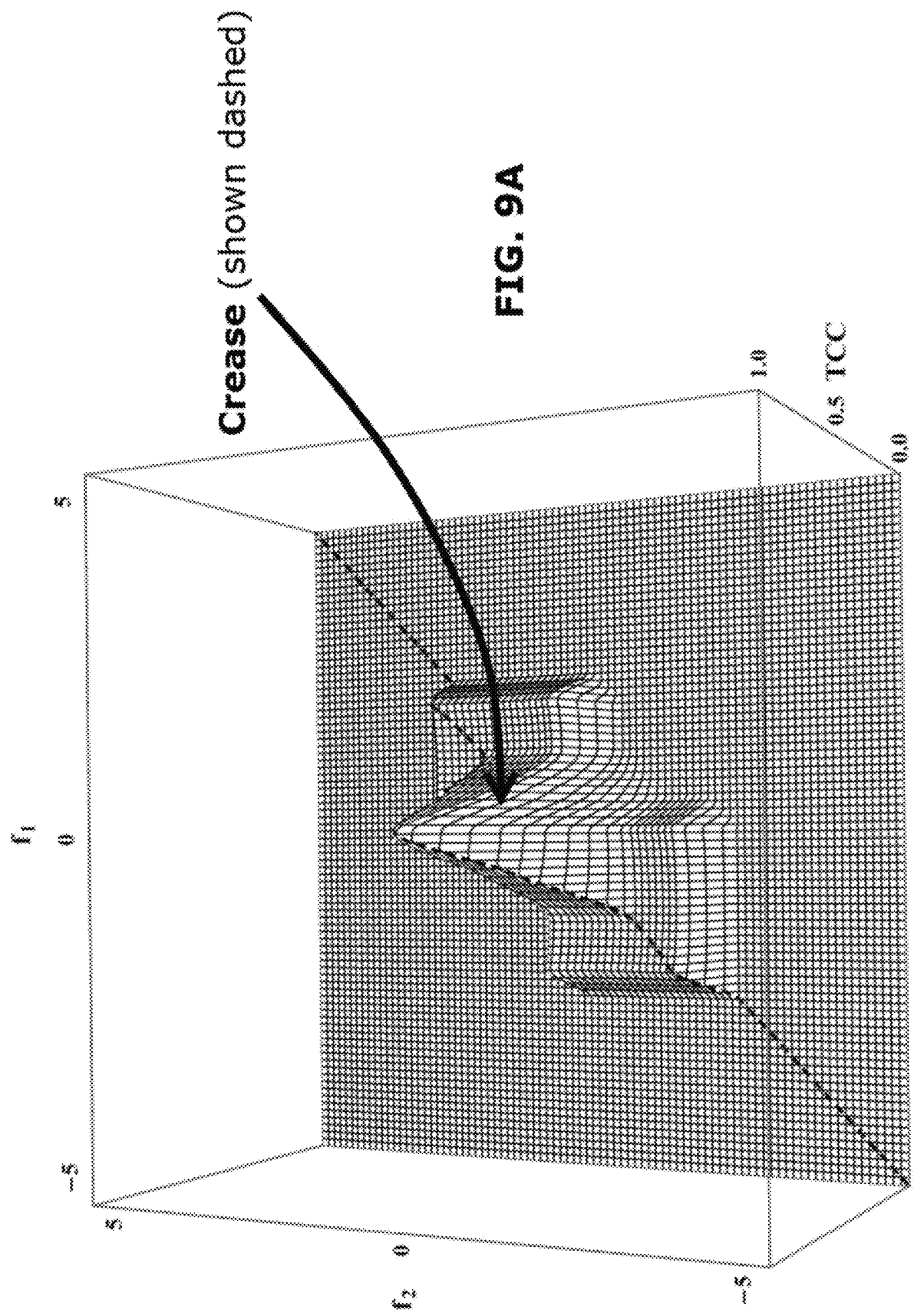

$$TCC^{(r)}(f_1,f_2) \equiv \sum_{\ell=1}^{\infty} T_{Rotated,\ell} \cong \sum_{\ell=1}^{L} T_{Rotated,\ell} \equiv \sum_{\ell=1}^{L} \tilde{T}^{(\ell)}(\overline{f})\tilde{T}^{(\ell)}(\Delta f) \equiv \sum_{\ell=1}^{L} \tilde{T}^{(\ell)}\left(\frac{f_1+f_2}{2}\right)\tilde{T}^{(\ell)}(f_1-f_2)$$

FIG. 11A

$$\left.\frac{\partial^2 T_{Rotated}}{\partial \overline{f}^2}\right|_{f=f_1=f_2} = \ddot{\tilde{T}}(f)\tilde{T}(0)$$

FIG. 11B

$$\left.\frac{\partial^2 T_{Rotated}}{\partial \Delta f^2}\right|_{f=f_1=f_2} = \tilde{T}(f)\ddot{\tilde{T}}(0)$$

FIG. 11C

$$E_{Rotate} \equiv \iint d\bar{f}\, d\Delta f \left| \hat{T}(\bar{f})\tilde{T}(\Delta f) - TCC^{(r)}\left(\bar{f}+\frac{\Delta f}{2},\bar{f}-\frac{\Delta f}{2}\right)\right|^2$$

$$= \left(\iint d\bar{f}\, d\Delta f \left|TCC^{(r)}\left(\bar{f}+\frac{\Delta f}{2},\bar{f}-\frac{\Delta f}{2}\right)\right|^2\right) + \left(\int d\bar{f}\left|\hat{T}(\bar{f})\right|^2\right)\left(\int d\Delta f\left|\tilde{T}(\Delta f)\right|^2\right)$$

$$- 2\text{Re}\left[\iint d\bar{f}\, d\Delta f\, TCC^{(r)}\left(\bar{f}+\frac{\Delta f}{2},\bar{f}-\frac{\Delta f}{2}\right)\hat{T}^*(\bar{f})\tilde{T}^*(\Delta f)\right]$$

FIG. 12A

$$\hat{T}(\bar{f}) \Rightarrow \hat{T}(\bar{f}) + \delta\hat{T}(\bar{f}) \equiv \hat{T}(\bar{f}) + \varepsilon\delta(\bar{f}-\bar{f}') \quad \text{and we require} \quad \delta E_{Rotate} = 0$$

FIG. 12B

$$\delta E_{\text{Rotate, Optimum}} = \text{Re}\left[\varepsilon\left\{\tilde{T}(\bar{f}')\left(\int d\Delta f\, |\tilde{T}(\Delta f)|^2\right) - \int d\Delta f\, TCC^{(r)}\left(\bar{f}' + \frac{\Delta f}{2}, \bar{f}' - \frac{\Delta f}{2}\right)\tilde{T}^*(\Delta f)\right\}\right] = 0$$

FIG. 12C

$$\tilde{T}(\bar{f}')\left(\int d\Delta f\, |\tilde{T}(\Delta f)|^2\right) = \int d\Delta f\, TCC^{(r)}\left(\bar{f}' + \frac{\Delta f}{2}, \bar{f}' - \frac{\Delta f}{2}\right)\tilde{T}^*(\Delta f)$$

FIG. 12D

$$\tilde{T}(\Delta f)\left(\int d\bar{f}\, |\tilde{T}(\bar{f})|^2\right) = \int d\bar{f}\, TCC^{(r)}\left(\bar{f} + \frac{\Delta f}{2}, \bar{f} - \frac{\Delta f}{2}\right)\tilde{T}^*(\bar{f})$$

FIG. 12E

$$\tilde{T}(\bar{f}')\left(\int d\Delta f \left|\tilde{T}(\Delta f)\right|^2\right)\left(\int d\bar{f}\left|\tilde{T}(\bar{f})\right|^2\right) = \int d\bar{f}' Q(\bar{f}',\bar{f})\tilde{T}(\bar{f}')$$

$$Q(\bar{f}',\bar{f}) \equiv \int d\Delta f\, TCC^{(r)}\left(\bar{f}'+\frac{\Delta f}{2},\bar{f}'-\frac{\Delta f}{2}\right)\left[TCC^{(r)}\left(\bar{f}+\frac{\Delta f}{2},\bar{f}-\frac{\Delta f}{2}\right)\right]^*$$

FIG. 12F

$$\tilde{T}(\Delta f')\left(\int d\Delta f\left|\tilde{T}(\Delta f)\right|^2\right)\left(\int d\bar{f}\left|\tilde{T}(\bar{f})\right|^2\right) = \int d\Delta f\, Z(\Delta f',\Delta f)\tilde{T}(\Delta f)$$

$$Z(\Delta f',\Delta f) \equiv \int d\bar{f}\, TCC^{(r)}\left(\bar{f}+\frac{\Delta f'}{2},\bar{f}-\frac{\Delta f'}{2}\right)\left[TCC^{(r)}\left(\bar{f}+\frac{\Delta f}{2},\bar{f}-\frac{\Delta f}{2}\right)\right]^*$$

FIG. 12G

$$E_{\text{Rotate, Optimum}} = \left( \iint d\overline{f}\, d\Delta f \left| \text{TCC}^{(r)}\left(\overline{f}+\frac{\Delta f}{2}, \overline{f}-\frac{\Delta f}{2}\right) \right|^2 \right) - \left( \int d\overline{f} \left| \widehat{T}(\overline{f}) \right|^2 \right)\left( \int d\Delta f \left| \widetilde{T}(\Delta f) \right|^2 \right) \geq 0$$

FIG. 12H

| Layer | Index | Thickness |
|---|---|---|
| Inc. | 1.44 | |
| 1 | 1.54 | 50 nm |
| 2 (Resist) | 1.65 + 0.04$i$ | 120 nm |
| 3 | 1.65 + 0.14$i$ | 120 nm |
| 4 | 1.45 + 0.25$i$ | 150 nm |
| 5 | 1.55 | 300 nm |
| Subs. | 0.89 + 2.6$i$ | |

FIG. 15C

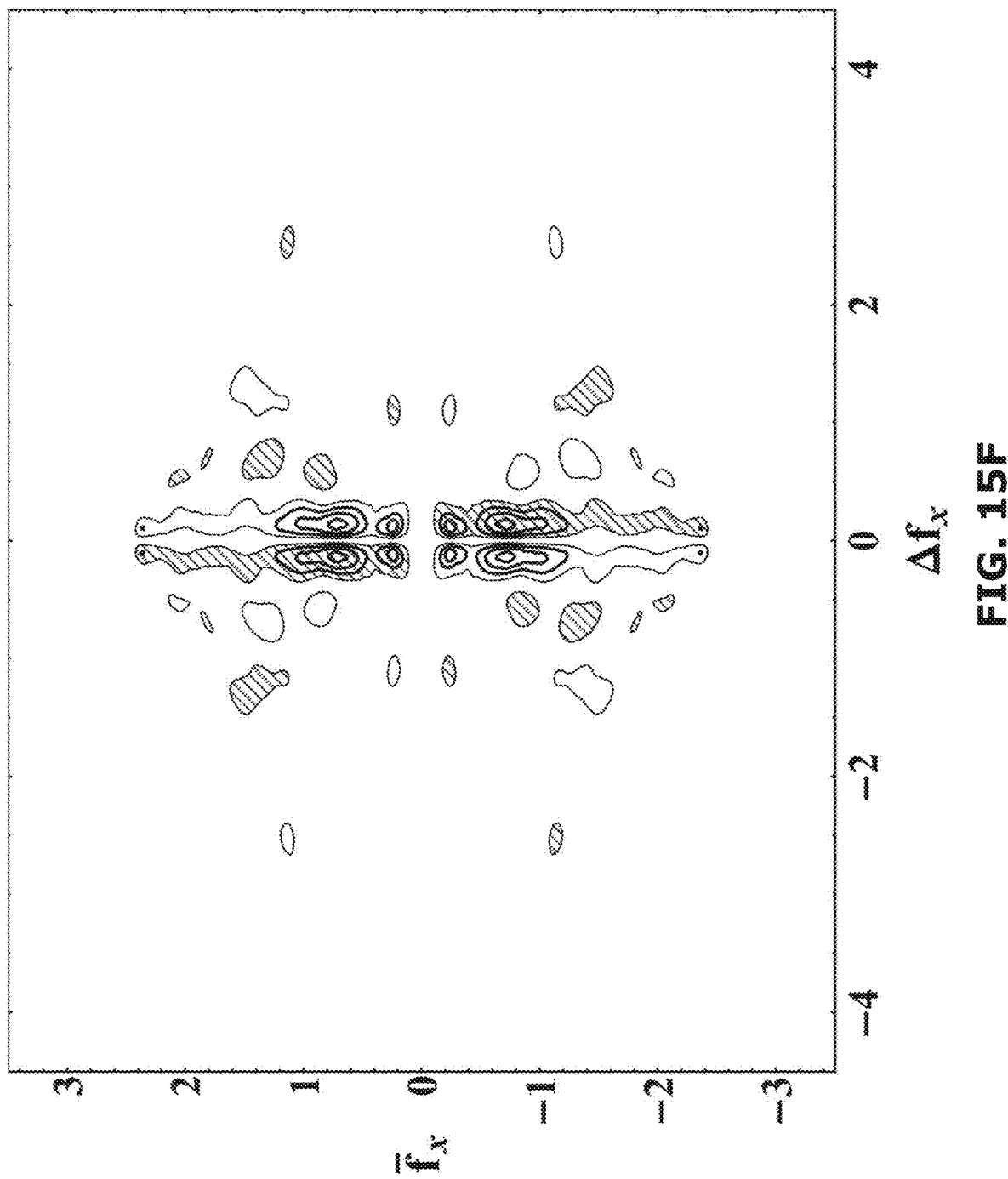

If $T_{i,j}$ denotes $TCC^{(r)}(\bar{f}, \Delta f)$ at the $i$th gridpoint for $\bar{f}$ and the $j$th gridpoint for $\Delta f$, and if $T_{i,j}$ is approximated by a rotated system, so that $T_{i,j} \cong \hat{T}_i^{(1)} \tilde{T}_j^{(1)}$, then $\hat{T}_i^{(1)} \cong \dfrac{T_{i,\Delta f=0}}{\tilde{T}_{\Delta f=0}^{(1)}}$.

FIG. 16A

$\hat{T}^{(1)}(\bar{f}) \propto TCC^{(r)}(\bar{f}, \bar{f})$, and without loss of generality we can choose $$\hat{T}^{(1)}(\bar{f}) = TCC^{(r)}(\bar{f}, \bar{f})$$

FIG. 16B

$$T_{Rotated,j} \equiv \tilde{T}^{(j)}(\bar{f})\tilde{T}^{(j)}(\Delta f) \equiv \tilde{T}^{(j)}\left(\frac{f_1+f_2}{2}\right)\tilde{T}^{(j)}(\Delta f) \Rightarrow \tilde{T}^{(j)}(f_1-f_2)\sum_{k=1}^{K}T'_{j,k}(f_1)T'^{*}_{j,k}(f_2)$$

FIG. 20A

$$T_{Loxicoherent,\ell} \equiv T'_{\ell}(f_1)T'^{*}_{\ell}(f_2)T''_{\ell}(f_1-f_2)$$

FIG. 20B

$$\Delta I^{(r)}(x) = \iint_{-\infty\ -\infty}^{\infty\ \ \infty} df_1 df_2\, e^{2\pi i(f_1-f_2)x} \times TCC^{(r)}(f_1,f_2)M(f_1)M^{*}(f_2)$$

FIG. 20C

$$\Delta I_\zeta^{(r)}(x) \cong \int\!\!\!\int_{-\infty}^{\infty} df_1\, df_2\, e^{2\pi i(f_1-f_2)x}\, T_\zeta'(f_1)\, T_\zeta'^*(f_2)\, T_\zeta''(f_1-f_2)\, M(f_1)\, M^*(f_2)$$

FIG. 20D

$$M_\zeta'(f) \equiv T_\zeta'(f)\, M(f)$$

FIG. 20E

$$\Delta I_\zeta^{(r)}(x) \equiv \int\!\!\!\int_{-\infty}^{\infty} d\bar{f}\, d\Delta f\, e^{2\pi i \Delta f\, x}\, T_\zeta''(\Delta f)\, M_\zeta'(\bar{f}+\Delta f/2)\, M_\zeta'^*(\bar{f}-\Delta f/2)$$

FIG. 20F

$$\Delta I_\ell^{(r)}(x) = \int_{-\infty}^{\infty} d\Delta f \, e^{2\pi i \Delta f x} \, T_\ell''(\Delta f) \left[ M_\ell' \ast M_\ell' \right]_{\Delta f}$$

FIG. 20G

$$I(x) \cong \sum_{j=1}^{N} \left| \psi_j(x) \ast m(x) \right|^2 + \sum_{\ell=1}^{L} t_\ell''(x) \ast \left| t_\ell'(x) \ast m(x) \right|^2 \quad \text{where } \ast \text{ denotes convolution}$$

FIG. 20H

$$I(x) \cong \sum_{j=1}^{N} \left| \psi_j(x) \ast m(x) \right|^2 + \sum_{\ell=1}^{L} t_\ell''(x) \ast \left( \left[ \sum_{\ell'(+)=1}^{R_\ell^{(+)}} \left| t_{\ell'(+),\ell}'(x) \ast m(x) \right|^2 \right] - \left[ \sum_{\ell'(-)=1}^{R_\ell^{(-)}} \left| t_{\ell'(-),\ell}'(x) \ast m(x) \right|^2 \right] \right)$$

FIG20 I

$$\underbrace{T_{\text{Rotated},1}}_{\text{First Eq.5.3A Term}} \cong \underbrace{\text{TCC}^{(r)}(f_1, f_2)}_{\text{TCC Residual}} = \underbrace{\tilde{T}\left(\frac{f_1+f_2}{2}\right)}_{\text{Fin Shape}} \underbrace{\tilde{T}(f_1 - f_2)}_{\text{Fin Cross-section}} \Rightarrow T_1'(f_1)\, T_1'^*(f_2)\, T_1''(f_1 - f_2)$$

FIG. 22A

$$\tilde{T}^{(1)}(\Delta f) \cong 0 \quad \text{unless} \quad |\Delta f| \ll \frac{NA}{\lambda}$$

FIG. 22B

$$TCC(f_1, f_2) = \sum_{j=1}^{\infty} \Psi_j(f_1) \Psi_j^*(f_2)$$

FIG. 22C

$$TCC^{(r)}(f_1, f_2) = \sum_{j=N+1}^{\infty} \Psi_j(f_1) \Psi_j^*(f_2)$$

FIG. 22D

$$\hat{T}^{(1)}(f) = TCC^{(r)}(f, f) = \sum_{j=N+1}^{\infty} |\Psi_j(f)|^2$$

FIG. 22E

$$\text{Im}\left[TCC^{(r)}(f, f)\right] = 0 \quad \text{and} \quad \text{Re}\left[TCC^{(r)}(f, f)\right] \geq 0$$

$$\text{Im}\left[\hat{T}^{(1)}(\bar{f})\right] = 0 \quad \text{and} \quad \text{Re}\left[\hat{T}^{(1)}(\bar{f})\right] \geq 0$$

$$TCC^{(r)}\left(\frac{f_1+f_2}{2}, \frac{f_1+f_2}{2}\right) \cong \sqrt{TCC^{(r)}(f_1,f_1) TCC^{(r)}(f_2,f_2)} \quad \text{unless } \tilde{T}^{(1)}(\Delta f) \cong 0$$

$$\text{and } \tilde{T}^{(1)}\left(\frac{f_1+f_2}{2}\right) = TCC^{(r)}\left(\frac{f_1+f_2}{2}, \frac{f_1+f_2}{2}\right)$$

$$\text{so } \tilde{T}^{(1)}\left(\frac{f_1+f_2}{2}\right) \cong \sqrt{TCC^{(r)}(f_1,f_1) TCC^{(r)}(f_2,f_2)} = \sqrt{TCC^{(r)}(f_1,f_1) TCC^{(r)*}(f_2,f_2)}$$

FIG. 22F

$$T_{Rotated,1} \Rightarrow T_{Incoherent,1}$$

$$\tilde{T}^{(1)}(\Delta f) \tilde{T}^{(1)}(\bar{f}) \cong \tilde{T}^{(1)}(\Delta f) \sqrt{TCC^{(r)}(f_1,f_1) TCC^{(r)*}(f_2,f_2)} \Rightarrow T_1''(\Delta f) T_1'(f_1) T_1'^*(f_2)$$

$$\text{Thus, } T_1'(f) = \sqrt{TCC^{(r)}(f,f)}$$

FIG. 22G

$$E_{Filter} \equiv \iint df_1 df_2\, D(f_1) D(f_2) \left| T_1'(f_1) T_1'^*(f_2) T_1''(f_1-f_2) - TCC^{(r)}(f_1,f_2) \right|^2$$

FIG. 22H

$$T_1'' \Rightarrow T_1'' + \delta T'' \equiv T_1'' + \varepsilon \delta(f_1 - f_2 - \Delta f_{pert})$$

FIG. 22I

$$T_1''(\Delta f) = \underbrace{\left[ \frac{\int d\bar{f}\, D\left(\bar{f} + \frac{\Delta f}{2}\right) D\left(\bar{f} - \frac{\Delta f}{2}\right) \text{Re}\left[\left(T_1'^{*}\left[\bar{f} + \frac{\Delta f}{2}\right] T_1'\left[\bar{f} - \frac{\Delta f}{2}\right]\right)^p \text{TCC}^{(r)}\left(\bar{f} + \frac{\Delta f}{2}, \bar{f} - \frac{\Delta f}{2}\right)\right]}{\int d\bar{f}\, D\left(\bar{f} + \frac{\Delta f}{2}\right) D\left(\bar{f} - \frac{\Delta f}{2}\right) \left|T_1'\left[\bar{f} + \frac{\Delta f}{2}\right] T_1'^{*}\left[\bar{f} - \frac{\Delta f}{2}\right]\right|^{p+1}} \right]}_{\text{if denominator is finite}}$$

$$0$$

if D product is zero throughout integral domain

FIG. 22J

$$\int_{OD} dx \left| \Delta \Gamma^{(r)}(x) \right|^2 \cong \int_{Band} d\Delta f \left| T_1''(\Delta f) \right|^2 \left| [M_1' \times M_1']_{\Delta f} \right|^2$$

FIG. 26

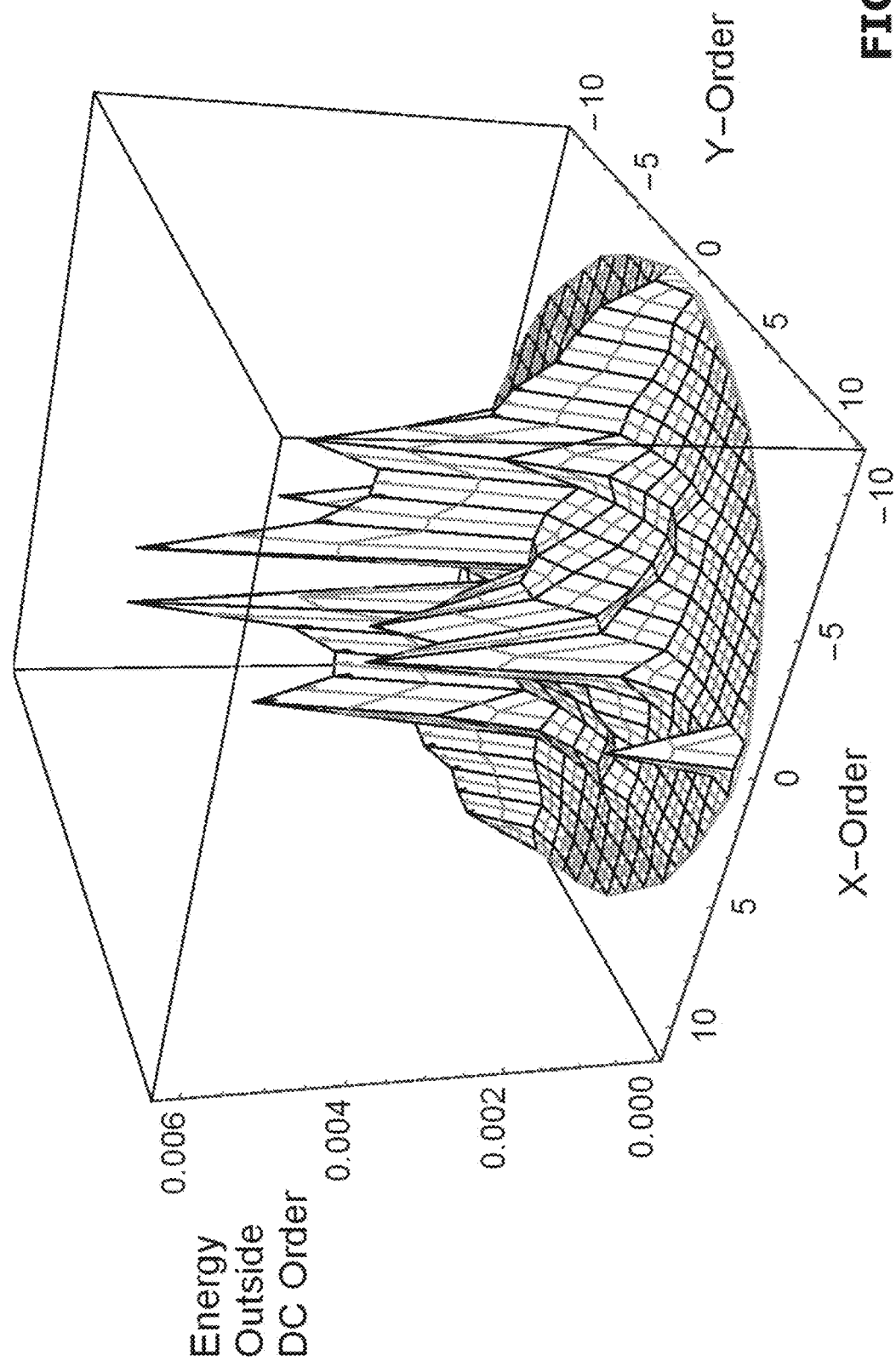

| Intensity Errors | Typical Practice (24 OCS Systems) | Use 2X more standard systems (49 OCS) | Increase standard OCS system count to 80 | 80 systems, & re-anchor at min-error dose | 1 Loxicoherent System + 24 OCS Systems (FFT count = 24 + 2) |
|---|---|---|---|---|---|
| | | Equal Line/Space Thru Pitch (70nm – 1μm) | | | |
| RMS Error | 0.00724 | 0.00364 | 0.00217 | 0.00154 | 0.00080 |
| Max Error | 0.01102 | 0.00603 | 0.00328 | 0.00307 | 0.00222 |
| Max–Min Error | 0.00972 | 0.00536 | 0.00282 | 0.00493 | 0.00442 |
| | | Single Isolated Space (35nm – 500nm) | | | |
| RMS Error | 0.00343 | 0.00144 | 0.00088 | 0.00101 | 0.00045 |
| Max Error | 0.00756 | 0.00326 | 0.00235 | 0.00278 | 0.00155 |
| Max–Min Error | 0.00748 | 0.00325 | 0.00234 | 0.00382 | 0.00248 |

FIG. 28

$$TCC^{(r)}(f_1,f_2) \equiv \hat{T}\left(\frac{f_1+f_2}{2}\right)\tilde{T}(f_1-f_2) \underset{\text{Large } j}{\Longrightarrow} \sim \hat{T}\left(\frac{f_1+f_2}{2}\right)\delta(f_1-f_2)$$

FIG. 29A

$$\int_{-\infty}^{\infty} df_2\, TCC^{(r)}(f_1,f_2)\{\delta(f_2-f_j)\} \Longrightarrow \int_{-\infty}^{\infty} df_2\, \hat{T}\left(\frac{f_1+f_2}{2}\right)\delta(f_1-f_2)\{\delta(f_2-f_j)\} \text{ asymptotically.}$$

$$\int_{-\infty}^{\infty} df_2\, TCC^{(r)}(f_1,f_2)\{\delta(f_2-f_j)\} \approx \int_{-\infty}^{\infty} df_2\, \hat{T}\left(\frac{f_1+f_2}{2}\right)\delta(f_1-f_2)\{\delta(f_2-f_j)\} = \hat{T}(f_j)\{\delta(f_1-f_j)\}$$

$\{\delta(f-f_j)\}$ is therefore an (approximate) EV of $TCC^{(r)}$, and $\Psi_j(f) \approx \sqrt{\hat{T}(f_j)}\delta(f-f_j)$.

The $f_j$ of the dominant remaining EV in $TCC^{(r)}$ is given by $f_j = \underset{f}{\arg\max}\left[TCC^{(r)}(f,f)\right]$.

FIG. 29B

$$TCC^{(r)}(f_1, f_2) \underset{\text{Large } j}{\Longrightarrow} \sim 0 \text{ if } f_1 \neq f_2$$

$$T_{\text{Mercer},j}(f_1, f_2) = \Psi_j(f_1)\Psi_j^*(f_2) \approx \hat{T}(f_j)\delta(f_1 - f_j)\delta(f_2 - f_j) = 0 \text{ if } f_1 \neq f_2$$

FIG. 29C

Try $\Psi_{\text{Multi point}}(f) \equiv \hat{T}(f_{j'})\delta(f - f_{j'}) + \hat{T}(f_{j''})\delta(f - f_{j''})$. We have:

$\Psi_{\text{Multi point}}(f_1)\Psi_{\text{Multi point}}(f_2) \neq 0$ when $f_1 = f_{j'}, f_2 = f_{j''}$. Thus, $\Psi_{\text{Multi point}}$ fails to match $TCC^{(r)}$ if $f_{j'} \neq f_{j''}$.

Valid EVs can only extract one point at a time [assuming for simplicity that $\hat{T}(f_{j'}) \neq \hat{T}(f_{j''})$].

FIG. 29D

$$T_{\text{Loxicoherent}}(f_1, f_2) = T''(f_1 - f_2)T'(f_1)T'^*(f_2)$$

$$\equiv T''(f_1 - f_2)\left\{\int_{-\infty}^{\infty} df'_j\, T'(f'_j)\delta(f_1 - f'_j)\right\}\left\{\int_{-\infty}^{\infty} df''_j\, T'(f''_j)\delta(f_2 - f''_j)\right\}^*$$

$$\approx 0 \text{ if } f_1 \neq f_2, \text{ since } T'' \text{ is narrow,}$$

successfully yielding $TCC^{(r)}(f_1, f_2) \approx 0$ when $f_1 \neq f_2$.

Also, in preferred embodiments, $T_{\text{Loxicoherent}} = TCC^{(r)}(f, f)$ when $f_1 = f_2 = f$.

$T_{\text{Loxicoherent}}$ successfully matches "all points of $TCC^{(r)}$ at once".

T' can be determined by matching TCC$^{(r)}$ along the $\Delta f = \Delta f_0$ diagonal, so that $$T'\left(\bar{f} + \frac{\Delta f_0}{2}\right) T'^*\left(\bar{f} - \frac{\Delta f_0}{2}\right) T''(\Delta f_0) = TCC^{(r)}\left(\bar{f} + \frac{\Delta f_0}{2}, \bar{f} - \frac{\Delta f_0}{2}\right),$$ and we can choose $T''(\Delta f_0) \equiv 1$.

FIG. 33A

Alternatively, in a segment of the diagonal where TCC$^{(r)}$ has a common sign, we can set $$T''(\Delta f_0) \equiv \mathrm{Sign}\left[TCC^{(r)}\left(\bar{f} + \frac{\Delta f_0}{2}, \bar{f} - \frac{\Delta f_0}{2}\right)\right]$$

$$\log\left[T'\left(\bar{f} + \frac{\Delta f_0}{2}\right)\right] + \log\left[T'^*\left(\bar{f} - \frac{\Delta f_0}{2}\right)\right] = \log\left[TCC^{(r)}\left(\bar{f} + \frac{\Delta f_0}{2}, \bar{f} - \frac{\Delta f_0}{2}\right)\right]$$

$$\log[T'(\bar{f})] * \left[\delta\left(\bar{f} + \frac{\Delta f_0}{2}\right) + \delta\left(\bar{f} - \frac{\Delta f_0}{2}\right)\right] = \log\left[TCC^{(r)}\left(\bar{f} + \frac{\Delta f_0}{2}, \bar{f} - \frac{\Delta f_0}{2}\right)\right]$$

FIG. 33B

If $\Delta f_0$ is a quasi-dominant diagonal, we have from the FIG.33A matching condition $$\sqrt{TCC^{(r)}\left(\bar{f}+\frac{\Delta f_0}{2}, \bar{f}-\frac{\Delta f_0}{2}\right)} = \sqrt{T'\left(\bar{f}+\frac{\Delta f_0}{2}\right)T'^*\left(\bar{f}-\frac{\Delta f_0}{2}\right)}, \text{ assuming that } T''(\Delta f_0) \equiv 1.$$

When $\Delta f_0$ is small, we can set $\sqrt{T'\left(\bar{f}+\frac{\Delta f_0}{2}\right)T'^*\left(\bar{f}-\frac{\Delta f_0}{2}\right)} \cong T'(\bar{f})$, yielding:

$$T'(\bar{f}) \cong \sqrt{TCC^{(r)}\left(\bar{f}+\frac{\Delta f_0}{2}, \bar{f}-\frac{\Delta f_0}{2}\right)}$$

Fig. 33C

$$f'_{1,+} \equiv f_1 - \frac{\Delta f_0}{2}$$

$$f'_{2,+} \equiv f_2 + \frac{\Delta f_0}{2}$$

Near the region of the positive frequency off-diagonal peak in $\mathrm{TCC}^{(r)}$, $f'_{1,+} - f'_{2,+}$ will be small.

FIG. 34A

$$\mathrm{TCC}_+^{(r)\prime}(f'_a, f'_b) \equiv \mathrm{TCC}^{(r)}\left(f_1\big|_{f'_{1,+}(f_1)=f'_a}, f_2\big|_{f'_{2,+}(f_2)=f'_b}\right) = \mathrm{TCC}^{(r)}\left(f'_a + \frac{\Delta f_0}{2}, f'_b - \frac{\Delta f_0}{2}\right)$$

FIG. 34B

$$\mathrm{TCC}_+^{(r)\prime}(f'_{1,+}, f'_{2,+}) \cong \widetilde{T}_{\substack{\text{Local}\\\text{Rotated}}}^{(+)}\left(\frac{f'_{1,+} + f'_{2,+}}{2}\right) \widetilde{T}_{\substack{\text{Local}\\\text{Rotated}}}^{(+)}\left(f'_{1,+} - f'_{2,+}\right) \quad \text{with} \quad \widetilde{T}_{\substack{\text{Local}\\\text{Rotated}}}^{(+)}(0) \equiv 1$$

FIG. 34C

$$\widetilde{T}^{(+)}_{\substack{Local \\ Rotated}} \left( \frac{f'_{1,+} + f'_{2,+}}{2} \right) \cong TCC^{(r)}_+ \left( \frac{f'_{1,+} + f'_{2,+}}{2}, \frac{f'_{1,+} + f'_{2,+}}{2} \right)$$

$$\cong \sqrt{TCC^{(r)'}_+ (f'_{1,+}, f'_{1,+}) \, TCC^{(r)'}_+ (f'_{2,+}, f'_{2,+})}$$

$$= \sqrt{TCC^{(r)} \left( f'_{1,+} + \frac{\Delta f_0}{2}, f'_{1,+} - \frac{\Delta f_0}{2} \right) TCC^{(r)} \left( f'_{2,+} + \frac{\Delta f_0}{2}, f'_{2,+} - \frac{\Delta f_0}{2} \right)}$$

FIG. 34D

Alternatively, in a segment of the diagonal where $TCC^{(r)}$ has a common sign, we can set $$\widetilde{T}^{(+)}_{\substack{Local \\ Rotated}} (0) \equiv Sign \left[ TCC^{(r)} \left( \frac{f'_{1,+} + f'_{2,+}}{2}, \frac{f'_{1,+} + f'_{2,+}}{2} \right) \right] \text{ and}$$

$$\widetilde{T}^{(+)}_{\substack{Local \\ Rotated}} \left( \frac{f'_{1,+} + f'_{2,+}}{2} \right) \cong \sqrt{\left| TCC^{(r)} \left( f'_{1,+} + \frac{\Delta f_0}{2}, f'_{1,+} - \frac{\Delta f_0}{2} \right) \right| \left| TCC^{(r)} \left( f'_{2,+} + \frac{\Delta f_0}{2}, f'_{2,+} - \frac{\Delta f_0}{2} \right) \right|}$$

FIG. 34E

$$TCC_+^{(r)'}(f'_{1,+}, f'_{2,+}) \cong \sqrt{TCC^{(r)}\left(f'_{1,+} + \frac{\Delta f_0}{2}, f'_{1,+} - \frac{\Delta f_0}{2}\right)} \sqrt{TCC^{(r)}\left(f'_{2,+} + \frac{\Delta f_0}{2}, f'_{2,+} - \frac{\Delta f_0}{2}\right)} \tilde{T}_{\text{Local Rotated}}^{(+)}(f'_{1,+} - f'_{2,+})$$

$$TCC^{(r)}(f_1, f_2) \cong \sqrt{TCC^{(r)}(f_1, f_1 - \Delta f_0)} \sqrt{TCC^{(r)}(f_2 + \Delta f_0, f_2)} \; T_{\text{Local}}^{"(+)}(\Delta f - \Delta f_0)$$

FIG. 34F

$$f'_{1,-} \equiv f_1 + \frac{\Delta f_0}{2}$$

$$f'_{2,-} \equiv f_2 - \frac{\Delta f_0}{2}$$

FIG. 34G

$$\mathrm{TCC}^{(r)}(f_1, f_2) \cong \sqrt{\mathrm{TCC}^{(r)}(f_1, f_1 + \Delta f_0)} \sqrt{\mathrm{TCC}^{(r)}(f_2 - \Delta f_0, f_2)} \; T''^{(-)}_{Local}(\Delta f + \Delta f_0)$$

FIG. 34H

$$T''^{(+)}_{Local}(\Delta f - \Delta f_0) = T''^{(-)*}_{Local}(-[\Delta f + \Delta f_0]) \equiv T''(\Delta f - \Delta f_0)$$

$$T''(f) \equiv 0 \; \text{ if } f < -\Delta f_0.$$

FIG. 34I

$$TCC^{(r)}(f_1, f_2) \cong T'_b(f_1) T'^*_a(f_2) T''(\Delta f - \Delta f_0) + T'_a(f_1) T'^*_b(f_2) T''^*(-\Delta f - \Delta f_0)$$

where $$T'_a(f) \equiv \sqrt{TCC^{(r)}(f, f + \Delta f_0)} = \sqrt{TCC^{(r)*}(f + \Delta f_0, f)} \equiv \overline{T}^*\left(f + \frac{\Delta f_0}{2}\right)$$

$$T'_b(f) \equiv \sqrt{TCC^{(r)}(f, f - \Delta f_0)} = \sqrt{TCC^{(r)*}(f_2 - \Delta f_0, f_2)} \equiv \overline{T}\left(f - \frac{\Delta f_0}{2}\right)$$

with $$\overline{T}(f) \equiv \sqrt{TCC^{(r)}\left(f + \frac{\Delta f_0}{2}, f - \frac{\Delta f_0}{2}\right)}$$

FIG. 34J

$$T''(\Delta f - \Delta f_0) = \frac{\int d\bar{f}\, D\left(\bar{f} + \frac{\Delta f}{2}\right) D\left(\bar{f} - \frac{\Delta f}{2}\right) \mathrm{Re}\left[\left(T_b'^*\left[\bar{f} + \frac{\Delta f}{2}\right] T_a'\left[\bar{f} - \frac{\Delta f}{2}\right]\right)^p \mathrm{TCC}^{(r)}\left(\bar{f} + \frac{\Delta f}{2}, \bar{f} - \frac{\Delta f}{2}\right)\right]}{\left[\int d\bar{f}\, D\left(\bar{f} + \frac{\Delta f}{2}\right) D\left(\bar{f} - \frac{\Delta f}{2}\right) \left|T_b'\left[\bar{f} + \frac{\Delta f}{2}\right] T_a'^*\left[\bar{f} - \frac{\Delta f}{2}\right]\right|^{p+1}\right]}$$

if denominator is finite, and $\Delta f \geq -\Delta f_0$ $$0$$

if D product is zero throughout integral domain, or if $\Delta f < -\Delta f_0$

FIG. 34K

$$\Delta I^{(r)}(x) = 2\text{Re}\left[\left(t''(x)e^{2\pi i \Delta f_0 x}\right) * \left(m'_b(x)m'^*_a(x)\right)\right]$$

where $$m'_b(x) \equiv \int_{-\infty}^{\infty} df\, T'_b(f)M(f)e^{2\pi i f x}$$

$$m'_a(x) \equiv \int_{-\infty}^{\infty} df\, T'_a(f)M(f)e^{2\pi i f x}$$

$$t''(x) \equiv \int_{-\infty}^{\infty} df\, T''(f)e^{2\pi i f x}$$

FIG. 34L

$$\Delta I^{(r)}(x) = 2\text{Re}\left[\left(t''(x)e^{2\pi i \Delta f_0 x}\right) * \left(\left\{e^{\pi i \Delta f_0 x}\left[\overleftrightarrow{t}(x) * \left(m(x)e^{-\pi i \Delta f_0 x}\right)\right]\right\}\left\{e^{\pi i \Delta f_0 x}\left[\overleftrightarrow{t}^*(x) * \left(m^*(x)e^{-\pi i \Delta f_0 x}\right)\right]\right\}\right)\right]$$

FIG. 34M

$$\text{Im}\left[\text{TCC}^{(r)}(f_1, f_2)\right] \cong \{T'_{b,\text{even}}(f_1) \, T'_{a,\text{even}}(f_2) - T'_{a,\text{even}}(f_1) \, T'_{b,\text{even}}(f_2)\} \, T''_{\text{even}}(\Delta f)$$

where $$T'_{a,\text{even}}(f) \equiv T'_{a,\text{even}}(-f)$$

$$T'_{b,\text{even}}(f) \equiv T'_{b,\text{even}}(-f)$$

$$T''_{\text{even}}(f) \equiv T''_{\text{even}}(-f)$$

FIG. 35A

$$\text{Im}\left[\text{TCC}^{(r)}(f_1, f_2)\right] \cong \{T'_{b,\text{even}}(f_1) \, T'_{a,\text{odd}}(f_2) + T'_{a,\text{odd}}(f_1) \, T'_{b,\text{even}}(f_2)\} \, T''_{\text{odd}}(\Delta f)$$

where $$T'_{b,\text{even}}(f) \equiv T'_{b,\text{even}}(-f)$$

$$T'_{a,\text{odd}}(f) \equiv -T'_{a,\text{odd}}(-f)$$

$$T''_{\text{odd}}(f) \equiv -T''_{\text{odd}}(-f)$$

FIG. 35B

$$\text{Im}\left[\text{TCC}^{(r)}(f_1, f_2)\right] \cong \left\{T'_{b,odd}(f_1) \, T'_{a,odd}(f_2) - T'_{a,odd}(f_1) \, T'_{b,odd}(f_2)\right\} T''_{even}(\Delta f)$$

where $$T'_{a,odd}(f) \equiv -T'_{a,odd}(-f)$$

$$T'_{b,odd}(f) \equiv -T'_{b,odd}(-f)$$

$$T''_{even}(f) \equiv T''_{even}(-f)$$

FIG. 35C

$$\widetilde{TCC_n^{(r)}}(f_1,f_2) \equiv \left(1 - \widetilde{T}_{n-1}''(f_1-f_2)\right)\left(\sum_{k=1}^{K_n} T'_{n-1,k}(f_1) T'^*_{n-1,k}(f_2)\right)$$

$$+ \widetilde{T}''_{n-1}(f_1-f_2)\left[\cos\frac{\pi\gamma_n}{2} \widehat{T}_{n-1}\left(\frac{f_1+f_2}{2}\right) + \sin\frac{\pi\gamma_n}{2} \widetilde{TCC}_n^{(r)}(f_1,f_2)\right]$$

FIG. 37A

Initially, FIG.12F, 12G are used to obtain $T_0''$ and $T_0$ as the components of the 1st rotated system for $TCC^{(r)}$, so that:

$$T_0''(f_1-f_2) \widehat{T}_0\left(\frac{f_1+f_2}{2}\right) \equiv T_{\text{Rotated},1} = T_0''(f_1-f_2) \sum_{k=1}^{\infty} T'_{0,k}(f_1) T'^*_{0,k}(f_2)$$

FIG. 37B

$$T''_n(\Delta f) = \begin{cases} \dfrac{\int d\bar{f}\, D\!\left(\bar{f}+\dfrac{\Delta f}{2}\right) D\!\left(\bar{f}-\dfrac{\Delta f}{2}\right) \operatorname{Re}\!\left[\left(\sum\limits_{k=1}^{K_n} T'^{*}_{n,k}(f_1) T'_{n,k}(f_2)\right)^{p} TCC^{(r)}\!\left(\bar{f}+\dfrac{\Delta f}{2},\bar{f}-\dfrac{\Delta f}{2}\right)\right]}{\int d\bar{f}\, D\!\left(\bar{f}+\dfrac{\Delta f}{2}\right) D\!\left(\bar{f}-\dfrac{\Delta f}{2}\right) \left|\sum\limits_{k=1}^{K_n} T'_{n,k}(f_1) T'^{*}_{n,k}(f_2)\right|^{p+1}} & \text{if denominator is finite} \\[2ex] 0 & \text{if D product is zero throughout integral domain} \end{cases}$$

FIG. 37C

Initially $n=0$, $\gamma_0 = 0$, and $K_0 \Rightarrow \infty$ (i.e. chosen very large), so when iterations commence with $n=1$, we will essentially have $$\widetilde{TCC}_1^{(r)}(f_1, f_2) = \sum_{k=1}^{K_0} T'_{0,k}(f_1) T''_{0,k}(f_2), \text{ or equivalently}$$

$$\widetilde{TCC}_1^{(r)}(f_1, f_2) = \hat{T}_0\left(\frac{f_1 + f_2}{2}\right)$$

FIG. 37D

$$\tilde{T}''_n(\Delta f) \equiv \frac{\left|T''_{n-1}(\Delta f)\right|}{\text{Max}\left[\left|T''_{n-1}(\Delta f)\right|\right]}, \text{ so that } 0 \leq \tilde{T}''_n \leq 1$$

$$TCC_{n+1}^{(r)}(f_1, f_2) \equiv \text{Sign}\left[T''_{n-1}(f_1 - f_2)\right] TCC^{(r)}(f_1, f_2)$$

By construction, $$\tilde{T}''_n(f_1 - f_2) TCC_{n+1}^{(r)}(f_1, f_2) \text{Max}\left[\left|T''_{n-1}(\Delta f)\right|\right] = T''_{n-1}(f_1 - f_2) TCC^{(r)}(f_1, f_2)$$

FIG. 37E

$$\widetilde{TCC}_n^{(r)}(f_1,f_2) \equiv \left(1 - \widetilde{T}''_{n-1}(f_1-f_2)\right)\left\{\sum_{k=1}^{K_0} e^{\left[\frac{\left(\text{Max}\left[0, k-\left(R^{(+)}+R^{(-)}\right)\right]\right)}{K_n}\right]^2}\right\} T'_{n-1,k}(f_1)T'^{*}_{n-1,k}(f_2)$$

$$+ \widetilde{T}''_{n-1}(f_1-f_2)\left[\cos\frac{\pi\gamma_n}{2}\widehat{T}_{n-1}\left(\frac{f_1+f_2}{2}\right) + \sin\frac{\pi\gamma_n}{2}\overset{\cup}{TCC}_n^{(r)}(f_1,f_2)\right]$$

FIG. 37F

$$TCC_{n+1}^{(r)}(f_1,f_2) \equiv \text{Sign}\left[T''_{n-1}(f_1-f_2)\right] TCC^{(r)}(f_1,f_2)$$

$$= \frac{TCC^{(r)}(f_1,f_2)}{\text{Sign}\left[T''_{n-1}(f_1-f_2)\right]} \quad \text{if we defer the case where } T'' = 0.$$

$$\xrightarrow{\text{Aggressive Strategy}} \frac{TCC^{(r)}(f_1,f_2)}{T''_{n-1}(f_1-f_2)}$$

FIG. 37G

For layered 2nd cycle of homotopy, define:

$$B(\bar{f}, \Delta f) \equiv \sum_{k=1}^{K_{\text{Cycle 1,}}^{\text{Keep}}} T'_{\text{Final},k} \; T'^{*}_{\text{Final},k}$$

or alternatively, for single cycle, set:

$$B(\bar{f}, \Delta f) \equiv 1$$

Then define:

$$C(\bar{f}, \Delta f) \equiv T''_{\text{Latest}}(\Delta f) \, B(\bar{f}, \Delta f)$$

FIG. 37H

$$\overline{TCC_n} \equiv \left(1 - \frac{T''_{n-1} \text{Sign}(\text{Re}[T''_{n-1}])}{\underset{\Delta f}{\text{Max}}(|T''_{n-1}|)}\right)\left(\sum_{k=1}^{K_n} T'_{n-1,k} T'^{*}_{n-1,k}\right)$$
$$+ \frac{T''_{n-1} \text{Sign}(\text{Re}[T''_{n-1}])}{\underset{\Delta f}{\text{Max}}(|T''_{n-1}|)}\left[\cos\frac{\pi \gamma_n}{2} \hat{T}_{n-1} + \sin\frac{\pi \gamma_n}{2} TCC^{(r)} \text{Sigmoid}\left(\frac{1}{C_{n-1}}, t\right)\right]$$

FIG. 37I

One suitable sigmoid choice: $\text{Sigmoid}(x, h) \equiv h \tanh\left(\frac{x}{h}\right)$

FIG. 37J

$$\overline{TCC_n} \equiv \left(1 - \frac{C_{n-1} \text{Sign}(\text{Re}[C_{n-1}])}{\underset{\bar{f}, \Delta f}{\text{Max}}(|C_{n-1}|)}\right)\left(\sum_{k=1}^{K_n} T'_{n-1,k} T'^{*}_{n-1,k}\right)$$
$$+ \frac{\text{Sign}(\text{Re}[C_{n-1}])}{\underset{\bar{f}, \Delta f}{\text{Max}}(|C_{n-1}|)}\left[C_{n-1} \cos\frac{\pi \gamma_n}{2} \hat{T}_{n-1} + \sin\frac{\pi \gamma_n}{2} TCC^{(r)}\right]$$

FIG. 37K

$$E_{Remap} = \iint d\bar{f} d\Delta f \left| TCC^{(r)}(\bar{f},\Delta f) - C(\bar{f},\Delta f) \sum_{k=1}^{K} \lambda_k \left[ \frac{\alpha}{\sqrt{K}} + \beta \Omega_k\left(\bar{f}+\frac{\Delta f}{2}\right) \right] \left[ \frac{\alpha}{\sqrt{K}} + \beta \Omega_k^*\left(\bar{f}-\frac{\Delta f}{2}\right) \right] \right|^2$$

FIG. 37L

$$2a\alpha^3 + b\beta^3 + 3c\alpha^2\beta + d\alpha\beta^2 = 2e\alpha + f\beta$$
$$c\alpha^3 + 2g\beta^3 + d\alpha^2\beta + 3b\alpha\beta^2 = f\alpha + 2h\beta$$

FIG. 37M

$$a \equiv \frac{\left(\sum_{k=1}^{K} \lambda_k\right)^2}{K} \iint d\bar{f}\, d\Delta f\, |C(\bar{f}, \Delta f)|^2$$

$$b \equiv \frac{2}{\sqrt{K}} \sum_{k'=1}^{K} \sum_{k''=1}^{K} \lambda'_{k'} \lambda''_{k''} \iint d\bar{f}\, d\Delta f\, |C(\bar{f}, \Delta f)|^2 \operatorname{Re}\left[\Omega_{k'}\left(\bar{f} + \frac{\Delta f}{2}\right)\Omega^*_{k''}\left(\bar{f} - \frac{\Delta f}{2}\right)\Omega^*_{k''}\left(\bar{f} + \frac{\Delta f}{2}\right)\right]$$

$$c \equiv \frac{\sum_{k=1}^{K} \lambda_k}{K\sqrt{K}} \sum_{k=1}^{K} \iint d\bar{f}\, d\Delta f\, |C(\bar{f}, \Delta f)|^2 \operatorname{Re}\left[\Omega_{k'}\left(\bar{f} + \frac{\Delta f}{2}\right) + \Omega^*_{k'}\left(\bar{f} - \frac{\Delta f}{2}\right)\right]$$

$$d \equiv \frac{2}{K} \sum_{k'=1}^{K} \sum_{k''=1}^{K} \lambda'_{k'} \lambda''_{k''} \iint d\bar{f}\, d\Delta f\, |C(\bar{f}, \Delta f)|^2 \operatorname{Re}\left[\Omega^*_{k'}\left(\bar{f} - \frac{\Delta f}{2}\right) \times \left\{\Omega_{k'}\left(\bar{f} + \frac{\Delta f}{2}\right) + \Omega_{k''}\left(\bar{f} + \frac{\Delta f}{2}\right) + \Omega^*_{k''}\left(\bar{f} - \frac{\Delta f}{2}\right)\right\}\right]$$

FIG. 37N

$$e \equiv \sum_{k=1}^{K} \frac{\lambda_k}{K} \iint d\bar{f}\, d\Delta f\, C(\bar{f}, \Delta f)\, TCC^{(r)}(\bar{f}, \Delta f)$$

$$f \equiv \frac{1}{\sqrt{K}} \sum_{k=1}^{K} \lambda_k \iint d\bar{f}\, d\Delta f\, C(\bar{f}, \Delta f)\, \mathrm{Re}\left[ TCC^{(r)}(\bar{f}, \Delta f) \left\{ \Omega_k\left(\bar{f} - \frac{\Delta f}{2}\right) + \Omega_k^*\left(\bar{f} + \frac{\Delta f}{2}\right) \right\} \right]$$

$$g \equiv \sum_{k=1}^{K} \sum_{k'=1}^{K} \lambda'_k \lambda''_k \iint d\bar{f}\, d\Delta f\, |C(\bar{f}, \Delta f)|^2$$
$$\times \mathrm{Re}\left[ \Omega_{k'}\left(\bar{f} - \frac{\Delta f}{2}\right) \Omega_{k'}^*\left(\bar{f} + \frac{\Delta f}{2}\right) \Omega_{k''}\left(\bar{f} - \frac{\Delta f}{2}\right) \Omega_{k''}^*\left(\bar{f} - \frac{\Delta f}{2}\right) \right]$$

$$h \equiv \sum_{k=1}^{K} \lambda_k \iint d\bar{f}\, d\Delta f\, C(\bar{f}, \Delta f)\, \mathrm{Re}\left[ \Omega_k\left(\bar{f} - \frac{\Delta f}{2}\right) \Omega_k^*\left(\bar{f} + \frac{\Delta f}{2}\right) TCC^{(r)}(\bar{f}, \Delta f) \right]$$

FIG. 37N (CONTINUED)

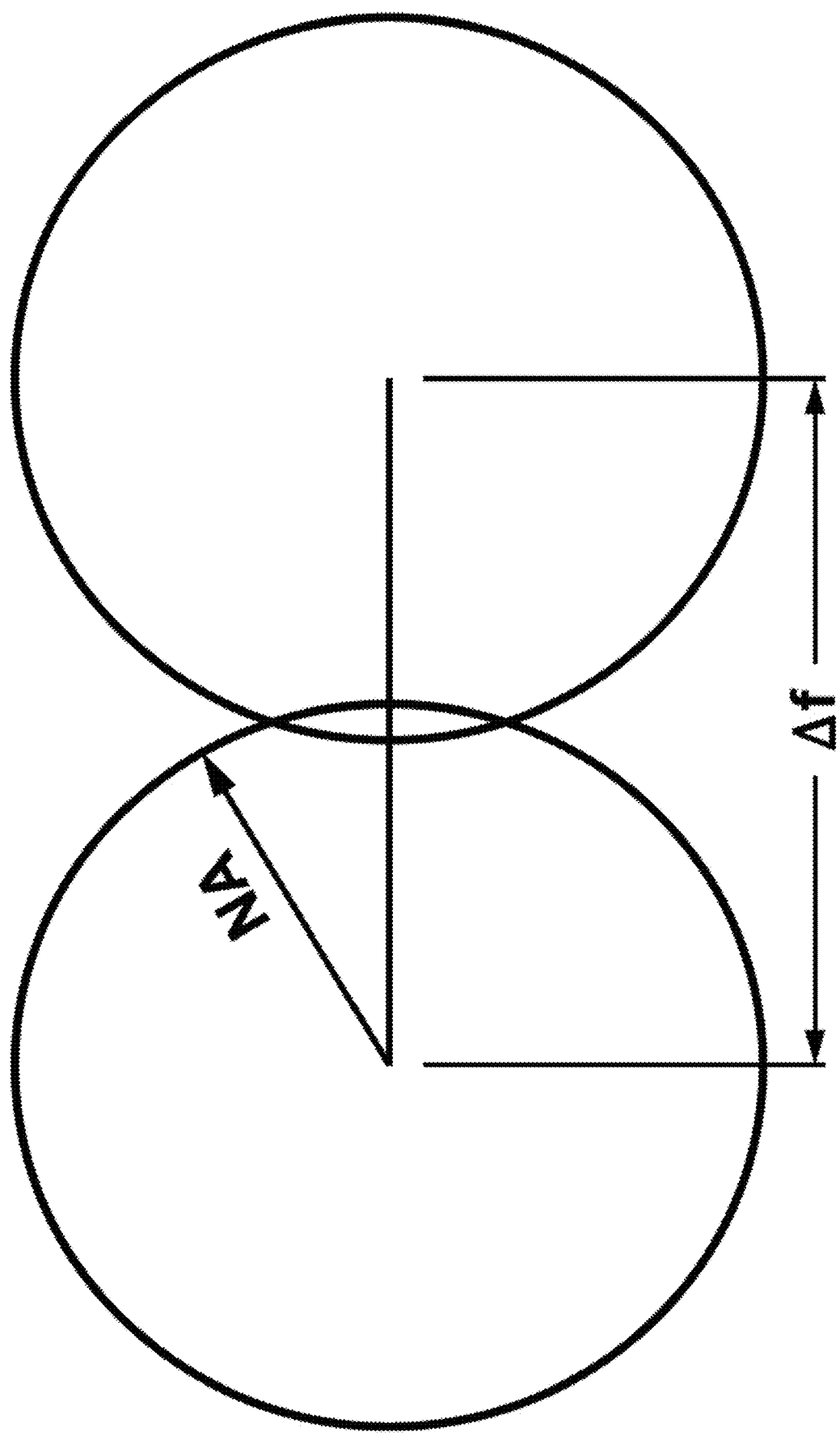

$$TCC\left(\bar{f}+\frac{\Delta f}{2}, \bar{f}-\frac{\Delta f}{2}\right)\bigg|_{\Delta f \to 2NA} \approx \begin{cases} \frac{4}{3\pi}\left(\frac{2NA-\Delta f}{NA}\right)^{3/2} S & \text{if } \Delta f < 2NA \\ 0 & \text{if } \Delta f > 2NA \end{cases}$$

FIG. 40A

$$\frac{\partial^2 TCC}{\partial \Delta f^2}\bigg|_{\Delta f \to 2NA} \approx \begin{cases} \dfrac{S}{\pi NA^{3/2}\sqrt{2NA-\Delta f}} & \text{if } \Delta f \leq 2NA \\ 0 & \text{if } \Delta f > 2NA \end{cases}$$

FIG. 40B

$$\lim_{(2NA-\Delta f)\to 0_+} \frac{\partial^2 TCC}{\partial \Delta f^2} = \infty$$

FIG. 40C

$$\Delta I^{(r)}(x) = \int_{-\infty}^{\infty}\int_{-\infty}^{\infty} df_1 df_2\, e^{2\pi i(f_1-f_2)x}\, TCC^{(r)}(f_1,f_2)\, M(f_1)\, M^*(f_2)$$

$$\Rightarrow \sum_{j=-N/2}^{N/2}\sum_{k=-N/2}^{N/2} e^{2\pi i(j-k)\delta f x}\, TCC^{(r)}(j\delta f, k\delta f)\, M(j\delta f)\, M^*(k\delta f)$$

FIG. 41A

In many cases, the frequency pairs $\{j\delta f, k\delta f\}$ that make the largest contribution to $\Delta I^{(r)}(x)$ will be those for which $j=0$ and/or $k=0$, since $M(f=0) \square M(f\neq 0)$ with most IC masks and feature sets. For this reason $TCC^{(r)}(f_1,0)$ and $TCC^{(r)}(0,f_2)$ will often make critical contributions to the image.

FIG. 41B

$$\Delta I^{(r)}(x) \cong \int\!\!\int_{-\infty}^{\infty} df_1 df_2\, e^{2\pi i (f_1 - f_2) x} M(f_1) M^*(f_2) \left[ TCC^{(r)}(f_1, 0) P(f_2) + TCC^{(r)}(0, f_2) P(f_1) \right]$$

assuming $TCC^{(r)}(0,0) = 0$ $$= 2\operatorname{Re}\left[ \left( \int_{-\infty}^{\infty} df_2\, e^{-2\pi i f_2 x} TCC^{(r)}(0, f_2) M^*(f_2) \right) \left( \int_{-\infty}^{\infty} df_1\, e^{2\pi i f_1 x} P(f_1) M(f_1) \right) \right]$$

$$= 2\operatorname{Re}\left\{ \left[ \left[ \int_{-\infty}^{\infty} dx_2\, tcc^{(r)}(x_1, x_2) * m[x] \right]_{x_1 = x} * m[x] \right]^* \left[ p[x] * m[x] \right] \right\}$$

"DC-Monolinear System"

FIG. 41C

$$E_{DC-mono} \equiv \int\int_{-\infty}^{\infty} df_1 df_2 \left| \left[ TCC^{(r)}(f_1,0) P(f_2) + TCC^{(r)}(0,f_2) P^*(f_1) \right] - TCC^{(r)}(f_1,f_2) \right|^2$$

If $P(f) \Rightarrow P(f) + \epsilon \delta(f - f_{pert})$ we require $\delta E_{DC-mono} = 0$.

FIG. 41D

$$P(f) = \left( \int_{-\infty}^{\infty} df' \hat{T}(0,f') \hat{T}(f',f) \right) - \frac{\hat{T}(0,f)}{2} \left( \int\int_{-\infty}^{\infty} df' df'' \hat{T}(0,f'') \hat{T}(0,f') \hat{T}(f',f'') \hat{T}^*(0,f'') \right)$$

$$\frac{TCC^{(r)}(f_1,f_2)}{\sqrt{\int_{-\infty}^{\infty} df' |TCC^{(r)}(0,f')|^2}}$$

where $\hat{T}(f_1,f_2) \equiv$

FIG. 41E

In many cases of interest, $TCC^{(r)}[0,0] \cong 0$. It is also often true that $TCC^{(r)}[f,0] \neq 0$ when $f \neq 0$.

In such cases $TCC^{(r)}[f,0]$ cannot be well fit by a Mercer term, since $TCC^{(r)}[f_1, f_2] \cong \Psi(f_1)\Psi^*(f_2)$ implies $TCC^{(r)}[0,0] \cong |\Psi(0)|^2 \cong 0$, and so $TCC^{(r)}[f,0] \cong \Psi(f)\Psi^*(0) \cong 0$.

FIG. 41F

$$\Delta I^{(r)}(x) \cong \text{Sign}\left[TCC^{(r)}(0,0)\right] \left|\Psi_{\substack{\text{Critical} \\ \text{Pairs}}}(x) * m(x)\right|^2$$

$$\text{where } \Psi_{\substack{\text{Critical} \\ \text{Pairs}}}(f) \equiv \frac{TCC^{(r)}(f,0)}{\sqrt{|TCC^{(r)}(0,0)|}}$$

FIG. 41G

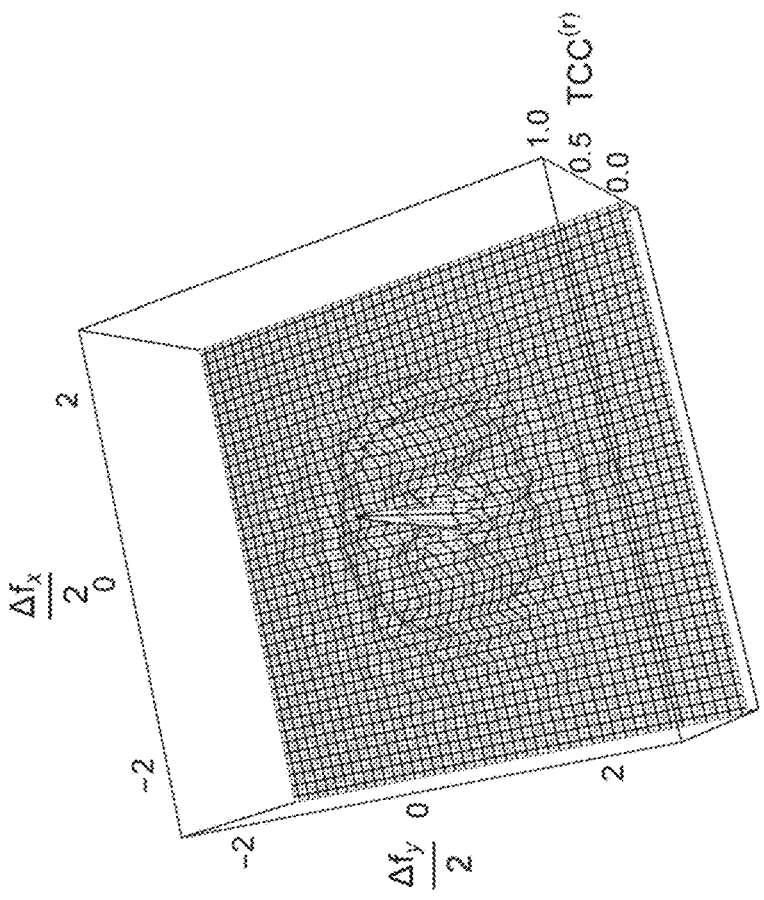
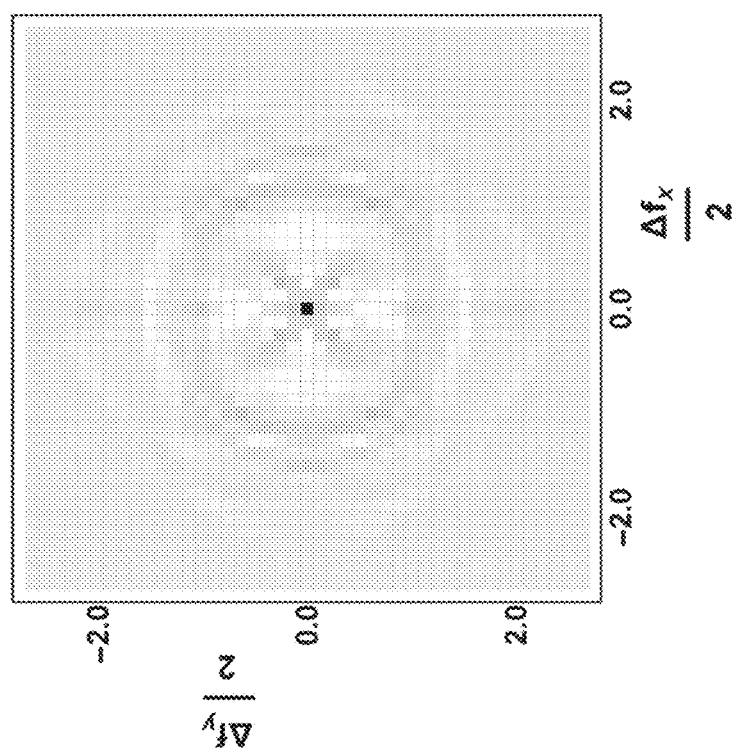
FIG. 43B

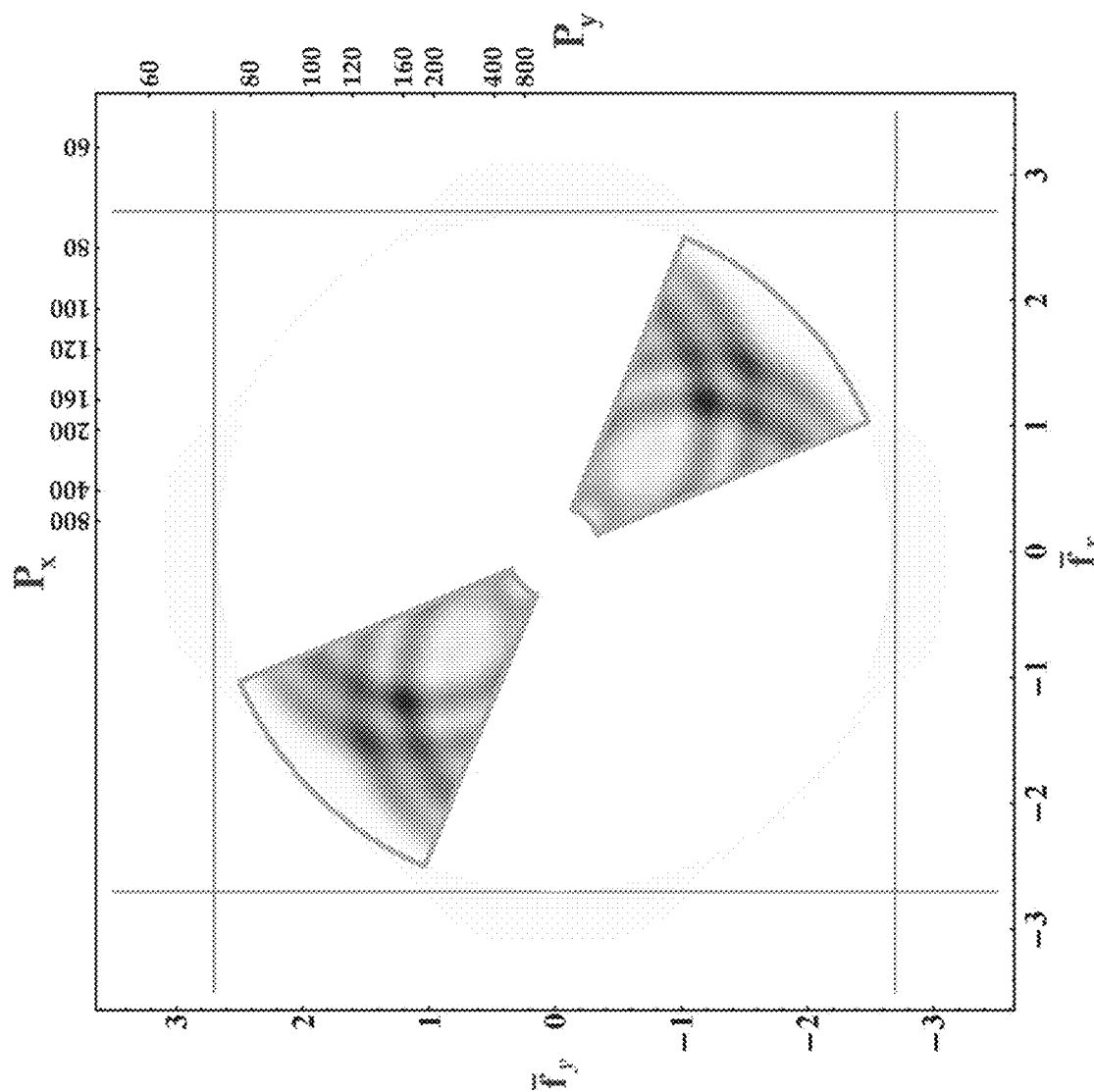

$$T_i''(\Delta f) = \begin{cases} \dfrac{\int d\overline{f}\, D\left(\overline{f}+\dfrac{\Delta f}{2}\right) D\left(\overline{f}-\dfrac{\Delta f}{2}\right) \Gamma\left(\overline{f}+\dfrac{\Delta f}{2}\right) \Gamma\left(\overline{f}-\dfrac{\Delta f}{2}\right) \mathrm{Re}\left[\left(T_i'^{*}\left[\overline{f}+\dfrac{\Delta f}{2}\right] T_i'\left[\overline{f}-\dfrac{\Delta f}{2}\right]\right)^p \mathrm{TCC}^{(s)}\left(\overline{f}+\dfrac{\Delta f}{2},\overline{f}-\dfrac{\Delta f}{2}\right)\right]}{\int d\overline{f}\, D\left(\overline{f}+\dfrac{\Delta f}{2}\right) D\left(\overline{f}-\dfrac{\Delta f}{2}\right) \Gamma\left(\overline{f}+\dfrac{\Delta f}{2}\right) \Gamma\left(\overline{f}-\dfrac{\Delta f}{2}\right) \left|T_i'\left[\overline{f}+\dfrac{\Delta f}{2}\right] T_i'^{*}\left[\overline{f}-\dfrac{\Delta f}{2}\right]\right|^{p+1}} & \text{if denominator is finite} \\[2ex] 0 & \text{if D product is zero throughout integral domain} \end{cases}$$

FIG. 45

$$E_{\text{Multisystem}} \equiv \iint d\bar{f} \, d\Delta f \, \Gamma\left(\bar{f} + \frac{\Delta f}{2}, \bar{f} - \frac{\Delta f}{2}\right)$$

$$\times \left| \text{TCC}^{(r)}\left(\bar{f} + \frac{\Delta f}{2}, \bar{f} - \frac{\Delta f}{2}\right) - \right.$$

$$\left[ T''_A(\Delta f) T'_A\left(\bar{f} + \frac{\Delta f}{2}\right) T'^{*}_A\left(\bar{f} - \frac{\Delta f}{2}\right) + T''_B(\Delta f) T'_B\left(\bar{f} + \frac{\Delta f}{2}\right) T'^{*}_B\left(\bar{f} - \frac{\Delta f}{2}\right) \right] \Bigg|^2$$

FIG. 46A

$$\hat{T}_{A\,or\,B}\left(\overline{f}, \Delta f\right) \equiv T'_{A\,or\,B}\left(\overline{f} + \frac{\Delta f}{2}\right) T'^{*}_{A\,or\,B}\left(\overline{f} - \frac{\Delta f}{2}\right)$$

FIG. 46B

$$F \circ G \equiv \int d\overline{f}\, \Gamma\left(\overline{f} + \frac{\Delta f}{2}, \overline{f} - \frac{\Delta f}{2}\right) F\left(\overline{f}, \Delta f\right) G^{*}\left(\overline{f}, \Delta f\right)$$

FIG. 46C

$$T_A''(\Delta f)\left[\hat{T}_A \circ \hat{T}_A\right] + T_B''(\Delta f)\left[\hat{T}_B \circ \hat{T}_A\right] = \left[TCC^{(r)} \circ \hat{T}_A\right]$$

$$T_A''(\Delta f)\left[\hat{T}_A \circ \hat{T}_B\right] + T_B''(\Delta f)\left[\hat{T}_B \circ \hat{T}_B\right] = \left[TCC^{(r)} \circ \hat{T}_B\right]$$

FIG. 46D

$$AL \equiv C_0(\bar{e}) - \sum_i P_i[c_i(\bar{e}); \lambda_i, \upsilon_i]$$

FIG. 47A

$$c_i(\bar{e}) \geq 0$$

FIG. 47B

$$P_i[c_i(\bar{e}); \lambda_i, \upsilon_i] \equiv \frac{\upsilon_i}{2}\left(\left[\text{Max}\left[0, \lambda_i - \frac{c_i}{\upsilon_i}\right]\right]^2 - \lambda_i^2\right)$$

FIG. 47C

$$AL \equiv \sum_i P_i \left[\sum_s^{\text{sparse}} f_{s,i} I_s\right]$$

FIG. 47D

$$\frac{\partial AL_{Loxi}}{\partial e_q} \equiv \sum_i \dot{P}_i \sum_s^{sparse} f_{s,i} \frac{\partial \left( t''(x) * |t'(x) * m(x)|^2 \right)\big|_{x=x_s}}{\partial e_q}$$

FIG. 47E

$$\frac{\partial AL_{Loxi}}{\partial e_q} \equiv 2\sum_i \dot{P}_i \sum_s^{sparse} f_{s,i} \int dx_k \, t'''(x_s - x_k) \, \text{Re}\left[ \left( (t'(x) * m(x))\big|_{x=x_k} \right) \left( \xi_q \int_{\text{Edge } q} dy' \, \Delta\tau \, t'(x_k - e_q) \right)^* \right]$$

FIG. 47F

$$\frac{\partial AL_{Loxi}}{\partial e_q} \equiv 2\sum_i \dot{P}_i \sum_s^{sparse} f_{s,i} \int dx_k \, t'''(x_s - x_k) \, \text{Re}\left[ K(x_k) \left( \xi_q \int_{\text{Edge } q} dy' \, t'(x_k - e_q) \right)^* \right]$$

with $K(x_k) \equiv \Delta\tau^* \left( (t'(x) * m(x)) \big|_{x=x_k} \right)$

FIG. 47G

$$\frac{\partial AL_{Loxi}}{\partial e_q} = 2\sum_i \dot{P}_i \sum_s^{sparse} f_{s,i} \sum_k t''_{s-k} \operatorname{Re}\left[ K_k \sum_r^{sparse} g_{r,q} t'^{*}_{k-r} \right]$$

FIG. 47H

$$\frac{\partial AL_{Loxi}}{\partial e_q} = 2\sum_r^{sparse} g_{r,q} \sum_s G_s \sum_k t''_{s-k} \operatorname{Re}\left[ K_k t'^{*}_{k-r} \right] \text{ with } G_s \equiv \sum_i \dot{P}_i f_{s,i}$$

FIG. 47I

$$\frac{\partial \Delta AL_{Loxi}}{\partial e_q} = 2\sum_r^{sparse} g_{r,q} \sum_k \overset{>}{T}_k \operatorname{Re}\left[ K_k t'^{*}_{k-r} \right] \text{ with } \overset{>}{T}_k \equiv \sum_s G_s t''_{s-k}$$

FIG. 47J

$$\frac{\partial \Delta AL_{Loxi}}{\partial e_q} = 2\sum_{r}^{sparse} g_{r,q} \sum_{k}\left(U'_k \text{Re}\left[t'_{k-r}\right] + U''_k \text{Im}\left[t'_{k-r}\right]\right)$$

with $U'_k \equiv T_k \text{Re}[K_k]$ and $U''_k \equiv T_k \text{Im}[K_k]$

FIG.47K

$$\frac{\partial \Delta AL_{Loxi}}{\partial e_q} = 2\sum_{r}^{sparse} g_{r,q}\left(H'_r + H''_r\right)$$

with $H'_r \equiv \sum_{k} U'_k \text{Re}\left[t'_{k-r}\right]$ and $H''_r \equiv \sum_{k} U''_k \text{Im}\left[t'_{k-r}\right]$

FIG.47L

TOOL TO PROVIDE INTEGRATED CIRCUIT MASKS WITH ACCURATE DIMENSIONAL COMPENSATION OF PATTERNS

CROSS REFERENCE TO RELATED APPLICATION

This patent application is a divisional application of copending U.S. patent application Ser. No. 15/420,246, filed on Jan. 31, 2017, which is a divisional patent application of copending U.S. patent application Ser. No. 15/329,654 filed Jan. 27, 2017, which is a national stage application of International patent application No. PCT/US2016/060462 filed Nov. 4, 2016, which claims priority to U.S. provisional patent application No. 62/393,866 filed Sep. 13, 2016, and U.S. provisional patent application No. 62/259,795 filed Nov. 25, 2015, which are hereby incorporated by reference in their entireties.

TECHNICAL FIELD

The embodiments of this invention relate generally to optical lithography and more specifically relate to optical lithography methods and systems that use an Optimal Coherent Systems (OCS) approach.

BACKGROUND

The optical micro-lithography process in semiconductor fabrication, also known as the photolithography process, involves the reproduction of desired circuit patterns onto semiconductor wafers for an overall desired circuit performance. The desired circuit patterns are typically represented as apertures with dimensionally compensated shapes formed on a template commonly referred to as a photomask, where the dimensional compensation aims to provide the desired circuit features on the wafer. In optical micro-lithography, patterns on the photo-mask template are projected onto a photo-resist coated wafer by way of optical imaging through an exposure system.

The continuous advancement of VLSI chip manufacturing technology to meet Moore's law of shrinking device dimensions in geometric progression has spurred the development of Resolution Enhancement Techniques (RET), Optical Proximity Correction (OPC) methodologies, Inverse Lithography Technology (ILT), and Source Mask Optimization (SMO) in optical microlithography. These techniques aim to provide mask patterns that are dimensionally compensated to correct for the errors that arise when forming images of mask shapes which are barely resolvable by the projection optical system. The limited resolution causes the wafer locations where a feature edge is desired in the developed photoresist to actually be exposed by "spillover" light from the images of adjacent features, and the detailed shape of the resulting exposed image must be determined in order to provide proper dimensional compensation in the mask aperture shapes. The printed wafer shapes are also influenced by non-ideal development behavior in the photoresist, but this too is determined by the detailed image pattern within the neighborhood of a given feature. The images projected by the optical system are of the partially coherent kind, meaning that the illumination source pattern consists of many independent illuminating waves rather than a purely coherent beam, i.e. the source distribution has a complicated shape in directional space, with the illuminating waves not being so complete in their directional coverage as to flood-illuminate the mask, which would produce incoherent images. While the directional distribution has a complex shape which is chosen by methods well known in the art, the total intensity field produced by the illuminating waves as they overlap on the mask is generally made highly uniform; thus it is the partial coherence distribution of the illuminating beams rather than their intensity distribution which is designed to enhance resolution.

The RET techniques based on partially coherent illumination are expected to be used by chip manufacturers for the foreseeable future due to the high volume yield in manufacturing and extended resolution that they provide, and their general past history of success. However, the ever shrinking device dimensions combined with the desire to enhance circuit performance in the deep sub-wavelength domain require ever more compute intensive applications of OPC and related methodologies to ensure the fidelity of mask patterns on the printed wafer as device counts increase. Methods to provide these capabilities are generally referred to as computational lithography. Device counts in individual integrated circuit levels now often exceed one billion, and providing dimensionally compensated patterns on this scale is quite expensive using known methods. In recent decades a substantial commercial industry has developed to implement and apply these methods in an efficient manner.

For the most part all of these methods use the same class of physical model to define the impact of resolution loss in projecting the mask shapes, namely the Hopkins model that is known to govern the complex and nonlinear partially coherent imaging process. In addition, an approximate but computationally more efficient form of the standard Hopkins model is universally applied in order to approximately match the partially coherent imaging process when mask shapes must be provided at full chip scale, namely the Optimal Coherent Systems approximation, which, as will be described, approximates the complex partially coherent imaging process by forming a superposition of simpler coherent images that can be determined far more quickly. The underlying physical basis for these methods is expressed in the well-known Hopkins equation of partially coherent imaging, which determines the intensity at a given image point from a sum of contributions from all pairs of points in the vicinity of the conjugate mask point, or from all pairs of spatial frequencies that diffract from within that region of the mask. Because of this pairwise interaction, partially coherent imaging takes place within a doubled domain (and correspondingly the Hopkins equation operates over a doubled domain), i.e., partially coherent images are in effect projected from a doubling of the space in which the mask patterns are defined, and in the Hopkins model the image intensity thus has a quadratic dependence on the pattern content (more specifically a bilinear dependence). The bilinear kernel that expresses the image contribution from a pair of interfering points or spatial frequencies is known as the transmission cross coefficient (tcc for interfering pairs of points, or TCC for interfering frequencies). Because of its quadratic nonlinearity the Hopkins equation cannot feasibly be evaluated over patterns of full chip scale, since compute cost becomes prohibitive. Fortunately, the full chip problem can be reduced to one that scales near linearly with area by breaking the circuit level into parts, referred to herein as OPC frames, correction frames, simulation frames, or simply as frames, with these frames being processed quasi-independently using a large number of processors, for example 1024 or 2048 processors. These frames must be larger than the resolution of the optical system in order that the dimensional compensation provided to a given mask shape properly take into account the influence from all nearby mask shapes that are sufficiently close as to noticeably influence the image of the given shape. (Such influences are referred to as optical proximity effects.) In other contexts the resolution of an optical system usually refers to, e.g., the width of the central core of the lens point spread function, which is about 75 nanometers in modern lithographic systems. However, point spread functions have long tails that fall off slowly, and in the context of compensating a mask shape for optical proximity effects it is therefore necessary to consider the associated weak impact from relatively distant patterns. The distance range deemed relevant is referred to in computational lithography parlance as the ambit, optical ambit, or optical diameter [OD], and is typically 1 or 2 microns. The spatial domain tcc is calculated over this range. The size of the OPC frame should, as a minimum necessary condition, be set at least as large as the optical ambit in order to properly account for local content when providing dimensional compensation. However, sizing the frame at the limiting ambit value is inefficient, because it only provides sufficient buffering context to accurately compensate features within a very small area at the center of the frame. In practice the frame size is therefore set a few times larger than the ambit, e.g. the frame size might be set at 5 to 10 microns, with the outer region of the frame (within about one OD of the boundary) serving as a guard band. Results from within the guard band may simply be discarded, with the inner frame contents being retained, and with the frames being overlapped by e.g. twice the guard band width in order that each mask pattern falls within the retained region of one frame.

Since the frames overlap it is not possible to define the contents of one frame independently of its neighbors, and this enforced overlap allows the shared influence that the inner cores of adjacent frames have on the wafer image to be accounted for. Though it is generally impractical to simultaneously account for the entire network of frame interactions across a full chip, it is common practice to use multiple communicating processors that operate in parallel, so that the task of determining the dimensional compensation for a plurality of frames can be carried out simultaneously, with the number of interacting frames that are processed in this way being e.g. 4 or 16. To accomplish this task the integrated circuit layout may be divided into regions that are correspondingly larger than a frame, e.g., 4 or 16 times larger. However, in this approach the basic computational scale of the image calculation remains that of the frame rather than the larger region, meaning that the image must be calculated over (typically square) areas of, e.g., 5 microns or 10 microns in size (including guard bands). Such dimensions are still quite large compared to the core optical resolution of, e.g., 75 nanometers, and evaluation of the Hopkins equation over such areas becomes impractically slow, due to its nonlinear scaling.

To carry out MBOPC (a commonly used acronym for Model-Based OPC) or mask design it is therefore necessary to approximately match the images from the partially coherent system using simpler systems whose images can be calculated more quickly. In practice all such approaches in current use are variants of the so-called Optimal Coherent Systems (OCS) method, which approximately matches the partially coherent images from the lithographic system with a sum of images produced by predetermined coherent systems, to be described in more detail below. The method is very widely used, but goes by many different names besides OCS, such as the Optimal Coherent Approximation (OCA), or the Sum of Coherent Systems method (SOCS), or Coherent Decomposition.

In a coherent system the illumination is produced by a single source point, and so may take the form of a single plane wave once the coherent illumination is collimated onto the mask object. Such illumination by only a single independent beam causes all pairs of mask points in the doubled domain to fully interfere with one another, and thus the pairwise interference takes place with a common degree of coherence (namely 100%). Because of this common coherence the image contribution produced by all interactions of a given mask point with all the other mask points (meaning all points within the other dimension of the doubled Hopkins domain) can be summed separately, and then multiplied by itself to obtain the image intensity. As a result of this devolution to a single domain, the image amplitude produced by a coherent system (and thus by each coherent system in the OCS approximation of the partially coherent imaging system) is formed as a linear superposition of amplitude contributions from the various mask points (which is then squared to provide an image intensity), and mathematically this linear superposition can be represented as a linear convolution of a coherent kernel with the mask pattern. Linear convolution processes can be simulated very rapidly using Fast Fourier Transforms, meaning that calculation of the image contribution from an OCS coherent system can be carried out far more rapidly than direct calculation of the image produced by a partially coherent system. Even if the OCS set contains hundreds of coherent systems, it can be more efficient when dimensionally compensating mask shapes to approximately match the partially coherent image by the sum of hundreds of coherent images from the OCS set, instead of working directly with the partially coherent intensity. However, the efficiency gain will generally not be large enough to make dimensional compensation practical at full chip scale unless a set of coherent systems can be found which successfully match the partially coherent images with adequate accuracy using a somewhat smaller total number of coherent systems, e.g., if the OCS set achieves acceptable accuracy using only about 25 coherent systems.

The simplest approach for choosing coherent systems that match a partially coherent system is to subdivide the partially coherent source into small point-like elements. Point sources provide coherent illumination, and thus a separate coherent system can be defined for each grid point in a gridding of the complex source shape used by the partially coherent system. This simple decomposition into coherent systems was developed by Abbe to analyze microscope images, and is known as Abbe's method. The illumination for each coherent system essentially takes the form of a single plane wave that is incident from the direction of a particular source point. The projection lens in each coherent system collects the coherent light transmitted by the mask, and in the Abbe mode of coherent matching the lens apertures of these coherent systems are identical to the lens used by the partially coherent system being matched. However, rather than having the different coherent systems in the matching set use different illumination tilts along with a common lens aperture, one may equivalently use a common direction for the illuminating plane waves (such as illumination at normal incidence to the mask), while skewing the lens aperture to a different offset position for each of the different coherent systems. These two alternative sets of coherent systems behave equivalently because in Hopkins imaging the effect of tilting a plane wave that illuminates an object (e.g. the mask) is simply to introduce a matching directional skew or tilt in the plane waves that diffract from the mask, meaning that the set of collected waves can be changed in an equivalent way by either tilting the illumination, or by skewing the collection aperture to an offset position. Thus, in the Abbe approach each coherent system can be formed by shifting the lithographic lens aperture to a location that is offset to intersect the direction of some single point in the source, with the intensity contribution from each coherent system being weighted by the intensity of the associated source point (and with a common coherent plane wave illumination being used by all systems). Imposition of such a weighting factor is equivalent to introducing a uniform change in the transmission of the lens pupil of the coherent system.

In some cases this simple Abbe approach can provide an efficiency gain with the partially coherent sources used in modern lithography, since current sources are sparse in a relative sense, meaning that current lithographic sources only introduce significant illuminating intensity from a small fraction of the full range of directions from which the mask might in principle be illuminated (i.e. only small fraction of the full hemisphere of potentially incident directions actually contains illuminating waves). In the opposite extreme, i.e. when a mask is flood-illuminated with uniform intensity from a full hemisphere of directions, the illumination on the mask object becomes incoherent, and the pairwise contribution of object points to the image (as specified by the Hopkins equation) has magnitude zero unless the two points are coincident, i.e. are the same single mask point. The object effectively becomes self-luminous in this incoherent limit, and in this limit the doubled domain of the Hopkins reduces to a single domain. Incoherent images can therefore be calculated very rapidly using linear convolution of an intensity kernel with the self-luminous object. Imaging becomes incoherent when, for example, an object mask is flood-illuminated, or when an object is self-luminous, or when a self-luminous pattern is created by illuminating a fluorescent medium with a shaped pattern.

Lithographic sources are neither coherent nor incoherent, but they are usually considerably closer to the coherent limit than the incoherent limit, since the coherence function defined by modern sources shows appreciable content over distances that are distinctly larger than the projection lens resolution. Nonetheless, most lithographic systems remain quite far from even the coherent limit. In fact, a significant practical drawback to the simple Abbe coherent matching approach arises from the relatively large number of coherent systems that are needed to match typical partially coherent systems when Abbe decomposition is used. For example, a typical lithographic source shape can easily contain more than 100 source points that emit with significant intensity when an accurate gridding is used, and may contain 100's of additional points that emit with an intensity that is weak but non-zero, whose contributions should still be included to obtain accurate dimensional compensation. Use of such a large number of coherent systems forces an undesirably long compute time when determining appropriate dimensional compensations in patterns at full chip scale.

The inefficiency of the simple Abbe form of coherent decomposition arises from the very limited character of the tailoring that this method makes when defining each coherent system in the matching set, since the Abbe method attempts to provide a useful contribution to the match by simply shifting the position and uniform transmission of a lens pupil having fixed shape (i.e., in Abbe decomposition each coherent system aperture maintains the fixed shape of the circular pupil of the projection lens, except that it is shifted in position and given an adjusted transmission to match the contribution from a single emitting point of the partially coherent source).

It is known that a more efficient set of coherent systems can be obtained by employing coherent apertures that have complex general form, wherein the transmission of each pupil is made continuously varying in a complex pattern that yields the best possible match, rather than being merely a simple shifted disk. The transmission pattern of the lens aperture in a coherent system essentially acts as a filter on the diffracted mask spectrum, i.e. the aperture pattern applies a filtering to the mask spatial frequency content that the lens reconverges to the coherent image, and there is a known method for obtaining the coherent filter function which best matches the behavior of a partially coherent imaging system.

In particular, a method is known for determining the set of coherent system apertures which are optimally efficient, i.e., the set of aperture transmission functions which will be able to obtain a particular accuracy level using fewer coherent systems than any other set of apertures, when averaged over all possible patterns. Since coherent kernels are optimal when chosen in this way, they are referred to as Optimal Coherent Systems (OCS), and their use is also referred to as an Optimal Coherent Approximation (OCA), or as a Sum Of Coherent Systems (SOCS) approach. When inverse Fourier transformed to the mask domain, these optimal coherent pupils become the kernels in linear convolutions of the mask patterns. It is known that these kernels may be explicitly determined as the eigenfunctions of the nonlinear (specifically, bilinear) kernel of the Hopkins equation, i.e., as eigenfunctions of the transmission cross coefficient (TCC, in the Fourier domain, or tcc, in the spatial domain, with lower case being used by convention in the latter acronym to denote a spatial domain quantity, and it is further known that the sum of an infinite number of squared convolutions of these eigenfunctions with the mask will reproduce the Hopkins equation result exactly. However, in practice OCS must use only a finite number of such squared convolutions, with each squared convolution providing the associated coherent image contribution, so that OCS approximately matches the partially coherent image using a finite sum of coherent images. The eigenfunction kernels used by OCS may be explicitly determined from the TCC by using standard algorithms and software packages for eigendecomposition. Some of these algorithms provide a complete eigendecomposition of the TCC when the TCC is gridded as a matrix, and since such a decomposition is akin to matrix diagonalization, the procedure is sometimes referred to as diagonalizing the TCC. At kernel counts that are practical for OPC (e.g., in the 10 to 100 range) the OCS coherent systems (each defined by a single kernel) provide a far more accurate match to the TCC than can coherent systems chosen by the Abbe method.

However, OCS accuracy still entails compromise in practice. For example, it should be noted that in a rigorous treatment the optical interaction range must be considered unbounded, though the interaction strength falls off rapidly to generally negligible levels once the core lens resolution and coherence length are exceeded. If the physical source contains an infinite number of points it would be necessary to use an infinite number of terms to exactly decompose the TCC into coherent system contributions, regardless of whether the Abbe or OCS method is used. However, at practical kernel counts the OCS method exhausts the TCC far more rapidly than the Abbe method (with the former in fact exhausting the TCC at the fastest rate possible for coherent systems), and the approximate match to the TCC that OCS provides is thus regarded as a valid decomposition of the exact TCC, even though it generally leaves unmatched a residual portion of the TCC whose impact on images of practical interest is often not entirely negligible.

Despite this imperfect accuracy, the OCS algorithm made MBOPC practical, and broadly speaking it has represented the state of the art in fast simulation of partially coherent projected images since about the mid-1990s. But even though OCS allows computational lithography shape adjustments to be determined with passable accuracy at speeds that are many orders of magnitude faster than is possible with direct evaluation of the Hopkins equation, MBOPC at full chip scale still requires very long compute times (of order one day) on very large computers, and so is quite expensive. Moreover, appreciable accuracy is often sacrificed in order to mitigate this high computational cost, and this increases the burden on empirical correction procedures that are used to fine-tune printed lithographic dimensions during production.

A further difficulty with the OCS algorithm is that the tradeoff between accuracy and speed becomes increasingly less favorable as required accuracy is tightened. Typical industry accuracy requirements have slowly increased as integrated circuit (IC) feature sizes push closer and closer to fundamental resolution limits, and this improvement requires a disproportionate increase in the number of OCS systems employed.

In summary, conventional practice to control the dimensions of IC patterns involves adjusting mask patterns in a process whose core is the so-called OCS method. The mask adjustment process (known as optical proximity correction or OPC) relies on OCS to assess candidate mask adjustments.

During use the OCS method simulates the wafer image of billions of mask features during each iteration of the adjustment. The OCS method constructs the wafer image as a sum of coherent images of the mask. Each coherent image in this approximate match to the partially coherent image is obtained as the squared convolution of the mask with a coherent kernel. The kernel may be considered as a function that is used as a component of an integration that is repeatedly applied, and each kernel in the OCS set is the inverse Fourier transform of the lens aperture of an Optimal Coherent System, which may be obtained as an eigenfunction of the Hopkins bilinear kernel. In general, a purely coherent image can be calculated as the squared convolution of a kernel with the object transmission, with the kernel being the inverse Fourier transform of the lens aperture (e.g. an Airy function in the simple case where the lens aperture is an open circle).

The current OPC practice requires a difficult tradeoff between runtime and accuracy when employing OCS. The OCS sum is only strictly accurate as an infinite series. However in current practice it may be considered reasonable to employ about 25 coherent systems to match the partially coherent lithographic system with an acceptable balance between runtime and accuracy, and therefore the OCS sum is typically terminated after only about 25 systems. An acceptable compromise can nonetheless involve too-large CD errors (typically ~2 nm although larger errors can be experienced for some pitches) and too-slow runtimes (e.g., a day or more on a very large computer).

Clearly, improvements to the conventional OPC and OCS-based methods are needed.

SUMMARY

In a first non-limiting aspect thereof the embodiments of this invention provide a tool that is configured to process input data. The tool comprises an input to receive input data representing integrated circuit shapes within separate mask regions of a semiconductor fabrication mask for use in optical lithography; and an output to provide output data representing a mask in which dimensions of mask shapes are compensated on the basis of image content in the vicinity of each mask shape when the mask is projected during optical lithography. The tool is configured to match a partially coherent lithographic image by superposing a sum of images from a set of coherent systems and a sum of images from a set of loxicoherent systems.

In another non-limiting aspect thereof the embodiments of this invention provide a computer-controlled tool that is configured to process input data representing integrated circuit patterns of a semiconductor fabrication mask to be used in projection lithography. The computer-controlled tool comprises at least one data processor configured to apply a dimensional compensation to circuit pattern shapes based on an intensity pattern produced in a projected lithographic image, where the intensity pattern is determined by performing an optimal coherent systems (OCS) process on input data using coherent OCS kernels derived from at least one Hopkins bilinear Transmission Cross Coefficient (TCC). The at least one data processor is further configured to perform a decomposition process on data using at least one compound loxicoherent system in which a constituent coherent system is paired with a constituent incoherent system to form the loxicoherent system, and where at least one kernel decomposition is made along an axis that is slanted between two domains of a Hopkins bilinear model to determine an aperture of the incoherent system.

In a further non-limiting aspect thereof the embodiments of this invention provide a tool to process data representing input integrated circuit patterns of a semiconductor fabrication mask to be used in projection lithography. The tool comprises a frame generation module configured to partition each region of a starting mask that is organized into separated regions of mask content into overlapped frames of mask data; a coherent system engine comprised of an optimal coherent systems (OCS) engine having an input to receive the overlapped frames of mask data of the starting mask and an output to provide a full Transmission Cross Coefficient TCC; and an incoherent system engine having an input connected to the output of the OCS engine and an output that provides a final mask definition for use during fabrication of an integrated circuit. In the tool a loxicoherent system is comprised of a pair of the OCS engine and the incoherent system engine. The incoherent system engine is configured to form a residual TCC by removing certain coherent system kernels from the full TCC; match the residual TCC with a sum of multiplied lower-dimensioned kernels that are separated along axes that are rotated in a doubled domain between mask content axes in the doubled domain; decompose at least one low-dimensioned kernel lying within the doubled-domain in the mean-frequency direction into a product of coherent system apertures serving to filter the mask content; select as an intensity kernel at least one low-dimensioned kernel lying along the doubled domain axis in a difference-frequency direction; and adjust mask fragments by iterating operations across one or more processors.

In a further non-limiting aspect thereof the embodiments of this invention provide a method to process data representing a semiconductor fabrication mask. The method comprises performing a decomposition process on a full Transmission Cross Coefficient (TCC) using optimal coherent systems (OCS) kernels; isolating a residual TCC that remains after a chosen number of coherent kernels are extracted from the full TCC; and performing at least one decomposition process on the residual TCC using at least one loxicoherent system.

In a still further non-limiting aspect thereof the embodiments of this invention provide a computer-implemented method to process data representing a semiconductor fabrication mask. The computer-implemented method comprises performing an Optimal Coherent Systems (OCS) process on the data using OCS kernels derived from at least one Hopkins bilinear model; and performing a decomposition process on the data using at least one loxicoherent kernel, in which at least one kernel decomposition is made along an axis that is slanted between two domains of the Hopkins bilinear model.

In yet another non-limiting aspect thereof the embodiments of this invention provide an apparatus that comprises an optimal coherent systems (OCS) system engine having an input to receive a starting mask and an output to provide a full Transmission Cross Coefficient (TCC). The apparatus further comprises a loxicoherent system engine having an input connected to the output of the OCS system engine and an output to provide a mask for use during fabrication of an integrated circuit. The loxicoherent system engine is configured to form a residual TCC by removing preferred coherent system kernels from the full TCC; decompose the residual TCC as a sum of lower-dimensioned kernels that are separated along axes that are rotated between mask content axes in a doubled domain; decompose at least one low-dimensioned kernel lying within the doubled-domain in the mean-frequency direction into a product of mask filters; select as an intensity kernel at least one low-dimensioned kernel lying along a doubled-domain axis in a difference-frequency direction; and iteratively adjust mask fragments.

In a further non-limiting aspect thereof the embodiments of this invention provide an article of manufacture that comprises a tangible computer readable medium having information stored therein or thereon. The information is configured to convert and transform a first object, embodied as a starting mask, into a second object, embodied as a final mask which can be used during fabrication of semiconductor circuits and structures. The information is configured to perform a decomposition process on a full Transmission Cross Coefficient (TCC) using optimal coherent systems (OCS) kernels; isolate a residual TCC that remains after a chosen number of coherent kernels are extracted from the full TCC; and perform at least one decomposition process on the residual TCC using at least one loxicoherent system.

In another further non-limiting aspect thereof the embodiments of this invention provide a data assemblage stored on or in a non-transitory computer-readable storage medium. The data assemblage represents mask data for use in fabricating an integrated circuit, and the data assemblage is created by a process that comprises performing an Optimal Coherent Systems (OCS) process on the data using OCS kernels derived from at least one Hopkins bilinear model; and performing a decomposition process on the data using at least one loxicoherent kernel, in which at least one kernel decomposition is made along an axis that is slanted between two domains of the Hopkins bilinear model.

In one further non-limiting aspect thereof the embodiments of this invention provide a tool that is configured to process input data, where the tool is comprised of an input to receive input data representing integrated circuit shapes within separate mask regions of a semiconductor fabrication mask for use in optical lithography; and an output to provide output data representing a mask in which dimensions of mask shapes are compensated on the basis of image content in the vicinity of each mask shape when the mask is projected during optical lithography by a partially coherent imaging system. The tool is configured to match a partially coherent lithographic image by superposing images from a set of decomposition systems that include a DC-monolinear system.

In a still further non-limiting aspect thereof the embodiments of this invention provide a tool configured to process input data and lithographic requirements. The tool comprises an input to receive input data representing integrated circuit shapes within separate mask regions of a semiconductor fabrication mask for use in optical lithography, and a specification of quantitative lithographic goals and requirements as a nonlinear programming problem whose variables include mask edge variables. The tool further comprises an output to provide output data representing a mask in which dimensions of mask shapes are compensated on the basis of image content in the vicinity of each mask shape when the mask is projected during optical lithography by a partially coherent imaging system. The tool is configured to determine image intensities from values taken by the mask edge variables, with spacings and separations of the mask edges defining the mask dimensions. The tool is further configured to compute the quantitative lithographic goals and requirements from the image intensities; to adjust the nonlinear programming problem variables, including the mask edge variables, to determine an optimal solution to the nonlinear programming problem; and to determine image intensities produced by the partially coherent imaging system by superposing the images from a set of decomposition systems that include at least one loxicoherent system.

In yet another non-limiting aspect thereof the embodiments of this invention provide a photomask for optical lithography. The photomask comprises mask shapes containing a reduced number of edges enabling the mask shapes to be decomposed into a reduced number of shots of an electron beam mask writer that creates the photomask.

BRIEF DESCRIPTION OF THE SEVERAL VIEWS OF THE DRAWINGS

FIG. 1 shows several equations, in FIGS. 1A-1E, that are discussed in context of the conventional OCS process and the Hopkins optical model.

FIGS. 2A-2C, collectively referred to as FIG. 2, provide background information related to this invention, where FIG. 2A explains how the contributions from each source point to each pair of interfering mask spatial frequencies in the doubled Hopkins domain contribute to image modulation, FIG. 2B shows how the sharp pupil of the projection lens determines whether both mask frequencies are projected to the wafer, and FIG. 2C illustrates determination of the TCC function that defines the overall modulation from all source points by means of a Hopkins diagram.

FIG. 4 shows that the slope discontinuity in the TCC occurs along the $\Delta f$ axis, whose direction is slanted across the doubled domain of the Hopkins equation.

FIG. 5 includes several equations, FIGS. 5A-5C, which show that the TCC is slope-discontinuous in the $\Delta f$ direction, but is generally continuous in the orthogonal f direction.

FIG. 7 includes equations in FIGS. 7A and 7B, which show that a Mercer term composed of OCS kernels is inherently ill-suited to modeling the slope-discontinuity in the TCC.

FIGS. 9A and 9B, collectively referred to as FIG. 9, illustrate in FIG. 9A a second TCC example for 1D line/space features based on a C-quad source that is shown in FIG. 9B, where the slope discontinuity in the TCC (also referred to as a "crease") is clearly visible at Δf=0.

FIG. 11 shows several equations in FIGS. 11A-11C which decompose the residual TCC in a series of so-called rotated systems in accordance with the invention, these systems being composed of two different lower-dimensional kernels with axes whose direction is rotated between the two domains of the Hopkins equation, also showing that the TCC slope contributed by each of these systems can, like the TCC itself, be very different in the f̄ and Δf directions.

FIG. 12 shows several equations in FIGS. 12A-12H which are discussed in the context of finding the two kernels of a rotated system which will best match a residual TCC.

FIGS. 15A-15F, collectively referred to as FIG. 15, show the TCC residual that remains after 24 OCS kernels are used to approximate the TCC from an example partially coherent lithographic system that uses a so-called free-form or SMO source. Results are shown with and without a wafer film stack, and the strong concentration of the TCC residual error near the slope discontinuity is seen in all cases, with the residual error exhibiting different characteristic symmetries in its real and imaginary parts.

FIG. 16 includes equations in FIGS. 16A and 16B, which show how one kernel of a rotated system can be determined when the residual TCC error is strongly concentrated near a slope discontinuity at zero difference frequency.

FIG. 20 includes equations in FIGS. 20A-20I, which show how a so-called loxicoherent system element of the invention can be formed by expanding a low-dimensioned kernel of a rotated system into a product of mask filters that each correspond to the aperture of a constituent coherent system, also revising the kernel along the slanted difference frequency direction to become an intensity kernel of a paired constituent incoherent system, and how such loxicoherent systems can be used to rapidly determine the contribution made by a TCC residual to a partially coherent image.

FIG. 22 shows several equations in FIGS. 22A-22J that are discussed in the context of determining the constituent coherent and incoherent kernels of a first or primary loxicoherent system.

FIG. 26 shows an equation which is used in an explanation of why overall lithographic image error is strongly influenced by the accuracy of the optical model at zero difference frequency, given the typical properties of lithographic masks.

FIGS. 27A and 27B, collectively referred to as FIG. 27, plot the intensity present in different spatial frequencies projected by an example metal level mask, showing the usual situation where most of the energy is concentrated in the zero order, with much of the remaining energy being concentrated into directions that project on either the x or y axis of the mask patterns.

FIG. 28 is a Table showing the 1D accuracy of the improved apparatus/method of this invention versus the conventional approach.

FIG. 29 includes equations in FIGS. 29A-29E, which show that in the asymptotic limit the primary loxicoherent systems of the invention become capable of modeling the entirety of the TCC residual at the slope discontinuity, whereas each additional coherent system can only capture a small portion of this error, explaining a property that can be exploited in forming higher-order loxicoherent systems.

FIGS. 31A and 31B, referred to collectively as FIG. 31, aid in explaining how patterns in the guard bands that provide mask frames with proper optical context for dimensional compensation are updated between iterations to accurately reflect the compensating adjustments made in adjacent frames.

FIG. 33 shows several equations in FIGS. 33A-33C that are discussed in the context of obtaining the mask filter kernels of a higher-order loxicoherent system when the residual TCC remaining after extraction of a first loxicoherent system is concentrated in low but non-zero difference frequencies.

FIG. 34 shows equations in FIGS. 34A-34M that are discussed in the context of obtaining higher-order loxicoherent systems that emphasize extraction of residual TCC content at quasi-dominant difference frequencies.

FIG. 35 shows equations in FIGS. 35A-35C that are discussed in the context of obtaining higher-order loxicoherent systems that model the imaginary parts of residual TCC errors.

FIG. 37 shows equations in FIGS. 37A-37N that are discussed in the context of a homotopy method for obtaining higher-order loxicoherent systems.

FIGS. 39A and 39B referred to collectively as FIG. 39 illustrate graphically that a slope discontinuity and associated residual error can arise in the TCC at difference frequencies that approach the band limit.

FIG. 40 includes equations in FIGS. 40A-40C which are introduced in a discussion of the slope discontinuity arising at the band limit, showing that the resulting residual TCC errors are concentrated at difference frequencies near twice the numerical aperture in direction cosine units, where they can be addressed by embodiments of the invention.

FIG. 41 includes equations in FIGS. 41A-41G which are presented in a discussion disclosing a so-called DC-monolinear system of the invention, which efficiently models the portions of the TCC which are most intensively sampled by typical lithographic masks.

FIGS. 43A-43C referred to collectively as FIG. 43 show three different 2D cross-sections or averaged cross-sections in the 2D manifold perpendicular to the ridge peak of the predominant residual error in the 4D TCC, in the case of a C-quad source example. These plots illustrate an azimuthal averaging that occurs when a T" intensity kernel of a loxicoherent system is determined.

FIG. 44, which includes FIGS. 44A-44D, shows plots of T' sectors for predominantly x,y pattern azimuths and T' sectors for predominantly 45° orientations, where the sectoring is implemented to counteract an azimuthal averaging in T" kernels for a full 4D error residual.

FIG. 45 shows an equation, which is used in the context of defining T" intensity kernels of the invention which, in conjunction with sectored T' kernels, counteract azimuthal averaging in modeling 4D error residuals, also taking advantage of the spectral inhomogeneity of typical IC mask patterns.

FIG. 46 shows equations in FIGS. 46A-46D, which illustrate that when a plurality of loxicoherent systems are used, the constituent intensity kernels of these loxicoherent systems can be simultaneously optimized to reflect their joint use, showing explicitly how this is done in the case where two loxicoherent systems are employed.

FIG. 47 includes equations in FIGS. 47A-47L which are introduced in a discussion of how the novel decomposition systems of the invention may be used during inverse lithography procedures to more efficiently calculate cost functions or augmented Lagrangians, and their gradients.

DETAILED DESCRIPTION

Figure 2A:
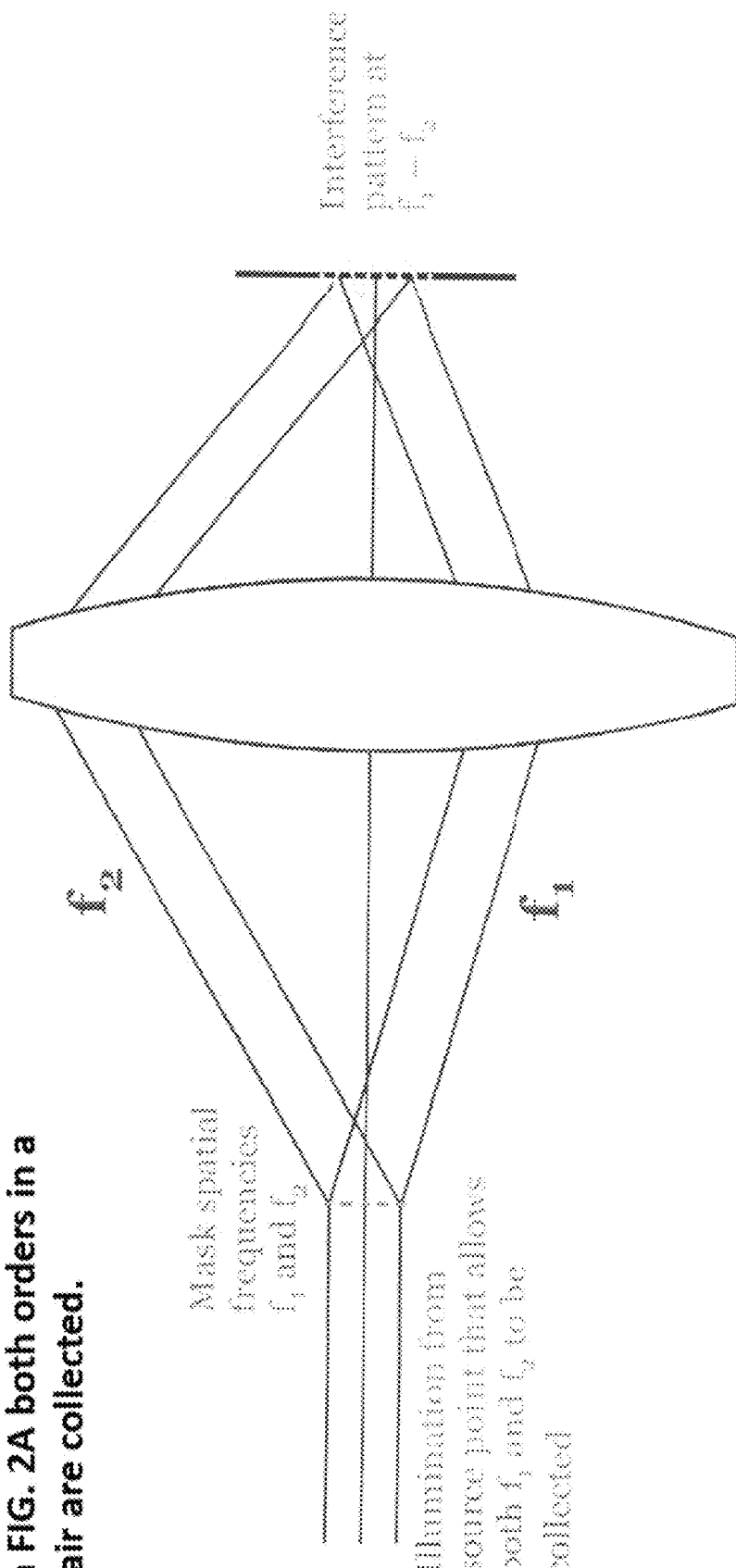

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention.

As employed herein a "loxicoherent system" is a term/phrase derived to be descriptive of embodiments of this invention. "Loxi" is Greek for slanted, the significance of which will be explained in detail below with respect to a loxicoherent kernel. The structure of a loxicoherent system is novel in that each such system is a compound system comprised of a plurality of constituent systems, for example a pair of constituent systems operating in sequence. The sequence begins with a first constituent system of the pair that is a coherent system, and that images the mask amplitude under plane wave illumination through a predetermined lens aperture (represented computationally by a predetermined filtering kernel) to produce a coherent image whose squared amplitude constitutes an intensity. This intensity is then propagated through a constituent incoherent system of the pair of systems, this constituent incoherent system having its own predetermined kernel (in particular an intensity kernel), thus forming an output image that serves as the output image of the loxicoherent system as a whole. The output image contribution from at least one loxicoherent system is summed with the contributions from other employed systems to approximately match the partially coherent lithographic image. The mathematical structure of the loxicoherent system is novel and clearly different from that of prior art coherent systems at least for the reason that it contains two distinct kernel functions rather than one (although below there are references to the T' function that sometimes term it to be a filter or aperture function rather than a kernel), corresponding to the two distinct apertures of the paired coherent and incoherent systems that comprise the loxicoherent system. It is noted that, while T' certainly qualifies as a kernel even though sometimes it is referred to as a filter or aperture, it can be described in any of these ways.

Aspects of the embodiments of this invention pertain to the decomposition of the TCC using non-coherent kernels for faster calculation of lithographic images. Conventional OPC codes achieve practical compute times at full-chip scale by approximating partially coherent images as sums of coherent images, a methodology known variously as OCA, SOCS, or OCS. Though many refinements have been made to the OCA methodology since its introduction in the mid-1990s, the basic approach of decomposing the partially coherent Hopkins kernel (TCC) as a sum of coherent systems has remained the state of the art for two decades.

An aspect of this invention is to derive and demonstrate a new form of image decomposition that is designed to closely match those portions of the TCC which are most recalcitrant to standard OCA. The new decomposition systems can be referred to herein as being loxicoherent.

While coherent systems employ a single convolution kernel, each loxicoherent system uses at least two distinct kernels. As with standard coherent systems, compute time with loxicoherent systems is proportional (with some overhead) to the number of kernel convolutions. Tests with one dimensional (1D) patterns show that for a given kernel-count budget in the typical, e.g., 10-100 range, image calculation error can routinely be reduced by at least a factor of five if loxicoherent systems are used in the decomposition. Loxicoherent systems likewise enable a given worst-case accuracy target to be achieved with at least three times fewer kernels. Based on theoretical arguments one may expect for 2D systems that the speed/accuracy tradeoff will remain far superior to that of standard OCA, although possibly by a smaller margin as compared with 1D patterns.

Standard OCA kernels correspond to the pupils of coherent imaging systems. The output of a coherent system is linear in amplitude, whereas a loxicoherent system has a more complex structure that is entirely nonlinear even in the lowest-order term. The structure of loxicoherent systems will be explained in detail herein, and they will be shown to be well-suited for extraction of any near-Toeplitz components present in the TCC. Such components have an eigenvalue spectrum that decays very slowly, and so are difficult to capture with OCA.

It can be shown that TCCs for lithographic systems in fact contain strong Toeplitz-like components that arise from slope discontinuities associated with the sharp aperture of the projection lens. Asymptotically, the uncaptured TCC becomes dominated by such discontinuities, and under idealized assumptions the fractional portion of the remaining un-mapped TCC that each new OCA kernel is able to extract becomes arbitrarily small, in the limit where a very large number of kernels has already been extracted. In contrast, a single loxicoherent system is able to capture the entire remainder in this idealized limit. While these behaviors apply in an asymptotic regime that can never be fully realized, qualitatively similar behavior is seen with practical kernel counts.

The rich structure of loxicoherent systems makes them useful for matching recalcitrant portions of the TCC, but their increased complexity may also make them more difficult to determine optimally in the general case. However, the largest practical benefit arises in the special case where the loxicoherent system must fit the TCC remainder left uncaptured by a typical set of OCA coherent kernels. In this special case a fast analytic method for choosing optimal loxicoherent kernels compares very favorably to brute-force numerical optimization.

A loxicoherent system kernel which is least-squares optimal can be rigorously obtained under general conditions, analogous to choosing a TCC eigenfunction as the least-squares optimal (lone) kernel of a coherent system. However, this rigorous method only optimizes a single kernel in the loxicoherent system, and optimization of all constituent kernels is necessary to obtain full advantage from the loxicoherent structure. In many cases of practical importance it proves possible to determine all constituent kernels by combining quasi-analytic calculations with fast (linear) least-squares fits. Under general conditions, illustrated herein for an exemplary 1D embodiment, a homotopy algorithm has been found to reliably produce an accurate and complete set of kernels.

Loxicoherent systems can improve accuracy during Inverse Lithography Technology (ILT) as well as OPC. By using adjoint differentiation the gradient of a cost function or Augmented Lagrangian can be calculated with the same FFT-gated near-linear area scaling that the forward intensity calculation exhibits.

A non-limiting aspect of this invention is a mask design and configuration tool that provides a mask having dimensionally compensated shapes. The tool is configured to process data from an input data stream, input database, or input queue, where the data represents integrated circuit shapes within separate mask regions of a semiconductor fabrication mask for use in optical lithography. The tool produces an output database or output data stream in which the dimensions of the mask shapes are compensated on the basis of the image content in the vicinity of each shape when the mask is projected during optical lithography. In operation the tool matches a partially coherent lithographic image by superposing a sum of images from a set of coherent systems and a sum of images from a set of loxicoherent systems, although the image from a single loxicoherent system may be used instead of a sum of contributions from a plurality of loxicoherent systems. A primary input for both sets of systems is a frame of integrated circuit shapes constituting a portion of a mask region from the input queue. In preferred embodiments each loxicoherent system is a compound system comprising a paired coherent system and incoherent system that act in sequence, with the output of the constituent coherent system being input as a self-luminous quantity to the constituent incoherent system, and with the output of the incoherent system then serving as the output of the loxicoherent system.

The lens apertures in the coherent system set may be the Fourier transforms of optimal coherent systems (OCS) kernels obtained by carrying out an eigendecomposition process on a full transmission cross coefficient (tcc, or TCC in the frequency domain). The apertures of the constituent coherent and incoherent systems in each compound system of the loxicoherent system set may be obtained by isolating a residual TCC that remains after the chosen set of coherent kernels in the coherent system set are extracted from the full TCC; and then performing at least one decomposition process on the residual TCC using at least one loxicoherent system. In preferred embodiments each loxicoherent system is chosen to closely match the portion of the TCC that remains unmatched by all previously chosen systems, and in preferred embodiments the first loxicoherent system (also referred to as the primary loxicoherent system) matches portions of the TCC that are recalcitrant to matching by OCS systems. In general, a system or set of systems that makes an approximate match is considered to extract the portion of the TCC that it matches, with the remaining portion of the TCC forming a residual TCC. The matched TCC portion is itself a TCC that can be used in the Hopkins equation to determine the total intensity produced by the system or set of systems that perform the approximate match. Such a TCC can be referred to as an approximate TCC.

In another aspect thereof the exemplary embodiments of this invention provide a computer-controlled tool to process an input stream of integrated circuit patterns representing a semiconductor fabrication mask to be used in projection lithography. The tool applies a dimensional compensation to the shapes based on the intensity pattern produced in the projected lithographic image, with this intensity being determined by first carrying out an Optimal Coherent Systems (OCS) process on the data using coherent OCS kernels derived from at least one Hopkins bilinear TCC; and then performing an additional decomposition process on the data using at least one system of a type referred to herein as loxicoherent, in which a constituent coherent system is paired with a constituent incoherent system to form the loxicoherent system, and where at least one kernel decomposition is made along an axis that is slanted between two domains of the Hopkins bilinear model to determine the aperture of the incoherent system.

It should be noted that the shape distortion which arises in wafer images of projected masks will in general entail a positional shift in, e.g., the center of gravity of a printed feature (relative to the nominal image conjugate), as well as changes in e.g. the width or length of the printed feature. Dimensional compensation of the mask features should preferably include corrective positioning of the printed feature as well as corrective sizing, i.e., dimensional compensation involves the proper positioning of the edges of each printed feature, as well as the achievement of proper feature sizes. Thus, dimensional compensation may be understood as requiring the proper spacing between the printed features, as well as requiring the proper dimensions within each feature. Similarly, the mask dimensions which receive compensation include the spacings between features as well as the widths of features (i.e. all polarities of edge separation are included), and dimensional compensation may equivalently be understood as a set of compensating adjustments that are made in the positions of the edges of mask features.

In another aspect thereof the embodiments of this invention provide a tool to process data representing input integrated circuit patterns of a semiconductor fabrication mask to be used in projection lithography. The tool comprises an OCS system engine having an input to receive a starting mask organized into separated regions of mask content and an output to provide a full TCC. The tool includes a module/function that divides each region into overlapped frames of mask data. The tool further includes a loxicoherent system engine having an input connected to the output of the OCS system engine and an output that provides a final mask definition for use during fabrication of an integrated circuit. The loxicoherent system engine is configured to form a residual TCC by removing certain coherent system kernels from the full TCC; to match the residual TCC with a sum of multiplied lower-dimensioned kernels that are separated along axes that are rotated in a doubled domain between mask content axes in the doubled domain; to decompose at least one low-dimensioned kernel lying within the doubled-domain in the mean-frequency direction into a product of coherent system apertures serving to filter the mask content; to select as an intensity kernel at least one low-dimensioned kernel lying along the doubled domain axis in a difference-frequency direction; and to adjust mask fragments by iterating operations across one or more processors. The iterated operations include determining loxicoherent system contributions to an image intensity at target edge positions by applying incoherent intensity kernels to squared mask transmissions through the coherent system that have been filtered by the mask filters; by determining the image intensity at target edge positions by adding the loxicoherent contributions to the sum of intensities from the coherent systems; by moving mask fragments adjacent to target edge positions whose intensity is lower than the intensity at the edge of an anchoring feature in a direction towards a darker side of the adjacent target edge; by moving mask fragments adjacent to target edge positions whose intensity is higher than the intensity at the edge of the anchoring feature in a direction towards a brighter side of the adjacent target edge; by modifying edge positions within frame overlap regions to reconcile the position movements made in the frames that overlap; and by terminating the mask fragment adjustment when the intensities at all target edge positions match that of the anchoring feature to within a tolerance value.

In the embodiments of this invention a decomposition process is performed on a full transmission cross coefficient (TCC) using optimal coherent system (OCS) kernels. The process involves isolating a residual TCC that remains after a chosen number of coherent systems are extracted from the full TCC; and performing at least one decomposition process on the residual TCC using at least one incoherent system that operates with an intensity kernel.

It should be understood that in some embodiments of this invention the tool can be embodied in whole or in part as a method or as an apparatus, or as a combination of a method and an apparatus.

It should also be understood that in some embodiments of this invention the tool can be embodied, in whole or in part, as an article of manufacture that comprises a tangible, non-transitory computer readable medium having information stored therein or thereon. The information is configured to convert and transform a first object, embodied as a starting mask, into a second object, embodied as a final mask that can be used during fabrication of semiconductor circuits and structures. The information is configured to perform a decomposition process on a full transmission cross coefficient (TCC) using optimal coherent system (OCS) kernels; isolate a residual TCC that remains after a chosen number of coherent systems are extracted from the full TCC; and perform at least one decomposition process on the residual TCC using at least one incoherent system that operates with an intensity kernel.

It should also be understood that in some embodiments of this invention the tool can be embodied, in whole or in part, as a data assemblage that represents mask data for use in fabricating an integrated circuit, where the data assemblage can be stored on or in a computer-readable data storage medium. The data assemblage is created by a process that comprises performing an Optimal Coherent Systems (OCS) process on data using OCS kernels derived from at least one Hopkins bilinear TCC; and performing a decomposition process on the data using at least one loxicoherent kernel, in which at least one kernel decomposition is made along an axis that is slanted between two domains of the Hopkins bilinear TCC.

Before describing the embodiments of this invention in further detail, and by way of introduction, in recent decades OPC has become a critical step in integrated circuit (IC) manufacture. The use of OPC only became feasible because the so-called OCS method allows partially coherent images to be calculated over large areas in near-linear time. However, OCS is an approximation whose residual errors under practical cutoffs can amount to a few nanometers.

A key accuracy limitation of OCS arises from limiting the number of coherent systems in the matching set, which is a key step in making OCS computationally feasible. Since each coherent system uses a single predetermined aperture that is represented computationally by a single kernel (most commonly an eigenfunction of the TCC), it follows that limiting the number of coherent systems for the sake of efficiency is computationally equivalent to truncating OCS kernel count, for example, limiting the number of TCC eigenfunctions employed. The embodiments of this invention are directed in part towards addressing the error that arises from truncating the kernel count.

The embodiments of this invention use novel loxicoherent systems whose kernels are generated by decomposing a transmission cross coefficient (TCC) of a lithographic system in new ways, namely into systems which each include a plurality of distinct kernels, in contrast with prior art OCS systems that are each formed with a single type of kernel, namely the single kernel that describes the transmission of a coherent system aperture. In exemplary embodiments the new loxicoherent systems include a paired coherent system and incoherent system acting in sequence, each represented by its own distinct kernel. In exemplary embodiments the new loxicoherent kernels are separated along axes which are rotated into a (non-spatial) direction that is skewed (i.e. slanted) between the duo of conventional mask manifolds whose coordinates are paired to form the 4D Hopkins domain, as will be discussed.

It will be understood that "rotation" does not refer here to a conventional geometrical rotation between the x and y axes of the circuit shapes, but rather this rotation takes place in the more abstract higher-dimensioned Hopkins domain that is formed as a doubling of the xy plane of the mask content.

A loxicoherent kernel that has been separated along an axis lying in a direction that is skewed between these two mask content planes is highly efficient at extracting the TCC content that is recalcitrant to rendition using standard OCS kernels. (As was noted above, "Loxi" is Greek for slanted.) It should also be understood that because of the higher dimensionality involved, the "axis" on which the loxicoherent kernel is separated may actually be two-dimensional, i.e. containing x and y components that correspond to the x and y axes of the circuit shapes. The separation direction of these kernels will sometimes be referred to as "diagonal", descriptive in the same way as "rotated" or "slanted", but here again the term "diagonal" should not be interpreted in an overly literal way.

The prior art OCS method matches the partially coherent lithographic image using a sum of images produced by optical systems that are purely coherent. In contrast, the optical systems used by the invention to match partially coherent images include at least one compound system comprising a plurality of constituent systems, such as paired coherent and incoherent constituent systems that operate in sequence to produce, as a final output from the pair, a non-coherent contribution to the image match. The images which are summed during application of OCS are conventionally referred to as coherent system images, and similarly the novel summed images formed in accordance with the invention by each paired coherent and incoherent system will be referred to as loxicoherent system images, and further each such paired coherent and incoherent system will be referred to as a loxicoherent system. While coherent systems are linear in the input amplitude and incoherent systems are linear in the input intensity, the compound structure of loxicoherent systems makes them fully nonlinear; however, the linearity of their constituent systems allows the output from loxicoherent systems to be determined with relatively low compute cost. Computationally, the coherent images used in OCS are determined by computing Mercer series terms that are composed from coherent kernels, with these mathematical series terms themselves being referred to in the art as "coherent systems". In analogy with this convention, the mathematical structures formed in accordance with the invention to calculate images from loxicoherent kernels will similarly be themselves referred to as "loxicoherent systems". The specialized meaning of the term "system" in this context will be clear to those skilled in the art; in the context of image decomposition the term "system" may be taken to refer generally to a term in a decomposition series where the term itself represents an optical system computationally, with this decomposition term being formed from a kernel or a plurality of kernels. "System" may, of course, also refer to the optical system whose behavior is described computationally by the decomposition series term (with the kernel functions being related to the lens aperture transmission of the optical system by well-known physical laws). As another point of nomenclature, a finite set of matching systems that only achieve an approximate matching is nonetheless considered to provide a decomposition of the partially coherent image produced by a given mask, and, more generally, such a set of decomposition systems is still described as providing a decomposition of the partially coherent TCC, even though such a system set leaves a residual TCC unaccounted for that may have non-negligible magnitude.

In the prior art OCS decomposition each coherent system term is formed from two copies of the same frequency-domain kernel function, since the term represents the physical behavior of a coherent imaging system whose aperture has the amplitude transmission pattern specified by the kernel, and the squaring of the image amplitude to provide the intensity causes this same single kernel to be repeated along each of the orthogonal mask axes of the Hopkins domain. In contrast, each decomposition system term of the invention is formed from at least two distinct kernel functions.

The invention employs a set of coherent systems, as well as one or more loxicoherent system(s). DC-monolinear systems, discussed in detail below, are also compound, and also contain two distinct kernel functions. One can consider a DC-monolinear system to be a specific type of loxicoherent system since it meets these criteria. If one adopts that convention one could simply use the phrase "loxicoherent decomposition system term"—it being noted that the constituent kernels of the DC-monolinear system do not meet the narrower criteria of operating sequentially or of lying along rotated axes.

In some non-limiting embodiments these new systems use three kernels instead of two, and some of these kernels are functions that lie along rotated or non-orthogonal axes within the Hopkins domain. In some non-limiting embodiments the loxicoherent system uses two copies of a first distinct kernel to represent a coherent system that is paired sequentially with an incoherent system which uses a single copy of a second distinct kernel, so that the loxicoherent system as a whole employs two distinct kernels. One general aspect of this invention that distinguishes it from prior systems is that it uses systems that are formed from more than one kind of kernel.

Computationally, loxicoherent systems have a richer structure than the bilinear product form (Mercer form) of OCS kernels, for example combining multiple distinct kernels in a triple product system, but like OCS kernels they can be applied using convolutions that exploit the efficient scaling of Fast Fourier Transforms (FFTs). The embodiments of this invention address and mitigate the limitations of standard lithographic practice related to the stringent tradeoff between accuracy and computational cost that is faced whenever the OCS method is used in image calculations, particularly the image calculations that must be made in order to produce functional lithographic masks. The accuracy gain from employment of increased numbers of traditional OCS systems is found to face diminishing returns, due to content in the exact TCC that has slope-discontinuities which are a consequence of the sharp band limit cutoff of lithographic lenses, the slope-discontinuities making this content extremely recalcitrant to matching with standard OCS kernels. The loxicoherent systems of the invention can be tuned to efficiently extract this content, along with other portions of the TCC that a standard OCS expansion does not capture with a frugal number of terms. The novel decomposition systems of the invention can also be tuned to accurately extract TCC regions that are heavily sampled by critical or predominant mask content, such as regions where one of the two interfering frequencies in the doubled domain is DC, these regions being important because the DC order is usually very strong in lithographic masks. The adoption of loxicoherent systems allows a given accuracy target to be achieved more efficiently than is possible by increasing the number of conventional OCS systems, and the accuracy target can be realized with fewer total systems being used. In other words, the cost-accuracy tradeoff inherent to OCS image simulation is significantly mitigated by the use of this invention.

Reference is made to FIG. 1 to provide some background information, including prior art computational considerations, related to this invention.

Lithographic imaging employs partially coherent illumination, wherein source points that are deployed in a complex tailored directional pattern illuminate a mask, with each source point illuminating the mask with a coherent plane wave that provides a unique slew in phase across the different mask points due to the specific directional tilt of the wavefront emitted by the source point. As a result of the ensemble of different illuminating tilt phases from the totality of chosen source directions, the mask points interfere with one another to a varying degree depending on their relative position, causing the optically interfering mask content from each pair of mask points to make its own (generally) unique contribution to the image. This standard form of partially coherent imaging can be considered to be governed by the Hopkins equation (see FIG. 1A in FIG. 1). The Hopkins equation is bilinear, i.e., it involves a quadratic double convolution over the mask pattern m(x), using a kernel referred to here as the "tcc", which is a spatial domain version of the Transmission Cross Coefficient, also known as the Hopkins C function. The tcc may also be regarded as an operator. The Hopkins equation shows that the intensity at each point in the image is given by a sum (or integration) of contributions from all different pairs of points on the exposing mask, rather than being a simple sum of contributions from all mask points; hence the Hopkins equation involves a doubled domain, and is not a linear convolution. For simplicity the mask transmission m(x) (or reflectivity, in the case of a reflecting mask) is written in FIG. 1A (and in many other equations to follow) as a function of a single position coordinate x; however it is understood that the mask transmission is in general a function of both x and y, although the most critical features for IC performance are often 1D grating-like or line-like patterns. As a kernel that is integrated over pairs of points, the tcc has as its domain a doubly-dimensioned space that expands the dimensionality of the mask transmission m(x) twofold, e.g. to 4D for 2D mask patterns. This space will be referred to as the Hopkins domain or doubled domain, as will the frequency space of the Fourier transform of the tcc. The tcc is, in fact, most commonly expressed as a Fourier transformed quantity, which we will denote as the TCC; more specifically, the quantity $TCC(f_1,f_2)$ is obtained by Fourier transforming $tcc(x_1,x_2)$ in both of its arguments. In the convention used here for operator kernels like the tcc, the exponential Fourier factor for the 2nd argument is inverted in sign. In capitalizing the Fourier transform of the spatial-domain tcc (i.e., the TCC) we also follow a convention in which lower case denotes a spatial domain version of a quantity and upper case the frequency domain version, e.g., for the mask m(x) versus M(f). Each individual mask frequency can for simplicity be considered to propagate as a plane-wave whenever the mask is illuminated by a single source point. In 1D each pair of interfering frequencies produces a sinewave intensity modulation trace in the image (with a superposed overall phase skew in general). Similarly, in 2D the interfering pair produces extended sinewave fringes that may have an arbitrary orientation in the x,y plane. The Hopkins equation shows that even when the mask pattern contains a great many spatial frequencies, it is only the action of the optical system on pairs of frequencies that affects the image. However, even the two-fold expansion of the domain of interaction that is present with partially coherent imaging is computationally very expensive to evaluate in the physically accurate manner specified by the Hopkins equation.

Fortunately lithography practitioners have made use of the OCS method to approximate partially coherent imaging; OCS can reduce the computational burden by roughly $\sim 10^3$ under typical conditions. As is shown in the equation of FIG. 1B in FIG. 1 the OCS method expands $tcc(x_1,x_2)$ in a Mercer series that is strictly accurate as an infinite series, but that must be truncated after only a relatively small number of terms in order to hold OPC runtimes to an acceptable duration. Under typical current practice, the equation of FIG. 1B might be truncated after ~25 terms. Each term of FIG. 1B, denoted $t_{OCS}$, is responsible for the image contribution produced by one coherent system in the approximately matching set. Each coherent system essentially approximates the equation of FIG. 1A as a product of separate linear convolutions (actually a square), as shown in the equation of FIG. 1C. Each term in FIG. 1C has the form of a squared convolution of a kernel with the mask transmission.

The equation of FIG. 1A shows that the partially coherent image of a specified mask m(x) is entirely determined by the tcc function associated with the lithographic optical configuration being used. One consequence is that any set of decomposition systems which can accurately approximate the tcc will also be able to accurately match the images produced by the lithographic optical system. The converse need not be true in situations where the mask patterns m(x) are highly restricted in form, since the images from a limited set of patterns may not be strongly impacted by all portions of the tcc. However, in many cases of practical interest the mask patterns contain considerable diversity, particularly when the set of e.g. $10^{10}$ patterns comprising a full integrated circuit level is considered, and failure to accurately compensate the dimensions of even a single pattern during OPC can cause the entire chip to fail. Moreover, this diversity of potential inputs increases if a given decomposition system is applied to multiple different masks. Most embodiments of the invention are designed to accurately match the tcc of a specified partially coherent imaging system (or equivalently, the TCC), though, as will be discussed, some embodiments tune the matching to emphasize accuracy for objects that embody particular traits of lithographic masks, and some embodiments allow tuning to match lithographic mask content of particular strategic importance. Prior art coherent system decomposition also aims to approximate the tcc as a whole, in most cases.

The coherent system kernels used in the FIG. 1C convolutions are the so-called OCS kernels $\psi_j(x)$. Ordinarily these kernels are calculated as the eigenfunctions of the tcc kernel, or as the inverse Fourier transforms of the eigenfunctions of the TCC kernel. A common mathematical convention for eigendecomposition requires that the norm of the eigenfunctions be set to 1. If that convention is followed, the mathematical expression for a Mercer series representation of an operator will include the eigenvalues as well as the eigenfunctions of the operator. A convention that can be more convenient in lithography applications is to normalize the eigenfunctions of the tcc operator to have a norm equal to the square root of the associated eigenvalue, and this latter convention will be used in describing the computations made by the invention, unless stated otherwise. (Since the intensity is real-valued and positive when the illumination is partially coherent, the tcc operator is Hermitian, and its eigenvalues are positive real numbers.) When this normalization convention is followed, the tcc Mercer series takes on the simple form seen in FIG. 1B, in which the eigenvalues are absorbed, and so do not appear explicitly. By choosing the OCS kernels to be the eigenfunctions of the tcc kernel, and ordering them in the equation of FIG. 1B such that the eigenvalue for each term is larger than the eigenvalues of all later terms (including the truncated terms, i.e. the infinite set of terms that are omitted) the expansion has the desirable property that each successive product term in FIG. 1B will represent the best possible coherent approximation to the remaining portion of the tcc that preceding terms have not been able to capture. However, it is known in the art that alternative coherent kernels may be chosen instead of the tcc eigenfunctions in order to better match the kernels to particular mask content of strategic interest. These kernels are no longer optimal in the sense of best matching all portions of the tcc without regard to content specialization, and will likely not be entirely optimal even for specialized mask content if they are chosen in a partly heuristic way. Nonetheless, even though the "O" in OCS stands for Optimal, the term OCS will, for simplicity, sometimes be used herein to refer generally to the use of any set of exclusively coherent systems to approximate a partially coherent tcc, even when the coherent system kernels are not optimal. (The term "OCS" will not generally be applied when coherent systems are used jointly with other kinds of systems.) It should also be noted that in a standard implementation where OCS aims to reproduce the TCC (or tcc) as a whole, the physical coherent systems that OCS defines will approximately match all images produced by the physical lithographic system, even though these coherent systems need only be simulated (with adequate accuracy) in order to provide proper dimensional compensation in masks. This matching at the physical level is reflected in standard nomenclature, e.g. "Sum of Coherent Systems" or "Optimal Coherent Systems".

It will be seen that the novel decomposition methods employed by the invention likewise define physical systems whose superposed outputs match the physical lithographic system (though the matching systems employed by the invention include systems that are not coherent, and the matching accuracy obtained is superior to that from purely coherent systems).

In the frequency domain, the Hopkins equation operates on pairs of spatial frequencies, i.e. on pairs of plane waves that diffract from the mask under illumination by mutually uncorrelated plane waves emitted by the specified source. As is customary in computational lithography, the term source refers to the shape of the illumination directional distribution, and a source is quantitatively specified by a map of the intensity of the illumination that is incident on the mask from each direction, with the intensity from any single direction being governed by the intensity of a single source point. Each illuminating plane wave produces a coherent image contribution per the Abbe decomposition, but the total image is partially coherent (despite the mutual incoherence of the separate illuminating waves), since the source shape only fills a limited portion of the full hemisphere of possible illuminating directions, in most cases only a very limited portion. When a given mask pattern is illuminated by a wave at normal incidence, the amplitude of the diffracted plane wave which has frequency f is written as M(f), where M(f) denotes the Fourier transform of m(x). The argument f also determines the direction at which the diffracted order propagates away from the mask, and f may be specified in direction cosine units. When the illumination is shifted away from normal incidence to a direction s, the propagation direction for frequency f shifts to a direction f+s, but under Hopkins imaging the amplitude is considered to remain M(f). Though not shown explicitly, it should be understood that f usually denotes a 2D spatial frequency that has x and y components. Each pair of interfering plane waves contributes an intensity modulation at the difference frequency, and the integrated superposition of these intensity harmonics gives the total image intensity, as shown in the first line of FIG. 1D. The OCS/Mercer kernels of TCC($f_1,f_2$) are denoted $\Psi(f)$, and they are the Fourier transforms of the $\psi(x)$ Mercer kernels of tcc($x_1,x_2$). Per FIG. 1B, the $\psi(x)$ are also the spatial-domain OCS kernels. When the frequency-domain TCC is expanded as a Mercer series, the image intensity becomes a sum of squared Fourier transforms of a series of differently filtered copies of the mask spectrum M(f), with each such filtering being imposed by the aperture of a coherent system, and with the $\Psi(f)$ kernels serving as transmission functions of these coherent system apertures, i.e. as filter functions that modulate the M(f) spectrum, as shown in the 2nd line of FIG. 1D. The truncated Mercer expansion of the TCC itself is shown in FIG. 1E. When the $\Psi(f)$ apertures are chosen to be the eigenfunctions of the TCC, the resulting OCS system will generally be a far more efficient decomposition set than the Abbe set of shifted apertures if practical levels of matching accuracy are sought, e.g. accuracies of order 0.1% to 1%.

Standard OCS kernels can be shown to inherently be smooth functions, based on the following argument: First, standard OCS kernels are chosen to be optimal in a least squares sense (the "O" of OCS in fact standing for Optimal), and it is known that an optimal kernel of this kind must be an eigenfunction of the tcc. It then follows from the mathematics of eigendecomposition that the OCS kernels must (prior to their final normalization) be the particular functions of unit integrated transmission that produce maximal intensity at the geometrical image point when imaged according to the full tcc (with an added constraint on this maximization that each new kernel must be orthogonal to all preceding kernels). One consequence of this maximization property is that any discontinuity in a putative $\psi$ distribution would cause unnecessary light loss from diffraction beyond the lens aperture, implying that the $\psi$ must instead be smooth functions. The same holds true for the frequency domain eigenfunctions $\Psi(f)$, which are simply the diffraction spectra of the corresponding $\psi$. This follows because lithographic sources are engineered to exclude illuminating directions with greater inclination than the numerical aperture of the projection lens (and in any case the source directional range is sharply bounded); thus any discontinuity in the $\Psi$ spectrum entails the unnecessary diffraction of light away from the geometrical image point during propagation from the exit pupil to the wafer. This continuity in the coherent system aperture spectrum $\Psi(f)$ stands in stark contrast to the functional form of the lithographic lens aperture; the circular physical aperture of the latter lens constitutes a frequency-domain cutoff filter whose edge sharpness is essentially infinite over all scales of relevance to computational lithography. It is true that, while smooth, an OCS kernel $\Psi_j(f)$ will typically exhibit stronger and stronger curvature as the order index j is increased, in many cases approaching the sharpness resolution of practical computational grids, but nonetheless a very large number of OCS terms will generally be needed in order to closely account for the TCC-impact of the sharp lens aperture, due both to the smoothness of OCS kernels, and to the restrictive mathematical structure of Mercer terms, as will be discussed. As a result, it will be seen that OCS's use of a Mercer series to approximate the TCC usually entails a non-negligible accuracy tradeoff.

The linear convolutions in FIG. 1C are preferably carried out using fast Fourier transforms (FFTs), and so execute rapidly. OPC is made practical by the rapid speed of the FFTs in FIG. 1C of FIG. 1, but the critical OPC accuracy/speed tradeoff is nonetheless gated by the number of FFTs employed. FFTs use a discrete sampling or gridding, and while the exact tcc is strictly bandlimited (meaning that the frequency-domain TCC only takes on non-zero values within a finite region of the doubly-dimensioned Hopkins domain), the approximate FIG. 1B truncated expression will include weak content outside the band limit. To avoid aliasing it is therefore desirable to use a spatial-domain gridding that is finer than the theoretical Nyquist spacing defined by the lens resolution. In addition, phenomenological resist models are often employed that include e.g. heuristic thresholding operations which introduce high-frequency content. With modern lithographic systems operating at for example NA=1.35 and $\lambda$=193 nm, one might typically employ a sub-Nyquist spacing of about 10 nm.

Standard OCS kernels are derived by eigendecomposition of the full functional map of the TCC. FIGS. 2A and B explain how the TCC value for each pair of spatial frequencies in this mapping is primarily driven by the basic optical consideration of whether or not the partially coherent lithographic optical system allows the plane wave orders associated with the two frequencies to interfere together in the image, and so create intensity modulation at the difference frequency $\Delta f = f_1 - f_2$. In lithography applications the calculation of the degree of modulation produced by a pair of object spatial frequencies (denoted $TCC(f_1, f_2)$) is primarily a matter of determining how many source points allow both orders to be collected. Many other effects must also be taken into account during a Hopkins TCC calculation (e.g., vector interference, aberrations, etc.), and the invention does so, but the basic summation of source point contributions during a Hopkins partial coherence calculation is the main driver of the TCC value, and is of central importance to the functioning of the invention. As FIG. 2A illustrates, the pair of orders will generally be able to interfere in the image if both orders are captured by the lens. The ability of the lens to capture a given pair of orders will vary with illumination direction, and in the FIG. 2A example the illuminating plane wave is from a source point on axis, and is seen in that case to allow both orders to be captured, whereas the obliquely incident plane wave considered in FIG. 2B does not, since the obliquity of the incident beam in the FIG. 2B case is sufficient to shift the $f_2$ diffracted order outside the pupil. Note that in FIGS. 2A and 2B the source is imaged to infinity and the illumination from a single source point is thus effectively a plane wave. Also, it should be understood that the detailed multi-element design of lithographic projection lenses will cause each collected wave to be focused to a point in the plane of the lens aperture, though for simplicity this has not been shown in FIGS. 2A and 2B. Thus, even though each point in the source gives rise to a collimated bundle of illuminating rays at the mask which are then diffracted as collimated diffraction orders after propagation through the mask, each such order will either be entirely passed through to the image (if it focusses inside the sharp perimeter of the lens aperture), or it will fail in entirety to reach the image (if it focusses outside the sharp perimeter of the lens aperture). Also, it should be noted that even though circular apertures are the most common pupil shape in lithographic lenses, other options such as annular apertures are also sometimes employed. These apertures likewise have sharp perimeters, and the consequences discussed herein of using circular apertures are also generally applicable with these alternative apertures.

Figure 2C:
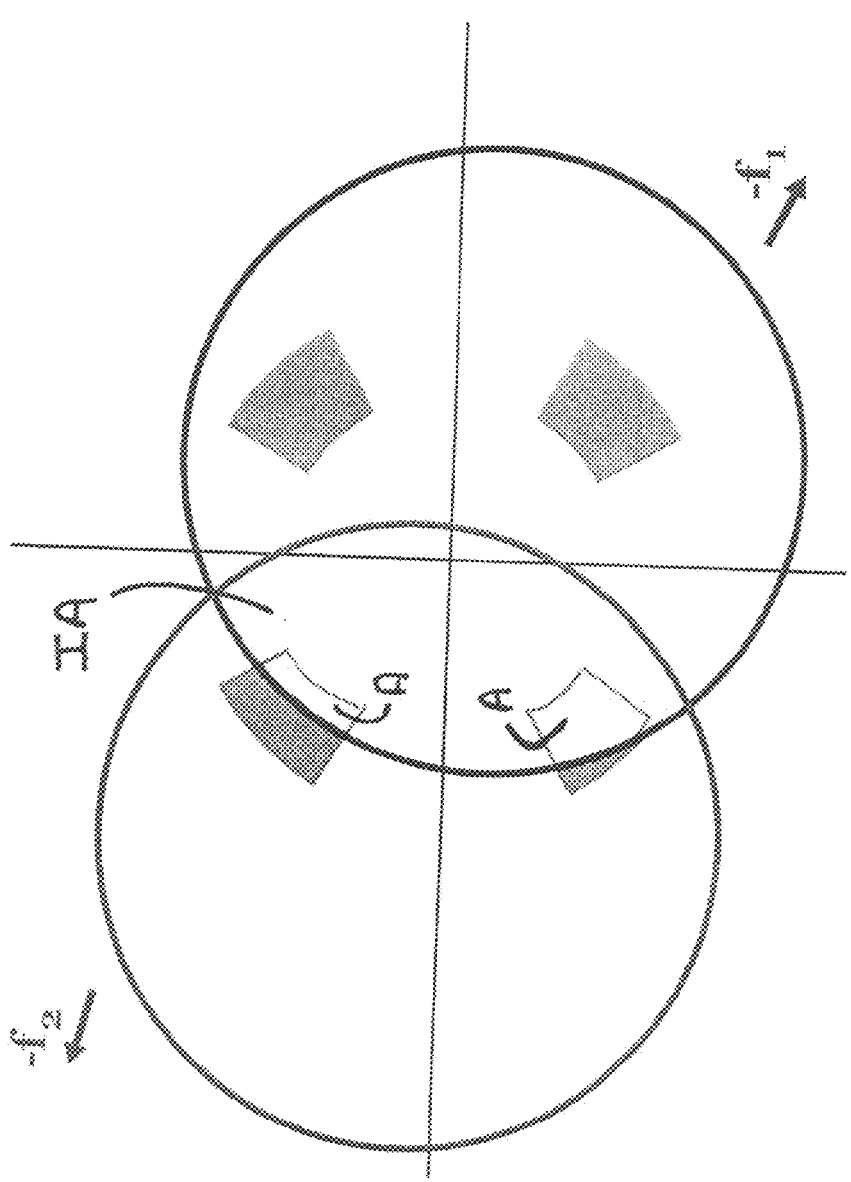

FIG. 2C illustrates how the TCC function for a specified pair of spatial frequencies $f_1$ and $f_2$ can be understood physically to represent the overall interference modulation produced by the two frequencies from all source points. The construction in FIG. 2C that is used to determine the TCC value for frequencies $f_1$ and $f_2$ is known as the Hopkins diagram or Hopkins construction. Rather than directly considering whether the $f_1$ and $f_2$ diffraction orders both intersect the lens aperture when their diffracted direction is shifted by illumination from each of the various source directions (as was done in the examples of FIGS. 2A and B), the Hopkins construction superposes on the frequency-domain source pattern two copies of the circular pupil aperture that are shifted by amounts equal and opposite to $f_1$ and $f_2$ (i.e., equal and opposite to $f_1$ for one copy of the circular aperture, and equal and opposite to $f_2$ for the other copy). When this construction is employed, $f_1$ and $f_2$ will both be collected when illuminated by source points in the regions labeled A, i.e. source points that lie within the intersection of the two shifted pupil circles.

Thus, briefly stated, the main function of the Hopkins diagram is essentially to count the number of source points that succeed in producing modulation. The source partial coherence is then accounted for by simply calculating the total source content within the intersection area (IA) shown in FIG. 2C, and normalizing that area by the total source area.

Of course, it will be clear to those skilled in the art that calculation of the TCC pursuant to the invention should preferably also take into account such effects as defocus, aberration, wafer stack reflections, and vector imaging. As is now well-known, these effects may be handled by methods that modify the integration over the intersection area in the Hopkins diagram. These methods are described, for example, in A. E. Rosenbluth et al., "Fast calculation of images for high numerical aperture lithography," SPIE v. 5377 Optical Microlithography XVII (2004): p. 615. However, while these detailed imaging phenomena are preferably included when integrating over the intersection area in the Hopkins construction, it is the geometry of source point inclusion in the Hopkins diagram that is of primary importance for the core functioning of the invention, and it is partial source inclusion within the Hopkins diagram that fundamentally defines the character of partially coherent illumination. Moreover, in standard photolithography practice the Hopkins diagram or its mathematical equivalent is used to determine the TCC function, and the TCC is then approximated for OPC as a sum of multiplied coherent OCS kernels, allowing the images produced by the partially coherent lithographic imaging system to be approximately matched by a sum of coherent system images.

Figure 3:
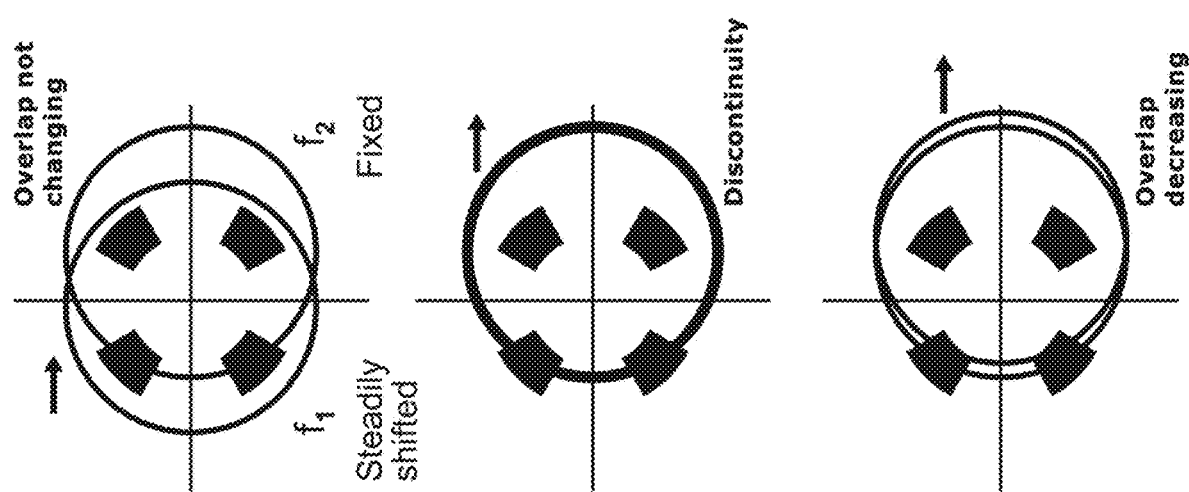
FIG. 3 shows in accordance with the invention that the dependence of the overall modulation from all source points on the interfering mask frequencies will exhibit a slope discontinuity as the difference $\Delta f$ between the frequencies passes through zero.

Referring to FIG. 3, the Hopkins TCC construction is now used to illustrate a limitation of the prior art methodology that has been discovered by the inventor, illustrating more particularly how the sharp edge of the lens pupil can cause slope-discontinuities in the TCC function at certain specific intensity harmonics. These slope-discontinuities are inherently difficult to approximate with a small number of OCS kernels, and this will be seen to cause significant error when using a truncated Mercer series of coherent systems to approximate the TCC. In particular, when a truncated Mercer series approximation to the exact TCC is subtracted from the exact TCC, the residual portion of the TCC that the Mercer series fails to capture will generally be very large at near-DC intensity harmonics, as will be discussed. The portion of the exact TCC which an approximate TCC fails to capture will be referred to as a TCC residual, denoted $TCC^{(r)}$. The presence of strong content in the TCC residual at near-DC intensity harmonics can be understood through study of FIG. 3, which shows the Hopkins TCC construction being applied to a sequence of mask spatial frequency pairs. More specifically, FIG. 3 depicts the changing TCC value implied by the Hopkins construction as one of a pair of interfering frequencies, namely $f_1$, is steadily decreased, while the other ($f_2$) is held fixed. Since the pupils in a Hopkins diagram are positioned with a shift that is equal and opposite to the $f_1$ and $f_2$ frequencies whose TCC is being calculated, FIG. 3 depicts the steady decrease in $f_1$ as a rightward shift of the $f_1$ pupil aperture, with the Hopkins construction for three successively smaller values of $f_1$ being shown as one progresses from top to bottom in the figure. Initially $f_1 > f_2$ (top diagram), which means that the difference frequency $\Delta f \equiv f_1 - f_2$ is positive. In this $\Delta f > 0$ regime, the upper Hopkins construction in FIG. 3 shows that the source fraction contained within the intersection of the $f_1$ and $f_2$ pupils is not changed by small rightward displacements of the $f_1$ pupil, since the $f_1$ pupil does not intersect the source under the example conditions depicted in the upper diagram. This in turn means that the TCC holds constant in this regime, if for simplicity we consider the case of aberration-free scalar imaging. As $f_1$ continues to decrease from its initial positive value, the DC condition of zero difference frequency is reached, and the pupils in the diagram then cross as the difference frequency is driven through zero, as can be seen in the central Hopkins diagram of FIG. 3. At that point the pupil for $f_1$ switches from being leftmost to being rightmost, and as a result the source fraction contained within the pupil intersection begins suddenly to decrease as $f_1$ is further decreased. This contained source fraction is essentially the TCC, and the sharpness of the pupil aperture causes the onset of this substantial rate-of-change in the TCC to be completely abrupt, i.e. to be arbitrarily sharp over scales of relevance in computational lithography, giving rise to a slope-discontinuity in the TCC at $\Delta f = 0$.

It can be noted with regard to FIG. 3 that the source portion that is within the intersection region could be outlined without shading, as in FIG. 2C, to emphasize that it is only this portion of the source which contributes to the TCC.

The slope-discontinuity that is illustrated in FIG. 3 is a specific example of a behavior that occurs quite generally in the TCC, and that has a significant impact on the accuracy of prior art OCS, as will be discussed. It should be noted that while the difference frequency $\Delta f \equiv f_1 - f_2$ is steadily changed as $f_1$ is decreased in the FIG. 3 example, the mean frequency $\bar{f} \equiv (f_1 + f_2)/2$ is also steadily changing at the same time, since $f_2$ is held fixed. However, the slope-discontinuity is generally a function only of the $\Delta f$ change, not the change in $\bar{f}$. A direction or path of change in the frequency pairs which holds $\bar{f}$ constant while changing $\Delta f$ can be understood as a change along a rotated or "slanted" coordinate, as will now be discussed. The TCC is customarily considered in the lithography field to be a function of the two mask frequencies $f_1$ and $f_2$, which are the coordinate axes of the doubly-dimensioned Hopkins domain. However, the TCC can also be regarded as being a function of $\bar{f}$ and $\Delta f$, and these alternative coordinates essentially constitute rotated coordinate axes in the Hopkins domain, i.e. axes which are not orthogonal to the $f_1$ and $f_2$ axes of the mask content. (It should be noted that a factor of ½ has been included in the definition of $\bar{f}$ in order that it represent a mean frequency, and that this ½ factor causes the distance metric to be different along the $\bar{f}$ and $\Delta f$ axes. If the distance metrics are equalized, the $\bar{f}$ and $\Delta f$ axes are seen to be rotated by 45° relative to the $f_1$ and $f_2$ axes.) When the effect of steadily changing $\bar{f}$ while holding $\Delta f$ at zero is depicted in a Hopkins diagram, two exactly overlapped pupils are translated in unison across the source. Although the edges of lithographic source poles are often illustrated as sharp, they are in practice actually slightly blurred in the pupil plane. Moreover, while the source poles in the FIG. 3 example have perimeters that partially parallel the edges of the lens pupil perimeter (though with a slightly different radius of curvature), the blurred boundaries between the on and off regions of most sources will generally have a substantially different orientation in the Hopkins diagram from the edges of the lens pupils, regardless of the $f_1$ and $f_2$ values involved. For this reason the TCC generally does not change in a sharply abrupt way when the frequency-pair is shifted along the axis of the rotated pupil coordinate $\bar{f}$, i.e. the TCC exhibits relatively smooth changes when $\bar{f}$ is varied with $\Delta f$ held at zero, corresponding to a translated pair of coincident pupil circles, as just described. Conversely, the TCC will generally include loci of sharp slope change when $\Delta f$ is varied, as will be discussed.

FIG. 3 can be seen to convey that the TCC-contributing source portion (namely the source portion which is within the intersection region of the pupils) is neither increasing nor decreasing as long as the moving $f_1$ pupil is to the left (upper diagram), but that this contributing source portion begins abruptly to steadily decrease in area once the moving $f_1$ pupil becomes the rightmost (middle and bottom diagrams).

Though FIG. 3 uses a simple $f_1$ sweep to illustrate a generic slope-discontinuity that arises in the TCC, it is the $\Delta f$ component of the sweep that gives rise to the slope-discontinuity, and this will be shown to in turn impact the accuracy of the prior art OCS method. In general, TCC slope-discontinuities arise inherently from certain variations along coordinate $\Delta f$, due to the abrupt change in the sign of the differential contribution to the TCC that occurs at all illuminated perimeter portions of the (briefly aligned) sharp lens pupils when the two pupils cross in the Hopkins diagram.

Referring to FIG. 4, this can be understood as a consequence of the unique ability of the $\Delta f=0$ frequency pair to receive a contribution to its TCC value from those source points which diffract the particular mask spectrum component having spatial frequency $\bar{f}=f_1=f_2$ exactly to the lens aperture. FIG. 4 includes inserts showing the lens pupil (note that they do not show the Hopkins construction); more specifically, the FIG. 4 inserts show in highly schematic form the location in the pupil with which a particular example source point (not shown) diffracts different orders $f_1$, $f_2$ into the lens pupil, in cases where $\bar{f}$ is the same in each insert, but where the $\Delta f$ coordinate is different. The source point chosen is one which diffracts the spatial frequency $\bar{f}$ exactly to the lens aperture when $f_1=f_2$, as depicted in the center insert. Since $f_1$ and $f_2$ are both (barely) collected for this $\Delta f=0$ frequency pair, the source point in question contributes to the TCC at $\Delta f=0$. On the other hand, the left and right inserts illustrate that one frequency or the other of the frequency-pair will fail to be collected when $\Delta f$ is changed to any other value, i.e. to any non-zero value, meaning that the particular source point does not contribute to the TCC if $\Delta f \neq 0$, though it does contribute at the isolated $\Delta f=0$ location. Moreover, any other source point which already contributes at some finite $\Delta f \neq 0$ (for the same fixed f) will also contribute when $\Delta f=0$, and the TCC contribution from such a source point abruptly switches on as soon as $f_1$ and $f_2$ are both collected. This onset of non-zero TCC contribution is independent of the sign of $\Delta f$, since the collection status of the pair remains unchanged if $f_1$ and $f_2$ are swapped; thus, a source point which begins contributing at some finite $\Delta f \neq 0$ will continue to contribute over a finite range of difference frequencies, including $\Delta f=0$. As the magnitude of $\Delta f$ is increased in either direction away from $\Delta f=0$, the Hopkins diagram pupils will steadily sweep away an increasing number of source points that no longer achieve collection of both $f_1$ and $f_2$, causing a (locally) linear decrease in the TCC in either direction away from $\Delta f=0$, with the sign of the change abruptly reversing as $f_1$ and $f_2$ interchange at $\Delta f=0$. A plot of the TCC as a function of small changes in $\Delta f$ about $\Delta f=0$ will therefore be very sharply peaked at the DC harmonic, as shown schematically in FIG. 4. This means that the derivative of the TCC with respect to $\Delta f$ will exhibit an arbitrarily steep jump at $\Delta f=0$ on any scale of interest in computational lithography, i.e. the first derivative will effectively be discontinuous, which means that the second derivative of the TCC with respect to $\Delta f$ will effectively become infinite at all values of $\bar{f}$ which are diffracted to the edge of the lens pupil by some portion of the source. The set of such $\bar{f}$ values constitute a locus of frequency pairs lying along $\Delta f=0$ where the exact TCC is slope-discontinuous (in the frequency domain). Such a locus will be referred to as a "crease". When the TCC is approximated using a finite number of OCS coherent kernels, i.e. with a truncated Mercer series, it is difficult for the finite set of Mercer terms to adequately approximate the TCC creases, as will be discussed.

Qualitatively, FIG. 4 explains that the crease in the TCC arises from a discontinuity that occurs in the sign of the contribution made by those source points which just diffract the fixed frequency $\bar{f}$ exactly to the edge of the lens pupil, with this discontinuity occurring when $\Delta f$ reaches 0 during a sweep from e.g. negative to positive values, i.e. when the two pupils in the Hopkins diagram cross after they are moved towards one another at equal and opposite speeds. Since $\Delta f \equiv f_1-f_2$, the $\Delta f$ axis along which the discontinuity occurs is slanted across the two mask domains ($f_1$ and $f_2$) that form the doubled domain of the Hopkins equation.

The discontinuity can be interpreted as an abrupt change in the sign of the differential contribution of source points at the edge of the two overlapped pupils in a Hopkins diagram, and as a result it can be calculated in the Hopkins diagram as an integral around the rim of the overlapped pupil circles. If aberrations and vector effects are neglected for purposes of discussion, the discontinuity can more specifically be expressed mathematically by the equation of FIG. 5A in FIG. 5. In this equation $S(f_x;f_y)$ denotes the intensity of the source as a function of pupil position. $\theta_f$ denotes the polar angle of source points along the edge of the coincident pupils (centered at $\bar{f}$) relative to an axis along the $\Delta f$ azimuth. The delta-function in FIG. 5A arises from the slope discontinuity which occurs at $\Delta f=0$ (and does not consider the merely finite curvature away from the slope discontinuity), and the magnitude of the second derivative of the TCC along the difference direction $\Delta f$ is therefore infinite at $\Delta f=0$, as indicated by FIG. 5B. In contrast, the second derivative in the orthogonal $\bar{f}$ direction will be finite in magnitude as long as the source intensity S is continuous, i.e. as long as the source directional pattern exhibits its customary blur. An explicit expression for the 2nd derivative in the $\bar{f}$ direction is shown in FIG. 5A. Like FIG. 5A, FIG. 5C neglects aberrations and vector imaging effects to aid clarity.

It should be noted that although the equations of FIGS. 5A and 5B are written in terms of a displacement along the $f_x$ axis, the main term in the equation of FIG. 5A integrals is independent of the orientation of the coordinate axis (considering in this case only orientations within the 2D x,y space of the mask patterns). More specifically, the second line of FIG. 5A shows that the $\Delta f$ azimuth choice only impacts the magnitude of the discontinuity through the |cos $\theta_f$| factor. In general, the slope-discontinuity that constitutes the crease is present across all azimuths that have zero difference-frequency within the 2D space of the mask spatial frequencies. Though the equations herein often simply denote spatial frequencies as e.g. f for the sake of brevity, the spatial frequencies present in a 2D pattern actually have x and y coordinates in general, and can also be understood to represent both the pitch and orientation of a phase oscillation, with FIG. 5A indicating that the 2nd derivative with respect to a difference frequency will exhibit a singularity regardless of the orientation of this difference frequency within the x,y plane. Since the 4D TCC is very difficult to display and somewhat cumbersome to describe in equations, the present invention description will typically employ equations and illustrations that in appearance treat spatial frequencies as scalar variables along a single coordinate axis, but it should be borne in mind that these spatial frequencies are actually two-dimensional, and that the TCC is a four-dimensional quantity. It should also be noted that while the discontinuity in TCC curvature is, to order of magnitude, broadly independent of orientation within the sub-manifold of the 2D x,y plane of the difference frequencies (which are the 2D frequencies of the intensity harmonics in the image), the extreme difference in magnitude between the infinite equation of FIG. 5A and the finite equation of FIG. 5B shows that the TCC curvature has a very strong anisotropy within the full 4D Hopkins space, and in particular between the $\bar{f}$ and $\Delta f$ directions that, within this larger space, are rotated relative to the x,y plane.

Figure 6:
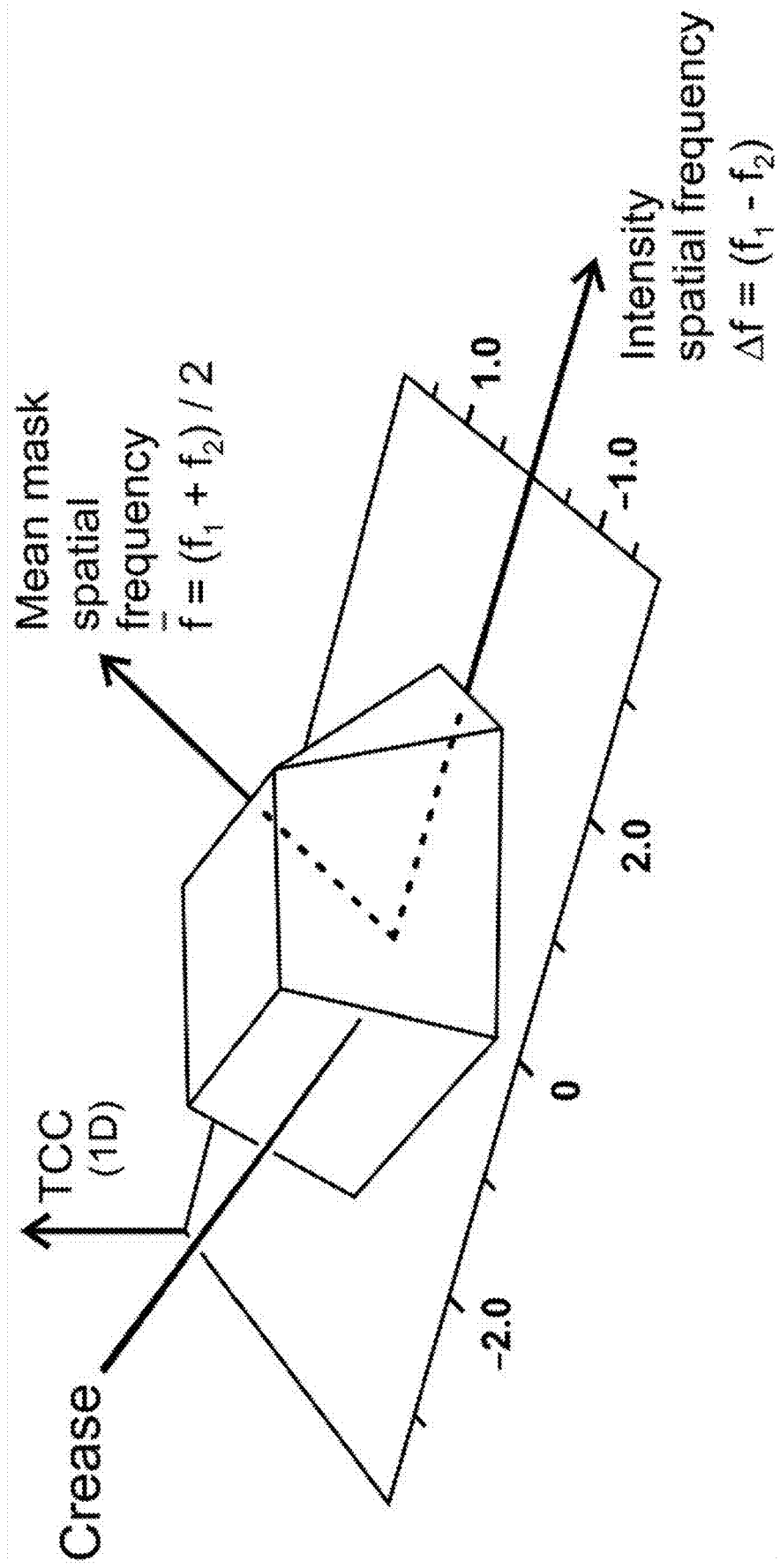
FIG. 6 shows an example of the TCC property of slope-discontinuity in the Δf direction, with continuity obtaining in the orthogonal f̄ direction, in the case of the TCC that governs imaging with a disk-shaped source.

FIG. 6 shows an example of the creases in the exact TCC function that the sharp pupil edge produces. The phenomenon is difficult to visualize except with one dimensional (1D) spatial frequencies such as those used in FIG. 6.

Depicted is the TCC slice that is relevant to 1D patterns. Note that instead of plotting the TCC as a function of $f_1$ and $f_2$, FIG. 6 uses rotated coordinates $\bar{f} \equiv (f_1+f_2)/2$ and $\Delta f \equiv (f_1-f_2)$. (Note further that the rotation referred to is carried out in the abstract doubled domain of the Hopkins integral, not in the physical space of the mask patterns.) The spatial frequency units on the FIG. 6 axes are defined using the "sigma" convention, which is commonly used in the photolithography field, where the spatial frequency value assigned to a mask modulation is the fractional position within the lens aperture stop where the diffracted modulation is focused when the mask is illuminated at normal incidence. The dominant "crease" singularities occur when the order interferes with itself (near-DC intensity frequencies) for source points that diffract the interfering orders near the edge of the pupil, so that the dominant crease (labeled in FIG. 6) is located along portions of the $\bar{f}$ axis, where $\Delta f=0$.

Note that FIG. 6 is a simple example that plots a scalar TCC for a $\sigma=0.5$ disk source at numerical aperture (NA) =0.8. This example is idealized in that the disk source is treated as having a sharp perimeter. However, it will be shown below that the $\Delta f=0$ crease is present even with realistic sources whose poles are blurred, and with sources of complex character, such as so-called free-form or SMO sources. It will further be shown that the $\Delta f=0$ crease is particularly hard for a finite number of conventional OCS/Mercer terms to reproduce. The FIG. 6 TCC may be seen to have slope discontinuities at other frequencies besides $\Delta f=0$, and, as will be discussed, there are embodiments of the invention that can be used to mitigate the impact of these additional discontinuities.

In computational terms, OCS kernels are used to approximate the TCC using Mercer terms which take the form $T_{OCS}=\Psi(f_1)\Psi^*(f_2)$, as shown in FIG. 1E, i.e. each frequency-domain Mercer term is a product that is separated in $f_1$ and $f_2$. The most common OCS practice is to choose the largest yet-unused eigenfunction of the TCC as the $\Psi$ function for each new $T_{OCS}$ term in the series, in order that this new term provide the best possible overall RMS fit to the as-yet-unfit portion of the TCC. (Here "largest" refers to the magnitude of the associated eigenvalue.) The creases in the TCC represent an effect whose behavior is dramatically different along the $\Delta f$ and $\bar{f}$ directions, in that the second derivative along the $\Delta f$ axis is effectively infinite, while that along $\bar{f}$ has a merely typical magnitude. The inherently smooth kernels in each separated OCS term are poorly suited to approximate this sharp crease, both because of their smoothness, and also because the Mercer terms have a relatively restrictive structure, as will be explained. Because of this limitation in the matching capability of coherent systems, residual error in the OCS approximation will tend to "spike" near DC difference frequencies.

Referring to FIG. 7, this difficulty in approximating the $\Delta f=0$ crease using coherent systems can be expressed mathematically using the equations of FIGS. 7A and 7B. Derived using a simple application of the chain rule, these equations show that when a Mercer term (i.e. $T_{OCS}$) and its derivatives are evaluated at a pair of frequencies along the crease of the TCC, the second derivative of the Mercer term along $\Delta f$ has a very similar form to the second derivative along $\bar{f}$; these two derivative expressions are seen to be composed of the same terms, with the two expressions only differing in the signs given the terms (and by a numerical factor which simply reflects the use of a different distance metric in the definitions of $\bar{f}$ and $\Delta f$). This similarity between the equations of FIGS. 7A and 7B reflects the somewhat constricted structure of a $T_{OCS}$ term of the equation of FIG. 1B, which attempts to map the 4D $TCC^{(r)}$ using a bilinear folding of a single 2D OCS kernel $\Psi$ (or $\psi$ in the spatial domain). In physical terms, an OCS coherent system attempts to match the behavior of a partially coherent system whose source is typically of complex shape by employing the best possible aperture pattern for the coherent system lens pupil (i.e. an optimal $\Psi$), but in general the former system will interfere pairs of nearly-equal frequencies in ways that no coherent system can match. A second limitation involves the (identical) factors in FIGS. 7A and 7B themselves, which involve the OCS kernels and their first and second derivatives. The OCS kernels are smooth functions, as previously explained, so their derivatives tend not to have extremely large magnitudes, particularly with Mercer expansions that are truncated for the sake of compute time to include only the lower order OCS kernels. It is therefore inherently difficult to develop large curvature differences in the OCS-approximated TCC, given the form of the FIG. 7A and FIG. 7B second derivatives, unless a very large number of Mercer terms are resorted to. On the other hand, the TCC exhibits second derivatives that, per FIGS. 5A-5C, are essentially infinite along $\Delta f$ while being only moderate in magnitude along $\bar{f}$; thus the OCS/Mercer terms are inherently incompatible with such a behavior. After, e.g., 10 or 20 Mercer terms have been employed, the OCS expansion will typically reproduce most portions of the TCC reasonably well, but significant error will remain at the near-DC harmonics in proximity to the crease. It should be noted that even though OCS kernels are inherently smooth, higher-order OCS kernels will tend to have increasingly larger curvatures, and as more kernels are added the absolute error in resolving the crease will slowly decrease, though the relative error at the crease will generally increase in comparison with the more rapidly decreasing errors with which other parts of the TCC are rendered. Thus, as more kernels are added, the remaining error tends to become concentrated in a narrowing vicinity around the crease region. This is somewhat analogous to the so-called "Gibbs phenomenon", where the error in approximating square-type waveforms using a finite number of smooth sine waves takes the form of a generic "ripple" that becomes a (largely) localized phenomenon arising within the vicinity of each squared-off edge discontinuity.

Figure 8:
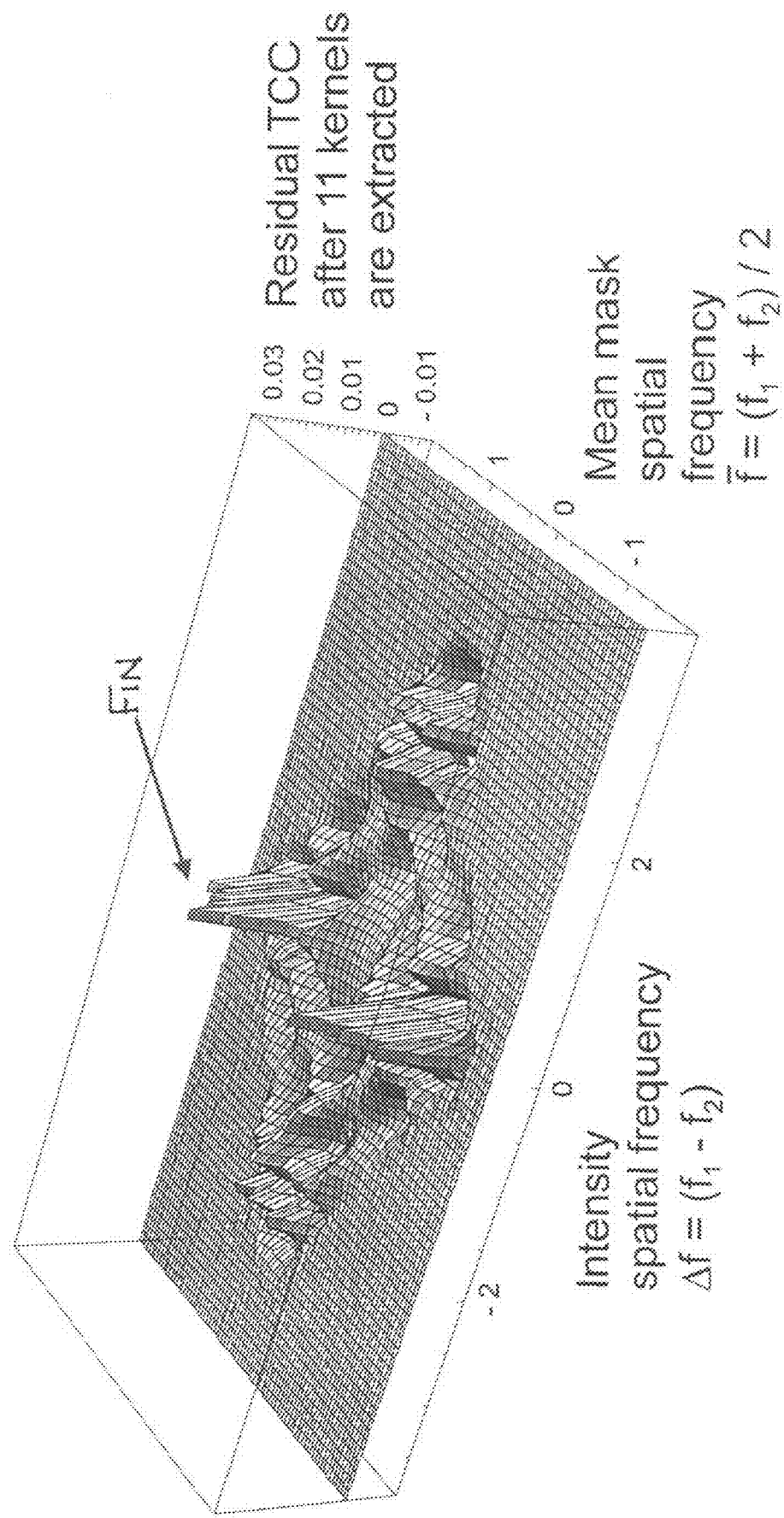
FIG. 8 shows an example of the TCC residual used as an element of the invention, in this case obtained by subtracting a Mercer series from the full disk-source TCC, showing that the residual after using 11 OCS kernels is strongly concentrated in the area of the slope-discontinuity.

FIG. 8 shows the residual after Mercer terms formed from the first 11 OCS kernels are subtracted from the TCC of the FIG. 6 example. In other words, the FIG. 8 surface plot shows the portion of the exact TCC that the prior art image calculation method fails to account for if 11 OCS kernels are used. Such an error kernel will be referred to as the residual TCC, and may be denoted $TCC^{(r)}$ for short. As in the FIG. 8 example, the term $TCC^{(r)}$ may refer to the portion of the exact TCC that is left uncaptured by a standard truncated Mercer series, i.e. by a prior art OCS expansion, but we will also use the symbol $TCC^{(r)}$ to refer more generally to the error left behind by any approximation to the exact TCC, including in some cases the TCC error that a specified interim, incomplete, or partial set of series terms leaves behind. In the case of FIG. 8, the plotted $TCC^{(r)}$ is the result of subtracting N=11 $T_{OCS}$ terms from the exact TCC discussed in connection with FIG. 6 (disk source), with these $T_{OCS}$ terms being formed (per FIG. 1E) from the 11 eigenfunctions of the exact TCC that have largest eigenvalue, as is standard practice.

As can be clearly seen in FIG. 8, the dominant feature in the uncaptured or residual TCC is the low-frequency (dose-like) "fin" near $\Delta f=0$. This represents a comparatively large error in representing the TCC in the vicinity of the crease, as is expected from FIGS. 7A and 7B. This is analogous to the Gibbs phenomena in Fourier analysis. As with Gibbs, one can expect asymptotically generic behavior in the residue once the kernel count becomes sufficiently large. The image impact of this fin partly resembles a dose error in its effect, since $\Delta f=0$ represents the DC harmonic. As discussed, this error can be understood as arising at frequencies where the pupil circles in the Hopkins diagram approach a crossing condition. The fin is quite narrow but does have finite width, due to the finite curvature of the retained smooth OCS kernels. This small but finite frequency span of the fin means that the intensity impact will vary depending on the pattern content within each local region of the mask, with the dominant scale length of the variation being several times wider than the projection lens resolution, but usually somewhat smaller than the simulation ambit, for example smaller by a factor of order 2, and thus several times smaller than the width of a typical simulation frame. Since the variation tends to be gradual over scales comparable to the lens resolution, i.e. the intensity error tends (roughly speaking) to vary only over scales that are somewhat larger than the typical individual features in today's IC patterns, it follows that the impact is locally somewhat similar in qualitative terms to a dose change; however this approximate dose variation can vary substantially even within the confines of a single simulation frame (though enforced homogeneity in circuit content over e.g. micron scales will reduce this variation).

To increase accuracy when using a standard truncated OCS expansion it is necessary to increase the number of systems (or kernels) N, but as N is increased one finds that the remaining error tends to decrease more slowly, so that the incremental accuracy advantage gained by inclusion of each successive OCS system faces diminishing returns. In addition, the TCC error that remains tends to become relatively more concentrated in the fin region, i.e. in the vicinity of the TCC crease.

Once a moderately large number N of OCS kernels have been employed, the approximate TCC provided by FIG. 1E will generally show reasonable accuracy in most respects, except that the sharp crease edges in the exact TCC will be rendered in the approximate TCC with excessive rounding, i.e. the rendered TCC will be rounded in the direction perpendicular to the crease.

Figure 9B:
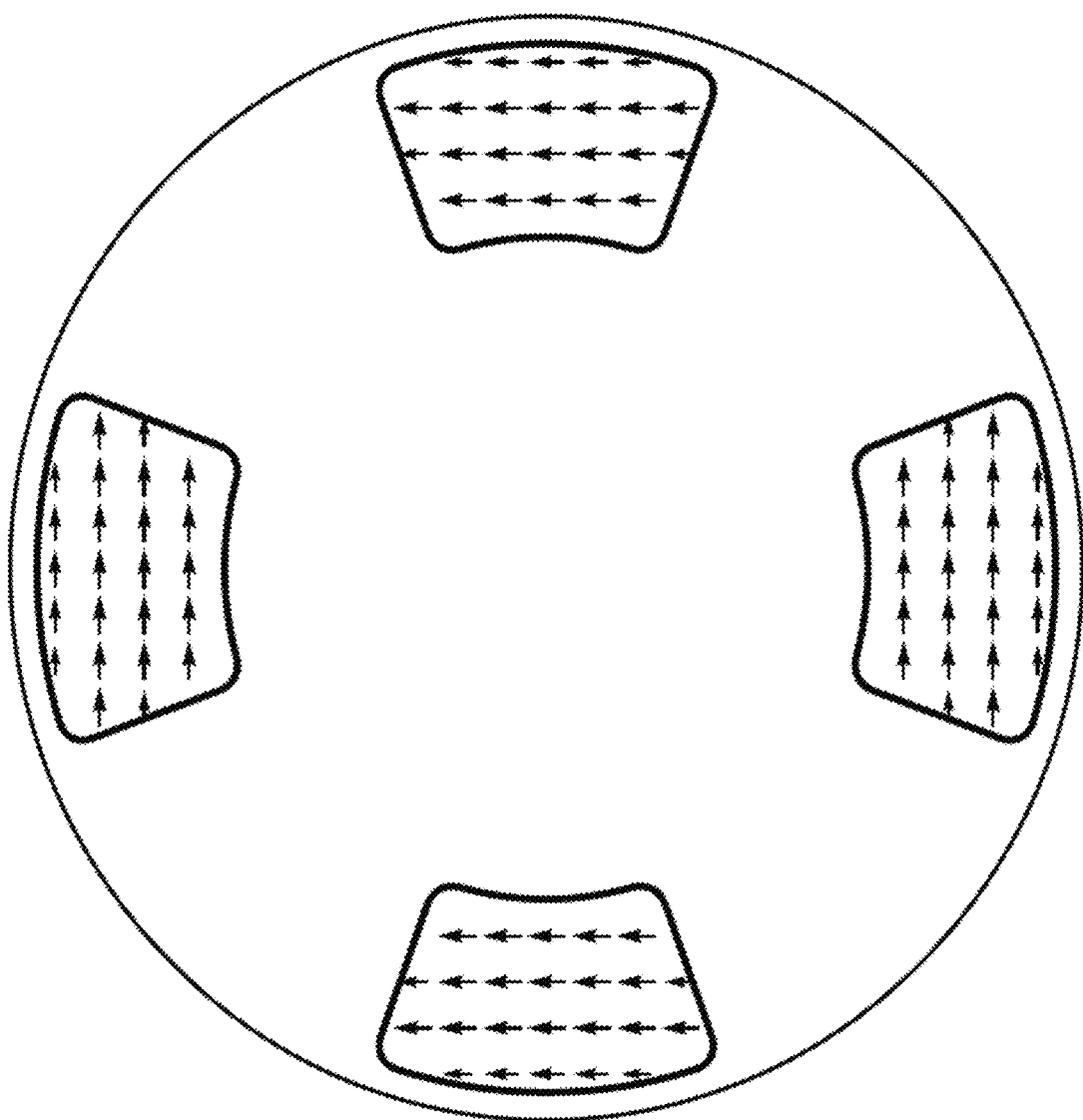

FIG. 9A illustrates a second TCC example for 1D line/space features, where in this plot the TCC has been calculated with quite high accuracy by setting N to a value far larger than would be considered practical when the equation of FIG. 1B is used during OPC; more specifically, N has been given the large value of 247. 247 OCS systems would normally be considered an adequate approximation to the exact TCC, but for reasons of runtime efficiency N must typically be given a much smaller value during chip-scale IC applications. In this example the TCC is seen to exhibit the expected sharp "crease" along the DC contour where $f_1=f_2$, highlighted in FIG. 9A with a dashed line. Whereas FIG. 6 considered a disk source example, the non-limiting example of FIG. 9A considers the case where a C-Quad Source ($\sigma$=0.6–0.95, 40° poles, Gaussian source blur), NA=1.35, xy-polarized, is used in the lithographic exposure. This source is shown in FIG. 9B, with the effect of Gaussian source blur being indicated schematically by the rounded corners of the poles. Vector imaging is assumed in the calculation, and the vector arrows in FIG. 9B show the polarization direction of different points in the source. The spatial frequency axes use direction cosine units, including the coupling refractive index as a multiplying factor, in this case equal to 1.44.

Figure 10B:
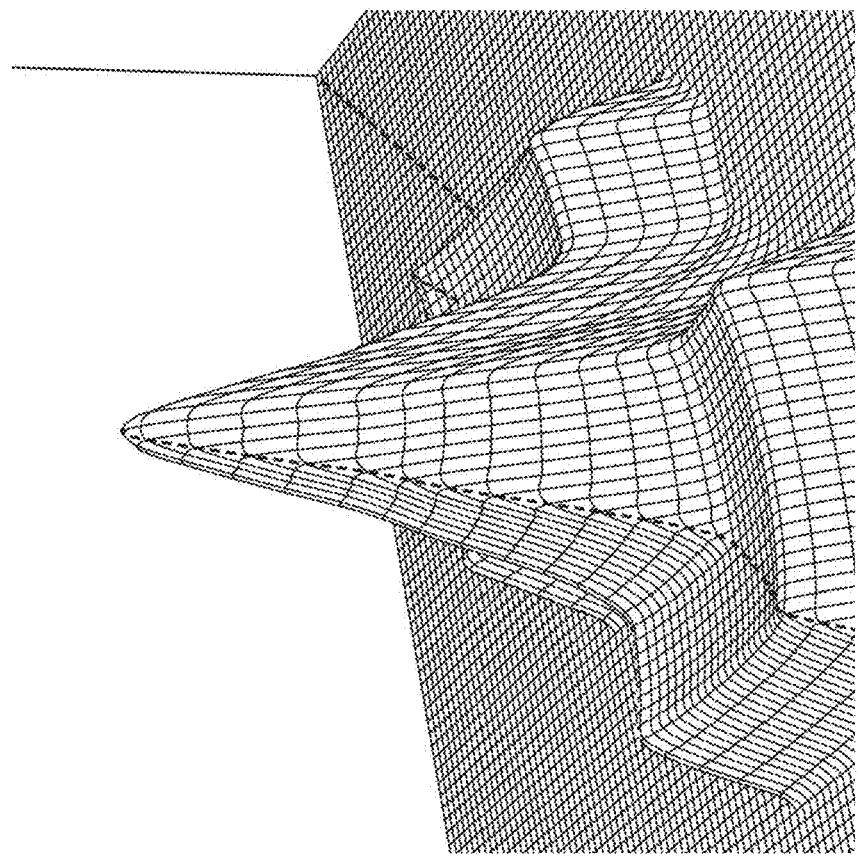
FIGS. 10A and 10B, collectively referred to as FIG. 10, provide a comparison of close-up images of the "crease" in the C-quad TCC when approximated using different numbers of OCS systems, namely 24 and 247 OCS systems, respectively.
Figure 10A:
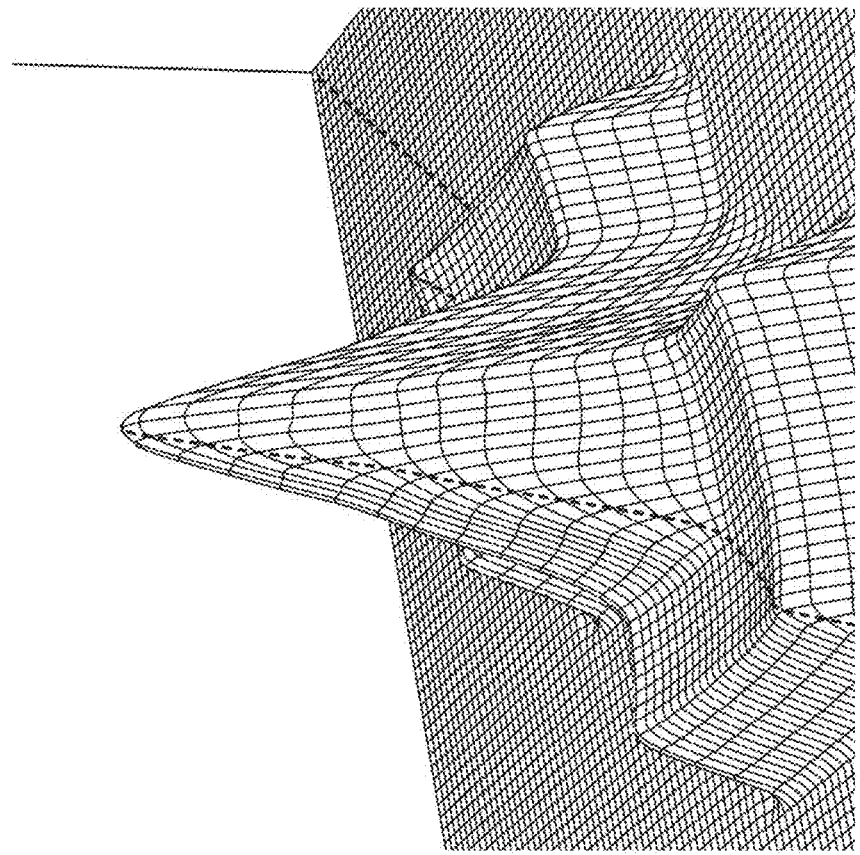

FIGS. 10A and 10B consider the same source and imaging conditions as are used in FIG. 9, and more specifically provide a comparison of close-up images of the $\Delta f=0$ crease region when the approximate TCC is calculated with 24 and 247 kernels, respectively. It can be observed in the FIG. 10A approximate plot that the bulk of the TCC is captured quite well with 24 kernels, but that the crease at $\Delta f=0$ is not. In particular, when N=24 the crease is seen to be rendered with appreciable rounding. FIG. 10B shows the same near-exact TCC as does FIG. 9, i.e. in both figures the plotted TCC slice for 1D patterns is obtained with 247 OCS kernels, but FIG. 10B uses the same perspective as the 24 kernel TCC plot of FIG. 9A, which is oriented to highlight the crease. As discussed, N=247 represents an impractically large kernel count for OPC applications, but the TCC that it yields comes fairly close to the exact value, and comparison of FIG. 9B and FIG. 9A makes it clear that the loss of rendition accuracy in the latter N=24 case occurs primarily along the rounded crease. Note too that even with the large value of N used in FIG. 10B, a small amount of rounding is still apparent in the rendered crease. Though 247 kernels would normally be considered an adequate approximation of the full TCC, the sharp crease cannot be exactly captured with any finite number of OCS systems.

The foregoing has shown that conventional Mercer terms cannot accurately represent the essentially infinite difference that (per FIGS. 5A and 5C) exists in the TCC between the second derivatives along $\Delta f$ and $\bar{f}$, with this limitation arising from the structural similarity in these second derivatives that a Mercer product of a smooth OCS kernel with itself must exhibit when the multiplied $\Psi$ functions are separated along the $f_1$ and $f_2$ axes, as has been demonstrated in FIGS. 7A and 7B. However, and referring to FIG. 11, one can, in accordance with the embodiments of this invention, instead express the TCC or TCC$^{(r)}$ using a (non-Mercer) series whose terms will be referred to as "rotated systems", denoted $T_{Rotated}$. Each rotated system is the product of two distinct kernel functions (instead of the single kernel $\Psi$ used in OCS/Mercer terms) that are separated along the $\Delta f$ and $\bar{f}$ axes (instead of $f_1$ and $f_2$), as shown in FIG. 11A. Further, since Mercer terms are well-suited for approximating most portions of the TCC, one more preferred embodiment shown in FIG. 11A uses the $T_{Rotated}$ terms to render the residual TCC rather than the full TCC, with the residual TCC being by construction the portion of the TCC that is comparatively recalcitrant to decomposition using a coherent system expansion (i.e. a Mercer expansion).

The $T_{Rotated}$ terms employ different kernels along the $\Delta f$ and $\bar{f}$ axes, denoted $\hat{T}$ and $\widehat{T}$ respectively, in order to readily capture the strong curvature anisotropies arising at the crease. FIG. 11A thus provides an expansion that is well-suited to approximating TCC$^{(r)}$. Of course, TCC$^{(r)}$ is exactly determined once a specified number N of OCS systems has been employed, but the goal of these expansions is to operationally approximate the TCC in a computationally efficient manner, since it is not computationally feasible to use TCC$^{(r)}$ directly in image calculations at full-chip scale.

As has been discussed, each prior art coherent system can be applied very efficiently during OPC by means of FFTs, but close rendition of the TCC crease requires an inordinately large number of conventional coherent Mercer series terms. Practical use of an alternative series of decomposition systems not only requires that the new kind of system accurately render the crease, but also that the new terms involve kernels that are computable, and further that evaluation of the new terms for individual frames of mask data be sufficiently fast for full-chip IC simulations. The question of accurate crease rendition will be considered first.

To enable accurate rendition of the crease, the novel $T_{Rotated}$ systems in FIG. 11A should in general use different functions for the two axes along which the system is separated, namely $\hat{T}$ along the $\bar{f}$ axis, and $\tilde{T}$ along the $\Delta f$ axis. FIG. 11 approximates the residual portion of the TCC (e.g. the portion that remains after application of N OCS terms) by additionally applying a finite number L of the new $T_{Rotated}$ terms, with the different terms being distinguished using an index l. This recalcitrant residual TCC portion tends predominantly to be localized to the vicinity of the crease, as has been seen in FIG. 8, where the resulting error takes on the appearance of a "fin" when plotted, i.e. this error is present as an extended peak along the f axis that has a narrow cross-sectional width along the $\Delta f$ axis. The relative importance of this fin region in the residual error typically becomes more pronounced as more and more OCS kernels are resorted to in defining $TCC^{(r)}$. An expansion along the rotated $\Delta f$ and $\bar{f}$ axes is well-suited to represent this region since the TCC exhibits very different curvatures along these two directions, and the use of two kernels (which can be given very distinct shapes) to form the $T_{Rotated}$ terms provides a direct way to render second derivatives of very different magnitude along the $\bar{f}$ and $\Delta f$ axes, as may be seen in FIGS. 11B and 11C. In particular, if T is given a slope discontinuity at the origin, it follows automatically from FIG. 11C that the second derivative of $T_{Rotated}$ with respect to $\Delta f$ will become infinite at $\Delta f=0$. Similarly, FIG. 11B shows that the second derivative of $T_{Rotated}$ with respect to $\bar{f}$ will have an appropriately moderate magnitude that will be shown capable of matching the finite second derivative of $TCC^{(r)}$ along the $\bar{f}$ axis if the curvature of the chosen $\hat{T}$ function is given the appropriate moderate values at the various $\bar{f}$ locations along the crease. The infinite 2nd derivative in $\tilde{T}$ simply means that the slope abruptly reverses sign at the origin, so that an appropriately constructed $\tilde{T}$ function can be expected to have a sharp peak or "tip" at the origin, while $\hat{T}$ will generally have finite curvature at all points. Such kernel functions enable $T_{Rotated}$ to match the dramatically different curvatures that $TCC^{(r)}$ exhibits in the meridians parallel and perpendicular to the crease. (In intuitive terms, we expect $\hat{T}(\bar{f})$ to trace out the "ridgeline" of the fin peak, and $\tilde{T}(\Delta f)$ to reproduce the average cross-section of the fin.) In contrast, each individual OCS system of the conventional Mercer series is typically only able to exhibit curvatures of broadly comparable magnitude in the vicinity of the crease, as was shown in FIGS. 5A and 5B, so that $TCC^{(r)}$ can only be well-matched by a conventional OCS expansion if a large number of conventional coherent systems are used, which entails a significant cost in OPC runtime.

Referring to FIG. 12, $\hat{T}$ and $\tilde{T}$ may be calculated explicitly as the particular functions which provide the best RMS fit to $TCC^{(r)}$ when used as $T_{Rotated}$ factors. FIG. 12A shows in particular that such a fitting may be made by minimizing the total squared fitting error, which is denoted $E_{Rotated}$. At its optimum, $E_{Rotated}$ will exhibit no first-order change when small variations are introduced in $\hat{T}$ or $\tilde{T}$, where, in the case for example of $\hat{T}$, the small variation may be assumed to take the form shown in FIG. 12B, in which a δ-function perturbation is introduced at an arbitrary location f', with this perturbation having an infinitesimal complex amplitude c that may have arbitrary phase. When the perturbation shown in FIG. 12B is substituted into the equation of FIG. 12A and the variation $\delta E_{Rotated}$ extracted as a first-order quantity and set to 0, one obtains the variational condition shown in FIG. 12C. The equation of FIG. 12C must hold for arbitrary complex-valued c, and this can only be true if the optimality condition shown in FIG. 12D is satisfied at each f'. The equation of FIG. 12D is not sufficient in itself for obtaining the $T_{Rotated}$ kernels, so we refer to the equation of FIG. 12D more specifically as a first optimality condition.

When the decomposition is optimal $E_{Rotated}$ must be minimized with respect to small variations in $\tilde{T}$ as well as $\hat{T}$. Minimization with respect to $\tilde{T}$ can be carried out using steps that closely parallel FIGS. 12B-12D, leading to a second optimality condition shown in FIG. 12E. If the equation of FIG. 12E is then used to replace the $\tilde{T}^*$ factor on the right side of FIG. 12D, we arrive at FIG. 12F, which allows $\hat{T}$ to be obtained explicitly. In particular, FIG. 12F shows that $\hat{T}$ is an eigenfunction of an operator $Q(\bar{f}, \bar{f})$ that is quadratic in $TCC^{(r)}$, with Q being Hermitian in the doubled f domain. (Note that the residual TCC is not itself Hermitian when expressed in the rotated coordinates $\bar{f}$ and $\Delta f$.) FIG. 12F shows that the eigenvalues of Q are given by the product of the two factors in parentheses on the left side of the first line of FIG. 12F. Since each eigenvalue is thus the product of the normalization integrals of the $\hat{T}$ and $\tilde{T}\tilde{T}$ kernels, these normalizations are only determined to within a product; this reflects the fact that $T_{Rotated}$ is unchanged by a complementary rescaling of both kernels. FIG. 12F allows explicit calculation of $\hat{T}$, since standard and well-known methods are available to diagonalize the operator Q. Moreover, as will be discussed, in a preferred embodiment of this invention only the dominant eigenfunction of Q needs to be calculated, and determination of an operator's dominant eigenfunction is known to be particularly straightforward.

An operator equation for determining $\tilde{T}$ can similarly be obtained by substituting from FIG. 12D into 12E. The result is FIG. 12G, which shows that $\tilde{T}$ is the eigenfunction of the Hermitian operator Z defined in FIG. 12G. Z can be seen to have the same eigenvalues as Q. To finalize determination of $\hat{T}$ and $\tilde{T}$ it is necessary to choose from among the different eigenfunctions of Q and Z, and then to suitably normalize the eigenfunctions. If we substitute from the equation of FIG. 12D or 12E into FIG. 12A, we arrive at the expression shown in FIG. 12H for the minimized value of $E_{Rotated}$ obtained at the optimum. It follows from the first line of FIG. 12A that this residual squared error cannot be negative. FIG. 12H has the form of the difference between the integrated squared residual TCC and the eigenvalue of Q and Z that is chosen when solving for $\hat{T}$ and $\tilde{T}$. One can therefore conclude that to minimize the error and achieve the best match one must choose the largest eigenvalue of Q and Z, i.e. that $\hat{T}$ and $\tilde{T}$ should be chosen as the dominant eigenfunctions of these operators. Moreover, the process can be repeated by re-forming operator $TCC^{(r)}$ after the newly obtained component has been removed, thereby enabling extraction of a new $T_{Rotated}$ component. Ordinarily this repetition would be equivalent to taking the second largest eigenelements of the previous Q and Z operators as defined from the original $TCC^{(r)}$. However, as noted above and to be further discussed below, extraction of a $T_{Rotated}$ component from $TCC^{(r)}$ is typically only the first stage in a two-stage extraction of a loxicoherent system, and the loxicoherent system extraction that is actually carried out will be different from extraction of the related $T_{Rotated}$ component. In general, the eigenelements of Q and Z that are present after the dominant loxicoherent system is extracted from $TCC^{(r)}$ will not be equivalent to the higher order eigenelements in the pre-extraction versions of these operators.

To finalize determination of $T_{Rotated}$ one chooses a normalization for $\hat{T}$ and $\tilde{T}$. According to FIGS. 12F and 12G, the eigenvalue in Q and Z of these kernels must be equal to the product of their normalization integrals, and this constraint leaves only a single overall free scale factor in their joint normalization. It is convenient to settle this floating factor by choosing $\tilde{T}(0)=1$.

FIGS. 12A-12H thus show that the $T_{Rotated}$ systems are readily computed, and it has been shown previously that these systems are well-suited to rendering the crease regions of the TCC that are recalcitrant to standard OCS decomposition. However, it will be shown later that the $T_{Rotated}$ systems are not directly useable for fast image calculations, but that, nonetheless, a more complex system decomposition can be derived from the $T_{Rotated}$ systems that can accomplish this function. In order to explain the steps of this additional system decomposition, it is necessary to first understand the generic behavior of the $T_{Rotated}$ systems once a typically large number N of OCS systems is used to obtain the $TCC^{(r)}$ function from which they are derived, such as N greater than about 10 or 20.

Figure 13B:
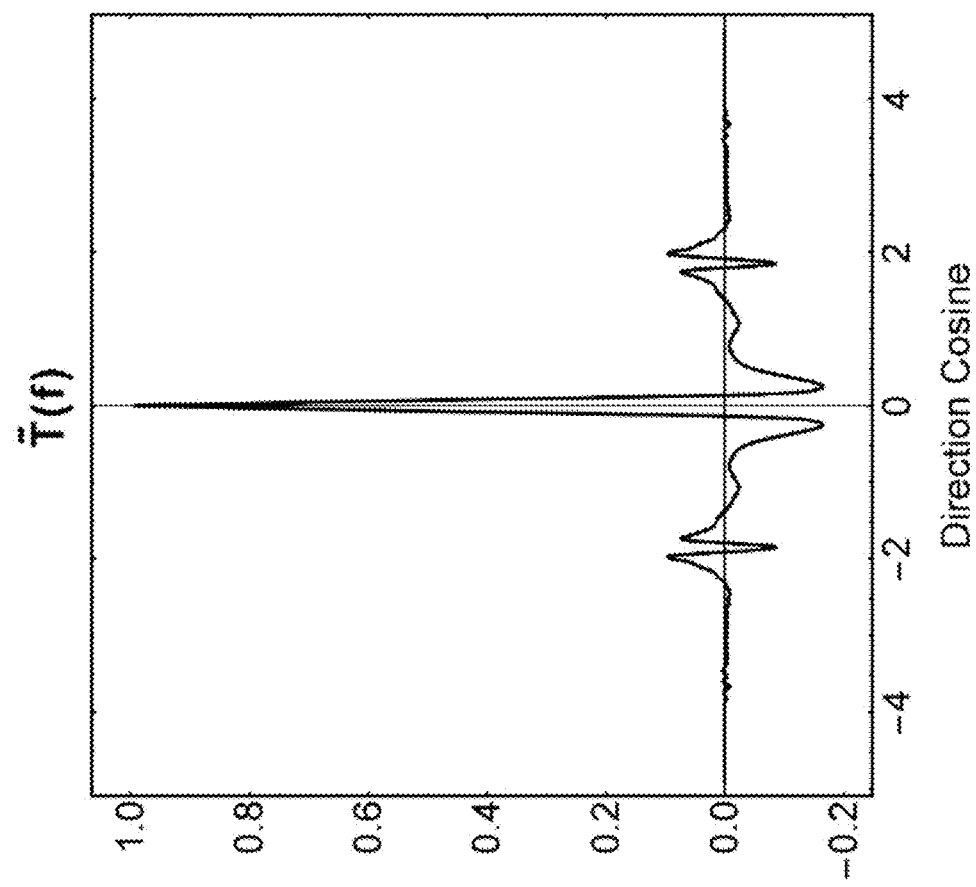
FIGS. 13A and 13B, collectively referred to as FIG. 13, show example 1D cross-sections of kernel functions for a rotated system that best matches the residual TCC when the full TCC for a C-quad example source is approximated using 24 OCS kernels.
Figure 13A:
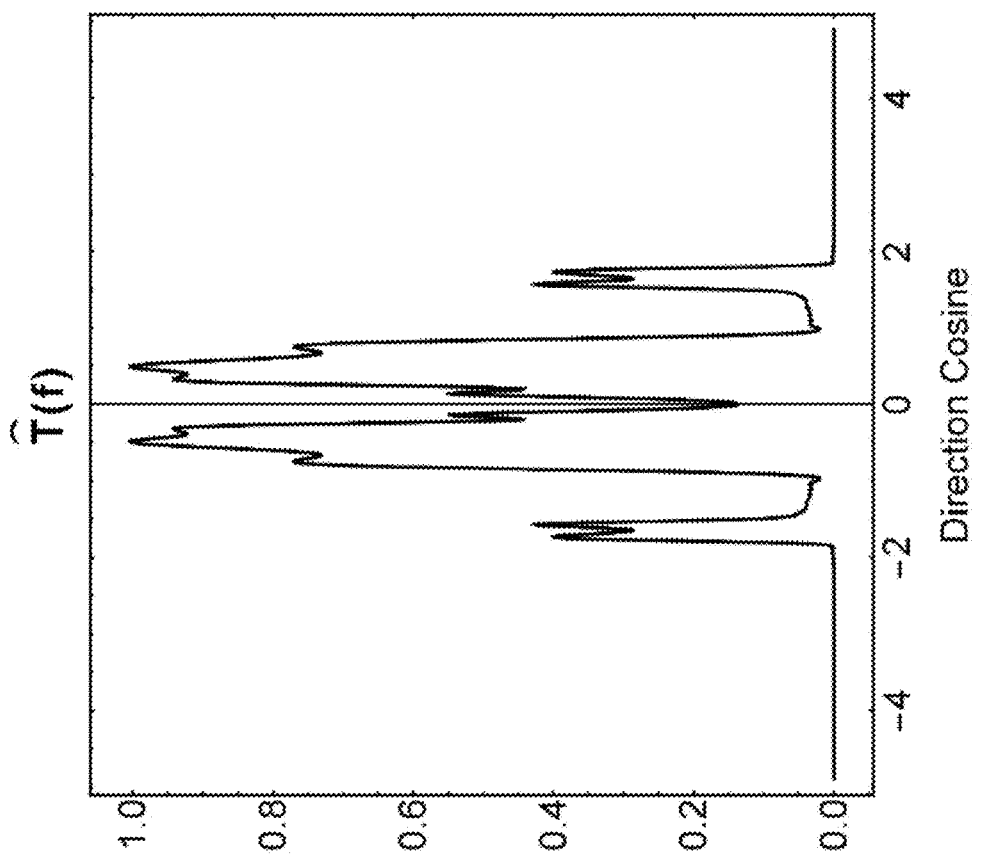

FIG. 13 shows a non-limiting example of the dominant $T_{Rotated}$ separated kernels, obtained by applying the equations of FIGS. 12F and 12G to the residual TCC that remains after N=24 OCS kernels have been extracted from the C-quad TCC of FIG. 9, with FIG. 13A showing $\hat{T}$ and FIG. 13B $\tilde{T}$. Note that the horizontal scale of the FIG. 13 plots expresses the frequency arguments in so-called "direction cosine" units, which are proportional to the sine of the angle at which a particular spatial frequency converges to the image when the mask is illuminated at normal incidence (so that the plotted direction cosine value of a collected spatial frequency can be larger than the numerical aperture of the lens if extended sources are used). In some cases the direction cosine may, by convention, include the refractive index of the coupling medium as a multiplying factor, facilitating comparison of the direction cosine with the lens numerical aperture, but the FIG. 13 axes do not include this multiplying factor. Frequencies $\bar{f}$ and $\Delta f$ can alternatively be expressed in reciprocal-period units; in that case the frequency that corresponds to a particular direction cosine value will be equal to the direction cosine divided by the wavelength. In the FIG. 13 non-limiting example the wavelength is 193 nm, and the coupling index is 1.44.

Figure 14:
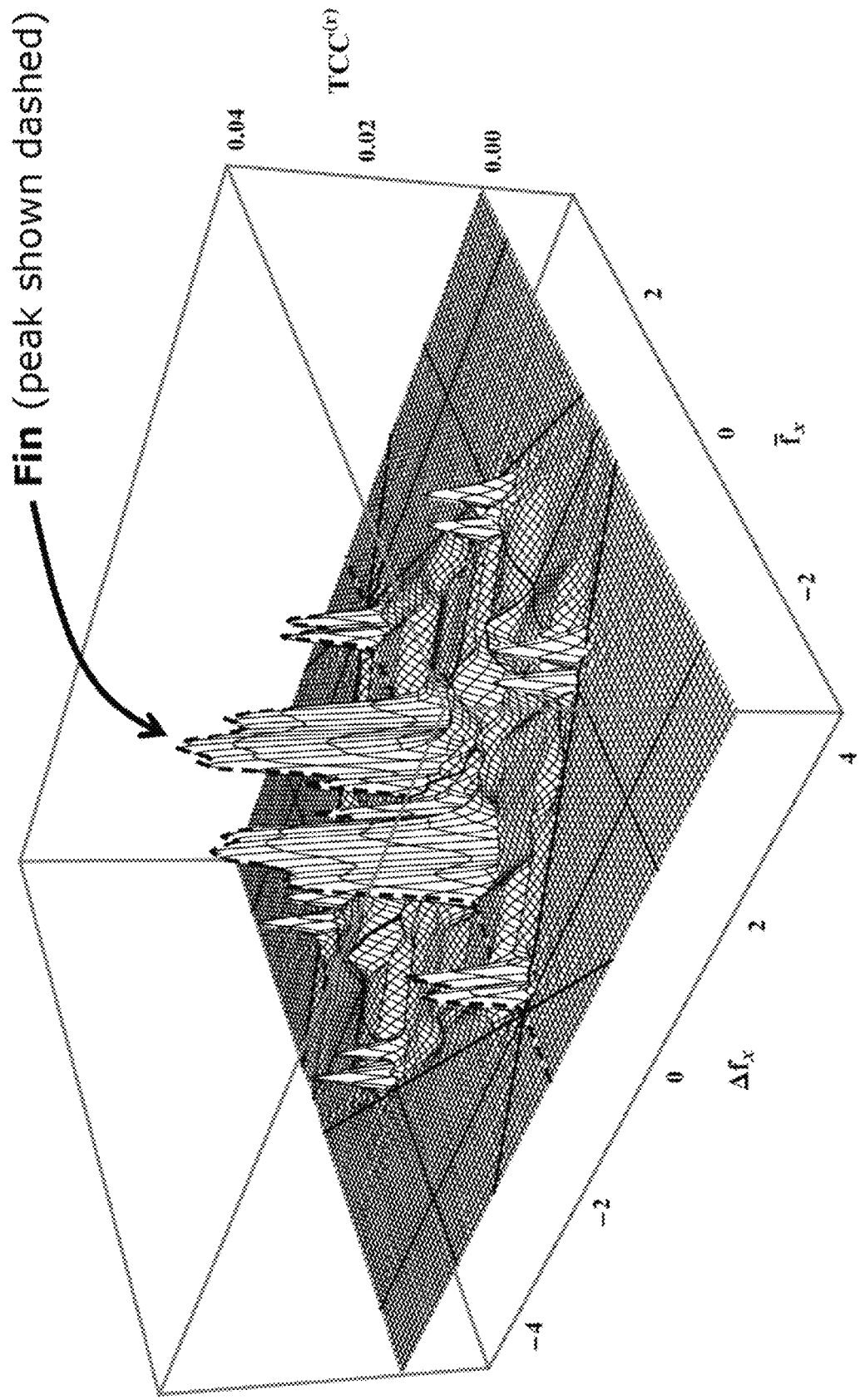
FIG. 14 shows the TCC residual that remains after using 24 OCS kernels to approximate the TCC of the FIG. 9 C-quad example, where the residual TCC error is seen to be strongly concentrated in the area of the slope discontinuity.

The $TCC^{(r)}$ from which the FIG. 13 kernels were derived is shown in FIG. 14. The FIG. 14 example $TCC^{(r)}$ was obtained by subtracting 24 OCS systems from the FIG. 9 TCC, i.e. N has been given the (typical) value of 24 when using a Mercer expansion to initially approximate the FIG. 9 TCC. FIG. 14 thus plots the error that would be incurred in using the standard OCS image approximation with a typical choice of system count, as well as depicting an input for the calculation of the FIG. 13 rotated system kernels (since the post-OCS $TCC^{(r)}$ is such an input). The spatial frequency axes in FIG. 14 use direction cosine units, including the coupling refractive index of 1.44 as a multiplying factor.

The predominantly "fin-like" character of the residual TCC error can readily be observed in FIG. 14. The fin represents the preponderant difference between the approximate TCC shown in FIG. 10A, and the (almost) exact TCC shown in FIG. 10B. The fin is, in other words, essentially the deficit between the sharp crease in the FIG. 10B TCC (which is calculated using a very large number (N=247) of OCS kernels, and so essentially represents the exact TCC), and the rounded (N=24) crease rendition of FIG. 10A, with the sharp crease in the exact TCC giving rise to the peak of the fin.

Figure 15A:
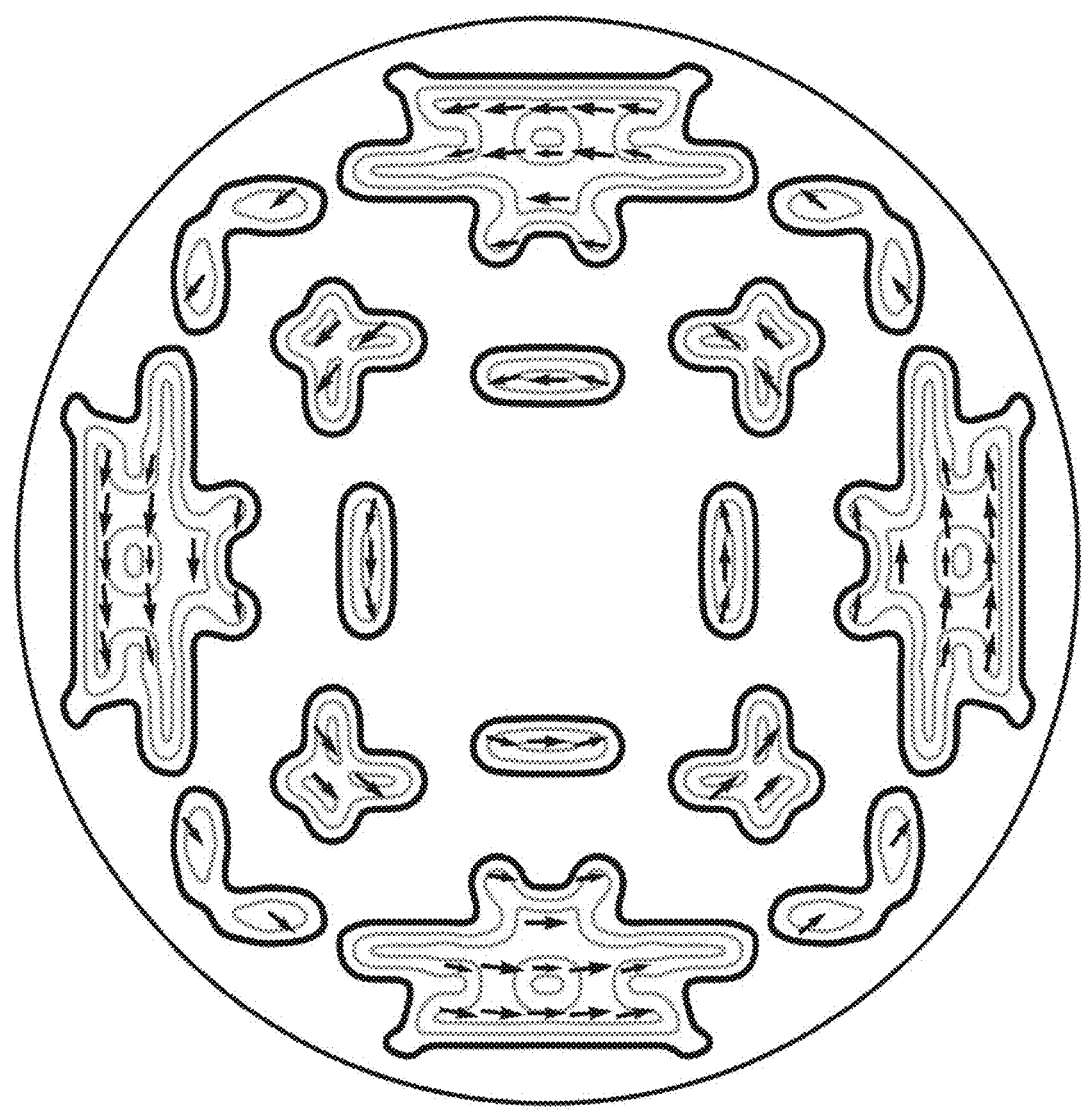

This fin-like predominant shape for $TCC^{(r)}$ is quasi-universal at the values of N typically used for OPC (e.g. N between 10 and 100), and represents a Gibbs-like phenomenon arising from the mismatch between the equations of FIGS. 5A-5C and FIGS. 7A and 7B. Additional $TCC^{(r)}$ examples exhibiting this general behavior are shown in FIG. 15 for the case of a so-called free-form or SMO source. The particular free-form source that was used is shown in FIG. 15A. Sources of this kind tend to depart from the simple binary on/off intensity settings of more conventional sources (though even conventional sources exhibit gradations in intensity at the edges of their illuminating regions, due to the blurring with which they are rendered in the pupil), and FIG. 15A depicts this varying intensity by using contours, with a single heavy-line contour at 15% of peak intensity being used to demarcate the rough boundaries of the illuminating source poles. Contours at 55% and 85% are also shown (in a lighter line), corresponding to brighter intensities in the interiors of the poles, some of which have local peak intensities that are well below 100%. The source intensity at locations well outside the 15% pole contours are substantially zero. The source is polarized with an azimuthal orientation, as indicated by the inserted vector arrows in FIG. 15A.

Figure 15B:
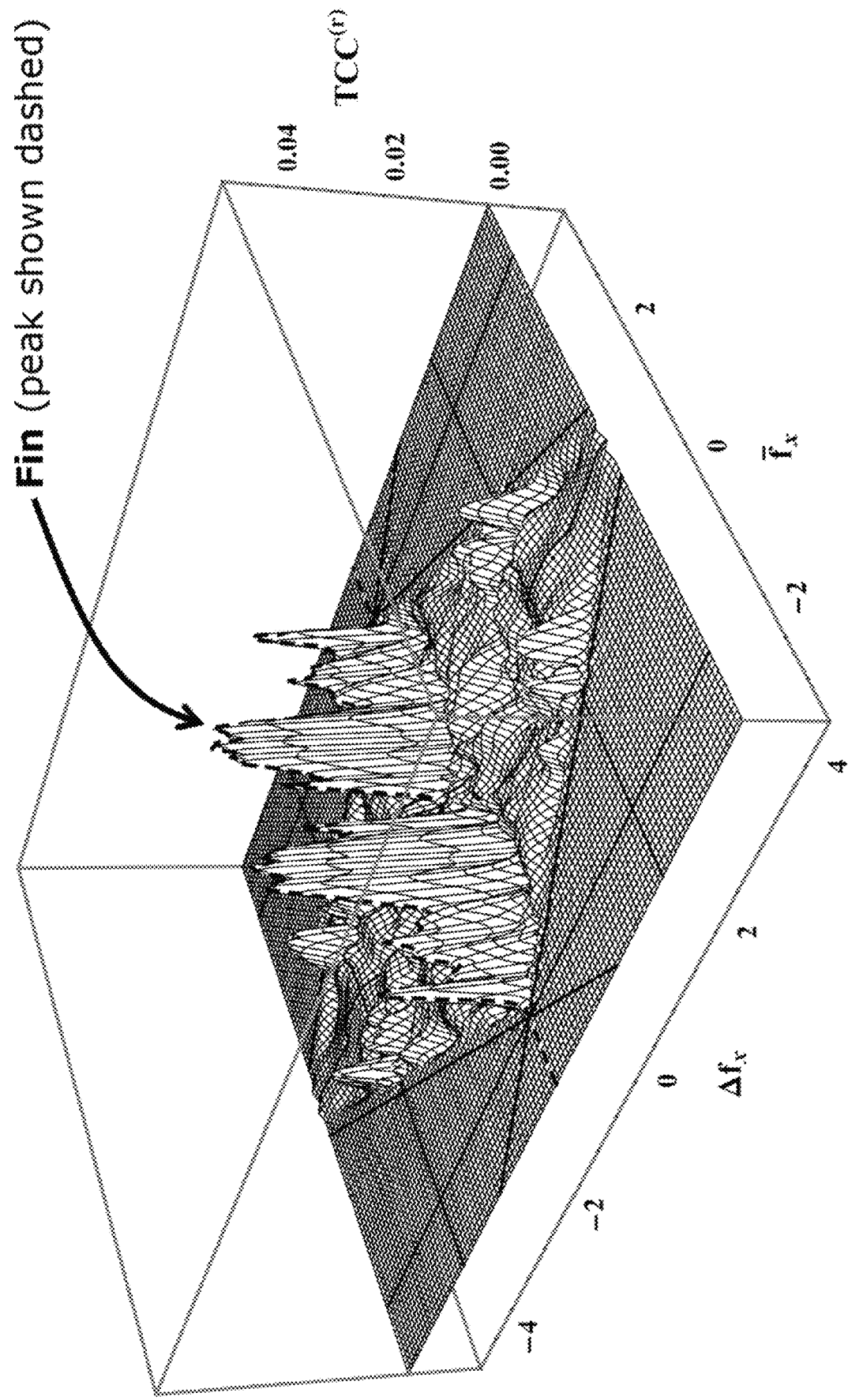

FIG. 15B shows the residual TCC when N=24 OCS kernels are used to approximate the TCC produced by the FIG. 15A free-form source when projected with NA=1.35 at λ=193 nm. The predominantly fin-like configuration of the residual TCC is apparent. Although FIG. 15B does not attempt to depict the 4D $TCC^{(r)}$ that governs 2D patterns, the fin is in fact present for such patterns, i.e. the fin is present as a peak within the 4D geometry of the full $TCC^{(r)}$, this higher-dimensioned peak being very narrow in both dimensions of every 2D cross-sectional manifold, while being extended in the 2 orthogonal directions along the 2D fin peak, the combined 4D configuration being of course difficult to visualize. It should be emphasized that the 24 OCS kernels used to calculate $TCC^{(r)}$ are the 24 most dominant 2D eigenfunctions of the full 4D TCC (even though they are only applied to 1D patterns in the figure), and are not merely eigenfunctions of the lower-dimensioned 2D TCC function that governs 1D imaging. This convention will be followed throughout the description of this invention when quoting kernel counts, unless stated otherwise.

Figure 15D:
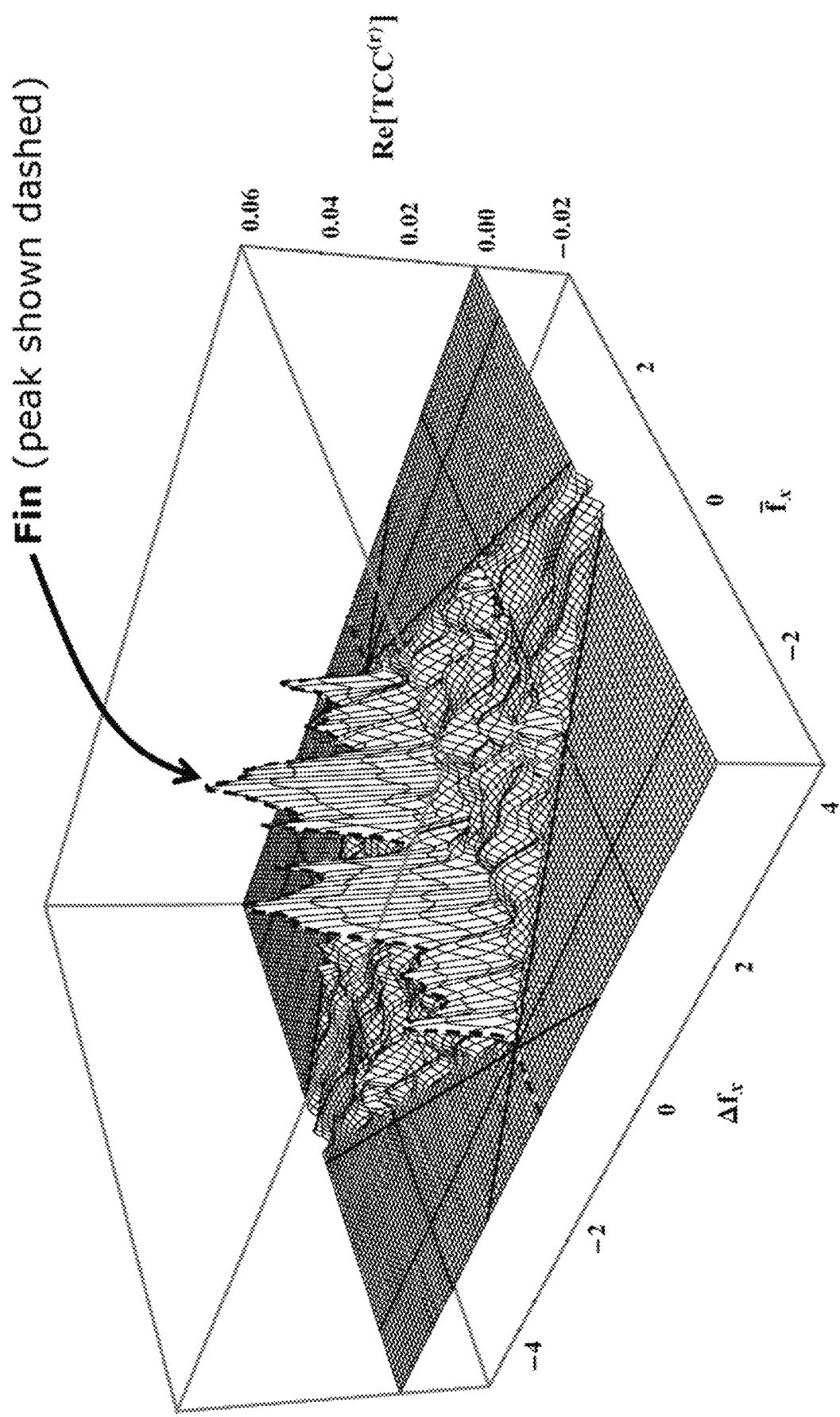

The $TCC^{(r)}$ fins shown in FIGS. 8, 14, and 15B represent the OCS error when calculating the so-called "aerial image" that the projection system produces within the coupling medium before the IC wafer is interposed into the imaging beam, i.e. the aerial image may roughly be regarded as the incident image that is imposed on the wafer. However, OPC is today typically carried out using the actual exposing intensity within a plane at some designated depth in the resist layer, with this plane being exposed by back-and-forth reflections of the image between the various interfaces of a wafer film stack in which the resist constitutes only one layer of many. For example, the table of FIG. 15C in FIG. 15 shows an exemplary wafer film stack in which layer #2 is the photoresist layer. FIG. 15D shows the $TCC^{(r)}$ after 24 OCS kernels are used to calculate the exposing intensity at the top of the resist layer (i.e. at the interface between layers #1 and #2), under conditions where the projection lens is focused at the midpoint of the layer, i.e. a ray intersection about 60 nm below the layer 1,2 interface. (The optical focus was set 93 nm below the upper surface of layer 1 to account for refraction.) The combined aberrations caused by the film stack and by defocus cause the TCC to become complex-valued, and FIG. 15D shows more specifically the real part of $TCC^{(r)}$. The fin-like configuration of the residual error from the OCS approximation is again apparent, since the mechanisms that produce it are essentially independent of the presence of a film stack, or of lens aberrations like defocus.

Lithographic exposure tools maintain very low levels of aberration, since modern IC requirements push resolution to the limit. Defocus represents a partial exception to this rule, because in practice it often proves impossible to maintain a perfectly sharp focus across exposure fields of macroscopic dimension on heavily processed wafers. But even where defocus is concerned, the aberration levels that must be taken into account during mask design and OPC are generally well under one wavelength. Under such conditions of weak to moderate aberration the real part of the TCC (and more specifically the real part of $TCC^{(r)}$) usually has a larger impact on image quality than does the imaginary part, particularly with modern lithographic masks, which tend not to be of the hard-phase-shift type. A lesser impact from the imaginary part of $TCC^{(r)}$ does not mean that the associated aberration itself will only have a weak impact (though in practice this is likely to be the case with aberrations other than defocus). This is because aberrations from defocus and the film-stack will generally cause the real part of $TCC^{(r)}$ to increase, as well as producing a non-zero imaginary part. This aberration-induced increase in the real part of $TCC^{(r)}$ may be seen in a comparison of FIG. 15D (defocus and film-stack) to 15B (in-focus aerial image), bearing in mind the difference in vertical scales of the two plots.

Figure 15E:
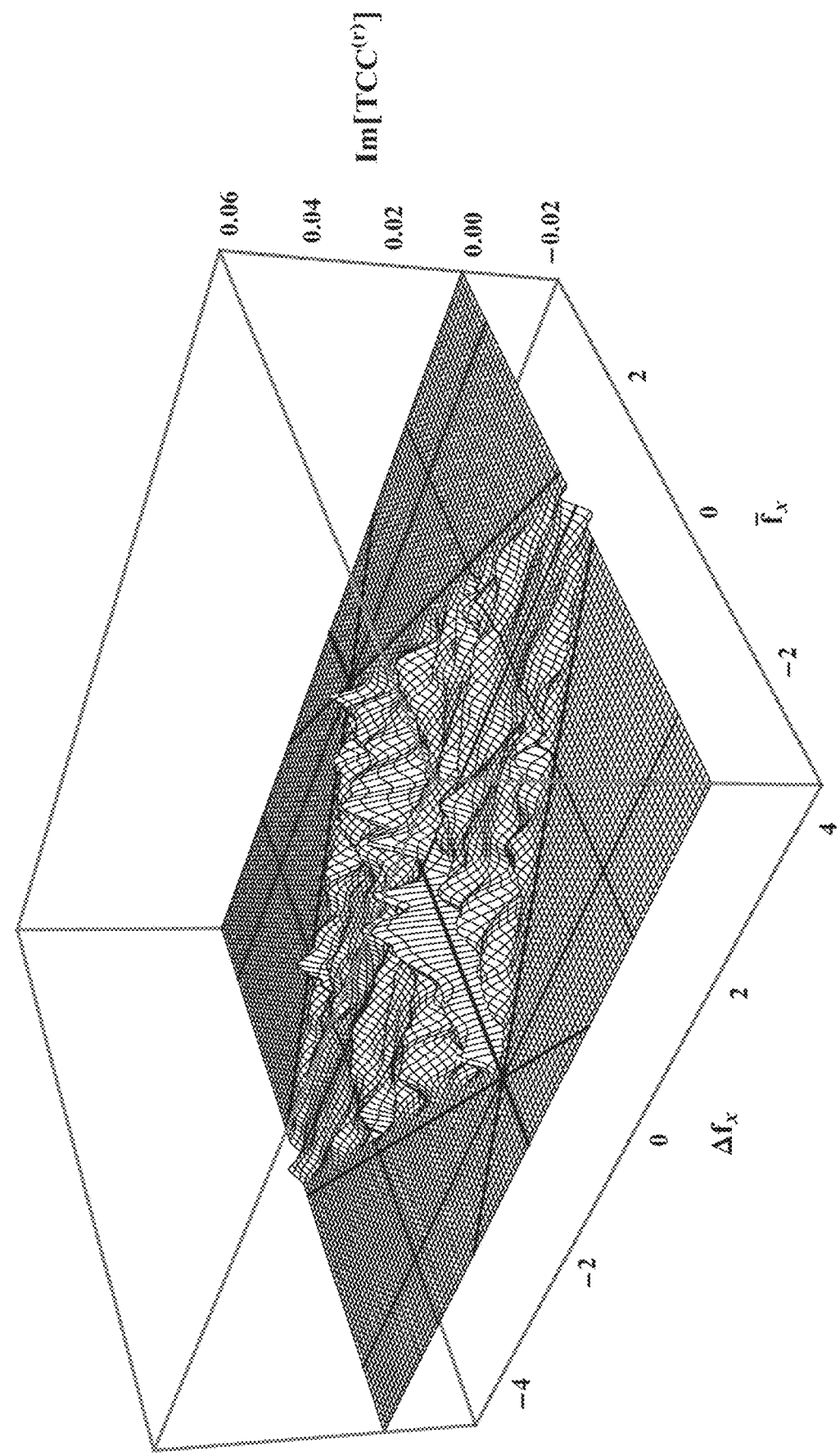

However, the imaginary part of $TCC^{(r)}$ does impact the image, and the embodiments of this invention can achieve a significantly smaller $TCC^{(r)}$ in both the real and imaginary parts than can standard OCS at the same compute budget, as will be discussed. FIG. 15E shows an example of the imaginary part of the residual TCC (denoted $Im[TCC^{(r)}]$), in this case after extraction of 24 OCS kernels under the same imaging conditions as in the example of FIG. 15D. Like the real part of $TCC^{(r)}$ (denoted $Re[TCC^{(r)}]$), $Im[TCC^{(r)}]$ shows an increased magnitude near $\Delta f=0$, but an additional consideration comes into play where the imaginary part is concerned. In particular, the $TCC^{(r)}$ must be entirely real where $\Delta f$ is exactly 0 (assuming that $TCC^{(r)}$ is calculated following the extraction of purely OCS kernels), since the TCC is Hermitian. The near-DC "fin" in $Im[TCC^{(r)}]$ therefore tends to take the form of paired peaks or "ripples" that have opposite sign, with these "peak and valley" ripples closely flanking a zero-valued contour lying exactly along the $\Delta f=0$ axis.

FIG. 15F uses a contour plot to more clearly illustrate this generic configuration of the imaginary part of the fin, plotting the same $Im[TCC^{(r)}]$ example as the surface plot of FIG. 15D. Thin-line contours are drawn at levels of +0.004 and −0.004, in order to enclose lobes or "peaks" (and matching "valleys") that have significant magnitude in $Im[TCC^{(r)}]$. Note that even when these regions are referred to as "peaks" for simplicity, the structure of $Im[TCC^{(r)}]$ actually consists of paired regions that extend to (relatively) large magnitudes in both positive and negative directions. To make this pairing clear the peaks that exhibit large negative magnitude are shown with cross-hatching in the figure. The imaginary part of $TCC^{(r)}$ is seen to have anti-symmetry in $\Delta f$, so that $Im[TCC^{(r)}]$ maintains its magnitude but reverses sign when mirrored about the $\tilde{f}$ axis (which is the vertical axis in FIG. 15F). This is a consequence of the Hermitian symmetry that the TCC must maintain (because the intensity that it provides is always real-valued and positive). $Im[TCC^{(r)}]$ is also seen to have mirror anti-symmetry about the horizontal $\Delta f$ axis of FIG. 15F; this reflects the bilateral symmetry of the FIG. 15A source about its x and y axes, operating in conjunction with the Hermitian symmetry of $TCC^{(r)}$. OPC and mask design are usually carried out with symmetric sources, or at least sources that are symmetric by design, in order to avoid position shifts of the printed patterns in the presence of small focus errors. Even when OPC takes into account the small asymmetries that are actually present in measured sources, it is often quite accurate to neglect these asymmetries when considering the impact of residual error terms like $Im[TCC^{(r)}]$ that are themselves already quite small even in their predominant symmetric contribution.

In addition to the thin-line contours at height ±0.004 in FIG. 15F that enclose lobes of non-negligible $Im[TCC^{(r)}]$ magnitude, thick-line contours at heights ±0.008, ±0.012, and ±0.016 are also included in the figure. These higher contours show that the magnitude of $Im[TCC^{(r)}]$ is fairly small except at locations near $\Delta f=0$, where $Im[TCC^{(r)}]$ exhibits strong peaks and valleys at low difference frequency (even though the imaginary part is 0 where $\Delta f$ is exactly 0). Except for the separating split (i.e. a small anti-symmetric displacement) away from the f axis, the shape of the $Im[TCC^{(r)}]$ fin peak as a function of f has qualitative similarities to the shape of the real part (e.g. comparing FIG. 15E to the real part shown in FIG. 15D), allowing for a change in scale and the more complicated symmetry of the imaginary part. The error mechanism that predominates in the imaginary part of the residual TCC after extraction of OCS kernels is the same as that previously discussed in connection with the real part, and for convenience we will continue to refer to the associated generic error configuration in the imaginary part of $TCC^{(r)}$ as a "fin", even though that term is less well-suited to the anti-symmetric character of e.g. FIG. 15F than it is to the symmetric real part.

The methods provided by embodiments of this invention can substantially correct the portions of $Im[TCC^{(r)}]$ that are recalcitrant to extraction with OCS kernels, as will be discussed, but the method is simpler to apply to the real part of $TCC^{(r)}$, so non-OCS extraction of $Re[TCC^{(r)}]$ will be considered first.

$T_{Rotated}$ kernels like those shown in FIG. 13 essentially constitute a close model of the sharply peaked fin content in $Re[TCC^{(r)}]$ after OCS extraction, with the sharp character of $\tilde{T}$ at the origin being particularly apparent in FIG. 13B. In lithographic applications the real part of $TCC^{(r)}$ usually has an appreciably larger impact on the image than does the imaginary part, and for simplicity this description of the invention will generally use $TCC^{(r)}$ to refer to the real part, unless otherwise stated. When $\tilde{T}$ is gridded during practical computations, the jump in the pixel-to-pixel value difference at the origin (involving a sign reversal) will decrease linearly rather than quadratically with the fineness of the grid, making the second derivative of $\tilde{T}$ effectively infinite at $\Delta f=0$ on any scale of computational interest. In contrast, the second derivative of $\hat{T}$, though fairly large in magnitude at some values of f, will in general always be finite.

It should be noted that the central peak of the T factor in the dominant $T_{Rotated}$ term of $TCC^{(r)}$ will almost always become quite narrow once the number of OCS systems N assumes a value typical of current practice, e.g. larger than about 10. This reflects the strong localization of the OCS-recalcitrant portion of the TCC to values of $\Delta f$ that are near the $\Delta f=0$ crease. While the standard expansion in Mercer terms faces diminishing returns once the number of OCS terms reaches this regime, the first terms of the FIG. 11A expansion will, in contrast, tend to converge very rapidly if $N \geq 10$ kernels have been used to calculate $TCC^{(r)}$, since the $T_{Rotated}$ factorization is well-suited to capture the extreme difference in TCC curvature at the vicinity of the crease that then predominates in $TCC^{(r)}$. In short, the $T_{Rotated}$ factorization is well suited to decomposing the parts of the TCC that are most recalcitrant to the standard Mercer decomposition used in current OPC practice, with such a Mercer decomposition being used in the invention as well to generate $TCC^{(r)}$. In fact, when N has been given a typically large value, the first $l=1$ $T_{Rotated}$ term will itself usually represent a close approximation to $TCC^{(r)}$.

To exploit this behavior one can consider an idealized limit in which $TCC^{(r)}$ (expressed along rotated coordinates) can almost exactly be fit by a single rotated system, so that $TCC^{(r)}(\bar{f},\Delta f)=\hat{T}^{(l)}(\bar{f})\tilde{T}^{(l)}(\Delta f)$ to a high degree of accuracy. In this limit one could fix $\Delta f$ to any arbitrary value (denoted $\Delta f_{fixed}$), and then use the known values of $TCC^{(r)}$ to solve for $\hat{T}^{(l)}(\bar{f})$ to within a constant of proportionality (this proportionality constant being the reciprocal of $\tilde{T}^{(l)}(\Delta f_{fixed})$), i.e. we could set $\hat{T}^{(l)}(\bar{f})\equiv TCC^{(r)}(\bar{f},\Delta f_{fixed})/\tilde{T}^{(l)}(\Delta f_{fixed})$. This idealized limit is not reached in practice, but there is in fact a close correspondence between the $l=1$ $T_{Rotated}$ term and $TCC^{(r)}$. Moreover, since the recalcitrant $TCC^{(r)}$ content that this $T_{Rotated}$ term closely matches will be concentrated along the $\Delta f=0$ fin, we can in practice determine $\hat{T}$ with quite high accuracy from the values that $TCC^{(r)}(\bar{f},\Delta f)$ assumes along the crucial $\Delta f$ contour that traces the ridge of the fin, i.e. by choosing $\Delta f_{fixed}=0$.

Of course, one might view such an approximation as unnecessary, since FIGS. 12A-12H provide exact values for the $T_{Rotated}$ kernels. However, it proves helpful to consider an approximate (but generally quite accurate) calculation of the first $T_{Rotated}$ kernel based on a fit at $\Delta f_{fixed}=0$, since it will be shown that such a fit is useful in subsequently decomposing the TCC in a way that allows fast calculation of optical images, which direct use of $T_{Rotated}$ does not provide. In practice, such an approximate calculation could be made using a discrete gridding of the TCC and kernels on a rotated $\{\bar{f},\Delta f\}$ grid, so that the gridded values of the $\hat{T}(\bar{f})$ kernel would be approximately calculated as being proportional to the value of $TCC^{(r)}$ at sampled f values along the $\Delta f=\Delta f_{fixed}$ column of the rotated grid. Since the fin is centered at $\Delta f=0$, it is most appropriate to choose the central $\Delta f_{fixed}=0$ column when making such an approximate determination. Moreover, it will be shown that achieving an accurate fit along the $\Delta f=0$ contour is particularly important for accurate image calculation.

Referring to FIG. 16, FIG. 16A shows that the undetermined constant of proportionality has the nominal value $1/\tilde{T}_{\Delta f=0}^{(1)}$. The first part of the equation of FIG. 16B then shows that in the continuous domain $\hat{T}(\bar{f})$ is approximately proportional to the value of $TCC^{(r)}$ along the $\Delta f=0$ axis (which is the fin peak), and without loss of generality we may define $1/\tilde{T}_{\Delta f=0}^{(1)}$ to have the value 1, since, as discussed above, the normalization scales of $\hat{T}$ and $\tilde{T}$ are only defined to within a common shared factor (i.e. $\hat{T}$ can be rescaled by any arbitrary factor, so long as $\tilde{T}$ is reduced by the same factor). FIG. 16B shows that $\hat{T}$ is then approximately given by the value of $TCC^{(r)}$ along the ridge of the fin.

To reiterate, though FIG. 12 provides an exact way to determine the $\hat{T}$ and $\tilde{T}$ functions, such a determination only provides a partial solution to the problem of improving the speed/accuracy tradeoff during image calculations. In particular, to obtain decomposition systems that not only provide an accurate match to the TCC, but that also permit a computationally fast calculation of partially coherent images, it is useful to further develop the FIG. 16B approximate solution. Though $\hat{T}$ can be determined from $TCC^{(r)}$ at the fin peak using FIG. 16A, FIG. 12E shows that $\tilde{T}$ is impacted by other regions of $TCC^{(r)}$, and FIG. 12E can in fact be used to optimally calculate $\tilde{T}$ at all other values of $\Delta f$, including difference frequencies that are quite far from the fin, thus accomplishing a reduction in $TCC^{(r)}$ throughout the doubled domain. The first $T_{Rotated}$ term can then be applied with fair accuracy throughout the band limit of $TCC^{(r)}$ (assuming that N has been given a reasonably large value). However, with the exception of a lesser spike in $TCC^{(r)}$ that is seen at the edge of the bandpass (e.g. at $\Delta f \approx 2.7$ in FIG. 14), which will be considered in a more sophisticated embodiment, $TCC^{(r)}$ is generally small at locations away from the fin. The small value of $TCC^{(r)}$ in these non-fin regions facilitates matching by the rotated system since FIG. 12E will then give $\tilde{T}$ a suitably small value. This means that $T_{Rotated}$ is critically determined by the behavior of $TCC^{(r)}$ in the narrow region near $\Delta f=0$, where the deficiency from neglected OCS terms beyond the cutoff N is significantly localized. Moreover, it will be shown below that the lesser $TCC^{(r)}$ spike at the bandpass edge is a distinct localized behavior which, though it arises from a (weaker) discontinuity associated with the sharp pupil edge, is completely independent of the dominant slope discontinuity that gives rise to the fin.

Figure 17A:
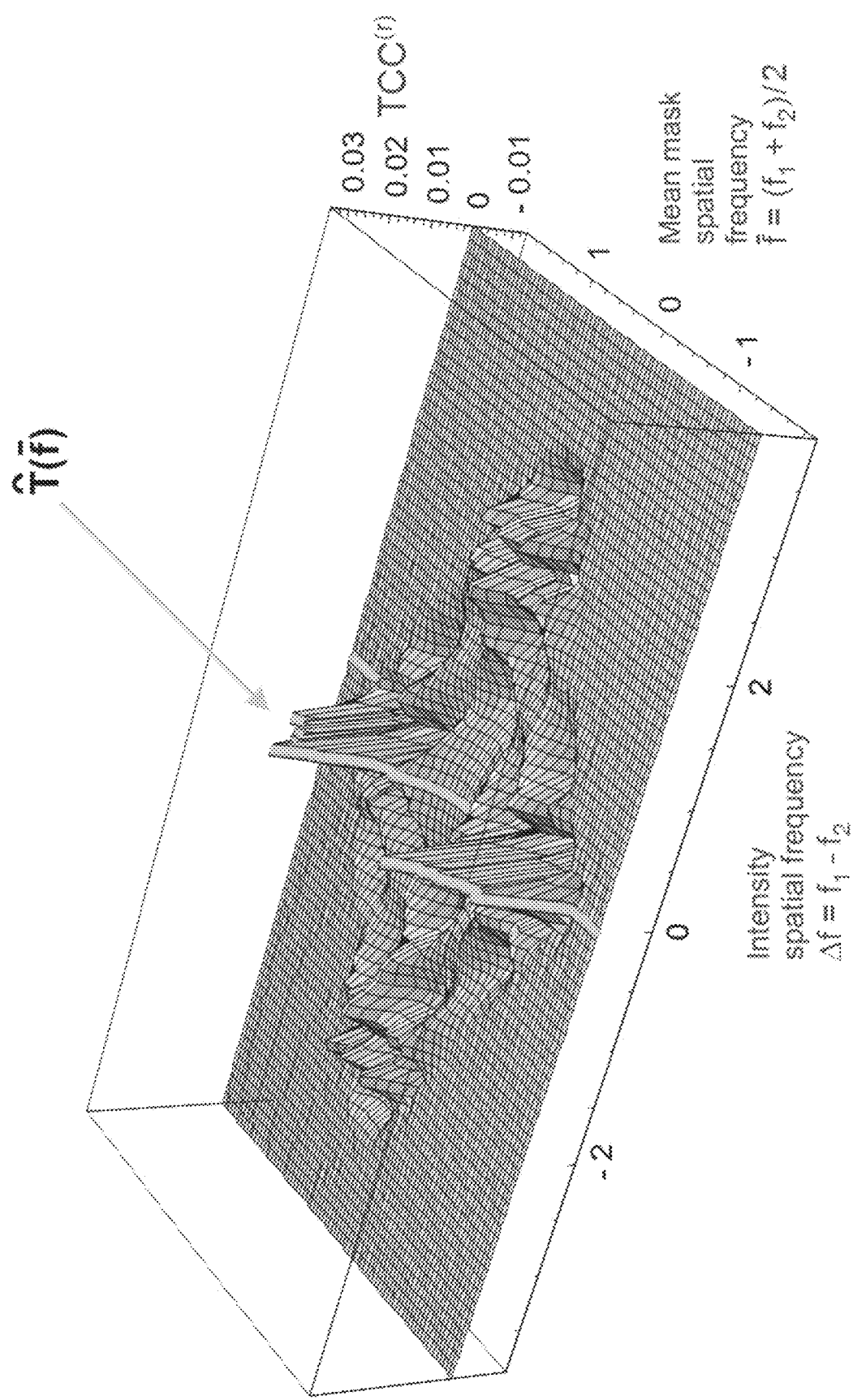
FIGS. 17A and 17B, collectively referred to as FIG. 17, shows how the predominant residual TCC in FIG. 8 from the disk source example can be closely modeled by the kernels of a rotated system.
Figure 17B:
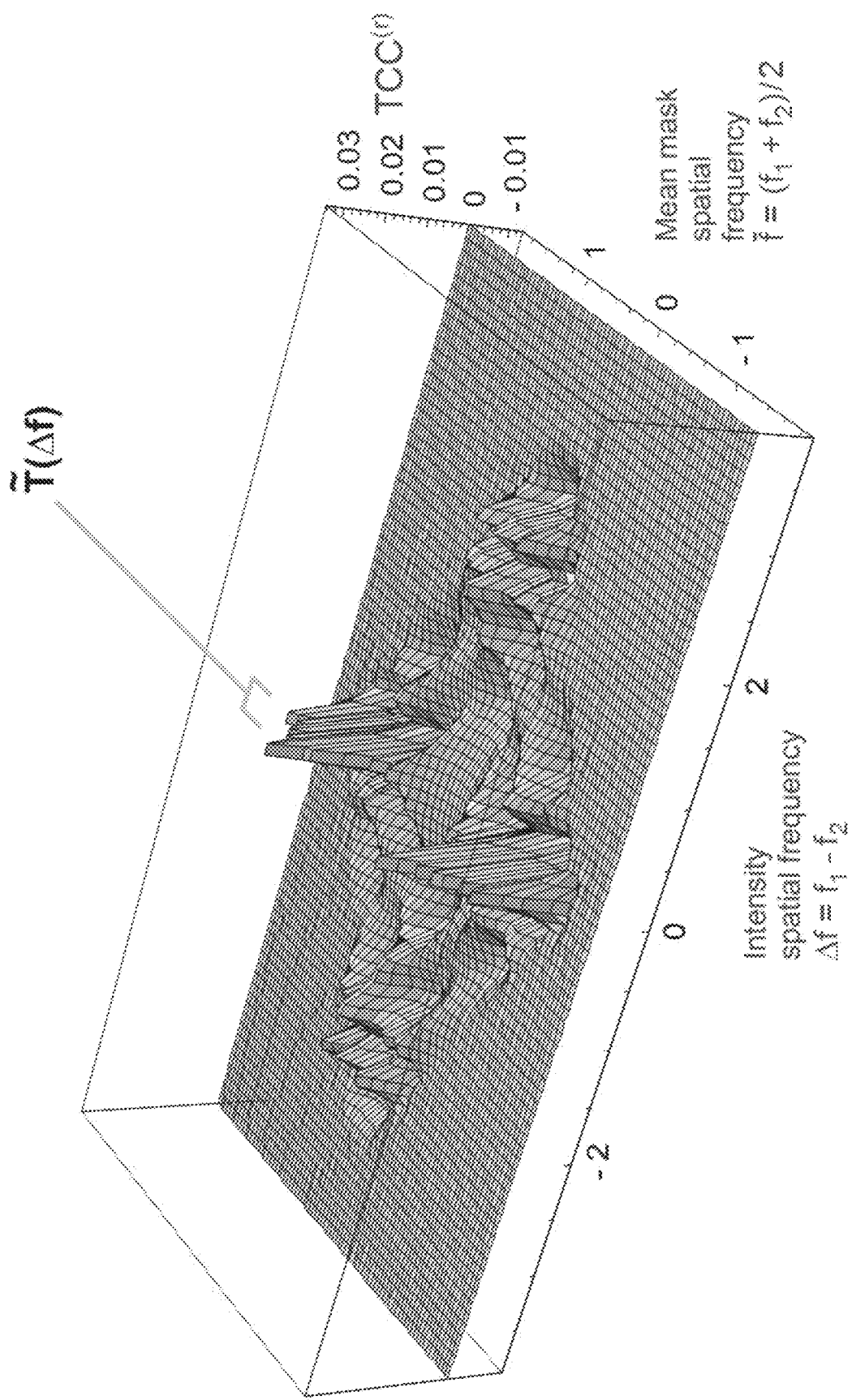

This means that once N has been given an adequately large value, the first $T_{Rotated}$ term ($l=1$ in the FIG. 11A expansion) essentially expresses the behavior of the intrinsically emergent fin, and so can be used to quantitatively express a generic behavior exhibited by the residual TCC. This generic behavior may be regarded as a Gibbs-like phenomenon, in the sense that it is an upswing in error that is triggered at all frequency pairs which involve a particular discontinuity (here a slope-discontinuity), and is largely localized to the vicinity of the discontinuity, and further because it results from a deficit of higher-order terms in an infinite series expansion that is ill-suited to rendering the discontinuity. The association of the rotated system kernels with the fin may be understood more specifically with reference to FIG. 17, which indicates schematically the role of the $\hat{T}$ and $\tilde{T}$ factors in approximating the residual TCC, using the disk-source $TCC^{(r)}$ that was shown previously in FIG. 8 as a non-limiting example. When $TCC^{(r)}$ is modeled with the expression $T_{Rotated}=\hat{T}(\bar{f})\tilde{T}(\Delta f)$, the $\hat{T}$ term essentially represents the frequency-dependence of the overall magnitude of the fin-like deficit in matching the full TCC, and per FIG. 16B this function will approximately be given by the value of $TCC^{(r)}$ along the ridge of the fin, as depicted in FIG. 17A. The TCC deficit will be concentrated within a narrow vicinity of the fin, which the first $T_{Rotated}$ term approximates with what may be regarded as a generic cross-section factor $\tilde{T}(\Delta f)$, as shown in FIG. 17B.

Upon further decomposition, to be discussed, each $T_{Rotated}$ term will be found to yield a new system which will be referred to as a "loxicoherent system", with this loxicoherent system consisting of a paired coherent system and incoherent system operating in sequence, with $\hat{T}$ being decomposed into the first system of the pair, namely a coherent system represented computationally by a bilinear product of coherent aperture functions which will be referred to as mask filters, denoted T', and with each loxicoherent system further comprising a second system which is an incoherent system, represented computationally by what will be referred to as an intensity filter, or intensity kernel, or incoherent kernel (these terms being synonymous), denoted T", with this intensity kernel being essentially a revised version of $\tilde{T}$ that typically will no longer follow FIG. 12G exactly. Much like the first rotated system, the lowest order or primary loxicoherent system continues to reproduce the quantitative details of the generic localized fin behavior, as well as providing a further partial reduction of $TCC^{(r)}$ over the entirety of the Hopkins double domain.

It should be noted that this generic behavior differs in its details from that of the classical Gibbs phenomenon. The latter phenomenon gives rise to a generic localized ripple pattern of quasi-fixed character that, in the inverse-transform domain (e.g. the spatial or time domain), is seen to arise at the vicinity of every sharp edge in a square-type wave, when that wave is reproduced with a truncated series in the Fourier domain, i.e. a Fourier series from which all high orders have been removed. In contrast, when a truncated OCS (i.e. Mercer) series is used to approximately match partially coherent optical images, the associated localized Gibbs-like behavior arises within the frequency domain (i.e. near the creases in the frequency-domain rendition of the TCC) rather than in the inverse-transform domain, and its quasi-fixed character is reflected in the fact that we can approximately reproduce the deficiency arising from the rounded rendering of the crease by making use of only a single $\tilde{T}$ function of fixed shape. While the presence of a weaker spike in $TCC^{(r)}$ near the bandpass edge tends to reduce the accuracy of the approximation made in the equation of FIG. 16B, it will be shown that this weaker spike can largely be extracted from $TCC^{(r)}$ using a separately fitted system, making the equation of FIG. 16B a very accurate approximation for the strongly crease-localized remainder that then results (with an analog of FIG. 16B being applied first in a preferred embodiment, as will be discussed).

Another conclusion that can be drawn from this behavior is that even though the $\tilde{T}$ kernel is determined from $\hat{T}$ as an optimized quantity (via FIG. 12E), it nonetheless only provides a kind of averaged approximation to the fin cross-section (see FIG. 17B), which at finite N will not exhibit perfectly generic behavior. It will be seen that control of the cross-sectional approximation should be considered when applying the invention to the 4D $TCC^{(r)}$. Conversely, even though $\hat{T}$ is only determined in an approximate way when FIG. 16B is used, it nonetheless exactly captures the behavior of the key fin peak, as illustrated in FIG. 17A.

In terms of accuracy and kernel computability, the $T_{Rotated}$ expansion of FIG. 11A provides a successful complement to the Mercer expansion of FIG. 1E, in the sense that the two expansions are well-suited to address the totality of the TCC. (The weaker discontinuity at the $\Delta f$ bandedge may require a third system to closely extract, as will be discussed, but this discontinuity is less resistant to extraction by OCS than is the dominant $\Delta f=0$ fin.) However, the FIG. 11A form of the $T_{Rotated}$ expansion falls far short of the Mercer expansion in a key way, since FIG. 11A provides no immediate analog of the efficient image calculation formulae in FIGS. 1C and 1D. In other words, while inclusion of terms from a rotated decomposition would provide an accurate approximation of $TCC^{(r)}$ due to their efficient capture of the fin residual that is recalcitrant to approximation with the prior art coherent kernels, such terms do not directly provide computational utility for OPC, since FIG. 11A offers no increase in computational efficiency over the basic Hopkins integral shown in the equation of FIG. 1A of FIG. 1. It is the FIG. 1C reduction of the Hopkins equation to a series of fast convolutions that provides the OCS decomposition method with utility for semiconductor manufacture.

It will now be shown that the FIG. 11A expansion is the first part of a full decomposition into what will be referred to as loxicoherent systems, where these loxicoherent systems provide a key practical advantage over the $T_{Rotated}$ expansion by enabling a very efficient image calculation step. As with rotated systems and coherent systems, the loxicoherent systems are formed from kernels whose arguments are of lower dimension than the TCC being decomposed, i.e. 2D when the TCC is 4D. Like the rotated systems (but unlike the prior art coherent systems), each loxicoherent system is characterized computationally by more than one distinct kernel (for example, two distinct kernels in the simplest embodiments, where these two kernels characterize the two different apertures of a paired coherent system and incoherent system that operate in sequence), and in most embodiments the argument of at least one of these kernels is separated along an axis that is not orthogonal to the primary $f_1$ and $f_2$ mask content axes that form the doubled Hopkins domain.

It will further be shown that the first term of the full loxicoherent decomposition usually captures virtually all of the large increase in TCC rendition accuracy that the first $T_{Rotated}$ term provides. It will also be shown that when the $T_{Rotated}$ decomposition is only the first part of a full decomposition into loxicoherent systems, it is preferable in lithographic applications to calculate the first term of the new expansion using FIG. 16B, rather than FIGS. 12F and 12G.

Referring to FIG. 20, the second part of the full decomposition into loxicoherent systems is carried out computationally by decomposing the $\hat{T}(\bar{f})$ factor in each $T_{Rotated}$ term. This will be shown to provide the lens aperture transmission that defines the first constituent paired system of a loxicoherent system, namely the constituent coherent system. (Here the first part of the full decomposition refers to the decomposition of $TCC^{(r)}$ into $T_{Rotated}$. As will be discussed, the second part of the decomposition initially provides the first coherent system in the paired sequence of constituent systems that form the loxicoherent system, with the final step of the decomposition then being the determination of the incoherent system of the paired sequence.) In particular, $\hat{T}(\bar{f})$, which can be regarded as a function of $f_1$ and $f_2$ via $\bar{f} \equiv (f_1+f_2)/2$, is decomposed into terms that are separated along $f_1$ and $f_2$ as bilinear products of a new kernel function denoted T', as shown in FIG. 20A, where FIG. 20A shows how the second part of the loxicoherent system decomposition is carried out on the jth $T_{Rotated}$ term. The decomposition of $\widehat{T}(\bar{f})$ yields at least one coherent system, i.e. this decomposition has the same computational form as a Mercer expansion, meaning that this decomposition could in principle be carried out using an eigendecomposition of $\widehat{T}(\bar{f})$ (considered as a function of the two arguments $f_1$ and $f_2$), e.g., one could carry out an eigendecomposition of a matrix that expressed a gridded sampling of $\widehat{T}(\bar{f})$ along $f_1$ and $f_2$ (which for 1D kernels would be a Hankel matrix, to which specialized eigendecomposition methods may be employed). However, while such a procedure would be appropriate in a context where a decomposition of a TCC into purely coherent systems was sought, the embodiments of this invention make use of novel loxicoherent systems, which in a preferred embodiment each comprise a sequentially paired coherent and incoherent system. A proper decomposition of $\widehat{T}(\bar{f})$ into coherent systems for pairings of this kind is quite efficient, as will be discussed; i.e. a preferred means for decomposing $\widehat{T}(\bar{f})$ will be shown to converge very rapidly in the retained terms of the full loxicoherent systems. In contrast, an independent decomposition into coherent systems (in particular, an eigendecomposition) of an operator like $\widehat{T}$ that has Hankel form will generally be slow to converge, and when carrying out a loxicoherent decomposition it is therefore preferable to take into account the presence of the $\tilde{T}$ factor, which, as will be discussed, has a very strong impact on the optimal choice of the T' kernels. This means that even though the decomposition of $\widehat{T}[(f_1+f_2)/2]$ into at least one coherent system has the form of a truncated Mercer series, the most efficient choice for the terms of this series are not, in general, the usual eigenfunctions of $\widehat{T}$, and in fact will usually depart very substantially from these eigenfunctions. In carrying out the decomposition of $\widehat{T}'$ a specific number K of separated terms is kept. When j is 1 in FIG. 20A it is usually preferable to set K to 1, so that $\widehat{T}$ is decomposed as a single coherent system, with kernel T'. The fact that the interaction of the T' kernel with $\tilde{T}$ will generally cause the optimal T' kernel to depart very substantially from any eigenfunction of $\widehat{T}$ is related to the fact that the constituent coherent and incoherent systems of a loxicoherent system would ordinarily provide an extremely poor fit to $TCC^{(r)}$ if considered individually. It is only as a sequentially operating pair that the constituent systems together provide a close match.

Each term on the right side of FIG. 20A forms the basis of a loxicoherent system. In certain preferred embodiments only a limited number of loxicoherent systems (in most cases a single such system) are extracted from each specific residual TCC. If additional loxicoherent systems are desired, it is preferable to first carry out a new $T_{Rotated}$ expansion on the remaining (i.e. updated) residual TCC, and then to extract further loxicoherent systems from the new $T_{Rotated}$ expansion of the updated $TCC^{(r)}$. In these embodiments each loxicoherent system may be chosen so as to maximally reduce the residual TCC, or to maximally reduce a specified sector of the residual TCC, as will be discussed. In general (but with some exceptions to be discussed), each new loxicoherent system that is deployed will be designed to at least strongly reduce the particular residual TCC that has been left unextracted by application of the preceding coherent and loxicoherent systems. Toward that end, the $\tilde{T}(\Delta f)$ factor may be individually revised within each system in order to maximize the reduction of $TCC^{(r)}$. This is indicated notationally in FIG. 20B of FIG. 20, where the expression therein provided for the lth loxicoherent system includes a new kernel $T''(\Delta f)$ in place of the $\tilde{T}(\Delta f)$ kernel that appears in the right-side of FIG. 20A, reflecting the fact that the $T''(\Delta f)$ kernel may be adjusted away from $\tilde{T}(\Delta f)$ in a way that improves the matching to $TCC^{(r)}$, as will be discussed. This adjustment typically represents the final step in the extraction of a loxicoherent system from $TCC^{(r)}$. Note that in the equation of FIG. 20B and subsequent equations the various loxicoherent system terms will be distinguished by a single index such as l, even though these terms may arise from a nesting of series in the first and second parts of the loxicoherent system decomposition, e.g. from nesting a $T_{Rotated}$ system series extraction indexed by j and a Mercer-form series expansion of $\widehat{T}([f_1+f_1]/2)$ indexed by k. The single l index simply enumerates the various j,k combinations that arise in applying FIG. 20A. It should also be noted that the two-part decomposition of a residual TCC into loxicoherent systems is, in a preferred embodiment, a two-part procedure for extracting a loxicoherent system from a residual TCC, with this procedure then optionally being repeated to extract successive new loxicoherent systems from the residual TCC left behind by each preceding extraction.

Another point to note is that there are embodiments of the invention, to be discussed in detail, in which the separate T" kernels in a plurality of loxicoherent systems are jointly optimized together, in such a way that the loxicoherent systems collectively extract the maximum possible total portion of $TCC^{(r)}$, rather than each T" being optimized as a single constituent kernel function to maximize the extraction provided by its own system.

A key aspect of the loxicoherent system is that it is formed from at least two distinct constituent lens system apertures, represented computationally by at least two distinct kernel functions that specify constituent lens aperture transmissions (or their autocorrelations), such as T' and T", unlike the prior art coherent systems used in OCS, which use a single coherent lens aperture with transmission Ψ, and so are formed computationally by multiplying two copies of the same kernel function Ψ. In the FIG. 20B embodiment each loxicoherent system consists of two constituent systems, the first being coherent and the second incoherent, and the loxicoherent system is represented computationally in FIG. 20B using two kernels; T' is a mask filter specifying the lens aperture transmission of the constituent coherent system, and T" is an intensity kernel specifying the autocorrelation of the lens aperture transmission of the constituent incoherent system, with T" also being referred to as a dose kernel or incoherent kernel. The Fourier transforms of T' and T" are spatial-domain functions, denoted t' and t". The combined right-side term of FIG. 20B describes the contribution made by the loxicoherent system in matching the TCC, and for simplicity the right-side of the equation of FIG. 20B can itself be referred to as a loxicoherent system. The roles of T' as the aperture transmission of a constituent coherent system and T" as the autocorrelation of a constituent incoherent system aperture will be shown to follow immediately from the mathematical structure of a loxicoherent system match to $TCC^{(r)}$.

It will now be shown that these loxicoherent systems differ from coherent systems in a number of ways; for example they employ two constituent imaging stages operating in sequence, with the first of these stages (a coherent system) using the amplitude transmitted by the mask object (coherently illuminated) as input, but with the second system of the sequence (an incoherent system) using, as an incoherent input, the intensity generated by the image that is output from the first constituent system. The embodiments of this invention then compute the output of the incoherent system, and use this output as one (loxicoherent) contribution to the intensity with which the partially coherent image intensity from the lithographic system is approximately matched, further using this matching intensity to process the incoming frames of mask data, as will be discussed.

In accordance with well-known theory, each computation of an incoherent intensity is made by convolving the input intensity pattern (which in this case is the image intensity produced by the paired coherent system) with a kernel (e.g. t'') that represents the squared inverse Fourier transform of the transmission of the incoherent system lens aperture, which is mathematically equivalent to the inverse transform of the autocorrelation of the incoherent system aperture. Only the computed intensity is required, but in physical terms the output image from the coherent system becomes incoherent if it passes through a fine diffuser, or if it excites self-luminous emission from the image-plane medium (which is the object-plane medium for the incoherent constituent system). When employed in accordance with the invention the loxicoherent kernels provide a computationally fast and comparatively accurate estimate of the image contribution made by the residual TCC (TCC$^{(r)}$), with this computational speed benefit successfully overcoming a critical limitation of the $T_{Rotated}$ systems. The conventional approach of accounting for the residual image contribution by increasing the number of coherent systems N in an OCS expansion will be shown to require significantly more computation than do loxicoherent systems in order to attain a comparable accuracy. It will also be shown that in many cases one can efficiently gain a further improvement in accuracy by supplementing the first loxicoherent system with what will be termed a DC-monolinear system.

Equations 8C through 8I relate to the efficient calculation of contributions made by loxicoherent systems in matching partially coherent images. The intensity error $\Delta I^{(r)}(x)$ from truncating the OCS expansion with N coherent systems is given by FIG. 20C, which has the same form as the typical frequency-domain Hopkins equation (FIG. 1D), but with the full TCC being replaced by the residual unaccounted-for portion of the TCC, i.e., by TCC$^{(r)}$. In one preferred embodiment each successive loxicoherent system is chosen to strongly match the remaining TCC$^{(r)}$, so the intensity error $\Delta I^{(r)}(x)$ is well approximated by replacing TCC$^{(r)}$ in FIG. 20C with the equation of FIG. 20B, to obtain FIG. 20D. The structure of FIG. 20D shows that the intensity contribution provided by the lth loxicoherent system results from an integration over the doubled Hopkins domain of the mask, in this case the doubled frequency domain consisting of all pairs of mask amplitude frequencies $f_1$ and $f_2$, with each amplitude frequency being passed through a coherent system lens aperture that has transmission T', thus producing an intensity modulation component when the amplitudes at the two frequencies interfere after being transmitted by the constituent coherent system to the coherent system image plane, this interference intensity component being modulated at the difference frequency $f_1-f_2$. The constituent incoherent system then transmits this intensity modulation to the output of the loxicoherent system, with the intensity transmission being given by T''$_l(f_1-f_2)$. In the image plane this intensity modulation oscillates spatially, as specified by the factor $e^{2\pi i(f_1-f_2)x}$.

The paired coherent and incoherent constituent systems operate in sequence, so that computationally the coherent system is accounted for first. If one applies the T' mask filter to the mask spectrum M (i.e. to the Fourier transform of the mask patterns), thereby representing computationally the transmission of the mask amplitude through the constituent coherent system of the loxicoherent system (in this case the lth loxicoherent system), one obtains the filtered version M' of the mask spectrum defined by FIG. 20E. By substituting M' into the equation of FIG. 20D, one obtains, after switching the variables of integration to the rotated axes $\bar{f}$ and $\Delta f$, the FIG. 20F expression for the image contribution provided by the lth loxicoherent system. FIG. 20F is partially separated in the rotated variables, making the $\bar{f}$ integration equivalent to an autocorrelation of the filtered mask spectrum, thus allowing the equation of FIG. 20F to be written in the form of FIG. 20G, where the star denotes autocorrelation.

By applying Fourier identities to the FIG. 20G frequency domain expression, and then taking the inverse transforms of the right sides of FIGS. 20G and 20E, FIG. 20H is obtained. FIG. 20H describes mathematically a new form of image decomposition, with the second term of FIG. 20H being the loxicoherent contribution, or more precisely the contribution from the employed set of loxicoherent systems, which are L in number. This second term is a sum over the inverse transforms of each FIG. 20G term. In FIG. 20H t' and t'' denote the inverse transforms of T' and T''. The N terms in the first summation of FIG. 20H represent standard coherent system terms, namely the OCS terms whose residual intensity error $\Delta I^{(r)}(x)$ is defined by the equation of FIG. 20C, while the L terms in the second summation provide the contributions from the new loxicoherent systems that closely match $\Delta I^{(r)}(x)$. Each convolution in FIG. 20H can be approximated by Fast Fourier Transform on the usual sub-Nyquist sampling grids used in computational lithography, providing near-linear area scaling in the overall image calculation.

Two convolutions over the simulation field are used to obtain each loxicoherent system contribution in FIG. 20H, whereas a prior art coherent system requires only a single convolution. However, when L is small the two additional convolutions in each loxicoherent system term of FIG. 20H provide a much greater accuracy improvement than would be obtained by adding two additional OCS kernels to the standard OCS expansion, as will be shown. It should be noted that these conclusions generally apply to two-dimensional mask patterns, i.e., mask patterns which are functions of both x and y coordinates, even though for simplicity the FIG. 20 equations only refer to a single mask coordinate x. Certain considerations particular to 2D patterns are discussed below.

The left summation in FIG. 20H uses coherent systems, and the lens apertures of these coherent systems (defined by their transmission functions $\Psi(f)$, or the inverse Fourier transforms $\psi(x)$ of these transmission functions) can be chosen by prior art methods, e.g., as the TCC eigenfunctions used in standard OCS. The set of coherent systems employed by the invention will be referred to as the coherent system set.

In preferred embodiments the number of systems N in the coherent system set will be of the same order of magnitude as the number of coherent systems employed by prior art OCS, e.g., N will generally be in the range of 10 to 100.

However, it is possible in principle for N to be 0. Moreover, from a fundamental point of view one can readily construct computationally a loxicoherent system that will match the behavior of any given coherent system (such as one of the coherent systems in the left summation of FIG. 20H), since the constituent incoherent system of a loxicoherent system can be given a fully open and corrected numerical aperture that is much larger than that of the constituent coherent system, i.e. the constituent incoherent system can be given a much higher resolution than the constituent coherent system, so that the intensity produced by the constituent coherent system is essentially transferred to the loxicoherent system output without further change. In that sense any coherent system could be regarded as merely a special-case loxicoherent system, and thus all of the image decomposition systems employed by the invention could be said to be loxicoherent systems, including those of the coherent system set. However, it would clearly be inefficient to actually expend compute resources on convolution with incoherent system kernels that merely produce a duplicative transfer, and the use of purely coherent systems is well-known in the art. Since the loxicoherent systems employed by the invention are novel, this invention description will continue to distinguish between the purely coherent systems of the coherent system set and the irreducibly loxicoherent systems of the loxicoherent system set. However, it should be understood that there are embodiments of the invention which do not use coherent system sets per se.

The intensity contribution from each loxicoherent system (e.g. in the right summation of FIG. 20H) should be real-valued, and in a preferred embodiment each t" spatial domain incoherent kernel is likewise real-valued. Although the total intensity must be non-negative, it is possible for individual loxicoherent systems in the expansion to make negative contributions, and since the t' convolutions are squared these negative contributions will arise from strongly negative regions in t". As will be discussed, it is commonly the case that the predominant residual content in $TCC^{(r)}$ shows a rapid dependence on $\Delta f$, but only a more gradual variation along $\bar{f}$, i.e., the typical content of $TCC^{(r)}$ tends to be laid out in "ripples" that lie along contours of $\Delta f$. This is, of course, strongly true of the pronounced fin along $\Delta f=0$ that dominates $TCC^{(r)}$ before extraction of the first loxicoherent system, but it generally remains true to a lesser degree after the first loxicoherent system has been extracted, i.e., when subsequent loxicoherent systems are extracted. These remaining "ripples" or ridges will be considerably weaker than the removed fin along $\Delta f=0$, and if $l \geq 2$ there will generally be no single remaining ripple that predominates over the other ripples to the same degree that the $\Delta f=0$ fin did before being extracted by the l=1 loxicoherent system. For this reason we may refer to the first loxicoherent system as the "primary loxicoherent system", or sometimes as the "first-order loxicoherent system".

If the sign of $TCC^{(r)}$ in the frequency domain can be approximated as being only a function of $\Delta f$ and not of $\bar{f}$, it can be advantageous to encode the sign of the loxicoherent contribution in the sign taken on by $T"(\Delta f)$ as $\Delta f$ changes. However, the T' kernels are functions of $f_1$ and $f_2$ in the loxicoherent system, not $\bar{f}$, and as a result it will usually not be possible to have a fully consistent sign encoding across multiple ridges, making it eventually desirable to resort to multiple additional loxicoherent systems. A savings in compute time is nonetheless possible when these multiple ridges have a predominantly "diagonal" or "slanted" orientation along contours of $\Delta f$, since this allows the specialized form of the loxicoherent expansion shown in FIG. 20I to be employed, wherein some coherent system inputs (which may be the input from a single coherent system, if $R_l^{(+)}$ is 1) to the lth incoherent system are given a positive sign, while other coherent system inputs (or single input, if $R_l^{(-)}$ is 1) to the lth incoherent system contribute with a negative sign. (Here "diagonal" and "slanted" should be understood as referring to a concentration along $f_1$–$f_2$ contours due to previous relative exhaustion by OCS of content that is well-aligned with $f_1$ or $f_2$, even though "diagonal" might arguably be appropriate in a literal sense only for 1D patterns.) FIG. 20I can be regarded as a special case of FIG. 20H in which the t" kernel for some systems is equal and opposite to the t" kernel of other systems, allowing them to be grouped as in FIG. 20I. When such a pairing is enforced explicitly, as in FIG. 20I, one need only carry out a single t" convolution for the grouped terms, resulting in an efficiency improvement. When the compute-efficient pairing is determined by the sign of the contribution made by different ridges to $TCC^{(r)}$, the resulting loss in matching accuracy is often quite minor.

The set of loxicoherent systems used in the embodiment described computationally by FIG. 20H (these loxicoherent systems being the L terms of the second summation appearing in this equation) are well adapted to matching the TCC portions that are poorly matched by the coherent system set that is also employed in this embodiment (the latter being represented by the N OCS terms in the first summation appearing in FIG. 20H). Moreover, when determining the T' and T" kernels it is particularly desirable that $TCC^{(r)}$ be matched accurately at $\Delta f=0$, not only because the residual error from the N OCS terms in the first summation of FIG. 20H is largest there, but also because the DC harmonics associated with this portion of the TCC have a particularly deleterious effect on the accuracy of lithographic image calculations, as will be discussed. In basic embodiments each loxicoherent system is preferably constructed to reduce the remaining TCC error as strongly as possible, and, as will be discussed, it is further desirable that both the first loxicoherent system (represented computationally by $T_{Loxicoherent,1}$), and the first rotated system $T_{Rotated,1}$ from which $T_{Loxicoherent,1}$ is derived, be designed to fully eliminate $TCC^{(r)}$ at DC intensity harmonics where $\Delta f=0$, while in addition minimizing $TCC^{(r)}$ throughout the doubled Hopkins domain, subject to this DC-matching requirement. Loxicoherent systems can meet both goals simultaneously, since they contain two independently optimizable constituent lens system apertures, i.e. two independently optimizable kernel functions.

Figure 21:
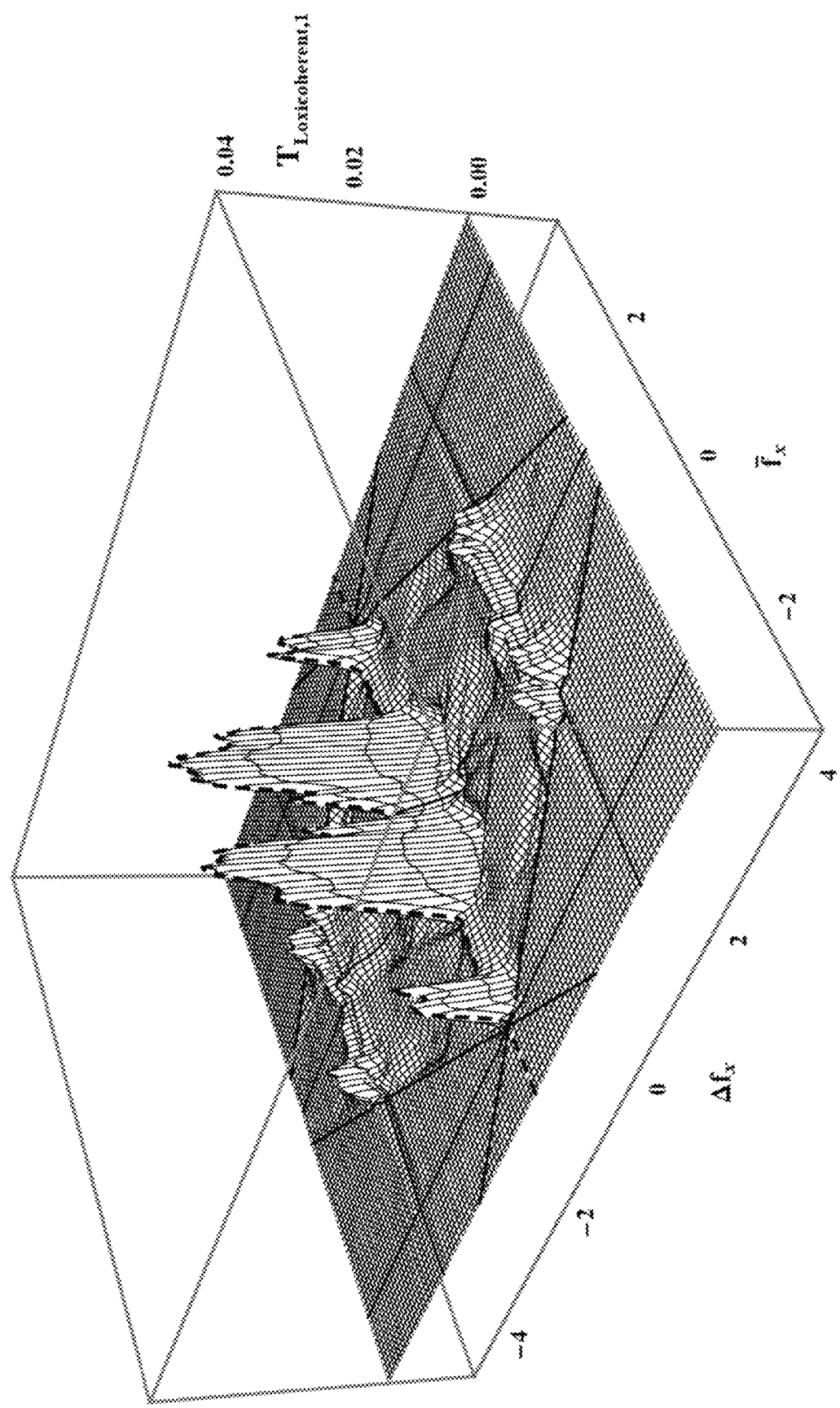
FIG. 21 shows a plot of a loxicoherent system response that best approximates the TCC residual shown in FIG. 14 for the C-quad source example.

An example illustrating these points is presented in FIG. 21, which shows a first loxicoherent system that has been extracted from (and is a best approximation to) the $TCC^{(r)}$ shown in FIG. 14. Comparison of the two figures shows that even the single loxicoherent system depicted in FIG. 21 provides on its own a reasonably close match to the residual TCC left unmatched by N=24 optimal coherent systems (FIG. 14). Depictions like FIGS. 14 and 21 can only show $TCC^{(r)}$ within a sub-manifold of limited dimension; in particular, they depict the 2D slice from the full 4D $TCC^{(r)}$ that governs the imaging of 1D patterns. However, even though FIG. 21 can only show this limited 2D slice, the first loxicoherent system that is partially depicted will approximately match a large portion of the full 4D $TCC^{(r)}$ of which FIG. 14 is a 2D slice; in particular, the first loxicoherent system partially depicted in FIG. 21 will be shown below to closely approximate the residual TCC over a full quadrant of the doubly-dimensioned Hopkins domain. It will further be shown that the FIG. 21 loxicoherent system exactly matches the FIG. 14 TCC$^{(r)}$ at $\Delta f=0$, absent small numerical errors. In addition to this exact matching at the fin peak, comparison of FIG. 21 with FIG. 14 illustrates that the single loxicoherent system also provides a close overall rendition of TCC$^{(r)}$ throughout the doubled Hopkins domain (though in 2D a matching as broad as this may require four loxicoherent systems instead of one, e.g. one system for each quadrant of the full Hopkins domain). The improvement in image accuracy that results from use of such loxicoherent systems will be discussed and illustrated below. In brief, the discussion above in connection with FIG. 1A shows that when the novel decomposition employed by the invention is able to accurately match the TCC of a lithographic imaging system, the invention will as a result be able to accurately match the images formed by the lithographic system, allowing the invention to provide accurate dimensional compensation to the mask shapes that the lithographic system projects.

Having demonstrated via FIG. 20 and associated discussion that the novel loxicoherent systems of the invention can be applied very rapidly to calculate image contributions from particular frames of mask data, and having shown (in a preliminary way, at this point) that the decomposition systems of the invention can match lithographic systems with greater accuracy and efficiency than prior art coherent systems, the question of determining specific loxicoherent systems that suitably match a particular lithographic system is next considered. FIG. 22 describes steps by which T' and T'' may be constructed to achieve an essentially optimal TCC$^{(r)}$ reduction. As a starting point, FIG. 22A indicates that $T_{Rotated,1}$ should approximate TCC$^{(r)}$ as closely as possible, and that in a preferred embodiment a single $T_{Loxicoherent,1}$ term should be constructed from $T_{Rotated,1}$ that best retains this close approximation. The right-side expression in FIG. 22A writes out the computational factors in $T_{Loxicoherent,1}$ explicitly, representing the physical structure of this system as a constituent coherent system (represented by T' twice repeated) that is paired with a constituent incoherent system (represented by T''). Prior to extraction of the first $T_{Rotated}$ term, the residual TCC will be strongly concentrated in close vicinity to the $\Delta f=0$ "fin ridge", and may be considered to have near-negligible value elsewhere. This means that when $T_{Rotated,1}$ is matched to TCC$^{(r)}$, $\tilde{T}(\Delta f)$ will typically be close to zero at frequency pairs whose distance from the fin is appreciable in comparison with the structural scale in the illumination coherence pattern, or the lens resolution. The equation of FIG. 22A expresses this behavior quantitatively, defining the lens resolution as being comparable to the ratio of the numerical aperture (NA) to the wavelength, and then defining the associated range of relevant (fin-impacted) frequencies (in inverse-distance units) as the reciprocal of this quantity. Since $\tilde{T}$ and $T_{Rotated,1}$ fall to zero at large $\Delta f$ in matching fashion, $T_{Rotated,1}$ will provide a good overall approximation to TCC$^{(r)}$ if $\widehat{T}^{(1)}$ is determined from TCC$^{(r)}$ in the vicinity of the fin. The value attained by $\widehat{T}$ at larger distances from the fin will not significantly impact the fit quality, because at such points a properly set $\tilde{T}$ will ensure that $T_{Rotated}$ takes on a suitably low value to match TCC$^{(r)}$, making the fit insensitive to the value of $\widehat{T}$.

Beyond these general considerations, it is highly desirable in fast calculations of lithographic images that any approximate rendering of TCC$^{(r)}$ provide a particularly close matching at $\Delta f=0$, since, as will be discussed, image accuracy is usually quite sensitive to the accuracy with which this portion of the TCC is rendered.

FIGS. 22C, 22D, and 22E explain properties of TCC$^{(r)}$ and $\widehat{T}^{(1)}$ that aid this matching. In particular, the first line of FIG. 22C considers the FIG. 1E Mercer series in the theoretical limit where an infinite number of kernels is used, deriving from it in the second line an exact series expression for the residual TCC after N OCS systems have been extracted. As discussed, we can arbitrarily set the scale of $\widehat{T}^{(1)}$ by choosing $\widehat{T}^{(1)}(0)=1$, and from FIG. 16B we see that $T_{Rotated,1}$ will exactly fit TCC$^{(r)}$ at $\Delta f=0$ if we then set $\widehat{T}$ equal to TCC$^{(r)}$ along the "ridge of the fin", i.e. set $\widehat{T}$ to match TCC$^{(r)}$ at $f_1=f_2=\bar{f}$. FIG. 22D shows how such an assignment can be related to the frequency-domain OCS kernels by substituting from the equation of FIG. 22C. In particular, FIG. 22D shows that $\widehat{T}^{(1)}$ will be equal to the sum of the squares of those OCS kernels that constitute the residual TCC (these excluded kernels having been discarded when the employed set of N coherent systems was chosen).

As a sum of squares, $\widehat{T}^{(1)}(\bar{f})$ will be a real-valued and non-negative quantity, a property expressed algebraically in FIG. 22E. FIG. 22E also notes that TCC$^{(r)}$ will likewise be real-valued and non-negative along the ridge of the fin.

The non-negativity property of the $\widehat{T}$ kernel will next be used in the specific numerical determination of $\widehat{T}$ as a function of $\bar{f}$. It has been shown in connection with FIG. 16B that, for the first rotated kernel, $\widehat{T}$ at a particular mean-frequency $\bar{f}=(f_1+f_2)/2$ should be set equal to TCC$^{(r)}(\bar{f},\bar{f})$, i.e. to the residual TCC value along the fin ridge at this same mean frequency. Also, FIG. 22B indicates that $\tilde{T}$ will typically suppress whatever contribution $\widehat{T}$ happens to make, except in regions where $f_1 \cong f_2$, which means that the values taken on by $\widehat{T}$ are, for the most part, only relevant when $f_1 \cong f_2$ (though $f_1$ and $f_2$ need not be exactly equal). This justifies a general application of the result shown in the first line of FIG. 22F, which points out that when $f_1$ and $f_2$ are reasonably close to each other, the TCC$^{(r)}$ value along the fin ridge at the arithmetic mean of these two frequencies will be very close numerically to the geometric mean of the two values taken on by TCC$^{(r)}$ at these two nearby frequency locations along the ridge. At other locations where $f_1$ and $f_2$ are strongly different we expect the rotated system to suppress any significant contribution, since $\tilde{T}$ will be very small at such locations (per FIG. 22B). Conversely, at frequency pairs where $\tilde{T}$ allows $\widehat{T}$ to make a significant contribution, FIG. 22F points out that the value of TCC$^{(r)}$ when both its arguments are set to the (arithmetic) mean frequency $(f_1+f_2)/2$ will be very close to the geometric mean of the two TCC$^{(r)}$ values obtained by setting both arguments first to $f_1$, and then to $f_2$. This follows because TCC$^{(r)}$ exhibits only finite curvature along $\bar{f}$ meridians, such as along the ridge of the fin, even though its curvature along the orthogonal $\Delta f$ meridians is essentially infinite at $\Delta f=0$ (per FIGS. 5B and 5C). As a result, the value that TCC$^{(r)}$ takes on at the ridge location where both its arguments are equal to the arithmetic mean of $f_1$ and $f_2$ will be approximately equal to the geometric mean of the TCC$^{(r)}$ ridge values at $f_1$ and $f_2$, assuming that the $\{f_1, f_2\}$ frequency pair is one at which $\tilde{T}(\Delta f)$ is significant, i.e. that $f_1 \cong f_2$. (Only frequency pairs at which $\tilde{T}(\Delta f)$ is significant are important in setting $\widehat{T}(\bar{f})$, i.e. we need to match TCC$^{(r)}$ in the vicinity of the fin.) Note that although the $TCC^{(r)}$ factors arising in the first line of FIG. 22F are being evaluated along the fin ridge, i.e. with the same frequency being used for both the first and second argument of the $TCC^{(r)}$ function, the two frequencies $f_1$ and $f_2$ under consideration are generally not exactly equal, though FIG. 22B shows that these two frequencies will not be greatly different when the numerical contribution of $T_{Rotated,1}$ has significant magnitude. In other words, the frequency pairs of interest for determining $\widehat{T}$ are those lying within the fin or its vicinity, since $\widetilde{T}$ can be relied on to block contribution by $\widehat{T}$ at large distances from the fin, thereby achieving an appropriately small value for $T_{Rotated}$ away from the fin where $TCC^{(r)}$ is likewise small; for this reason $\widetilde{T}$ makes the value taken on by $\widehat{T}$ unimportant away from the fin. Nonetheless, it should be understood that the relevant frequencies need not reside exactly on the fin peak. Though $TCC^{(r)}[f_1, f_2]$ will generally exhibit rapid variations in the fin region of the Hopkins domain, the variation along the arc connecting the particular frequency pairs used in the first line of FIG. 22F will be more gradual, making the approximation in the first line of FIG. 22F very accurate. Moreover, this approximation will be exact for the most critical frequency pairs, namely those which do lie along the fin ridge, where $f_1=f_2$. This latter point means that even though FIG. 22F involves an approximation, the loxicoherent system generated from FIG. 22F achieves a near-optimal extraction of $TCC^{(r)}$, as will be shown.

The second line of FIG. 22F then substitutes from the first part of FIG. 22D, and the third line makes the further modification of replacing $TCC^{(r)}(f_2, f_2)$ by its complex conjugate, which is a valid substitution according to FIG. 22E.

The next step in a preferred approach for obtaining the first loxicoherent system is to use FIG. 22F to express $T_{Rotated,1}$ in a form exhibiting the general loxicoherent structure shown in FIG. 20B, which essentially means decomposing $\widehat{T}^{(1)}(f)$ into suitable separated T' functions of $f_1$ and $f_2$. The first two lines of FIG. 22G express this decomposition, including substitution from the last line of FIG. 22F. Note that the last line of FIG. 22F already achieves a separation of $\widehat{T}$. This means that the first approximation in the second line of FIG. 22G (based on substitution from FIG. 22F) already provides a structure that qualifies as a loxicoherent system; however the right side of the second line indicates that because this interim system is not yet fully developed, T" should only be regarded as being implicitly determined pending further refinement, meaning more specifically that in a preferred embodiment T" will be chosen in such a way as to make $T_{Loxicoherent,1}$ as accurate a rendition of $TCC^{(r)}$ as possible, and indicating more generally that the optimum T" will therefore be different from the optimal $\widetilde{T}$, as will be discussed.

If on this basis one identifies T' with the square root of $TCC^{(r)}$ along the peak of the fin, as expressed in the third line of FIG. 22G, the resulting loxicoherent system will exactly match $TCC^{(r)}$ along the critical $\Delta f=0$ fin peak, assuming the normalization choice T"(0)=1. The third line of FIG. 22G thus represents a preferred method for determining the first T' mask filter, thus defining the constituent coherent system of the first or primary loxicoherent system ($T_{Loxicoherent,1}$) that is employed by the invention. In brief, the equation of FIG. 22G decomposes the $T_{Rotated}$ kernel which lies along the rotated axis $(f_1-f_2)/2$ into a separated bilinear product of the T' mask filters, namely $T'(f_1) T'(f_2)$.

To complete the determination of $T_{Loxicoherent, 1}$, we should preferably choose a T" kernel that optimally takes into account the change made by replacing $\widehat{T}$ in the rotated system precursor with a separated pair of T' kernels. FIG. 22G guarantees the key property that $T_{Loxicoherent, 1}$ match $TCC^{(r)}$ on the ridge of the fin, as long as T"(0) is set to 1. T" at other values of $\Delta f$ can then be chosen in such a way as to optimize the matching of $T_{Loxicoherent, 1}$ to the remaining regions of $TCC^{(r)}$ (i.e. the regions where $\Delta f \neq 0$).

FIG. 22H provides a least-squares metric $E_{Filter}$ to accomplish this matching, with the matching criterion being the minimization of $E_{Filter}$ with respect to differential variations in the function T"(f) at the optimum. In particular, $E_{Filter}$ at the optimum (i.e., at minimum matching error) should exhibit no first order change when small variations are introduced in T", with these variations having the form shown in FIG. 22I. The δ-function perturbation in FIG. 22F is introduced at an arbitrary location $\Delta f_{pert}$, i.e. at $\Delta f=\Delta f_{pert}$.

Another consideration here is that the loxicoherent system is inherently unable to match any $TCC^{(r)}$ value with non-zero magnitude that may happen to arise at a frequency pair where either one of the T' factors in FIG. 22H is zero. Thus, if there is a $\Delta f$ value with the property that $T'(f_1)$ and/or $T'(f_2)$ is zero for every $\{f_1, f_2\}$ frequency pair having this $\Delta f$ difference, then $E_{Filter}$ will automatically be stationary, and T" should preferably be set to zero at this $\Delta f$ value. To identify such conditions a windowing function D(f) has been introduced in FIG. 22H. In some embodiments, D(f) is defined to be 1 whenever T'(f) has appreciable magnitude, and 0 whenever T'(f) is 0. Alternatively, D(f) may be set to 0 whenever the magnitude of T'(f) falls below a designated small threshold. Other useful designs for window D(f) will be discussed in the context of matching the 4D TCC that governs 2D patterns.

In the special case where the $D(f_1)D(f_2)$ product in FIG. 22H is everywhere zero for some particular value of $f_1-f_2$, $T"(f_1-f_2)$ can be set to zero by definition. Ordinarily this special circumstance does not apply, and it then becomes straightforward to invert the condition of stationarity in $E_{Filter}$ to solve for T", using steps that are broadly similar to those discussed in connection with FIG. 12. The resulting solution is shown in FIG. 22J.

The equation of FIG. 22J has been generalized to include a parameter p, whose value can be set to 1 if strict minimization of $E_{Filter}$ is sought. However, parameter p can also be set to a lower value, such as 0, if one seeks a T"($\Delta f$) solution with reduced content at large |$\Delta f$|. Although the p=1 direct solution to the minimization will yield an accurate calculation of the image intensity via FIG. 20H, it is possible in principle for the equation of FIG. 20H to yield small negative intensity values in very dark areas of the image. While such values do not represent a large error in numerical terms (since the loxicoherent system in fact acts to reduce the absolute error), and are quite rare, it may be considered preferable to ensure that all intensities are non-negative. A simple way to achieve this is to threshold I(x) to be nowhere below zero. However the possibility of small negative intensities can be rendered more remote by lowering parameter p. Setting p to zero corresponds to determining T"($\Delta f$) by matching the averages of $TCC^{(r)}$ and the T' product along each contour of constant $\Delta f$. With any choice of p between 0 and 1, the loxicoherent kernel $T_1"(\Delta f)$ for the first loxicoherent system will typically have a similar shape to $\widetilde{T}_1(\Delta f)$, and will be strongly peaked at $\Delta f=0$.

When applying FIG. 22H to the first loxicoherent kernel it may not be necessary to include the D factors (i.e., the D factors may simply be considered to have value 1 throughout the bandwidth), but it should be noted that FIG. 22J is applicable to other loxicoherent kernels beyond the first. For example, it will be shown that the D factors can be useful when calculating multiple sets of loxicoherent systems for 2D spatial frequency pairs (i.e., for the 4D TCC).

It should also be noted that even though the method of FIG. 22 sets T' in order to provide a good match to $TCC^{(r)}$ in the vicinity of the fin, FIG. 22J optimizes T" to provide a good match to $TCC^{(r)}$ throughout the doubled Hopkins domain. While a prior art coherent kernel might be considered to achieve an analogously optimal match over the doubled domain, in the sense that the TCC eigenfunctions Ψ are the optimal aperture choice for overall RMS matching of the TCC using coherent systems, the prior art coherent kernels are unable to accurately match the crease region of the TCC. In contrast, loxicoherent systems in accordance with embodiments of this invention have a richer structure comprising at least two distinct kernel functions, and this richer structure allows them to provide both advantages simultaneously.

Figure 23:
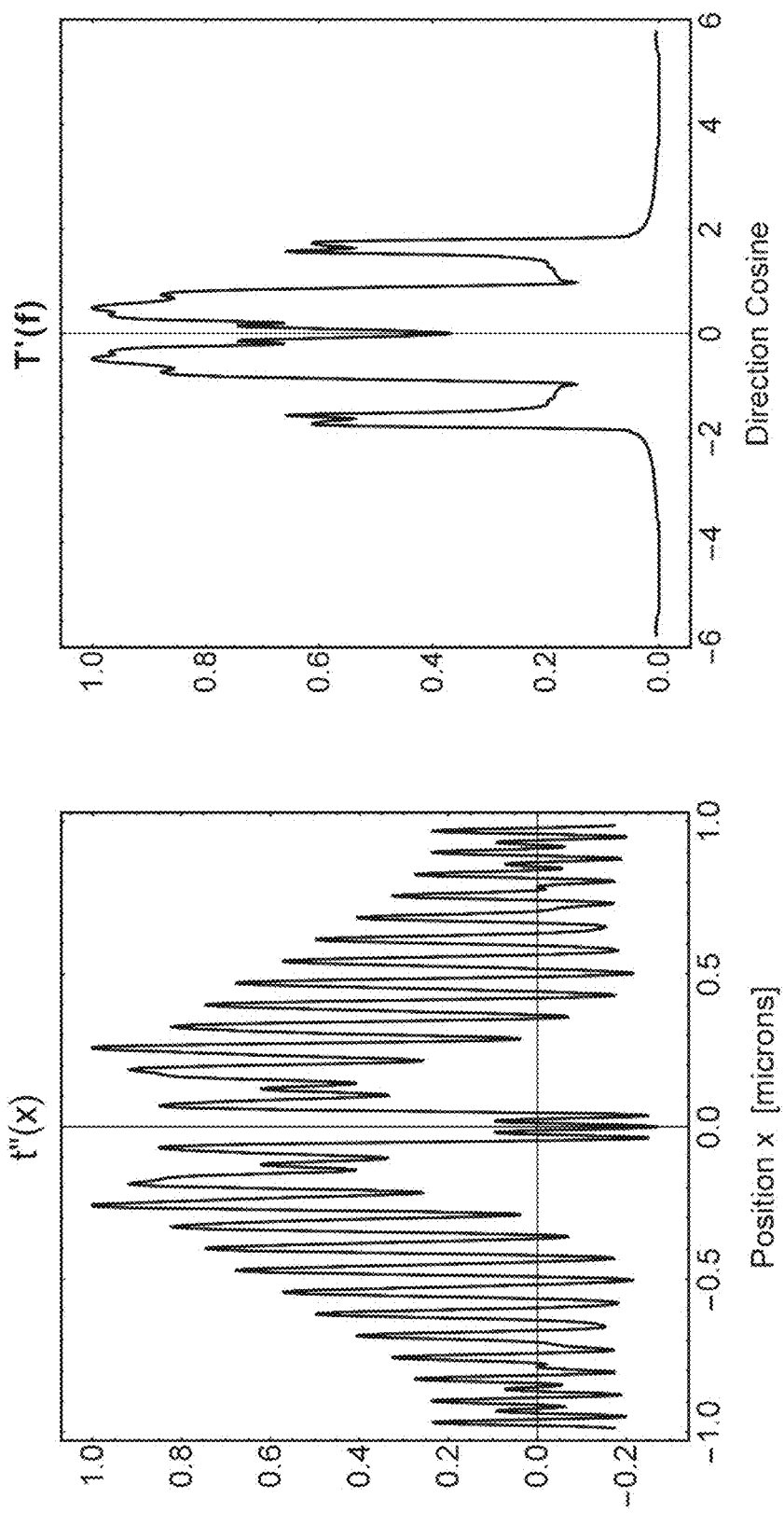
FIG. 23 depicts two plots showing loxicoherent filter kernels calculated by applying equations of FIGS. 22G and 22J on a discrete grid, with parameter p set to 0.

FIG. 23 depicts two plots showing the loxicoherent kernel t" and mask filter T' obtained using the FIG. 22 method, for the C-quad test case discussed previously, which employs the source shown in FIG. 9B. The T" kernel was calculated with p set to 1 in FIG. 22J. The inputs to FIGS. 22G and 22J were obtained from the $TCC^{(r)}$ kernel shown in FIG. 14, which was also used to obtain the $T_{Rotated}$ system shown in FIG. 13. (In addition, the FIG. 23 kernels are used in example image simulations discussed below.) FIG. 23 shows t" in the spatial domain, and the plot illustrates that loxicoherent t" kernels have a characteristic scale that is considerably broader than the lens resolution, often being only slightly smaller than the size of the optical ambit, which in this non-limiting example is 2 microns. The mask filter T' exhibits a complicated dependence on spatial frequency, determined primarily by the source shape, as will be discussed.

Application of a loxicoherent system (e.g., calculating and applying the l=1 term of the second sum in FIG. 20H) might be considered to bear some analogy with a generic calculation of incoherent optical flare, in the limited operational sense that both procedures involve the convolution of a kernel having broad spatial extent with a quadratic function of the mask pattern (though t" for a loxicoherent system is generally much less extended than typical optical flare kernels, and in addition the result of the squared t' convolution has little resemblance to the lithographic image intensity which drives flare, since the circular aperture of the lithographic lens is very different from the T' aperture of the constituent coherent optical system, and because the lithographic image is produced with a partially coherent source). Since the first loxicoherent system maps $TCC^{(r)}$ quite closely, it could be said that OCS truncation error is somewhat flare-like in its behavior. However, it should be noted that the OCS truncation error has only a broad resemblance to flare or dose error. First, the t'(x) pre-filter has a strong frequency dependence which differs very substantially from that of OCS kernels, and thus the intensity pattern produced by the optimal constituent coherent system is very different from the lithographic intensity which drives optical flare, e.g. via scatter or stray reflections. (In other words, though the constituent coherent system may be optimal for its role as one element of a best-matching loxicoherent system, the image produced by this constituent coherent system will, if considered in isolation, generally bear little resemblance to either the loxicoherent image contribution, or the lithographic image.) Second, the broadly flare-like t"(x) loxicoherent kernel has a fine structure with no analog in flare (as may be seen in the left plot of FIG. 23), and has a fall-off width that is usually somewhat shorter than the optical diameter, whereas the kernel for optical flare usually has a much larger extent. And, of course, the procedure for obtaining the loxicoherent system kernels has no resemblance to procedures for determining flare kernels, since the physical quantities and mechanisms involved are completely different. Moreover, the loxicoherent systems of the present invention encompass a broader range of structures than the FIG. 22 preferred embodiment for the first loxicoherent system, and these alternative systems no longer take the form of a convolution with a squared mask transmission analogue, as will be discussed. For example, the DC-monolinear system discussed below may be regarded as being even more closely analogous to a truly coherent amplitude image than is an OCS/Mercer system, since the latter is a fully quadratic function of the mask amplitude transmission, whereas the DC-monolinear system may sometimes be considered to exhibit a quasi-linear dependence on m(x) (see below). Application of the DC-monolinear system thus lacks even an operational resemblance to a calculation of incoherent optical flare. Nonetheless, the first loxicoherent system provides the most important improvement over a truncated OCS decomposition, and its rough impact in the spatial domain is to correct a pattern-dependent dose-like error.

Figure 24:
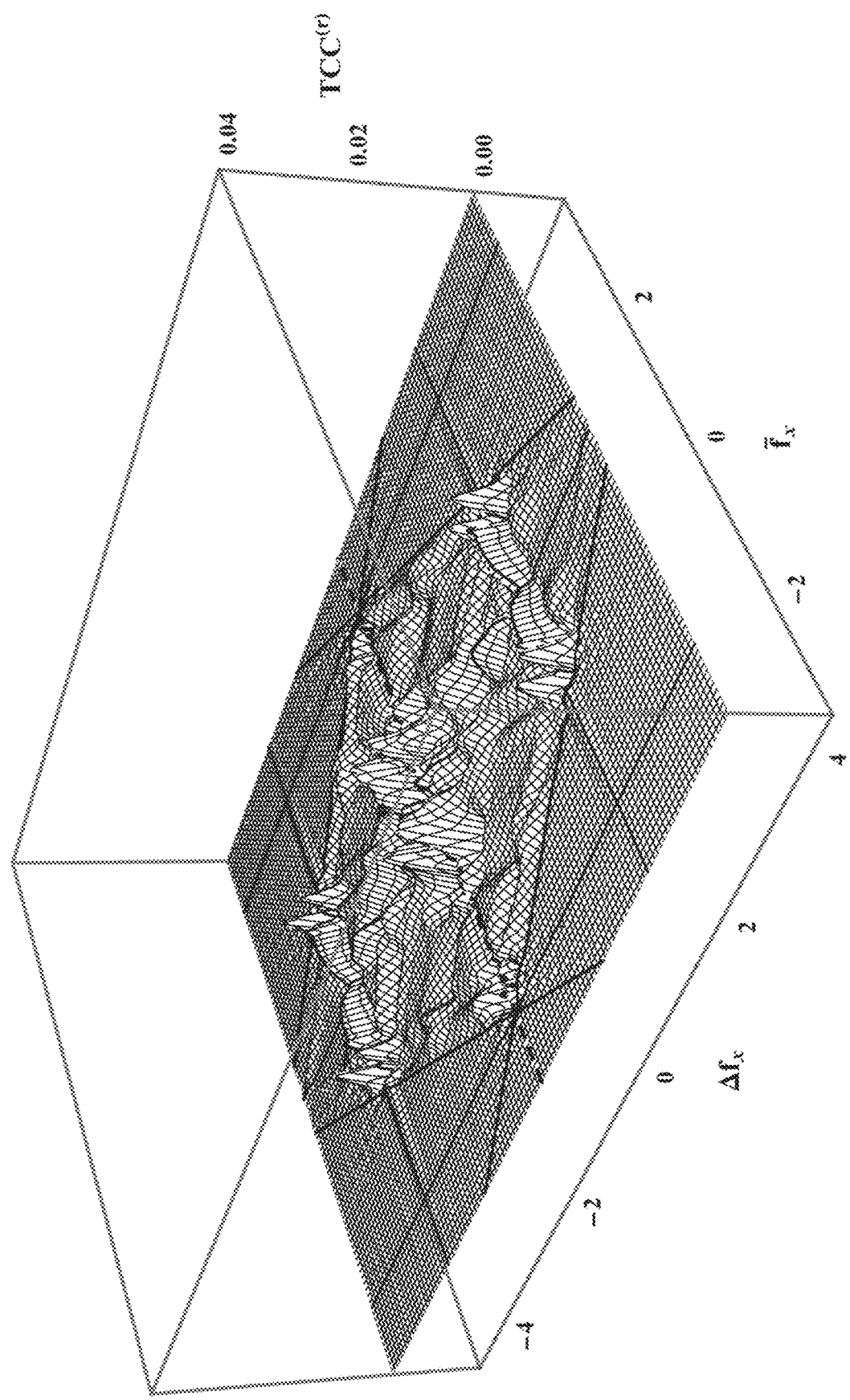
FIG. 24 shows as an example the reduced residual TCC error obtained by means of the invention when a primary loxicoherent system is used to approximate the residual error which in FIG. 14 was shown to result from using 24 coherent systems to match partially coherent images from a C-quad source.

FIG. 24 depicts the remaining residual TCC after the first loxicoherent system (whose kernels are shown in FIG. 23) has been extracted from the residual TCC of FIG. 14, in accordance with the invention. Since FIG. 14 depicts the residual TCC after 24 standard OCS systems have been extracted from the exact TCC, one may regard FIG. 14 as depicting the frequency-domain TCC error that is imposed when the standard FIG. 1D OCS decomposition of the prior art is applied (with N=24 OCS systems being used in this case). FIG. 24 then depicts an improved residual TCC error that results from applying FIG. 20H with N=24 and L=1. It is apparent from a comparison of FIGS. 24 and 14 that the introduction of a single loxicoherent system to the TCC decomposition has resulted in a very substantial reduction in residual error.

It should be noted that the adoption of each additional loxicoherent system in FIG. 20H will entail a computational cost of two new FFT-based convolutions, whereas the addition of each single conventional OCS system will only require a single such convolution. However, when N is of typical magnitude, the accuracy gain from the first few loxicoherent systems (and in particular from the first loxicoherent system) is very large, since these systems are tailored to extract those portions of $TCC^{(r)}$ that are most recalcitrant to standard OCS decomposition, with the image error associated with these remaining $TCC^{(r)}$ portions thus being difficult to mitigate by increasing N. For this reason the improvement provided by the first loxicoherent systems comes at considerably lower computational cost than would be entailed by adoption of sufficient coherent systems to achieve the same accuracy. In other words, the loxicoherent systems allow a given accuracy target to be achieved at an appreciably lower computational cost.

Figure 25:
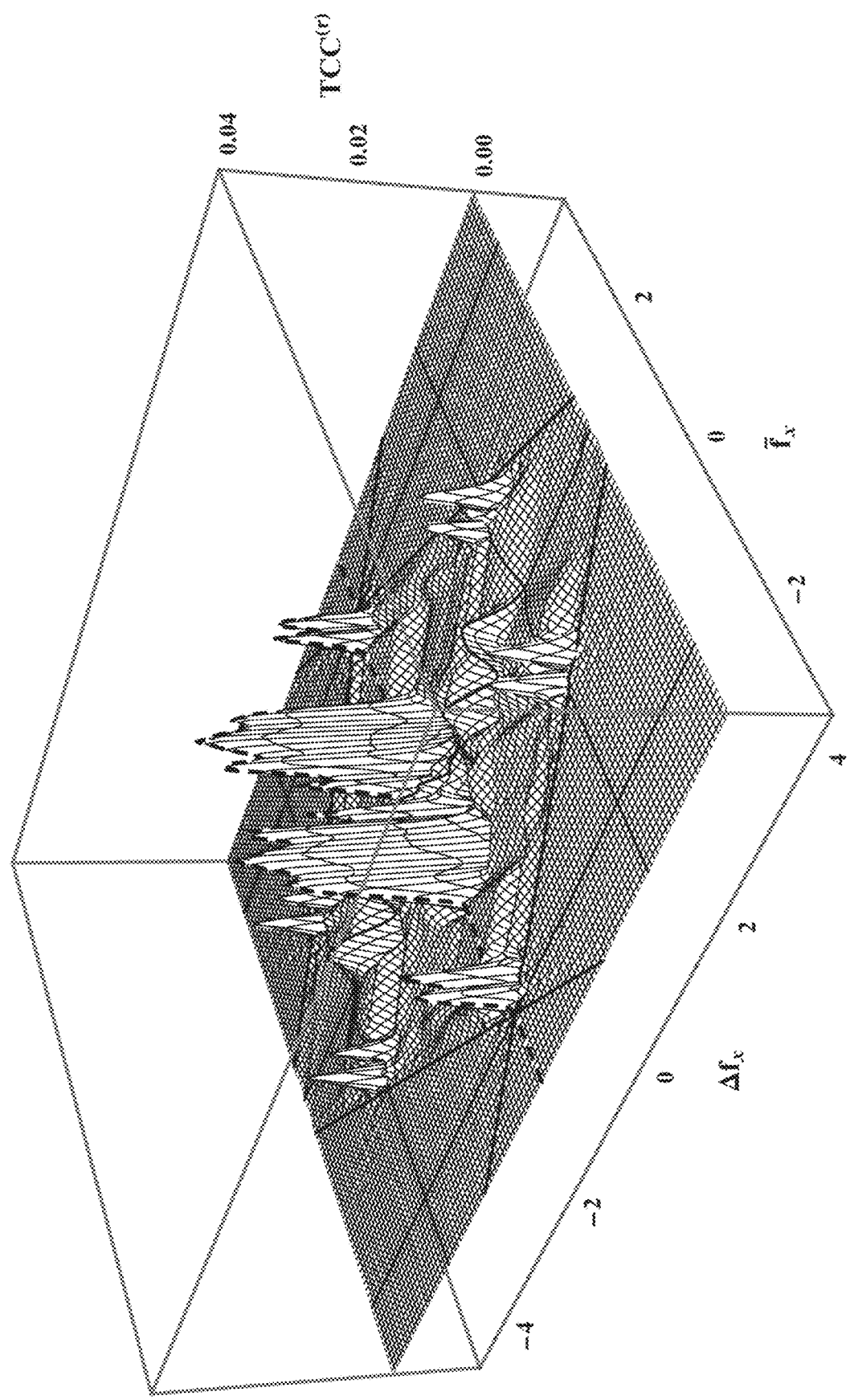
FIG. 25 shows the comparatively large remaining residual TCC error when the 24 coherent systems of the C-quad source example are supplemented by 2 additional coherent systems instead of the equally compute-intensive loxicoherent system that was used in FIG. 24 to reduce the residual error.

To illustrate this advantage, FIG. 25 depicts the residual TCC from an OCS decomposition for the same imaging configuration as the OCS residual of FIG. 14, except that in FIG. 25 two additional OCS kernels have been used, i.e., 26 standard OCS kernels have been used in obtaining FIG. 25, whereas FIG. 14 uses 24. The computational cost of obtaining the FIG. 25 residual is thus the same as that for the FIG. 24 loxicoherent residual, since the computational cost of each added loxicoherent system is two FFT-based convolutions. However, the two added OCS convolutions in FIG. 25 are seen to provide only a modest decrease in the TCC error compared to FIG. 14, reflective of the fact that in practical applications the conventional OCS expansion is operating in a regime of diminishing returns. The FIG. 24 residual TCC likewise entails an added cost of two FFT convolutions relative to FIG. 14, but in the case of FIG. 24 the two convolutions are used to incorporate a loxicoherent system into the decomposition, in accordance with the invention. FIG. 24 shows that the loxicoherent system provides a far greater accuracy improvement than do additional standard coherent systems having the same overall cost.

The dashed line along the $\Delta f=0$ crease in FIG. 24 is entirely flat, at a height of 0, illustrating that the residual TCC error at $\Delta f=0$ is completely eliminated by the introduction of a loxicoherent system constructed according to FIGS. 20B, 22G, and 22J. The benefit from achieving such exact correction along the ridge peak of the fin may be understood by reference to the equation in FIG. 26, which can readily be derived by applying Parseval's theorem to the equation in FIG. 20G. The left side of FIG. 26 is the total squared error in an image when calculated using a truncated OCS expansion, while the right side is an estimate of that total error based on the approximation that the residual TCC which gives rise to the total error can be approximated by the first loxicoherent system.

Figure 27A:
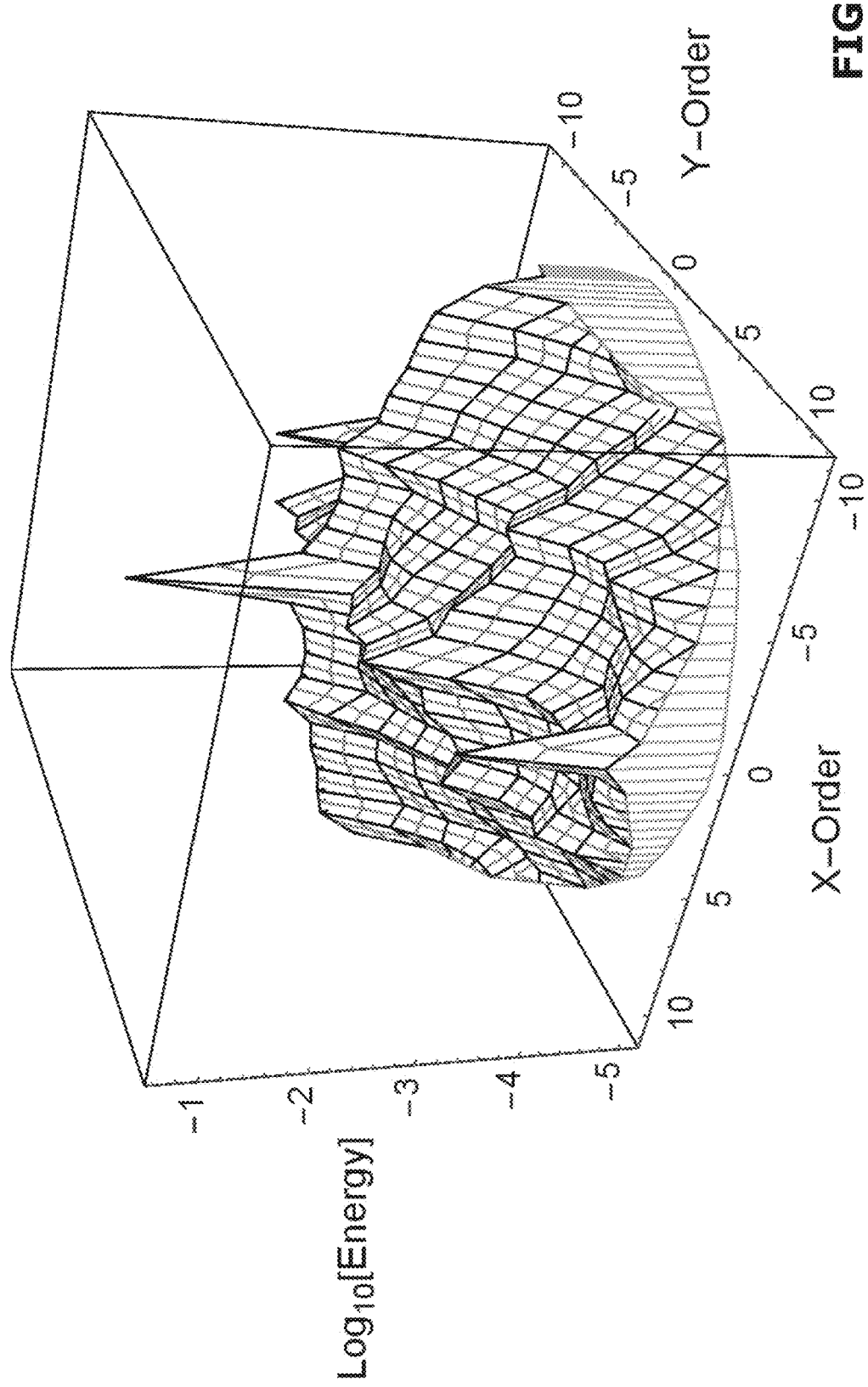

An important consideration in assessing the impact of FIG. 26 is that in practice the filtered mask autocorrelation (the expression in square brackets) will almost always be strongly peaked at $\Delta f=0$. Several aspects of current lithographic practice contribute to this dominance of the zero frequency in the autocorrelation. For example, when the spatial-domain circuit pattern contains semi-isolated small features, it is known that these features should be surrounded within the designed mask pattern m(x) by a quasi-periodic array of even smaller non-printing features, of the kind known in the art as assist features or SRAFs (for Sub-Resolution Assist Features). SRAFs provide an extension in depth of focus, and for this reason their use in modern lithography has become quite standard. Though in many cases these SRAFS are kept too narrow to print as resolved patterns, they are nonetheless able to concentrate the mask spectral content M(f) into spatial frequencies that have large depth of focus, while depleting spatial frequencies with small depth of focus. This is one of several reasons why mask content that is printed using state-of-the-art lithography tends to favor preferred pitches, and to be deficient in so-called forbidden pitches. As will be discussed, such behavior increases the sharpness of the $\Delta f=0$ peak in the mask autocorrelation term of FIG. 26. In addition, the decreased use in recent years of strong mask phase shift, and the increased use of bright-background masks (particularly in so-called negative-tone processes), both tend to produce a large disparity between the magnitude of the zero (i.e. DC) order and all other orders. This is illustrated in FIG. 27, which shows the distribution of energy within the 2D orders of 1000 example mask clips from an integrated circuit layer referred to in the art as a 22 nm first metal layer. FIG. 27A plots this frequency domain energy on a logarithmic scale, where it is seen that the zero order (in x and y) predominates over all others. The height of the {0,0} peak in FIG. 27A is about 0.234, while the next strongest orders only have intensity 0.006. While the strong zero-order is often somewhat diminished when the mask filter T'(f) is applied to M(f) to produce the filtered spectrum M'(f), the T' filter will typically impose a complex structure of its own on the filtered spectrum M', which further increases the autocorrelation peak at the origin. In addition, with 2D IC patterns the diffracted energy is usually highly concentrated along preferred directions, which are most often directions that are tilted along the x or y axes, corresponding to the main diffracting meridians of so-called Manhattan geometries. This tendency can be seen in FIG. 27B, which plots the same data as FIG. 27A on a linear scale, but with the {0,0} order removed. It is seen that orders which do not lie within the meridians of the x or y axis are relatively attenuated.

All of these factors tend to provide the filtered spectrum profile M'(f) with a highly non-uniform structure. This in turn means that the two autocorrelated M' terms appearing in FIG. 26 will make their strongest contribution to the autocorrelation when they are "aligned", i.e. when $\Delta f=0$. The $T''(\Delta f)$ kernel is also very sharply peaked at $\Delta f=0$; for example, $T''$ will typically resemble the $\hat{T}(\Delta f)$ function shown in FIG. 13B, as will be discussed. FIG. 26 then shows that the RMS intensity error as averaged over the optical diameter will tend to be very strongly dominated by the behavior at $\Delta f=0$, making it desirable that the first loxicoherent system exactly match $TCC^{(r)}$ at the peak of the fin, as is accomplished when FIG. 22G is used. Simulations show that image accuracy will actually be slightly diminished when both kernels in $T_{Loxicoherent,1}$ are instead optimized to best match $TCC^{(r)}$ in an averaged way across the bandpass, as opposed to choosing the FIG. 22G match at $\Delta f=0$. Of course, the fin will typically constitute a very substantial portion of the overall TCC error, making the numerical difference between these two matching criteria quite small.

FIG. 28 is a Table showing the 1D accuracy of the improved method of this invention versus the conventional approach. The Table shows RMS and worst-case intensity errors over a broad spectrum of CDs. The imaging conditions are those of the C-quad test case discussed above, e.g., in connection with FIG. 9. Results for two categories of 1D patterns are shown, namely 1) so-called equal line/space patterns, where the duty cycle of the periodic pattern is kept at 50%, with the pitch being stepped from 70 nm to 1000 nm in increments of 2.5 nm, and 2) a set of so-called isolated space patterns, each being a single isolated opening, with the widths of the isolated open features being stepped from 35 nm to 500 nm in increments of 1.25 nm. The table rows list various metrics that describe the error when calculating the intensity over extended cutlines. The right-most column shows these errors when the image is calculated according to the invention, using FIG. 20H with N set to 24 and L set to 1, i.e. by extracting a first loxicoherent system from the TCC residual left by 24 OCS systems (or kernels). Columns further left in the table show the error levels achieved by standard OCS using different numbers of kernels. The rightmost of these OCS columns (i.e. the second column in from the right) shows the error levels achieved by employing 80 OCS kernels, and in addition taking the step of artificially anchoring the dose at a level which minimizes the intensity error (instead of following the standard practice of adjusting the dose to print a critical feature on target).

Overall, the FIG. 28 Table shows that the loxicoherent systems of the present invention provide broadly superior accuracy to prior art OCS, at significantly lower compute cost. If the N=24 OCS system is taken to be representative of current practice, column 2 of the Table shows that a worst-case intensity error of about 1% is incurred. In contrast, column 6 shows that use of the invention allows a stringent 0.25% accuracy criterion to be met (vis-à-vis count-truncation error) with little additional overhead. Alternatively, the improved method can be used to maintain currently accepted (and anticipated future) accuracy levels with far fewer FFTs being required, and thus with correspondingly faster calculation times.

The FIG. 28 results illustrate the very dramatic reduction in residual image error that is achieved by extracting only a single loxicoherent system, i.e., by merely choosing L=1 in FIG. 20H. It will prove useful to understand the mechanism behind this dramatic improvement in more detail. The single loxicoherent system is seen not only to remove nearly all of the residual TCC error, but also to reduce $TCC^{(r)}$ more effectively than is possible with quite a substantial number of added conventional coherent kernels. FIG. 24 illustrates that some residual TCC error does remain, but it will be shown that, within a certain asymptotic level of approximation, the single loxicoherent system is able to extract (in the idealized asymptotic limit) the entirety of $TCC^{(r)}$, as only an arbitrarily large number of conventional coherent systems could similarly extract. Such a complete level of success is only achieved as an approximation, and the single loxicoherent system does in fact leave some residual TCC error. While this residual error is quite small, it can be further reduced by extracting additional loxicoherent systems, and to design these additional systems it is useful to exploit the mechanism by which the first loxicoherent system is able (in the idealized asymptotic limit) to match the performance of an extremely large number of coherent systems.

In particular, to develop efficient loxicoherent systems beyond the first, it is useful to exploit the same physical considerations which allow the loxicoherent system of FIG. 20B to achieve almost-complete extraction of $TCC^{(r)}$, dramatically outperforming the much slower extraction achieved by additional coherent systems of the prior art FIG. 1B form. These physical considerations may be understood with reference to FIG. 29, wherein FIG. 29A encapsulates the extreme asymptotic behavior of $TCC^{(r)}$ in the regime of diminishing returns that arises after a great many conventional coherent kernels have been extracted. As discussed, $TCC^{(r)}$ takes on the character of a very narrow fin in this regime, and because of the narrowness of the fin we may consider it to have almost a δ-function width; thus FIG. 29A represents the (not fully realizable) limit where such ideal asymptotic behavior is considered to actually be realized.

In this limit, an asymptotic form for the OCS kernels may readily be deduced by using the equation of FIG. 29B, whose rationale will be explained. The first line of FIG. 29B considers the integral of $TCC^{(r)}$ with a certain delta-function whose key role (explained below) is emphasized by enclosing it in braces; the right side of the first line of FIG. 28 shows the result of approximating $TCC^{(r)}$ in the asymptotic limit by substituting from FIG. 28A. The second line of FIG. 28B then notes that the resulting integral can be carried out explicitly, with the result being the right-hand expression in the 2nd line. It can then be observed that the left-most and right-most terms of the second line of FIG. 29B have the form of an eigenfunction equation for the $TCC^{(r)}$ operator, with the function in braces serving as the eigenfunction. Thus, this asymptotic eigenfunction consists of a δ-function centered at a frequency $f_j$. This means that if the asymptotic limit of the equation of FIG. 29A could actually be reached, the OCS kernels would take the form of δ-functions in the frequency domain. If we then consider a situation where $TCC^{(r)}$ is the residual TCC after j–1 OCS kernels have been extracted, and presume that these coherent kernels have been optimal, i.e. eigenfunctions of the TCC, then the jth OCS kernel will by definition correspond to the eigenvalue that is dominant in the Mercer series for the remaining $TCC^{(r)}$, and because this eigenfunction (in the asymptotic limit) is a δ-function centered at $f_j$, we see that $f_j$ must be positioned at the highest remaining point in the fin structure of $TCC^{(r)}$ (since the eigenvalue $\hat{T}$ ($f_j$) is maximal there), as is noted in the fourth line of FIG. 29B.

Thus, in the asymptotic limit, an OCS kernel only succeeds in extracting the residual TCC at a single frequency $f_j$ along the fin, leaving the error at all other frequencies along the fin unextracted. Since the residual TCC is highly extended along the diagonal, it is seen that the jth OCS kernel is quite inefficient at reducing the overall remaining TCC error, despite $f_j$ being the largest single point of residual TCC. This helps explain why the prior art OCS method faces diminishing returns once N becomes large, and will also prove useful in designing higher-order loxicoherent systems to achieve even greater levels of image accuracy than those illustrated by FIG. 28. Of course, it is understood that FIG. 29A only represents the limiting asymptotic behavior of $TCC^{(r)}$, and this limiting behavior cannot actually be reached at finite j. For example, the OCS kernels must be smooth functions as noted above, and even though frequency-domain versions of these kernels tend to exhibit comparatively sharp localizations within the pupil at large j, they cannot truly take the form of δ-functions. Moreover, a more careful version of the FIG. 29 analysis shows that the simple form of FIG. 29B does not hold when more than one point along the fin has the same magnitude (though the same overall conclusion is reached in the end), and points of matched fin height occur very often in practice, given system symmetries. Nonetheless, FIG. 29B does appropriately reflect both the strong pupil localizations (which usually are multi-fold within each kernel) and the slow extraction rate that are exhibited by high-order OCS kernels.

It should also be noted that even though each Mercer term formed from single OCS kernels in the FIG. 29B limit only succeeds in extracting a very small portion of the $TCC^{(r)}$ fin, such kernels by definition represent the optimal coherent match to $TCC^{(r)}$, and a major part of this matching success arises in the extended regions of the doubled Hopkins domain that are not part of the fin, where the very low $TCC^{(r)}$ levels that have already been achieved must not be undone when new systems that are added. In particular, it will now be shown that the delta-function asymptotic OCS kernels of FIG. 29B accurately reproduce the near-zero-valuedness that $TCC^{(r)}$ exhibits away from the fin in the asymptotic regime. This point is demonstrated in FIG. 29C, where the first line reiterates that $TCC^{(r)}(f_1,f_2)$ is approximately zero in regions where $f_1 \neq f_2$, once a large number of OCS kernels have been extracted. And, per the second line of FIG. 29C, this behavior is matched by Mercer terms that are formed from OCS kernels of the asymptotic FIG. 29B form, since at such ($f_1$, $f_2$) frequency pairs away from the fin one or the other δ-function kernel appearing in the Mercer term will be zero. The fin region is recalcitrant to OCS extraction, but OCS largely succeeds in reproducing other parts of the TCC once N reaches moderate values, and this success is maintained as new OCS systems are added, i.e. succeeding OCS systems continue to hold $TCC^{(r)}$ near zero away from the fin.

This matching success away from the fin would be lost if one attempted to extract more than one position along the fin at a time using only a single putative OCS kernel, as is demonstrated in FIG. 29D. In particular, FIG. 29D considers the behavior of a trial coherent kernel function $\Psi_{\text{Multi-Point}}$ that attempts (in contradiction to the equation of FIG. 29B) to simultaneously extract the fin content at two fin frequencies $f_{j'}$ and $f_{j''}$. A Mercer-like term formed from such functions will unfortunately fail to match the zero value of $TCC^{(r)}$ at the non-fin frequency pair $(f_{j'}, f_{j''})$, as shown in the second line of FIG. 29D. If we assume for simplicity that the fin heights at $f_{j'}$ and $f_{j''}$ are not the same, such a term cannot match $TCC^{(r)}$ as accurately as the FIG. 29B valid eigenfunctions. This demonstrates that even an optimal coherent system is inherently limited to a very slow extraction rate in the large kernel-count regime, and these idealized asymptotic arguments prove to be qualitatively accurate as limiting trends in practical regimes.

The situation with loxicoherent systems is quite different, as explained in FIG. 29E. The second line of FIG. 29E shows that each T' factor appearing in a loxicoherent system can be interpreted as a superposition of a very large number of δ-function samples. This means that an optimal T' for a first loxicoherent system that is constructed per FIG. 22G can be regarded as a superposition of δ-functions which sample every point along the fin (unlike an optimal coherent system, which only samples a single fin point in this asymptotic limit). However, as shown in the third line of FIG. 29E, such a superposition will not lead to a poor matching of $T_{Loxicoherent}$ to $TCC^{(r)}$ away from the fin (where $f_1 \neq f_2$), as arose with the putatively multi-point coherent system of FIG. 29D (which therefore proved suboptimal), because loxicoherent systems include a $T''(f_1-f_2)$ term which acts as an "envelope" that (at least in the asymptotic limit) drives the loxicoherent system to zero at frequency pairs away from the fin. Along the fin, i.e. when $f_1=f_2=f$, it has already been shown that the loxicoherent system will match $TCC^{(r)}(f,f)$ exactly when constructed according to FIG. 22G, as noted in the fourth line of FIG. 29E. FIG. 29E thus shows that in the asymptotic limit the loxicoherent system will essentially match $TCC^{(r)}$ at all $\{f_1,f_2\}$ frequency pairs, i.e. the match will (asymptotically) be perfect throughout the doubled domain.

Loosely speaking, FIGS. 29A-29E demonstrate that even though a coherent system which is fully optimal can only extract "a single point" of the $TCC^{(r)}$ fin, the richer structure of the loxicoherent system allows it to extract "all points at once". In particular, the constituent coherent system in the loxicoherent system is able to extract all points along the fin at once, in contrast to the prior art OCS/Mercer coherent system which (in the asymptotic limit) can only reduce $TCC^{(r)}$ at a single point; this strongly superior performance is achieved because the constituent coherent system acts in sequence with the constituent incoherent system, with the latter preventing the degradation of fitting accuracy that arises at $f_1 \neq f_2$ when an OCS/Mercer coherent system attempts to extract more than a single fin point. It should be reiterated that FIG. 29A only describes an asymptotic limit that is not met in realistic cases, and that the behaviors derived from FIG. 29A are only qualitatively accurate. While the first loxicoherent system will typically achieve a dramatically larger extraction than can additional coherent systems, as illustrated in FIGS. 24 and 28, these examples also show that the first loxicoherent system cannot generally be expected to truly extract the entire residual TCC, as nominally occurs in the asymptotic limit. However, the first loxicoherent system does achieve very substantial reductions in $TCC^{(r)}$ by means of the FIG. 29E mechanism, and this same mechanism can be exploited in designing additional loxicoherent systems that achieve further significant reductions in $TCC^{(r)}$, as will be discussed.

A further qualitative guideline involving the appropriate choice of N may be inferred from the difference in asymptotic behavior of each additional coherent system that is introduced if N is further increased, as compared with the asymptotic behavior of the first loxicoherent system. Once N has reached the regime where additions to the coherent system set will roughly follow the FIG. 29C form, each added coherent system merely provides an incremental reduction in $TCC^{(r)}$, through extraction of only a single (though largest) remaining point along the fin, whereas per FIG. 29E the asymptotic behavior of the lowest order loxicoherent system is to extract all fin points at once, thus accomplishing the same result as would inclusion of all successive Mercer terms, i.e. N→∞. In particular, we may infer from this asymptotic behavior that, were it to be followed rigorously instead of only qualitatively, there would eventually be no benefit from further increasing the number N of coherent terms that, per FIG. 20H, are extracted as a precursor step to calculating the first loxicoherent system. This conclusion holds asymptotically because the single loxicoherent system eventually becomes able to provide the same benefit as would any indefinitely large number of added coherent systems, i.e. the first loxicoherent system removes the entirety of the fin, regardless of the specific value of N (once N is very large). Though this behavior will only obtain qualitatively in practice, one may find in a typical case that after N reaches a value of about 50 or 100, there is little merit in further increasing N before extracting the first loxicoherent kernel. This means that further increases in N will typically have passed into a regime of diminishing returns at that point, even when augmented by a loxicoherent system. Nonetheless, it still proves possible to obtain additional rapid improvements in accuracy by extracting additional loxicoherent systems (i.e. by increasing L rather than N in FIGS. 20H and 20I), as will be discussed.

A comparison of the asymptotic form taken on by the constituent coherent T' mask filters $$\left[\text{namely } T'(f) = \sqrt{T(f)}\right]$$

and the asymptotic form of optimal OCS/Mercer kernels $\Psi_j$ [namely $$\Psi_j(f) = \sqrt{T(f_j)}\, \delta(f - f_j)\right]$$

shows that the constituent coherent system of the first loxicoherent system will differ very substantially from a standard OCS coherent system, and the same conclusion holds with higher order loxicoherent systems. This means that if the constituent coherent system were used in isolation, i.e. as a standalone OCS system, its performance would generally be very poor compared to an optimal OCS system. (While the optimal OCS system yields only a small asymptotic increase in accuracy, the constituent coherent system would significantly degrade accuracy if used in isolation.) Similarly, the constituent incoherent system would make poor intensity predictions if used independently from the constituent coherent system, since the former fails to capture the strong frequency dependence that is present along the fin (as in FIG. 23). However, extremely good performance is obtained by the sequential pairing of the two constituent systems to form a loxicoherent system.

Figure 30A:
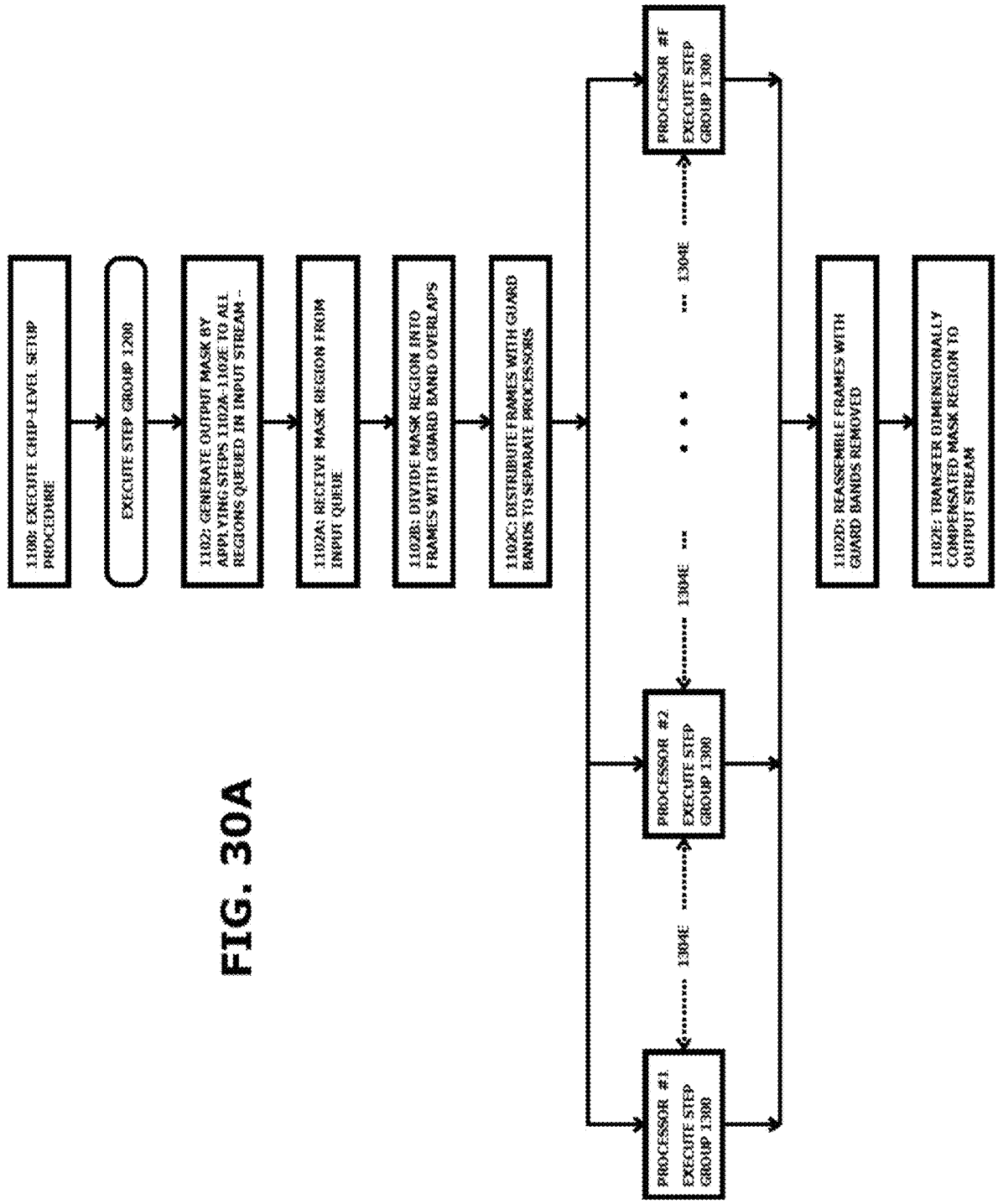
FIGS. 30A-30C, referred to collectively as FIG. 30, provide a logic flow diagram illustrating basic steps carried out in accordance with the embodiments of this invention in the non-limiting context of an OPC implementation. The various blocks shown in FIG. 30 can also be viewed as assemblages of serial-connected and parallel-connected logic/arithmetic functional units/modules/engines of at least one apparatus that implements the tool that this an aspect of this invention.
Figure 30B:
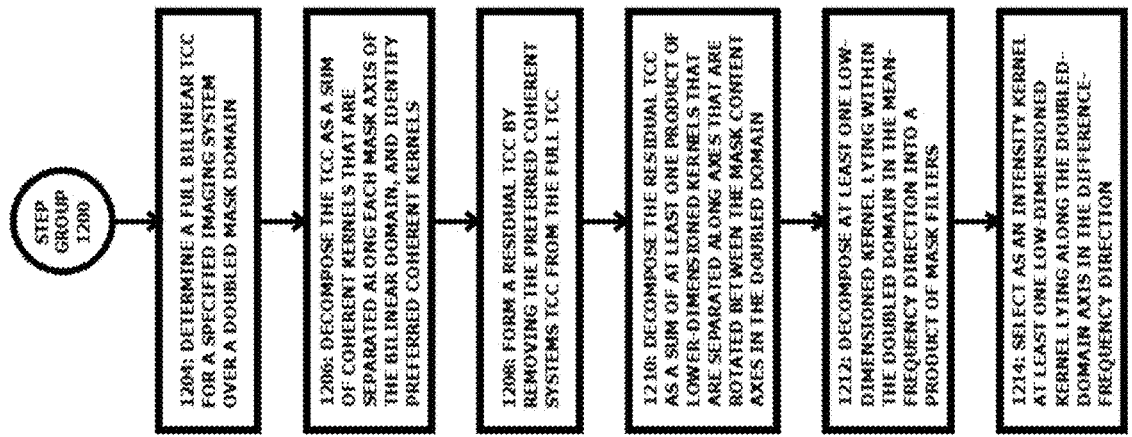
Figure 30C:
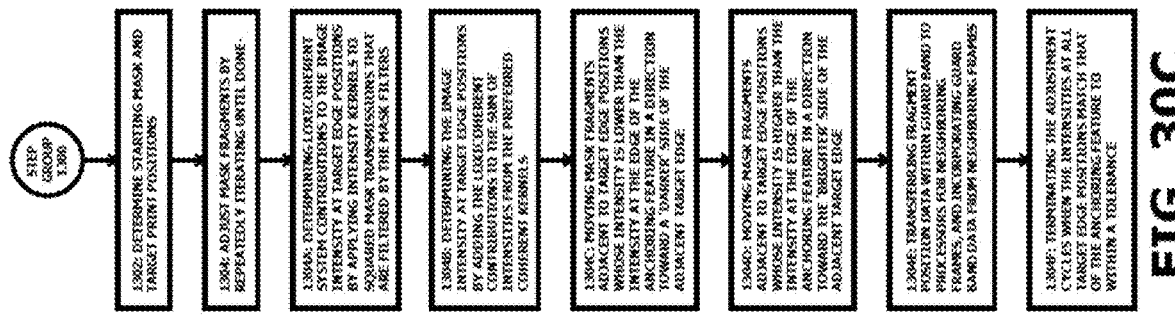

FIG. 30, consisting of FIGS. 30A, 30B and 30C, is a logic flow diagram illustrating the basic steps with which the invention employs one or more loxicoherent systems in accordance with the embodiments of this invention. The method is depicted in the non-limiting context of an OPC implementation. FIG. 30 shows that the embodiments of this invention can use more than one loxicoherent system, and also emphasizes the use of the embodiments of this invention as a tool for producing masks useful for, by example, the manufacturing of semiconductor integrated circuits/chips.

FIG. 30A diagrams the functions executed by the invention, in a high level summarized form. Some steps in FIG. 30A could be viewed as being similar to those of prior art OPC systems. Block 1100 is a chip-level setup procedure, largely known in the art, where options are defined, per user inputs, for specifying target dimensions and edge positions for printed integrated circuit features, for example, defining these target dimensions to be those of the patterns explicitly supplied in an input queue or database, or specifying that these target dimensions be modified away from the queued input dimensions according to user-defined rules; also specifying partially coherent imaging conditions for a lithographic system; identifying an anchoring mask feature; and defining so-called fragmentation rules. In some embodiments the invention prepares a queue by extracting designs for circuit chips, or modules, or the small circuit sections known in the art as "clips", from a database or library, selecting specific library entries based on user input. Block 1100 may be carried out by a gateway node in a large-scale computer cluster.

The process of identifying the anchoring mask feature is a well-known step in IC mask design. The specific choice of anchor feature is basically a matter of engineering judgment, but typically one chooses a simple yet key pattern whose preferred mask design can be inferred even before OPC is carried out. Simple line-space patterns at a most critical pitch are often chosen. The anchor feature is used to experimentally set the exposure dose when a mask is first printed, and the impact of this eventual dose-centering operation is preferably taken into account when the compensated mask features are designed by OPC.

The process/tool then next executes, in accordance with aspects of this invention, a procedure that determines the coherent system set and loxicoherent system set which together produce intensity patterns that approximately match the images produced by the partially coherent lithographic system. This procedure is represented by a group of steps that are designated in FIG. 30A as Step Group 1200; these steps are explained in more detail below in relation to FIG. 30B. The coherent and loxicoherent system sets provided by Step Group 1200 allow the images produced by trial mask patterns to be determined more rapidly and/or accurately than is possible in the prior art.

At Block 1102 the tool, in accordance with exemplary embodiments of this invention, begins processing the mask regions that are queued in an input stream. This can be accomplished by applying the steps in Blocks 1102A-1102E to each input mask region in sequence, though more sophisticated embodiments can process multiple regions in parallel. Most often a plurality of processors will participate in the execution of these steps even where the processing of a single mask region is concerned, with each processor providing the dimensionally compensated output patterns for a single frame of the region, but with the processors sharing data in order to "stitch" the output patterns across overlapped guard bands, i.e. to reconcile any dimensional divergences that arise from the different proximity cutoffs that are entailed by the division of the region into different frames whose overlap is only finite. As discussed, the span of any single calculated image is generally limited to a single frame, and because the calculations within the frame do not quite achieve linear scaling, the frame size is typically held below 5 microns or 10 microns in order to avoid excessively long runtimes, i.e. the frame size is usually kept a few times smaller than a typical mask region.

At Block 1102A a queued mask region is received from the input stream, and at Block 1102B the region is split into frames. This is discussed in more detail below. In a basic implementation, each frame contains an inner core, whose typical size might be a few microns, with these frame inner cores being laid out in a grid that evenly divides the mask region, and with each point in the mask region falling within a single grid box, and thus being located within a single frame inner core. However, each frame inner core is surrounded by a guard band, of width e.g. 1 or 2 microns, that overlaps the inner core of the adjacent frame, so that the full frames overlap, with some points in the inner core of one frame also falling within the guard band of the adjacent frame, namely those points which are separated from the inner frame boundary by no more than the so-called guard band distance. Here the term guard band distance refers to the width of the guard band, which may be chosen equal to the optical ambit.

At Block 1102C the frames are sent to separate (but communicating) processors to generate the output shapes for each frame. The number of processors handling the frames for each region is denoted F; typically F might be in the range of 4 to 16. The processors operate in parallel, but some frame processing can proceed sequentially if F is smaller than the frame count. Each processor creates output mask shapes by executing the procedure designated as Step Group 1300, to be discussed in relation to FIG. 30C. This procedure includes a repeated step 1304E in which guard band data is communicated between processors, as indicated in FIG. 30A using dotted line arrows. Further details are provided below.

Though not shown in FIG. 30A, the number of processors employed by the tool in accordance with this invention will typically be much larger than F, e.g. the tool might use 1024 processors, with only e.g. F=8 being used in the single flow shown in FIG. 30A. The invention is able to achieve this increase in employed computational resource by processing multiple mask regions in parallel, with each region being processed, e.g., according to the FIG. 30A flow.

At Block 1102D the inner cores of the frames which are output from each of the F processors are collected, and then re-tiled per the region gridding to form an output mask region, and in Block 1102E this output region is transferred to the output database or stream.

It will be clear to those skilled in the art that other standard process steps can be applied to the dimensionally compensated mask regions in the output database in order to fabricate a finished lithographic mask. Since the regions are large compared to the optical ambit it can be useful to exploit redundancy in the mask layout, taking advantage of the fact that integrated circuit designs often contain many repeated regions. This is sometimes referred to in the art as exploiting layout hierarchy. As a given mask region is repeatedly inserted into different parts of the overall layout, the content of the neighboring regions that surround each repeat will generally be different in each insertion, and there are known methods for adjusting the dimensional compensation of shapes near the border of each repeat to accommodate the varying proximity impacts.

Since the mask regions in the output database are large compared to the optical ambit, efficiency is not at a premium when carrying out shape reconciliation along the borders of deployed regions. However, it will be clear to those skilled in the art that the invention can be adapted to perform this reconciliation with greater efficiency or accuracy through its use of loxicoherent systems.

FIG. 30B conveys in further detail the actions carried out by the tool in accordance with embodiments of this invention to obtain the coherent system set and loxicoherent system set that are used to match the TCC of the lithographic imaging system, providing in particular a flow diagram of the procedure referred to in FIG. 30A as Step Group 1200.

At Block 1204 of Step Group 1200, the invention determines a full bilinear TCC for the specified imaging system over a doubled mask domain.

The concept of the "doubled mask domain" has been explained above. Equation 1A, which expresses the basic behavior of partially coherent imaging, shows that points in the mask pattern m(x) contribute pairwise to the image; in other words, the image intensity at a given point is not made up of a sum of contributions from all mask locations that are within resolution range of the point in question, but rather the intensity is given by a sum of contributions from all pairs of points that are (both) within resolution range of the image point. This physical behavior is reflected in the double integration over the mask domain, which essentially sums over all pairs of points $(x_1,x_2)$ on the mask (or, in practice, all pairs of points within the simulation field). Such an interaction can be regarded as an augmentation or expansion of the mask into what has been referred to as a doubled domain or bilinear domain.

At Block 1206 the tool in accordance with embodiments of this invention decomposes the TCC as a sum of coherent systems that are separated along each mask axis of the bilinear domain, and identifies what will be referred to as the preferred coherent kernels (e.g., eigenfunctions or other chosen lens aperture functions to carry-out coherent decomposition).

Summarized in computational terms, the spatial-domain TCC (referred to herein as the tcc) represents the weights with which the contribution from the doubled mask content at all pairs of neighboring points are summed in order to generate the intensity at a given point. The discretized tcc can be written as a matrix, where different rows and columns represent mask points at different relative distances from the given point, with the rows and columns both being involved because of the above pairwise weighting of the contributions. The eigenfunctions of this tcc matrix are ordinarily chosen as the normalized OCS kernels, and must be properly scaled through multiplication by the square root of the associated eigenvalue. The most dominant kernels are those with the largest eigenvalues.

It is known in the art that, even though choosing the dominant eigenfunctions of the TCC operator as coherent Mercer kernels will produce the most rapid OCS-based extraction of the TCC possible, thus yielding the most broadly accurate OCS-based imaging in general terms, one can sometimes obtain more accurate images of the narrow set of critical patterns in a particular IC level by making a more specialized or tailored choice of coherent kernels, i.e. tailoring the lens apertures of the employed coherent systems to better match particular mask content of special importance. For example, Li et al., in U.S. Pat. No. 7,933,471, "Method and system for correlating physical model representation to pattern layout," show how to form coherent kernels that are specialized to particular pattern content by linearly combining with optimal coefficients the eigenfunctions of the TCC. In a related reference, "Kernel Count Reduction in Model Based Optical Proximity Correction Process Models," Jpn. J. Appl. Phys. 48,6S (2009), Li et al. show how to choose coherent kernels that map particularly well to sliver-like pattern-changes that are made when mask fragments are finely adjusted during OPC. Since these specialized systems continue to be Mercer terms based on (now specialized) kernels that are coherent, they are very different from the loxicoherent or rotated systems of the present invention; e.g. in this invention the image is not approximated as a pure sum of coherent system contributions, and thus the image is not calculated as a simple sum of squared convolutions of kernels with the mask, as it is with the specialized coherent kernels of the prior art. In most embodiments the loxicoherent systems do contain constituent coherent systems, but the loxicoherent system output is obtained by using the output of the constituent coherent system as an input to a constituent incoherent system. A related point that bears mentioning is that Li et al. use the term "rotation matrix" to refer to the matrix of coefficients for the linear combinations of OCS kernels that they use as targeted coherent kernels; they choose this term because their coefficient matrix must be an orthonormal matrix, and in some conventions "rotation matrix" is a synonym for an orthonormal matrix. However, this use of the term "rotation" has no connection with the rotated or slanted axes on which the novel kernels of the present invention's rotated and loxicoherent systems are separated along. These latter axes are rotated in a direction within the doubled Hopkins domain that is not orthogonal to the main $f_1$ and $f_2$ (frequency domain) axes of the mask. In contrast, the specialized coherent kernels of Li et al. remain functions of the main mask coordinates (i.e., the axes of their coherent kernels are not rotated), and in their case the term "rotation" simply indicates that the squares of the coefficients that combine the TCC eigenfunctions to form each specialized coherent kernel must sum to 1, and that the sets of coefficients for different specialized coherent kernels must be orthogonal to one another, thereby making the conversion matrix orthonormal. This in turn does mean that the Li et al. conversion matrix can be described as a rotation matrix, but only under a meaning of the term "rotation" which is quite distinct from that which describes the axes of certain kernels of this invention.

However, even though the loxicoherent kernels of the present invention have no similarity to the prior art specialized or targeted coherent kernels, joint employment of loxicoherent kernels and targeted coherent kernels is nonetheless possible, i.e., the two are quite compatible with one another. In other words, since specialized coherent kernels continue to be subject to the limitations described in FIGS. 3, 4, and 7, the present invention and its advantages are fully consistent with use of these specialized coherent kernels amongst the coherent systems (N in number) which form the $TCC^{(r)}$ from which loxicoherent systems are extracted in accordance with this invention. To allow for this possibility we will refer to the N coherent systems in the coherent system set as "the preferred coherent systems", whose kernels may comprise, for example, the dominant eigenfunctions of the TCC operator (meaning per customary parlance the eigenvectors associated with the largest eigenvalues, as in standard OCS); however, the preferred coherent kernels can also include customized coherent systems that may be designed by known methods to correlate strongly with critical mask content.

At Block 1208, and in accordance with an aspect of this invention, the residual TCC is formed by removing the preferred coherent systems from the full TCC. This may be done by using a truncated Mercer series to form an approximate TCC, and then subtracting this approximate TCC from the full TCC.

At Block 1210 the tool in accordance with embodiments of this invention decomposes the residual TCC as a sum of multiplied lower-dimensioned kernels that are separated along axes which are rotated between the mask content axes in the doubled domain.

At Block 1212 the tool in accordance with embodiments of this invention decomposes at least one low-dimensioned kernel lying within the doubled-domain in the mean-frequency direction into a product of mask filters, thus determining a constituent coherent system.

At Block 1214 the tool in accordance with embodiments of this invention selects as an intensity kernel at least one low-dimensioned kernel lying along the doubled-domain axis in the difference-frequency direction, thereby determining a constituent incoherent system.

Referring next to FIG. 30C, a flow diagram is provided for the procedure referred to in FIG. 30A as Step Group 1300, this being in particular the procedure with which the tool in accordance with embodiments of this invention determines a set of dimensionally compensated shapes within a particular mask frame. In most embodiments Step Group 1300 is separately executed for each frame, typically on multiple separate processors that process multiple frames simultaneously.

At Block 1302 each processor handling the patterns within a particular frame generates a starting mask, meaning a starting set of shapes within the frame, including adjustable edge fragments for the mask features to be projected and printed, as well as assisting features, and in addition determines the target positions where the edges of the projected integrated circuit features should be printed.

With specific regard to the adjustable "edge fragments" and "assisting features", it should be noted that the "edge fragments" and the "mask fragments" (referred to below with respect to Blocks 1304C and 1304D) both refer here to mask edge fragments. Block 1302 may be viewed basically as a conventional OPC step. Fragmentation of mask edges essentially creates the "levers" that OPC uses to control printed shapes, based on the following considerations: IC design patterns are usually Manhattan polygons whose edge lengths are comparable in size to the lens resolution. Because the lens resolution response function has long tails, the position of the contour that is printed from an imaged mask polygon will be distorted in a complicated way by optical proximity effects, with the distortion along a printed edge roughly taking the form of e.g. a retraction, protrusion, or wavering of the print contour in and out from the design edge (target edge), due to the varying proximity contributions from the features that neighbor different parts of the edge with differing proximity dispositions. OPC uses mask polygons that generally resemble the target polygons, but with edges that are broken up into finer "fragments" or segmented sections. OPC then pulls each adjustable fragment in or out in such a way as to pull the adjacent wavering print contour back into alignment with the target edge. In basic OPC implementations the fragments are "Manhattan", i.e. oriented along the x or y axes of the integrated circuit design, and the position of each adjusted fragment is treated algorithmically as a "lever" that controls the position of the (locally quasi-parallel) print contour along the normal to the fragment midpoint, with the fragment position only being shifted along this normal (i.e. not in the perpendicular direction), and with the length of the fragment being kept fixed. With the exception of corners, such an implementation may only allow adjustment of (roughly speaking) every other segment within each fragmented edge of a Manhattan mask polygon, namely those edge segments which are roughly parallel to the adjacent print contour, with the length and position of the edges that connect these adjustable fragments then being fully determined once the adjustment values are chosen.

The position adjustments made during OPC thus take the form of introduced retractions or protrusions of fragments that serve to compensate the tendency of the adjacent print contour to protrude or retract, which if left uncompensated would leave the printed feature with an improper dimension along the cross-section. The print contour will successfully trace its desired target positions and thus provide proper dimensions once a suitable set of position adjustments have been applied to the mask fragments. Such a properly adjusted mask is referred to as dimensionally compensated, and in 2D the dimensionally compensated patterns may have distinctly different shapes from the target patterns.

In a basic OPC implementation, the proper adjustments are arrived at by an iterated feedback methodology (e.g. per Block 1304, to be discussed), meaning that the trial adjustment which is made (during one iteration) to a given fragment is chosen purely on the basis of the shortfall or excess in the local position or intensity of the contour that is immediately adjacent to that fragment. For example, an adjustment may be made if there is a non-zero separation between two particular intersection points along the normal to the midpoint of the given fragment, namely the nearby print contour location where the fragment normal intersects the print contour, and the location where the fragment normal intersects the target contour. Alternatively, an adjustment may be made if the intensity at the intersection of the fragment normal with the target contour exceeds or falls short of the intensity at the print contour of the anchoring feature. (The print contour location may be adjusted to take into account the offset predicted by an intensity-driven resist model, as is well-known in the art. The effective intensity at the target edge may be similarly adjusted to take resist effects into account, as is also well-known in the art.) The (generally weaker) impact of the trial adjustment on other neighboring portions of the print contour is not considered in a direct way by such a feedback scheme, and as a result the printed dimensions will not be fully compensated by the adjustments made during a single iteration. However, the controlling fragment adjacent to a particular print edge will generally exert the dominant influence on the position of that printed edge, allowing the feedback methodology to properly converge all print positions within tolerance after several iterations, e.g. within about 10 iterations. Typical tolerances might be of order 0.1 nanometers. (This description has been highly abbreviated for brevity; it will be clear to those skilled in the art that many other prior art OPC techniques and features can usefully be incorporated into the invention's procedure. These well-known techniques allow OPC to consider, e.g., slope information, non-Manhattan geometries, a plurality of process conditions, resist effects, and mask-making constraints; however these techniques and features are largely independent of whether standard OCS or the novel loxicoherent systems of the invention are used to calculate intensities. Resist effects in particular can be numerically significant, but standard pre-calibrated models of resist behavior have been developed to take resist effects into account during OPC; this is done by essentially determining a local shift in the dose level at which the resist develops out [or determining an equivalent effective intensity shift], and the input to these standard models is the exposing intensity pattern itself, which the invention determines more efficiently than prior art tools.)

In a preferred embodiment, convergence is made more monotonic by damping the adjustment, e.g., in a single iteration each adjustable edge fragment might be shifted by a lesser amount than that which is estimated to fully correct the adjacent print contour. In general, the ratio of the induced shift in the position of a printed contour and the driving shift in the adjacent mask edge which causes the contour shift, is known as the Mask Error Enhancement Factor, or MEEF, and MEEF may be estimated for particular edge fragments by sampling, or by tracking the shifts observed in previous iterations. Stability of the convergence behavior through the course of iterations can be improved by limiting the adjustments that are made in any single iteration to, e.g., ½ the values which would fully correct the remaining errors in print contour position according to the best available estimates of the local MEEF, i.e. convergence behavior is improved by damping the adjustments.

It is impossible for uncompensated wavering of the (unconverged) print contour to oscillate with great rapidity within the image plane, since the exposing image is bandlimited. (This band limit applies to optical proximity effects for which compensation is possible; it does not apply to stochastic effects in the resist itself.) For this reason the density of control points will usually be adequate as long as the edge fragments are moderately shorter than the lens resolution, e.g. a few times shorter. On the other hand, the dominance of the controlling fragments can be unduly reduced if the fragment lengths are made overly fine, and this will slow convergence. Rules are known in the art for appropriately choosing the fragment lengths and positions, and these so-called fragmentation rules are specified during step 1100. The rules may be applied to the patterns within each frame inner core during step 1302. Alternatively, the patterns in the input queue may be pre-fragmented using the same standard methods.

Most commonly the mask patterns in the input queue are initialized to the target patterns, thus providing block 1302 with target print positions. In other cases, so-called retargeting rules are used to make changes in the specified target print positions, for example requiring that isolated lines or equi-spaced lines of particular pitch be printed with specified biases. Retargeting rules may be input in step 1100, and may be applied within the individual guard-banded frames during step 1302.

The "assist features" deployed during block 1302, also referred to as assisting features or SRAFs (Sub-Resolution Assist Features), are well-known in the art. Broadly speaking, assist features are used to mitigate an aspect of printing features near the limit of resolution wherein the pattern-dependence of the not-fully-avoidable deterioration in image quality is increased, due to the fact that only the coarse image harmonics fit within the lens bandwidth. This pattern-dependent variability also increases when customized illumination directional distributions (referred to as "sources" for short) are used to increase the upper limit on the density of patterns that can be resolved, and with customized sources the variation in print quality becomes particularly pronounced between semi-isolated features and features that are laid out in a high density. Typically the source design is chosen in such a way that the high density features have acceptable depth of focus, with the depth of focus for semi-isolated features remaining quite small. The assist features that mitigate this remaining focus sensitivity are dummy mask features that are laid out adjacent to semi-isolated features with a density and periodicity that approximates the density/periodicity of e.g. the most critical dense features being printed, with each assisting feature usually being kept too small to fully expose the resist at its location, i.e. assists are generally kept sub-resolution in size, so that they don't print as artifacts. It should be noted that there are variant procedures in which the assist features are allowed to print because other masking steps will be employed in fabricating the IC level that can be used to remove the printed artifacts. Even non-printing assists will, however, form a sub-threshold spot or line-segment of light in the image, and these adjacent spaced out pulses of light, though sub-threshold, will interfere in such a way as to cause the semi-isolated feature to print in a manner more closely resembling the printing of dense features, thus reducing the variability between features, and allowing other RETS to be more narrowly targeted. Assist features are generally not adjusted during OPC, but are laid out in fixed positions within the starting mask. The assists may be provided in the input, or they may be deployed during Block 1302 using so-called assist rules that may be supplied during step 1100.

At Block 1304 the processor handling the patterns within a frame assigned to it adjusts the mask fragments (sometimes simply referred to as edges for brevity) within the frame by repeatedly cycling (iterating) the steps of:

Block 1304A: determining loxicoherent system contributions to the image intensity at target edge positions by applying the intensity kernels to squared mask transmissions that have been filtered by the mask filters;

Block 1304B: determining the image intensity at target edge positions by adding the loxicoherent contributions to the sum of intensities from the preferred coherent systems;

Block 1304C: moving mask fragments adjacent to target edge positions whose intensity is lower than the intensity at the edge of the anchoring feature in a direction towards the 'darker' side of the adjacent target edge;

Block 1304D: moving mask fragments adjacent to target edge positions whose intensity is higher than the intensity at the edge of the anchoring feature in a direction towards the 'brighter' side of the adjacent target edge;

Block 1304E: transferring to other processors the iterated positions of fragments within the guard band of the frame being processed, in particular transferring this data to other processors which are handling adjacent frames that are overlapped by this guard band; then using position data from the guard bands of other frames that have similarly been transferred from the adjacent-frame processors to unify and harmonize the positions of fragments in the exterior guard band of the frame being processed before commencing the next iteration cycle; and Block 1304F: terminating the adjustment cycles when the intensities at all target edge positions match that of the anchoring feature to within a tolerance.

Figure 31A:
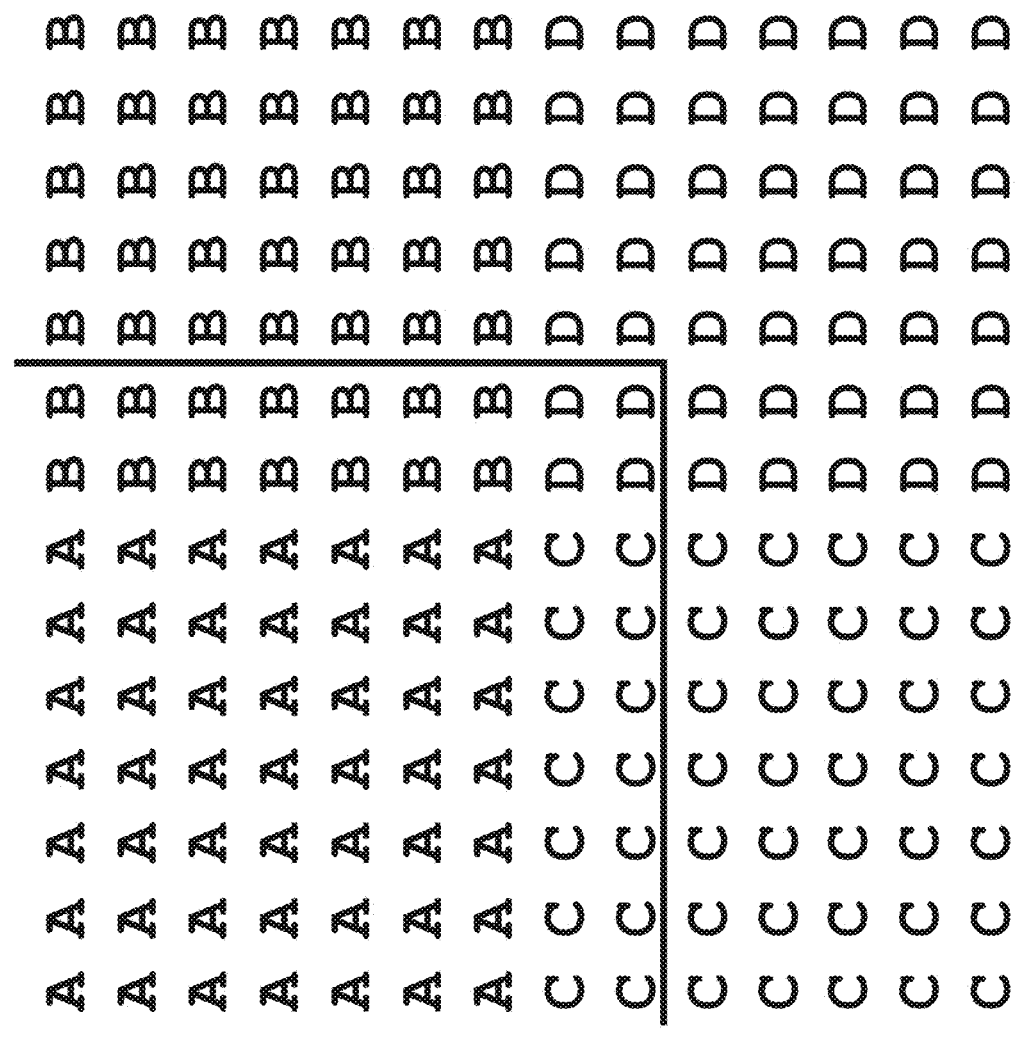

Block 1304 is repeated several times across multiple iterations (e.g. 10), and across multiple processors handling different frames (e.g. 16). Each iteration refines the results of the previous iteration, including previous iteration results from adjacent overlapped frames via Bock 1304E. Further details on the handling of data from adjacent overlapped frames may be understood with reference to FIG. 31. In particular, FIG. 31A shows, in schematic form, a mask area where four adjacent frames intersect in a corner. Only the corner regions of the frames are shown, with the inner core portions of the frames being indicated in highly schematic fashion by the four letters A, B, C, and D. In addition, for one of the frames (frame A), the corner portion of the boundary for the full frame, including the guard band, is shown as a thick line. This boundary extends into the neighboring frames, since the guard band of each frame overlaps the inner cores of adjacent frames by a uniform distance, which might in practice be chosen as 1 micron or 2 microns, e.g. the overlap might be set to the OD.

When the processor handling frame A makes an iterative adjustment in the positions of the mask shape fragments contained within its frame (during Blocks 1304C and 1304D), the shapes from adjacent frames which are overlapped by the guard band of frame A could, in a basic embodiment, be among those receiving an adjustment, since the guard band is part of the frame. As a specific example, those shapes labeled schematically as "B" which lie inside the thick-line-delineated boundary of frame A (this boundary being shown along the lower right corner of frame A) could be adjusted by the frame A processor along with the other shapes within frame A. Since these B shapes fall within the inner core of frame B, they will also receive an independent adjustment by the processor handling frame B. More precisely, when the frames are distributed to separate processors in Block 1102C, the shapes within the guard band regions where frames A and B overlap will be sent (essentially as copies) to two separate processors for adjustment (as well as to additional processors in the extreme corner regions where four frames overlap). During the adjustment process the optical impact of neighboring patterns is accounted for in Block 1304B, but the description of these neighboring patterns that is available to each processor is incomplete for patterns in the exterior guard bands; in other words, the guard band fulfils its purpose of providing optical context for patterns in the frame inner core, but the guard band does not itself have a guard band. Periodic boundary conditions are typically employed during OPC (as a consequence of using FFT-based convolutions), meaning that the neighboring environment for e.g. the "B" patterns in the exterior guard band of frame A includes a "fictional" repeat of frame A to the right of the thick-line frame boundary shown in FIG. 31A. Alternatively, the image may be obtained using only the patterns present within the frame, meaning that the exterior region is effectively treated as empty. In general, the neighborhood environment for, e.g., the B patterns lying within the guard band of frame A will not be correctly represented in the region to the right of the frame boundary (as far as the processor assigned to frame A is concerned). Thus, an iterated adjustment made by the frame A processor to these B patterns would be less accurate. However, as discussed above, the adjustments made during each iteration are preferably damped, so the inaccuracy introduced into these B patterns relative to their previous position is fairly modest. This means that these adjusted B patterns are able to serve as a reasonably faithful representation of the neighborhood environment when the A patterns on their interior side are being adjusted by the frame A processor, both in terms of their optical impact, and in accounting for any mask manufacturability limits that may arise at the inner core boundary. In other words, the inclusion of a guard band containing B patterns allows the frame A processor to make a reasonably accurate adjustment to the inner core patterns in frame A that are adjacent inwardly to the frame B patterns, even though the frame A processor is not able to adjust the overlapped B patterns themselves very accurately.

In alternative embodiments the frame A processor only makes adjustments to the frame A inner core patterns during Blocks 1304C and 1304D, i.e. the exterior guard band patterns are left unadjusted during these steps, but in such embodiments a similar conclusion can still be drawn; the omitted adjustments in the exterior portion of the guard band will not be of large magnitude in any single iteration, meaning that the unadjusted guard band patterns in the B overlap region can still provide reasonable context for the adjacent frame A inner core patterns, at least for the first iteration in which guard band adjustment is omitted (and, as will be seen, proper guard band adjustment can still be provided before the next iteration commences).

The above situation is of course reversed for the frame B processor; that processor cannot generally provide an accurate adjustment for the frame A inner core patterns that are within its guard band, but the B inner core patterns that are within the guard band of frame A (and thus not accurately handled by the frame A processor) can be handled reasonably well by the frame B processor. Given this complementary accuracy in coverage, a reasonable strategy for the Block 1304E overlap reconciliation is to simply swap the iteration results for exterior guard band locations in each frame, replacing them with the corresponding inner core results from adjacent frames. In other words, since the processor for frame B can obtain more accurate adjustments than the frame A processor for those B patterns that are also used as a guard band by the frame A processor, it is reasonable for the A processor to replace the edge positions of these B pattern edge fragments, when commencing the next iteration, by the edge positions that were calculated by the B processor during the previous iteration, these B results being received by the A processor during the Block 1304E reconciliation step. In general, each processor replaces the fragment positions that it obtains for patterns within the exterior guard band of its frame with the (generally more suitable) positions given to these patterns as part of the inner core of an adjacent frame. Similarly, the processor also transfers to other processors the edge positions of fragments within the inner core of its frame that also fall within the guard bands of other frames.

Figure 31B:
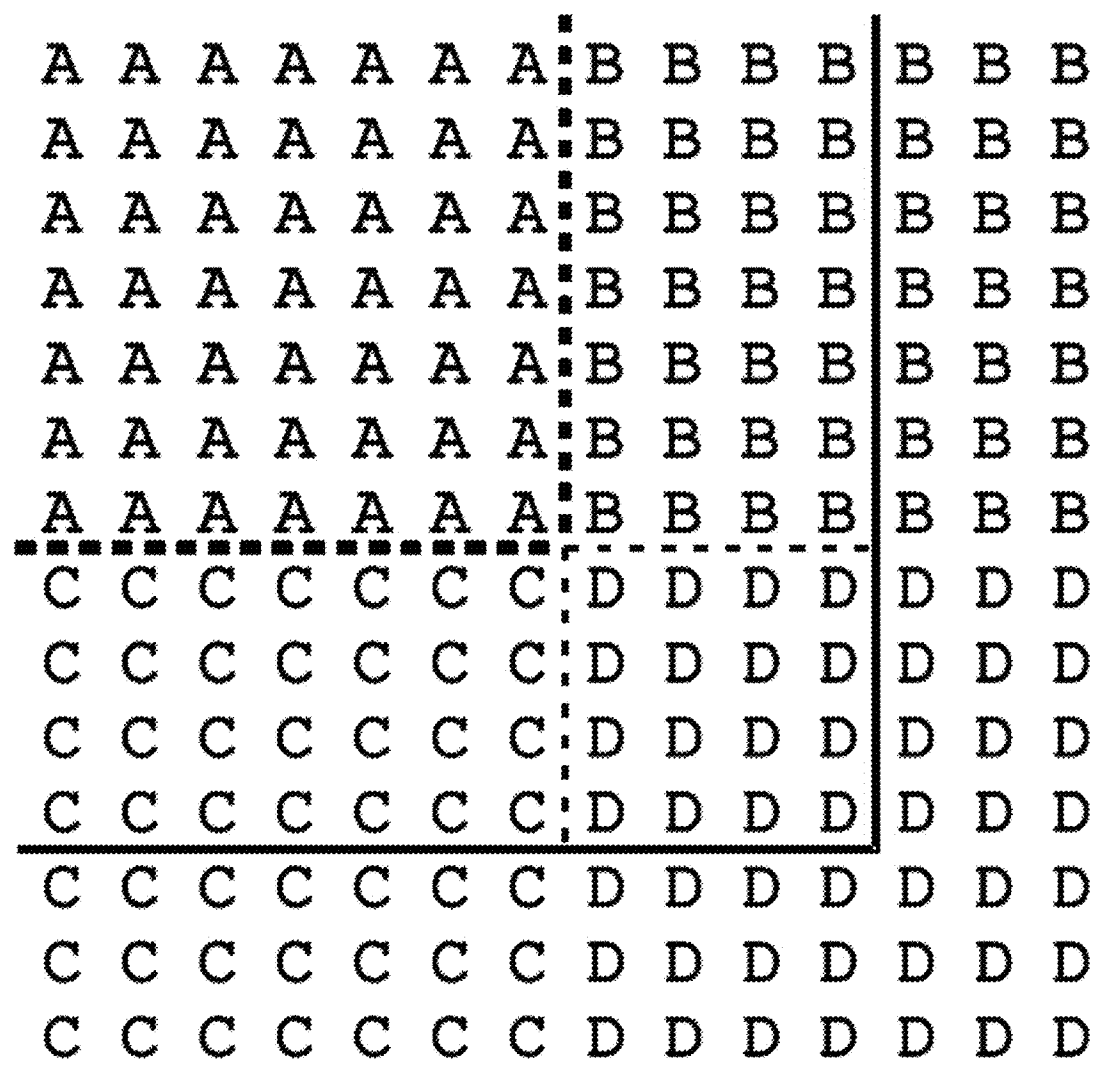

With this simple swap scheme an abrupt change is made to patterns outside the frame inner core, while patterns inside the inner core are left entirely unchanged. More sophisticated schemes can be used in which the boundary reconciliation changes are spatially smoothed. One such scheme may be understood with reference to FIG. 31B, which shows the same corner region between four frames as FIG. 31A. In the FIG. 31B embodiment the frame boundaries have been extended to increase the overlap with the inner cores of adjacent frames, as may be seen from the frame A outer boundary, which is again indicated in its corner portion with a thick solid line. As with the simple swap scheme of FIG. 31A, the FIG. 31B smoothing scheme for boundary reconciliation can leave unchanged (during Block 1304E) the edge positions calculated by the processors for shapes in their frame inner cores. For example, the boundary of the frame A inner core is shown in FIG. 31B as a thick dashed line, and patterns inside this boundary can be left unchanged by the frame A processor during reconciliation step 1304E. However, reconciliation changes will in general be made by the frame A processor to guard band patterns that lie outside the frame A inner core, using a linear interpolation that blends two categories of data; first, the previous-iteration edge positions that the frame A processor itself obtains during application of steps 1304A through 1304D to the full frame A (including exterior guard band regions), and second, the previous-iteration edge positions that the frame A processor receives from the processors of adjacent frames during step 1304E. The specific mode of interpolation can be chosen based on the overlapping frames involved. For example, the exterior guard band for frame A may be divided into 8 regions involving different overlap combinations, of which 3 are shown (or partially shown) in FIG. 31B. In the strip-like region (partially shown) where only frames A and B overlap (outside the frame A inner core), the interpolation weight given to the processor A results may be ramped linearly from 100% on the left side of the strip to 0 on the right, with the weight given to the B results being ramped in complementary fashion, i.e. from 0 to 100% left-to-right. Similarly, the fragment positions used in the (partially shown) strip-like guard band portion where only frames A and C overlap may be smoothly merged between the frame A and frame C results by using complementary interpolation weights that ramp linearly from top to bottom of the strip.

In corner portions of the guard band where four frames overlap (e.g., the square-shaped corner portion of the frame A guard band whose edges are delineated in FIG. 31B with thick solid lines and thin dashed lines), the fragment positions can be set using a bilinear interpolation of the results from the four overlapping frames, with each interpolation weight being the product of a linear ramp for the x coordinate and a linear ramp for the y coordinate. For example, the result from frame A may be given a weight that is the product of a first factor that ramps from 100% to 0 as the x coordinate of the fragment midpoint in question varies from the left edge of the corner region to the right edge, and a second factor that ramps from 100% to 0 as the y coordinate varies from top to bottom of the corner region. Similarly, the weight given to the frame B result can be a product of linear terms that ramp from 0 to 100% left-to-right, and 100% to 0 top-to-bottom. The weighting system extends in the obvious way to the other frames that overlap in this (lower-right) guard band corner of frame A, and likewise to the other corners of the frame A guard band, and further to the guard bands of other frames, as does the weighting scheme for handling the strip-like portions of exterior guard bands where two frames overlap. This smoothed reconciliation of guard band data during Block 1304E provides continuity with adjacent frames while allowing the guard bands to continue providing suitable context for the inner cores, even as the frames are being processed (largely) in parallel.

Resist effects can be taken into account with an additional step between Blocks 1304B and 1304C in which one of the standard resist models used in OPC is applied, as will be clear to those skilled in the art. These resist models use the exposing intensity pattern (e.g. as obtained during Block 1304B) as input, and provide as output e.g. an effective (phenomenological) change in the local intensity at each feature edge, such that when the revised intensity pattern is thresholded at the exposure dose required by the resist, the resulting revised dose contour will accurately reflect the deviations of the developed resist edge contour from the physical dose tracking response of an ideal resist. The edge adjustments in Blocks 1304C and 1304D can make use of the effective intensity as modified by the resist model, rather than referencing the true optical intensity. Some resist models ostensibly determine an effective change in the local development threshold instead of the local intensity level, but for the execution of Blocks 1304C and 1304D this only amounts to a sign change in the revision. As is well-known, the standard resist models determine the dose or intensity adjustment at each feature edge by applying a model function whose terms can be interpreted as "traits" extracted from the local image; for example, these traits may include the local slope of the intensity along a cutline that crosses the feature edge, or the maximum or minimum values of the intensity along such a cutline, or the values taken on at the feature edge by convolutions of the intensity with regression kernels. The standard functional forms for the resist model are generally regression polynomials or modified polynomials whose coefficients and parameters are determined in a data fitting step undertaken before OPC commences, i.e. a regression step in which the resist model parameters are fit to e.g. a few thousand measured dimensions of a diverse set of calibration patterns exposed in resist under different dose and focus conditions.

The adjustments in Blocks 1304C and 1304D should also respect standard precautions to ensure that the dimensionally compensated aperture shapes can actually be manufactured on the mask, which may mean accepting an imperfect dimensional compensation. A common approach is to check each adjustment in fragment position against so-called mask manufacturability rules, which in the simplest case specify minimum separations that must be maintained between any two facing edges of an opaque mask feature, or between the feature edges at opposite sides of an aperture shape formed on the mask. The adjustments in Blocks 1304C and 1304D should thus be clipped to maintain the minimum spacings imposed by these manufacturability rules, and the termination criterion expressed in Block 1304F should be understood to include an exception for edges where complete equalization of the target edge intensity to the common dose of the anchor contour is blocked by mask manufacturability constraints.

Block 1304A allows for the use of a plurality of loxicoherent systems, and the set of loxicoherent systems employed by the invention (or the single loxicoherent system, if only one is used) will be referred to as the loxicoherent system set. In accordance with an aspect of this invention the presence of even a single loxicoherent kernel (requiring 2 FFTs to apply) has been found to remove most of the 1D error; this is achieved by the removal of the fin (along the diagonal), with resulting benefit as has been illustrated in e.g. FIG. 28.

The use of the first loxicoherent kernel provides a strong incremental benefit. As was discussed above, the prior art OCS method is known to provide the best possible technique to approximate the imaging operator (i.e. the TCC) as a sum of coherent systems, although with specialized mask content it can be useful to apply specialized OCS kernels, as is now well-known. This optimality property might seem to contradict the strong advantage seen from applying loxicoherent systems. However, while the optimality results known in the art establish that OCS provides optimum kernels for matching the TCC using Mercer terms having the form $\Psi(f_1)\Psi^*(f_2)$, these results do not prove the superiority of OCS over, e.g., expansions with terms according to the invention having the form $\hat{T}(f)\tilde{T}(\Delta f)$ or $T'(f_1) \, T'^*(f_2) \, T''(\Delta f)$. Explained in more physical terms, the optimality proofs in the literature show that the eigenfunctions of the TCC operator provide the best possible lens apertures for a set of coherent systems whose images are superposed (summed) to match a partially coherent lens system, but they do not address the performance of the novel loxicoherent systems employed by the invention (or even indicate awareness of such novel compound systems in any way), and these loxicoherent systems have been shown herein to be strongly useful in image calculations. Even though OCS/Mercer kernels may be preferable for the first few terms of the decomposition, it quickly becomes preferable to add at least one loxicoherent system in accordance with the embodiments of this invention.

The OCS terms have difficulties at the $\Delta f=0$ crease because at these locations $\partial^2 TCC/\partial \Delta f^2$ must become essentially infinite, even while $\partial^2 TCC/\partial \bar{f}^2$ remains of moderate magnitude. Strictly speaking, the assumption that imaging is isoplanatic over the OD is not perfectly accurate, and the notion of an infinitely sharp TCC crease breaks down at some point. However, as a practical matter, field-dependent lithographic aberrations are quite small to begin with, and the OD is very small compared to the full lens field (e.g. a few microns versus tens of millimeters), so TCC creases may be considered arbitrarily sharp at any scale that is relevant to OPC.

As has been discussed in connection with FIG. 11, one can readily provide the approximated TCC with very different curvatures along the $\Delta f$ and $\bar{f}$ meridians by using terms of the form $T_{Rotated} = \widehat{T}(\bar{f})\widehat{T}(\Delta f)$, with each of the distinct constituent kernels being given very different curvatures, whereas, per FIG. 7, conventional Mercer terms have curvatures in these two meridians that tend to be broadly similar to order of magnitude. Use of rotated axes thus allows the approximated TCC to better match the sharp crease in the true TCC that conventional OCS kernels can only slowly extract. The same conclusion of superior compatibility applies to the $T'(f_1)T''^*(f_2)T''(\Delta f)$ loxicoherent system decomposition. The FIG. 30B procedure in effect assigns $\widetilde{T}(\Delta f)$ an effectively infinite sharpness corresponding to ~1 pixel of the simulation grid.

Figure 32:
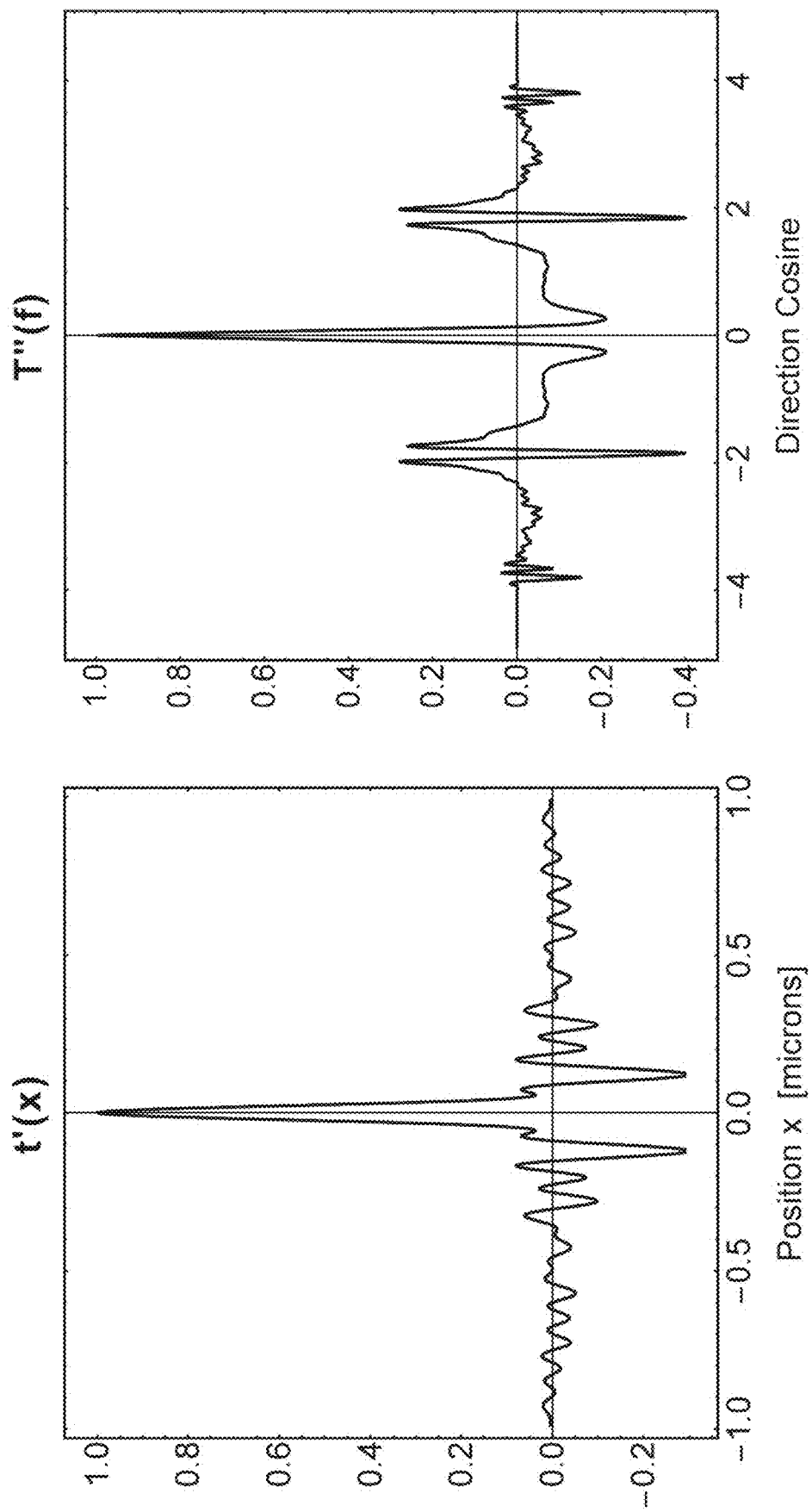
FIG. 32 illustrates plots of two loxicoherent kernels, namely a T" frequency domain filter kernel, and a t' spatial domain mask filter.

Reference in this regard can be made to the plot shown in FIG. 32 that illustrates a T" filter kernel, along with a t' spatial domain kernel. FIG. 32 is complementary to FIG. 23, with the right side of each plot showing frequency domain kernels. The sharp peak at the origin in the T" frequency domain kernel in FIG. 32 is apparent (C-quad test case introduced in FIG. 9). In contrast, the T' filter kernel shown in FIG. 23 (right-side plot) has only a moderate curvature.

Although the first loxicoherent system can extract large portions of the residual TCC error, the ideal asymptotic limit in which $TCC^{(r)}$ is entirely extracted by this one system cannot be fully realized in practice, and the first system will still leave some residual TCC error, as has been illustrated in FIG. 24. This remaining TCC error can be regarded as a new $TCC^{(r)}$ from which additional loxicoherent systems can be extracted. However, additional mathematical considerations are involved in these extractions, since it is no longer appropriate to carry out step 1212 (where the constituent coherent system aperture T' is determined) of the FIG. 30B procedure using FIG. 22G in unmodified form. As with the first loxicoherent system, one may once again extract new rotated systems (i.e. of the FIG. 11A form) from the new $TCC^{(r)}$ by using the eigenfunctions of operators Q and Z in FIGS. 12F and 12G, but FIG. 22G no longer provides an optimal route for extracting new loxicoherent kernels (in particular, the constituent coherent system aperture, also referred to as a mask filter) from these rotated systems. The difficulty is that FIG. 22F (and thus FIG. 22G) is contingent on the presence in $TCC^{(r)}$ of a dominating fin along $\Delta f=0$, and this fin is removed once the first loxicoherent kernel is extracted, as may be seen by comparing FIG. 24 to FIG. 14.

It is, of course, straightforward to extract valid constituent coherent kernels from the $T_{Rotated}$ kernels by diagonalizing the $\widehat{T}$ kernel into a Mercer series in its eigenfunctions, which would achieve the form specified in the last step of FIG. 20A, and then setting T" equal to $\widetilde{T}$. However, each such loxicoherent kernel would tend to be highly suboptimal. This can be understood by noting that when $\widehat{T}$ is treated as an operator in the doubly-dimensioned Hopkins space, it will depend on its two arguments (the $f_1$ and $f_2$ coordinates) only in the combination $\bar{f}=(f_1+f_2)/2$. It follows that when $\widehat{T}$ is inverse Fourier transformed under complex operator conventions (meaning that the transform in the $f_2$ argument uses a conjugated exponent), the resulting spatial domain function $\widehat{t}$ will be Toeplitz, in the sense that it will depend only on $x_1-x_2$, so that its gridded form will be a Toeplitz matrix. In general the Mercer expansion (diagonalization) of such a matrix will only converge slowly, and this slow convergence will be replicated back in the frequency domain, i.e. in the diagonalization of $$\bar{T}\left(\frac{f_1+f_2}{2}\right).$$

This in turn implies that a very large number of terms K would need to be used in the right-hand side of FIG. 20A in order to get a close approximation of the first new rotated system, where the first new rotated system referred to here is the first rotated system to be extracted from the new $TCC^{(r)}$ (i.e. the newly remaining TCC error) that is formed after the first loxicoherent system has been extracted.

However, even though direct use of eigendecomposition in the last step in FIG. 20A would typically require an impractical number of terms K, a direct Mercer expansion of this kind can prove helpful as one element in a more sophisticated decomposition method, as will be discussed.

Before describing this and other more sophisticated decompositions, it is helpful to first consider a simpler but more straightforward method for extracting a second loxicoherent system (and subsequent higher-order loxicoherent systems). While the kernels provided by this simpler method are mildly sub-optimal in their reduction of RMS $TCC^{(r)}$, they are often a close enough match to $TCC^{(r)}$ to provide an appreciable and quite useful accuracy improvement. This simple method is based on the expectation that after only a single loxicoherent kernel has been extracted to remove the $\Delta f=0$ DC fin, one may still expect to see moderately pronounced residual ridge-like content in $TCC^{(r)}$ along adjacent diagonally displaced contours where $\Delta f$ has constant (but generally non-zero) magnitude. Although $TCC^{(r)}$ will at this point be extremely small (and preferably zero) where $\Delta f$ is exactly 0, non-negligible "diagonal" ridges or "ripples" will often be present at low values of $\Delta f$ that closely flank the former peak of the removed fin at $\Delta f=0$, as may be seen in FIG. 24. The T" kernel of the first loxicoherent system may broadly be interpreted as a mean cross-section of the $\Delta f=0$ fin, and the residual ripples that remain after this fin is removed may be thought of as deviations from the extracted mean. While these residual ridges will be small in comparison with the removed fin, they are likely to nonetheless represent the largest remaining content in $TCC^{(r)}$ after the first loxicoherent system is extracted. They also represent content at low (but non-zero) spatial frequencies, and, as was discussed in connection with FIG. 26, with practical masks a strong low frequency peak will almost always be present in the spectral autocorrelation function of the mask patterns, and this peak tends to make the extraction of low frequency content in $TCC^{(r)}$ more important for image matching accuracy than reduction of the overall RMS magnitude of $TCC^{(r)}$.

By focusing on extraction of $TCC^{(r)}$ in the largest diagonal "ridge" that remains after the $\Delta f=0$ fin has been extracted, it is possible to extract a second loxicoherent system using much the same procedure as has been derived above for obtaining the first loxicoherent system (e.g. obtaining the first system by using FIGS. 22G and 22J), but substituting (as a replacement for the $TCC^{(r)}(f,f)$ fin peak that is used to extract T' for the first loxicoherent system) the residual content along a difference frequency diagonal $\Delta f=\Delta f_0$ that is deemed to now be dominant in the remaining TCC residual (with $\Delta f_0 \neq 0$). Since such content typically shows far less relative predominance than the $\Delta f=0$ fin in the $TCC^{(r)}$ from which the first loxicoherent system is extracted, we will refer to the strongest remaining ridge as "quasi-dominant", and more generally we will deem any diagonal ridge with strong residual TCC content (other than the $\Delta f=0$ fin) to be "sub-dominant". As a further point of nomenclature, when a subsequent loxicoherent system is designed to extract $TCC^{(r)}$ content in the vicinity of a particular difference-frequency "ridge", such as a quasi-dominant ridge, the peak difference frequency of this ridge will typically be denoted $\Delta f_0$.

The method (to be described) for extracting loxicoherent systems that capture this quasi-dominant content will also succeed in capturing $TCC^{(r)}$ content at other difference frequencies throughout the Hopkins domain; analogously with the primary loxicoherent system, the plurality of constituent systems that are present in a higher-order loxicoherent system allows complete or near-complete suppression of a quasi-dominant peak in $TCC^{(r)}$ via one constituent kernel, while also providing simultaneous minimization of RMS $TCC^{(r)}$ over the entire doubled domain using the other kernel. Moreover, simple iteration of the method allows multiple loxicoherent systems to be defined in a systematic way, since extraction of a quasi-dominant ridge may be followed by a new application of the method to another quasi-dominant diagonal that is present in the $TCC^{(r)}$ that still remains. (The quasi-dominant diagonals in the still-remaining $TCC^{(r)}$ will generally all have been changed somewhat, since the previously extracted system will generally have reduced $TCC^{(r)}$ throughout the domain.) Just as the first loxicoherent system may be referred to as a first-order loxicoherent system, these succeeding loxicoherent systems may be referred to as higher-order loxicoherent systems.

It should be noted that FIG. 22E will not be applicable in general along $\Delta f$ contours other than $\Delta f=0$, since the remaining $TCC^{(r)}$ after the first system is extracted will usually be roughly balanced in its primary real part between positive and negative residuals. Appropriate alternatives to extract loxicoherent systems beyond the first will now be presented. In the usual case where the quasi-dominant $\Delta f$ diagonals are of low (but non-zero) frequency, it is appropriate to apply loxicoherent systems in the specialized form of FIG. 20I, rather than the simpler form of FIG. 20H that suffices for the first loxicoherent system. For example, a single T' kernel might be extracted for a ~50% region (or for disjoint regions collectively comprising ~50%) along the $\Delta f=\Delta f_0$ diagonal within which the real part of $TCC^{(r)}$ is positive, and another T' kernel extracted for regions along this quasi-dominant diagonal wherein $TCC^{(r)}$ is largely negative, so that parameters $R^{(+)}$ and $R^{(-)}$ would both chosen as 1 in this non-limiting example.

A useful consequence of such choices is that the logarithm of the T' kernel that is associated with a particular choice of $r^{(+)}$ or $r^{(-)}$ in FIG. 20I will be finite within any contiguous region of the window function D, and need not cross a branch cut. In principle this allows isolation of the nonlinear character of the condition that matches the new loxicoherent system to $TCC^{(r)}$ along the quasi-dominant $\Delta f_0$ diagonal, by use of logarithms.

Referring to FIG. 33, the condition for matching a loxicoherent system to $TCC^{(r)}$ along a quasi-dominant diagonal $\Delta f=\Delta f_0$ is expressed as FIG. 33A, and since FIG. 33A involves products of the unknown T' function, it is nonlinear. However, when the log of T' is regarded as the unknown, the matching equation becomes a linear equation, as shown in the first line of FIG. 33B. This equation holds at all $\bar{f}$ points along the $\Delta f_0$ diagonal at which $TCC^{(r)}$ has the same chosen sign, so a system of linear simultaneous equations can be obtained by gridding the equation in $\bar{f}$. In principle T' can then be determined by solving this system of simultaneous equations, with log $[T''(\Delta f_0)]$ being treated as an arbitrary constant offset, which may be set to 0. (If $TCC^{(r)}$ is negative in this region, $T''(\Delta f_0)$ can initially be set to −1, as indicated in the last line of FIG. 33A, but with this negative sign being considered to cancel (and be canceled by) the sign of $TCC^{(r)}$, leaving log $[T''(\Delta f_0)]=0$.) However, these simultaneous equations are extremely ill-conditioned in practice. A formulation with slightly better conditioning is obtained by recognizing that the two log [T'] terms whose sum is the log of $TCC^{(r)}$ along the $\Delta f=\Delta f_0$ diagonal (with arbitrary constant offset log $[T''(\Delta f_0)]$, which may be set to 0) are two copies of the same function, each being shifted from one another by $\Delta f_0$, i.e. one copy is shifted by $+\Delta f_0/2$, and the other by $-\Delta f_0/2$. Their sum can therefore be regarded as a single copy of the log [T'] function that has been convolved with a kernel which contains two impulses, i.e. this kernel is the sum of a delta-function centered at $+\Delta f_0/2$ and a delta-function centered at $-\Delta f_0/2$. This conversion to a convolution is expressed in the second line of FIG. 33B. Extraction of log [T'] from the known log $[TCC^{(r)}]$ along a segment of the quasi-dominant diagonal can then be treated as a deconvolution problem, to which standard regularized methods can be applied. Once T' is determined from the quasi-dominant diagonal, T'' can be obtained using FIG. 22J.

This deconvolution method can yield reasonably well-conditioned solutions in the case of small $\Delta f_0$, i.e. where the dominant remaining errors in image matching involve intensity modulation at low spatial frequencies, and the residual content that is quasi-dominant indeed usually occurs at values of $\Delta f_0$ that are small, i.e. values which lie in close proximity to the $\Delta f=0$ fin that is removed by the first loxicoherent system. However it is often easier to avoid ill-conditioning by avoiding the logarithmic transformation, and instead solving the equation of FIG. 33A directly as a nonlinear optimization problem, e.g., minimizing the RMS error in satisfying FIG. 33A at multiple gridded $\bar{f}$ values, potentially including weights that reflect the generally heterogeneous frequency content of IC masks, as has been illustrated in FIG. 27. Standard minimization algorithms can be used, and the calculation is generally quite fast because optimization takes place over the limited dimensionality of the quasi-dominant diagonal. When $\Delta f_0$ is small, a suitable starting solution for T' is provided by the last line of FIG. 33C.

FIG. 33C is based on roughly the same simplification as FIG. 22F, which was shown to hold in the vicinity of the fin. Since the $TCC^{(r)}$ content that is quasi-dominant after extraction of the first loxicoherent system often represents content in the "foothills" of the fin that could not be exactly fit by the first T" kernel, it is often the case that $\Delta f_0$ is quite small (though not zero), which makes FIG. 33C quite accurate. In fact, the last line of FIG. 33C may in itself provide a sufficiently accurate solution for T' along the quasi-dominant diagonal, without any further refinement, as will be seen.

The solutions for T' and T" obtained using FIGS. 33A-33C may then optionally be further refined to maximally extract $TCC^{(r)}$ across the full 2D or 4D domain, rather than along the quasi-dominant diagonal alone. However, it should be noted that even when T' is only optimized within the quasi-dominant diagonal, the optimization of T" using FIG. 22J considers the full 2D or 4D Hopkins domain, so that it provides a degree of reduction in $TCC^{(r)}$ throughout the full $f_1,f_2$ space. In particular, FIG. 22J provides the T" kernel that is optimal in a least squares sense over the full Hopkins domain (when used in a loxicoherent system). Since the OCS kernels $\Psi$ are optimal (for use in coherent systems) under the same criterion when chosen in the standard way, it can be seen that loxicoherent systems and OCS systems both include a kernel function that provides a least squares optimal reduction in $TCC^{(r)}$ over the full Hopkins domain (for use within systems of their respective prescribed structures). However, unlike a coherent system, each loxicoherent system includes more than one distinct kernel, e.g. a T' kernel in addition to a T" kernel. In embodiments where the procedure for determining T' includes a step of numerical optimization, this optimization can optionally be carried out over the full doubled domain, or alternatively over a restricted domain, such as along a quasi-dominant diagonal. With either option, well-known optimization methods may be used, such as the Gauss-Newton or Levenberg-Marquardt algorithms. These are appropriate for minimization of a least squares objective, such as the squared fitting error in matching the second loxicoherent system to $TCC^{(r)}$.

Accelerated gradient methods may alternatively be used. Regularization terms can be added to the objective to prevent imbalance in the sizes of T' and T", since in the objective these two factors always occur together in products. If the optimization is unconstrained, an implicitly two-stage optimization can be used, with the T" values being obtained from FIG. 22J during optimization loops, rather than being optimized as variables.

When $\Delta f_0$ is large, the approximation of FIG. 33C will be inaccurate (sometimes making it unsuitable even for initializing an optimization). In addition, the most optimal form for higher order loxicoherent systems may differ from FIGS. 20H and 20I when $\Delta f_0$ is large. A more suitable form (which in some cases entails an additional FFT) may be understood with reference to FIG. 34. In particular, to obtain a suitable form for a newly added loxicoherent system in cases where the quasi-dominant frequency $\Delta f_0$ is no longer small relative to the band limit, one can extract the system using the offset frequency coordinate system defined in FIG. 34A, also referred to as a local frequency coordinate system. The FIG. 34A local frequency variables (designated with primes) allow a loxicoherent system to be defined based on the quasi-dominant diagonal $\Delta f_0$ in much the same way that the first loxicoherent system is obtained via FIGS. 22A-22H from the dominant fin at $\Delta f=0$. $TCC^{(r)}$ will have Hermitian symmetry when preferred practices are followed, which means that it will contain symmetric quasi-dominant diagonals at both $+\Delta f_0$ and $-\Delta f_0$. However, we will first consider the case where $\Delta f_0$ represents the positive-valued frequency difference. Toward that end, the + subscript on the primed local frequencies $f'_{1,+}$ and $f'_{2,+}$ indicates that the local coordinates in FIG. 34A refer to the positive-frequency quasi-dominant diagonal. $TCC^{(r)}$ will have relatively large magnitude near this diagonal, so as a working approximation we can treat $f'_{1,+}-f'_{2,+}$ as a small quantity for frequency pairs of interest, though this assumption will be less productive than the corresponding approximation that was made at the earlier stage of extraction where the dominant $\Delta f=0$ fin was captured by the first loxicoherent system. (However, as with the method of FIG. 22 [e.g. FIG. 22F], our approximation that $\Delta f'$ is small will not prevent the resulting loxicoherent system from fully extracting the quasi-dominant diagonal, while at the same time improving $TCC^{(r)}$ throughout the remainder of the Hopkins domain via an incoherent kernel that is least-squares optimal.) We further define a primed version of the $TCC^{(r)}$ function that expresses the residual TCC error as a function which has the primed frequency coordinates as its arguments. In other words, we define a function $TCC_+^{(r)'}$ to be a shifted version of $TCC^{(r)}$ that has been centered at the origin of the new primed coordinate system, as expressed mathematically in FIG. 34B, where the right-hand expression then maps the primed arguments back to the conventionally centered frequency arguments of the TCC, via FIG. 34A.

Since the $+\Delta f_0$ and $-\Delta f_0$ diagonals are quasi-dominant, we can efficiently extract $TCC^{(r)}$ in each region of given sign by following much the same procedure as was used above for the dominant $\Delta f=0$ fin, if we work in the locally rotated system. FIG. 34A shows explicitly how an efficient rotated system approximation to the local residual TCC can be expressed in the local coordinates. For the same reasons as were applicable with FIG. 16B above, we can consider the local $\widehat{T}$ function for the positive frequency $\Delta f_0$ diagonal to have a peak value of 1, with this peak occurring at $\Delta f=\Delta f_0$, i.e. at $\Delta f'=0$. This means that the local rotated system kernel $\widehat{T}$ can be determined by matching it to $TCC_+^{(r)'}$ along the ridge peak of the quasi-dominant diagonal, as shown in the first line of FIG. 34D, with this determination of $\widehat{T}$ being analogous to that which was carried out in FIG. 16B for the dominant fin using unprimed coordinates. Since $f'_{1,+}$ is numerically close to $f'_{2,+}$ within this quasi-dominant diagonal region, we can approximate $TCC_+^{(r)'}$ at the arithmetic mean of $f'_{1,+}$ and $f'_{2,+}$ along the ridge peak (i.e. with both arguments of $TCC_+^{(r)'}$ being given this same mean value in the primed coordinates) as being very close in value to the geometric mean of the ridge values of $TCC_+^{(r)'}$ at $f'_{1,+}$, and at $f'_{2,+}$. This approximation is shown as the second line of FIG. 34D, and is analogous to that used in FIG. 22F with unprimed coordinates. Note that when $TCC_+^{(r)'}$ is complex-valued, the geometric mean must be calculated in a way that ensures continuity in phases, and this may require setting $\widehat{T}$ to zero near branch cuts. A simpler approach is to calculate separated loxicoherent systems for the positive and negative components of the real and imaginary parts, although in some cases these can be combined. FIG. 34E shows, analogously to the last line of FIG. 34A, that in regions along the quasi-dominant diagonal where the sign of $TCC^{(r)}$ is everywhere negative, we can set the peak of the T function to $-1$, and can reverse the sign of $TCC^{(r)}$ when taking square roots in FIG. 34D. This approach can be taken with either the real or imaginary part of $TCC^{(r)}$, in cases where complex-valued kernels are not being employed. Since this amounts to a simple absorption of the sign by $\widehat{T}$ and T", we will essentially follow the same procedure whether dealing with the complex $TCC^{(r)}$ or its real or imaginary part, or with the positive or negative $TCC^{(r)}$ sections of these parts, though the distinctive symmetry of the imaginary part is preferably taken into account, as will be discussed. For simplicity the following equations will not explicitly distinguish the case of negative-valued $TCC^{(r)}$, where it is understood that the sign of the overall contribution to the loxicoherent system will be reversed.

Under all of these sign variants, the local $TCC_+^{(r)'}$ functions whose geometric mean is calculated in the second line of FIG. 34D can next be converted back to the global $TCC^{(r)}$ function by applying the equation of FIG. 34B, which results in the third line of FIG. 34D. The FIG. 34C rotated system approximation to the quasi-dominant $TCC^{(r)}$ now takes the form shown in the first line of FIG. 34F. Converting the overall expression back to the global $TCC^{(r)}$ function on the left and to global frequency coordinates on the right (by applying the equations of FIGS. 34B and 34A, respectively) we arrive at the second line of FIG. 34F. This already qualifies as a loxicoherent system (but has a remaining deficiency to be discussed shortly), so following the logic introduced earlier in connection with FIG. 20B, we substitute a T" kernel for the T kernel of the rotated system, as a notational change to indicate that the function can be refined for better matching to $TCC^{(r)}$ when used in a loxicoherent system instead of a rotated system.

Since $TCC^{(r)}$ is Hermitian, the quasi-dominant diagonal at $\Delta f = +\Delta f_0$ will be complemented by an equally strong diagonal at $\Delta f = -\Delta f_0$. Analogously to FIG. 34A, FIG. 34G defines appropriate local frequency coordinates $f_{1_-}'$ and $f_{2_-}'$, whose values will be numerically close in regions of significant $TCC^{(r)}$ near this second quasi-dominant diagonal. Through steps similar to FIGS. 34B-34F we then arrive at FIG. 34A, which represents the portion of an added loxicoherent system that applies near the $\Delta f = -\Delta f_0$ quasi-dominant diagonal, just as the last line of FIG. 34F applies near the $\Delta f = +\Delta f_0$ quasi-dominant diagonal. From Hermitian symmetry it follows that the T" functions for these two regions share a common mirrored shape, as shown in the first line of FIG. 34I, where a common shape function T" has been introduced. Since the $+\Delta f_0$ and $-\Delta f_0$ portions of $TCC^{(r)}$ are fitted separately in the new loxicoherent system, T" should depress to 0 any contributions from the excluded diagonal, i.e. from the distant diagonal on the opposite side of the origin from the peak. In the convention used here T" is defined as a (generally narrow) function that is centered at the origin; T" is then given an argument when applied in the loxicoherent system that shifts it to $\pm\Delta f_0$, as shown in the first line of FIG. 34I. This means that the required truncation of contributions from the excluded diagonal is effected by defining T" to drop to 0 when its argument is less than $-\Delta f_0$, as shown in the second line of FIG. 34I. These steps allow the last line of FIG. 34F to be combined with FIG. 34H to form the loxicoherent system that is shown in the first line of FIG. 34J, with subsequent lines defining the terms involved. The FIG. 34J loxicoherent system is seen to have a slightly different form from the systems of FIG. 34H or 34I. However, as in other embodiments, each FIG. 34J system uses multiple distinct kernels (unlike prior art coherent systems, each of which is represented computationally by a bilinear product of a single kernel), with the FIG. 34J system using the three distinct kernels $T_a'$, $T_b'$, and T" (though as noted, $T_a'$ and $T_b'$ are derived as two distinct kernels from a common function T). The loxicoherent form shown in the first line in FIG. 34J gains efficiency by combining the systems of FIGS. 34F and 34H, and so removes a deficiency in these latter systems that was referred to earlier.

It should also be noted that even though FIG. 34J calculates the T' kernels in terms of a single quasi-dominant difference frequency $\Delta f_0$, these expressions may readily be averaged over a range of $\Delta f_0$ values; for example (in the case of 2D patterns), over a range of 2D difference frequencies having the same Euclidean magnitude.

To complete construction of the FIG. 34J loxicoherent system it is necessary to explicitly calculate the constituent incoherent system kernel T". This can be accomplished using FIG. 34K, which may be derived using the same logic as was used to derive FIG. 22J (also making use of the last line of FIG. 34I). The equivalent of 3 FFT-based convolutions are required to apply the FIG. 34J loxicoherent system during image calculations, as shown in FIG. 34L; for example, the spatial domain quantities $m'_a$ and $m'_b$ may each be calculated using what is essentially a convolution, and then a further convolution of their product with the re-phased t" kernel may be carried out to obtain the intensity contribution $\Delta I^{(r)}(x)$. (The FIG. 33 kernels only entail 2 convolutions per system, and are typically a more appropriate choice when $\Delta f_0$ is small.) FIG. 34L has a compact structure that is convenient for computation, but its relationship to the simpler lth loxicoherent system term in the more basic FIG. 20H decomposition can be seen by re-writing FIG. 34L as the expression shown in FIG. 34M, which is readily derived from FIG. 34L when $\bar{T}$ (defined in FIG. 34J) is real-valued (with $\bar{t}$ denoting the Fourier transform of $\bar{T}$). FIG. 34M shows explicitly how loxicoherent kernels in the unprimed form can be re-phased in order to map properly to $TCC^{(r)}$ content at nonzero $\Delta f_0$. In physical terms, the FIG. 34J loxicoherent system includes two constituent coherent systems which are differently displaced in the frequency domain, though their apertures have a common local shape, with the transmitted amplitudes from these constituent coherent systems being interfered with one another after having the two different tilt phases $\pm\Delta f_0/2$ prismatically removed, with this interference pattern then being used as an input to a constituent incoherent system whose output is upshifted by $\Delta f_0$.

A specialized form of the FIG. 34J loxicoherent system will now be discussed that is particularly well-suited for correcting the imaginary part of $TCC^{(r)}$ using real-valued kernels. This specialized form may also employ a different symmetry in the T" kernel from that expressed in FIG. 34I. As has been discussed in connection with FIG. 15F, $Im[TCC^{(r)}]$ tends to have a more complicated symmetry than $Re[TCC^{(r)}]$, in that the imaginary part of the near-DC fin is actually zero-valued where the difference frequency $\Delta f$ is exactly zero, though it nonetheless becomes relatively large (in magnitude) at finite difference frequencies that are close to 0, exhibiting a ridge structure that is antisymmetrically split between positive and negative ridges (referring only to the imaginary part of $TCC^{(r)}$). In lithographic applications the real part of $TCC^{(r)}$ is typically of greater significance than the imaginary part of $TCC^{(r)}$, particularly prior to extraction of the first loxicoherent system; nonetheless, defocus can have a non-negligible impact via $Im[TCC^{(r)}]$, even though the impact of defocus through the real part of $TCC^{(r)}$ (this latter being also changed- and generally increased-by defocus) is usually the stronger effect. (Note too that the peak $\Delta f = 0$ values of the dominant fin are pure real, per FIG. 22E.) Defocus maintains the bilateral symmetries that lithographic sources are usually designed with. Any asymmetries in the source shape as physically rendered are usually small in lithographic applications, as are residual asymmetric lens aberrations, and these asymmetries may often be neglected when considering high-order correction terms, like loxicoherent systems beyond that for the dominant $\Delta f=0$ fin.

Referring to FIG. 35, when correcting the imaginary part of the residual TCC error it is appropriate to use certain specialized variants of FIG. 34J, such as those shown in FIG. 35A, 35B, or 35C; each of these specialized forms being shown more specifically as the first line of FIG. 35A, 35B, or 35C. It should be noted that in the FIG. 35B form T" is made antisymmetric (i.e. an odd function, as shown in the last line of FIG. 35C), while in the other cases T" is symmetric (even). The T' functions in these loxicoherent systems are determined from $TCC^{(r)}$ in one quadrant of the doubly-dimensioned Hopkins domain (e.g. the quadrant where $f_1>0$ and $f_2>0$), for example by using one of the embodiments discussed in connection with FIGS. 33 and 34. The odd/even symmetries prescribed in FIG. 35A, 35B, or 35C then act to provide the overall fitted approximation to $Im[TCC^{(r)}]$ with the proper symmetry in the other quadrants of the domain. The embodiments described in FIG. 33 provide a single T' function, and this function can readily be adapted to provide a loxicoherent approximation to $Im[TCC^{(r)}]$ that takes on the FIG. 35B form, since the FIG. 35B kernels ($T'_{a,odd}$ and $T'_{b,even}$) can share a common shape T" within one quadrant of the doubly-dimensioned Hopkins domain (e.g. where $f_1>0$ and $f_2>0$), with this shape being mirrored with and without a sign change to provide the provide the appropriate overall even or odd parity required of $T'_{a,odd}$ and $T'_{b,even}$. Such a procedure is convenient and acceptably accurate in the usual case where $\Delta f_0$ is low frequency.

Another approximation that can provide acceptable accuracy may be made when extracting loxicoherent systems from a $TCC^{(r)}$ that is complex-valued, in that it is typically possible to combine the constituent kernels of two distinct loxicoherent systems that separately match the real and imaginary parts of $TCC^{(r)}$ into a single kernel that can approximately match the full complex-valued $TCC^{(r)}$, thereby reducing convolution count. This approximation involves treating the mask transmission as real-valued. Most lithographic masks are designed to at least approximate a real-valued transmission, i.e., their generic transmission polarities are nominally real-valued. However, in practice various non-idealities come into play. For example, the amplitude transmittance of mask blank films will vary with propagation angle, and the transmittance will usually have an imaginary component that, while quite small, is not entirely negligible. In addition, the finite thickness of practical mask films will generally give rise to scattering effects along the edges of patterned apertures, and this scattering is typically modeled as a transmitted edge-field or boundary field that is complex-valued. However, even though the total imaginary-part contribution of these non-ideal components is usually large enough to matter in the overall image calculation, it is usually sufficiently small as to be neglectable where high-order correction terms are concerned (such as in the contributions of higher-order loxicoherent systems), since these high-order corrections are already small even where the dominant real-part contribution is concerned.

Thus, when calculating the image contributions made by high-order loxicoherent systems, it is usually acceptable to neglect the imaginary parts of e.g. the blank transmission and the edge fields. For similar reasons one can generally neglect the contribution made by residual asymmetric lens aberrations to high-order loxicoherent kernels, so that $jTCC^{(r)}$ residuals can be treated as symmetric. If the real and imaginary parts of $TCC^{(r)}$ are individually matched using separate loxicoherent systems, symmetry in the residual TCC will cause the frequency-domain constituent kernels of these systems to be purely symmetric or anti-symmetric, and separate matching of the real and imaginary parts will make these individual kernels real-valued. Spatial-domain kernels are obtained as the inverse Fourier transforms of these symmetric or antisymmetric real-valued functions, and it follows that the spatial-domain constituent kernels will be either pure-real or pure-imaginary. Moreover, when convolving these spatial-domain kernels with a mask transmission that is approximated as pure-real, a factor of i (i.e. the square-root of −1) may arbitrarily be added to a kernel that is pure-real, or removed from a kernel that is pure-imaginary, so long as this factor of i is properly added back when the convolution is completed. In other words, a kernel can be changed from pure-real to pure-imaginary and vice-versa, and when the mask transmission is pure-real this choice will be preserved in the convolution output.

It then becomes possible to multiplex together two separate mask convolutions involving different T' kernels into a single convolution that uses a complex-valued kernel, as long as the imaginary-part contributions from asymmetric aberrations and mask-blank non-idealities can be neglected, as will usually be the case when the T' kernels are constituent to higher-order loxicoherent systems. For example, once the dominant DC-fin has been extracted (with this fin being pure-real along the peak), the imaginary part of the remaining TCC residual may then be approximately matched using a higher-order system of, e.g., the FIG. 35B form, and the real part of $TCC^{(r)}$ approximately matched using, e.g., a higher-order system of the FIG. 33C form. To improve efficiency, the mask convolution that is carried out when applying the latter system may then be absorbed into one of the mask convolutions used in applying the former system. This may be done by forming a complex-valued T' kernel whose imaginary part is e.g. the $T'_{a,even}$ kernel used in matching $Im[TCC^{(r)}]$, and whose real part is the T' kernel used to match $Re[TCC^{(r)}]$.

In some cases acceptable accuracy may be maintained if this merging of constituent kernels is extended to the T" kernels. As has been discussed, both the real and the imaginary parts of the $TCC^{(r)}$ which remains after extraction of a primary loxicoherent system will tend to be dominated by low frequency content, i.e. the real part of $TCC^{(r)}$ and the imaginary part will both generally have sub-dominant peaks at low $\Delta f_0$ frequencies that flank the removed DC-fin. The sub-dominant peaks in the imaginary part will generally have $\Delta f_0$ frequencies that are somewhat closer to zero (DC) than the frequencies of the sub-dominant peaks in the real part, since the former function is antisymmetric and the latter symmetric; however, accuracy may still remain adequate if both systems are handled using a single common T" convolution, thereby further reducing convolution count and runtime.

Returning now to the case of distinct (i.e. non-multiplexed) system kernels, it should be noted that even though the methods of FIGS. 33, 34, and 35 only define T' kernels in terms of their ability to correct $TCC^{(r)}$ along a quasi-dominant diagonal $\Delta f_0$, these methods also use the equation of FIG. 34K to define T" in a way that provides optimized improvement throughout the Hopkins doubled domain. Moreover, as discussed earlier, T' can also be refined to provide additional improvement at frequency pairs away from the $\Delta f_0$ diagonal. This allows refinement to be used to correct a limitation of the FIG. 33 methods that arises when they are used to provide an initial T' kernel, namely that the FIG. 35B kernel is inherently incapable of providing correction at difference frequencies sufficiently high that $|\Delta f|>2\bar{f}$, in the case where $T'_{a,odd}$ and $T'_{b,even}$ are derived from different mirrorings of a common T' function. However, refinement of $T'_{a,odd}$ and $T'_{b,even}$ over the full domain as independent variables can provide this high frequency correction.

Figure 36A:
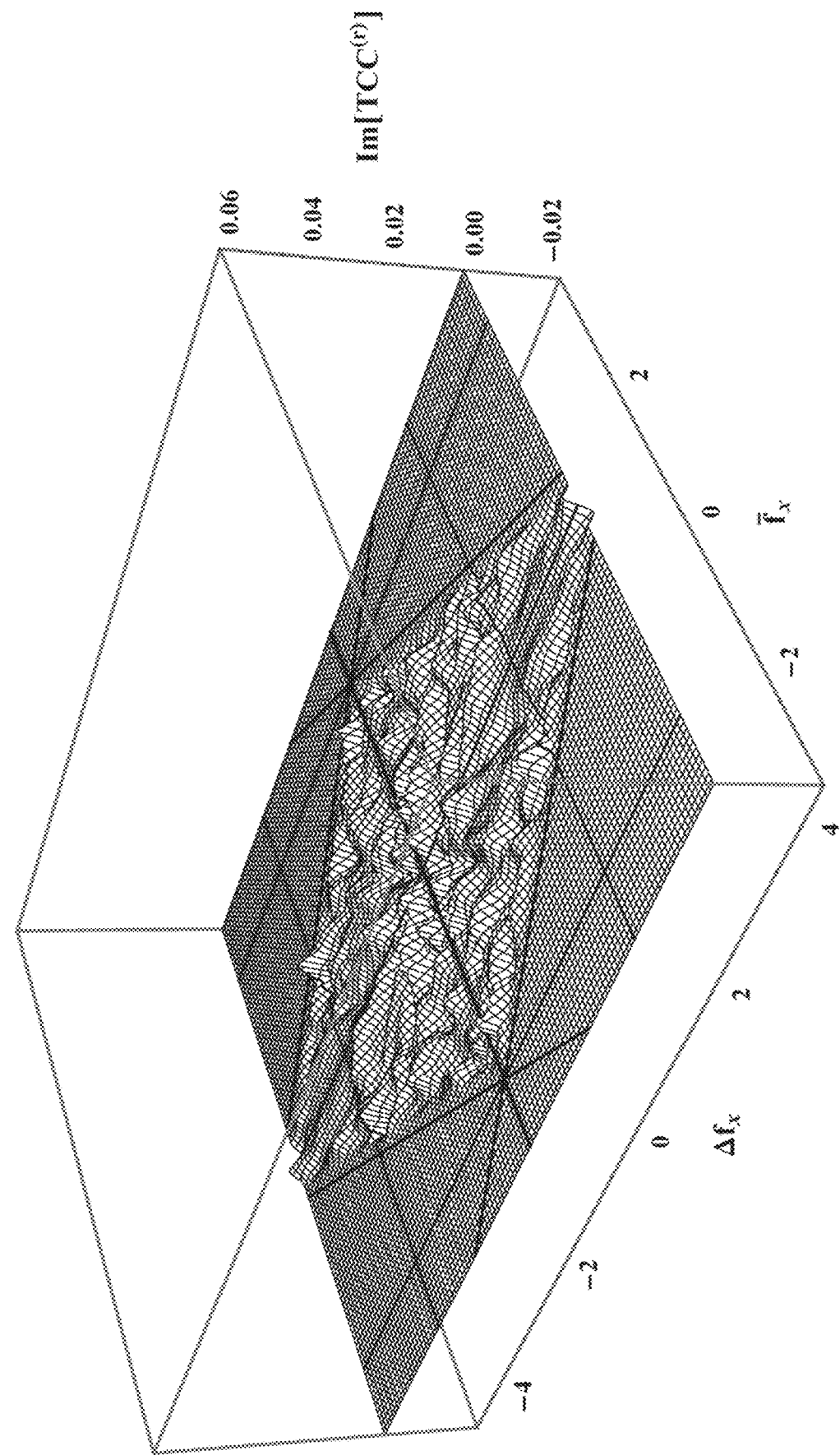
FIGS. 36A-36C, collectively referred to as FIG. 36, show three plots of reduced levels of imaginary-valued residual TCC error that are obtained when higher-order loxicoherent systems are used according to three different embodiments of the invention to match the imaginary part of the residual TCC that is shown as an example in FIG. 15E.
Figure 36B:
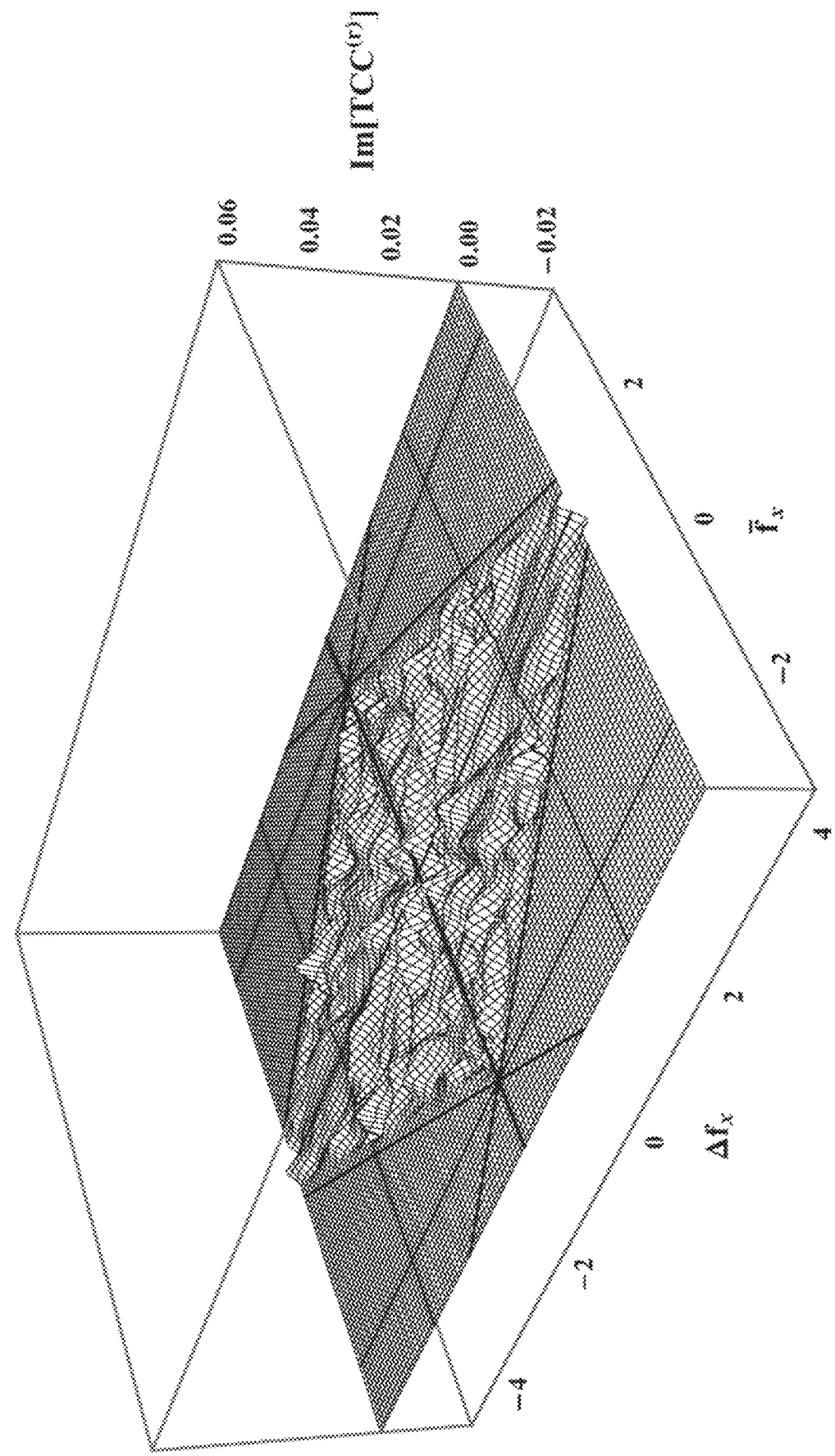
Figure 36C:
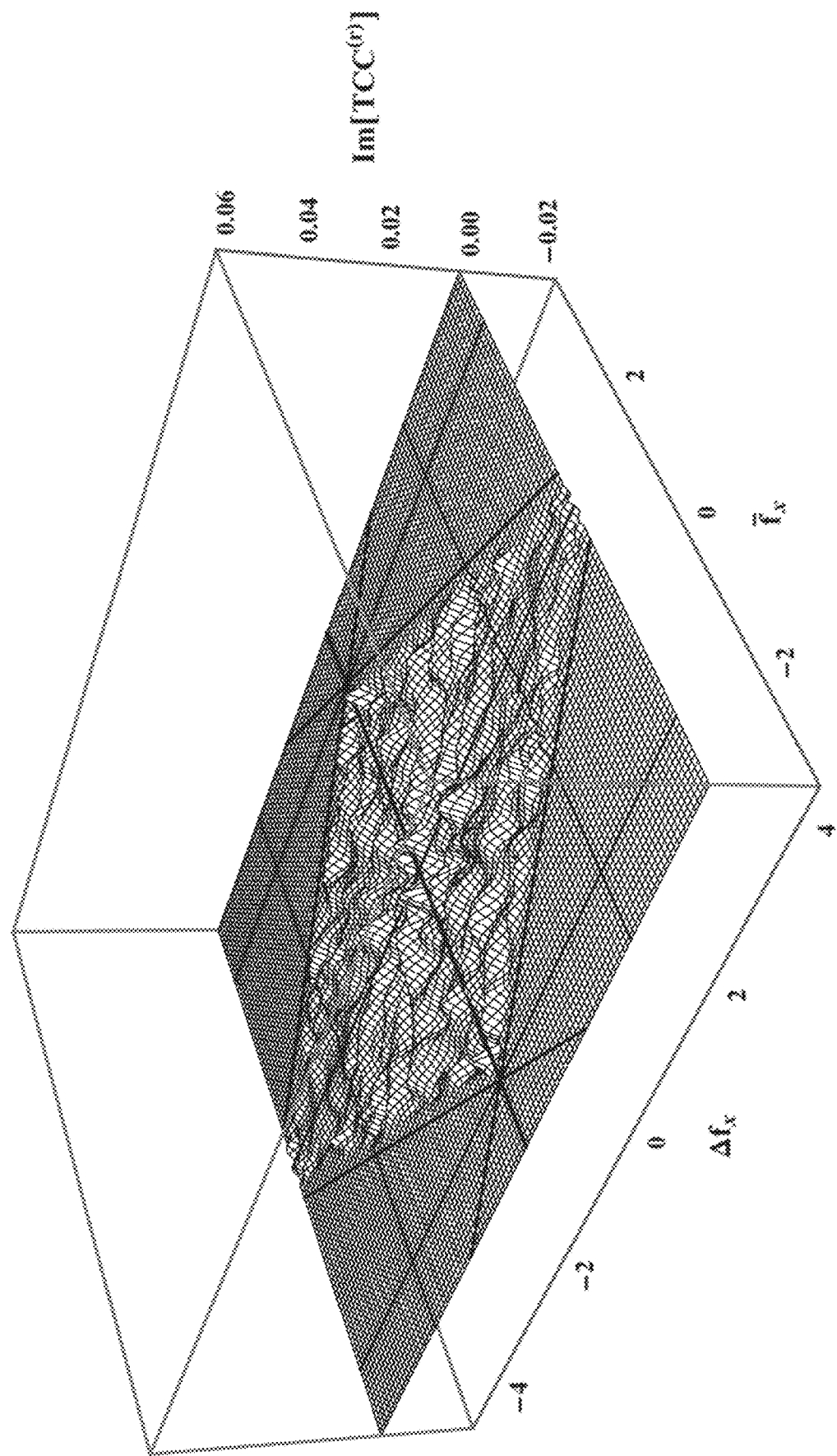

FIG. 36 shows examples of these different modes of correction; in particular, FIGS. 36A-36C show for comparison three different TCC residuals that remain (specifically, the imaginary part of the remaining TCC residual) after three different second loxicoherent systems are applied in the previously described example involving the free-form source of FIG. 15A and the film stack of FIG. 15C, the three different loxicoherent systems are obtained using three of the embodiments described above, as will be explained. In all cases the second loxicoherent system is extracted from the $Im[TCC^{(r)}]$ that was shown previously in FIG. 15E.

The example second loxicoherent system used for FIG. 36A employs T' constituent kernels obtained with the simple analytical expression of FIG. 33C, and uses the system structure shown in FIG. 35B. It should be noted that the FIG. 36A plot of the newly reduced $Im[TCC^{(r)}]$ is (like the FIG. 15E plot of the original $Im[TCC^{(r)}]$) plotted on the same vertical scale as was used in FIG. 15D, with FIG. 15D showing, as discussed above, the more consequential real part of the $TCC^{(r)}$ that remains after 24 OCS kernels have been extracted from the TCC of an imaging system that employs the FIG. 15A free-form source and the FIG. 15C film stack.

Comparison of FIG. 36A to FIG. 15E shows that the newly added second loxicoherent system has been able to very substantially reduce the magnitude of the imaginary part of $TCC^{(r)}$. To obtain T' for the new system $|\Delta f_0|$ is set to 0.1 (in direction cosine units) when applying FIG. 33C, since this difference frequency corresponds to the peak of the quasi-dominant ridge in $Im[TCC^{(r)}]$ that is visible in FIG. 15E adjacent to the $\Delta f=0$ axis. FIG. 15F shows how this quasi-dominant peak is split between positive and negative regions [with the latter being shown cross-hatched in FIG. 15F]. T" for this system has been calculated using FIG. 34K.

FIG. 36A illustrates that even the simple FIG. 33C solution is able to very substantially reduce the magnitude of the imaginary part of $TCC^{(r)}$. FIG. 36B next shows the result of a slightly improved solution that is obtained by numerically refining the T' kernel along the segment of the quasi-dominant peak at $|\Delta f_0|=0.1$ that lies within the left-hand quadrant (where $TCC^{(r)}$ is positive-valued), in order to improve the fit to the peak within this quadrant, as discussed above. Symmetry is then relied on to obtain a matched improvement in the other quadrants. Such refinement is quite fast because it is carried out in a low-dimensional manifold, in this case the manifold where $|\Delta f_0|=0.1$ (with our choice in this example being more specifically $\Delta f_0=-0.1$).

While the FIGS. 34A and 34B residuals are both considerably reduced below the initial residual shown in FIG. 15E, close inspection shows that neither of these reduction methods provide improvement at large values of $|\Delta f_0|$, though it should be noted that $Im[TCC^{(r)}]$ is quite small to begin with in these high frequency regions. As discussed above, use of $T'_{a,odd}$ and $T'_{b,even}$ kernels that share a common shape T' within one quadrant does not provide reductions in $TCC^{(r)}$ at high difference frequencies where $|\Delta f|>2\bar{f}$. However, if $T'_{a,odd}$ and $T'_{b,even}$ are refined as independent variables to minimize $Im[TCC^{(r)}]$ over the full domain, the imaginary part of $TCC^{(r)}$ can successfully be reduced across all parts of the doubly-dimensioned space. The result of such an optimization is shown in FIG. 36C, where refinement of $T'_{a,odd}$ and $T'_{b,even}$ over the full domain has in addition further reduced the residual at moderate difference frequencies, as well providing an improvement at high difference frequencies where $|\Delta f|>2\bar{f}$.

One may regard the methods of FIGS. 33 and 34 as attacking the problem of extracting higher order loxicoherent systems by generalizing to non-zero $|\Delta f_0|$ the FIG. 22 method for extracting the dominant $\Delta f=0$ loxicoherent system. This broad class of methods is attractive because Mercer kernels are inherently inefficient at extracting "diagonally oriented" content within the doubly-dimensioned Hopkins domain, where (as usual when describing the invention) diagonal refers not to orientations that are slanted between the x and y Cartesian coordinates of the object patterns, but rather to orientations that mix the two sets of mask coordinates that appear in the doubly-dimensioned Hopkins domain. The $\Delta f=0$ diagonal ("fin") dominates as a Gibbs-like residual at the primary slope discontinuity in the TCC, but more generally the post-OCS residual TCC will tend to contain additional content along other diagonals that can be efficiently extracted using additional loxicoherent systems, but that is not well extracted by additional OCS kernels. Loosely speaking, the methods of FIGS. 33 and 34 may be considered to extract content along these sub-dominant diagonals using enhanced versions of the FIG. 22 method. This approach is efficient as long as $TCC^{(r)}$ content remains concentrated in particular diagonals. It is almost always the case that the extraction efficiency of e.g. a second loxicoherent system which is obtained using a quasi-dominant off-diagonal will be quite high (with this efficiency being improved by the FIG. 34K optimization of T" over all diagonals, and optionally being further improved by refinement of T' over the full domain). However, the residual content in $TCC^{(r)}$ becomes more evenly distributed as further kernels are extracted, reducing the benefit from using the strongest diagonal ridge in $TCC^{(r)}$ as the basis for choosing later T' kernels. Of course, even a suboptimal T' kernel will provide some benefit, and such a kernel can be improved by refinement. However, the non-convex nature of the loxicoherent extraction problem makes it desirable to begin any such refinement with as strong a starting design as possible. Moreover, even though only a very small number of loxicoherent kernels are typically sufficient in practice to reduce $TCC^{(r)}$ to a very low level, it is convenient to have a general method that is suitable for extracting an indefinite sequence of loxicoherent kernels. One such systematic approach is to extract $TCC^{(r)}$ diagonal by diagonal. More specifically, such a systematic approach employs the methods of e.g. FIGS. 33, 34, and 35 to extract $TCC^{(r)}$ using a sequence of loxicoherent systems whose T' kernels are defined using a succession of quasi-dominant diagonals, and whose T" kernels are individually optimized to reduce $TCC^{(r)}$ throughout the Hopkins domain. However, it can be advantageous to define higher order loxicoherent systems without restricting the determination of T' to consideration of a narrow diagonal portion of the doubled domain.

This can be done by employing a homotopy method that will now be described, in which an oversimplified but readily solvable problem is transformed, in an incremental (and therefore tractable) way, into the loxicoherent extraction problem of interest. In particular, an initial problem formulation having a valid but inefficient solution is slowly transformed, in small homotopy steps, into a problem that provides valid and efficient loxicoherent kernels as its solution, where the steps are made sufficiently small as to allow each new problem to be recast into a more tractable form based on knowledge of the solution from the previous problem. This homotopy method for kernel determination is of particular interest because it follows the same computational scaling law as does calculation of an OCS kernel, albeit with a considerably larger but still acceptable constant factor. (Note that the scaling here refers to the relatively small task of computing the necessary decomposition systems; compute time for the main task of applying these systems during mask generation is proportional to the number of mask convolutions required, and so is strongly reduced by the novel system sets employed by the invention.)

Before explaining the specific steps used in the homotopy method, the general outlines of the homotopy flow will be described, providing an overview of how the solution progresses from a result with known calculability via FIG. 20A, but with limited practicality, to a final solution that constitutes an efficient implementation of the desired loxicoherent structure of FIG. 20I. More specifically, the initial homotopy problem will be shown below to have as its solution a simple version of the right side of FIG. 20A; one in which the $\hat{T}$ kernel of the first rotated system (for the new $TCC^{(r)}$ residual) is simply diagonalized into a large number of eigenfunctions T'. For reasons discussed previously, the right side of FIG. 20A can make an accurate match to the first rotated system (which is a reasonably accurate fit to $TCC^{(r)}$), if one accepts the (extremely) inefficient expedient of choosing a relatively large number K of eigenfunctions with which to decompose $\hat{T}$. Successive steps of the homotopy are then undertaken, with each step being indexed by an iterator n, to reduce K to a desired small value without degrading accuracy (and, in fact, almost always improving accuracy). The homotopy problem transformation is governed by parameters $K_n$ and $\gamma_n$. Before the homotopy begins, n is considered to have the value 0, and the initial number of $\hat{T}$ eigenvectors that are retained (this initial number being denoted $K_0$, with each of the $K_n$ eigenvectors in a subsequent nth iteration being denoted T' due to their status as constituent coherent filter kernels) is preferably chosen large enough that the retained large set of these T' kernels is sufficient to decompose $\hat{T}$ with high accuracy; for example $K_0$ might be set large enough to include all eigenelements with relative eigenvalue magnitude larger than $10^{-5}$. Parameter $\gamma_0$ is typically initialized to 0 at the beginning of the homotopy, and evolved during the homotopy to a final value of 1.

Over an appreciable number of steps (denoted $n_{final}$, which might be as many as about 50), parameter $K_n$ is reduced to a value that permits efficient image calculation, and this value should preferably be set equal to $R^{(+)}+R^{(-)}$ in FIG. 20I. For example, in a preferred embodiment, the final value of K (denoted $K_{n_{Final}}$) is set at 2, which corresponds to both a first component that predominantly matches to quasi-positive $TCC^{(r)}$ content (so that $R^{(+)}=1$), and a second component for predominantly negative content (so that $R^{(-)}=1$), thereby yielding a final loxicoherent system whose application entails three convolutions. In the spatial domain such a system has three kernel components, namely a $t'_{(+)}$ component which may pre-filter for largely-positive $TCC^{(r)}$ content, a $t'_{(-)}$ component for largely-negative content, and a t" intensity kernel for an outer convolution along the slanted difference-frequency axis. The homotopy procedure actually solves for the frequency-domain Fourier transforms of these kernels, denoted $T'_{(+)}$, $T'_{(-)}$, and T".

In its intermediate steps the homotopy procedure yields intermediate versions of $T'_{(+)}$ and $T'_{(-)}$, which for the nth step are denoted $T'_{n,1}$ and $T'_{n,2}$. These kernels are defined during the homotopy as the dominant eigenfunctions of a matrix denoted $\overline{TCC^{(r)}}$, which is referred to as a homotopy matrix. As will be discussed, $\overline{TCC^{(r)}}$ is a kind of amalgam of both $TCC^{(r)}$ itself, and the $\hat{T}$ kernel of the dominant rotated system that is extracted from $TCC^{(r)}$ via FIGS. 12F and 12G. (In an alternative embodiment, $\overline{TCC^{(r)}}$ can be interpreted as an amalgamation of $\hat{T}$ with a more general corrector that yields $TCC^{(r)}$.)

Referring to FIG. 37, $\overline{TCC^{(r)}}$ in the nth step of the homotopy is specifically given by FIG. 37A. For computational purposes the quantities appearing in this equation may be assumed to be gridded, and the nth version of the $\overline{TCC^{(r)}}$ homotopy matrix is denoted $\overline{TCC_n^{(r)}}$. The quantities $T\breve{C}C_n^{(r)}$ and $\breve{T}_n$ are scaled and adjusted versions of $TCC^{(r)}$ and T", respectively, as will be discussed. A total of $K_n$ eigenfunctions of the nth version of $\overline{TCC^{(r)}}$ are retained, with the kth of these eigenfunctions being denoted $T'_{n,k}$. (As will be discussed, $K_n$ does not, in a preferred embodiment, denote a sharp dividing line between wholly retained and wholly discarded eigenfunctions; instead, a more gradual filtering of eigenfunctions beyond $K_n$ is preferably employed.) Usually $T'_{n,1}$ and $T'_{n,2}$ will represent the working versions of the final $K_n=2$ loxicoherent filter kernels that will be produced as a completed solution by the homotopy [these being denoted $T'_{(+)}$ and $T'_{(-)}$]. It should be noted that in early stages $T'_{n,1}$ and $T'_{n,2}$ will often have a form which is radically different from that which they take at the end of the homotopy. FIG. 37A indicates that the nth version of $\overline{TCC^{(r)}}$ is formed using the T' and $\breve{T}$" kernels from the previous iteration (n−1).

As shown in FIG. 37B, the procedure of FIGS. 12G and 12F may be used to initialize $\hat{T}$ as the optimal rotated system kernel along the $\bar{f}$-axis (with the symbol $\hat{T}$ having been introduced earlier for such a purpose). In some embodiments $\hat{T}$ is not changed from this initial form during the homotopy. However, in other embodiments $\hat{T}$ may be evolved during the homotopy, and in such cases the nth version of $\overline{TCC^{(r)}}$ can be updated from the previous $\hat{T}_{n-1}$ version of the $\bar{f}$-axis kernel. The T' functions are initialized as the eigenfunctions of $\hat{T}$, and, per the convention used throughout this invention description, the $T'_{n,k}$ are normalized to absorb the square root of their associated eigenvalue. This same normalization convention is followed when later iterations of T' are extracted as eigenfunctions of $\overline{TCC^{(r)}}$. The homotopy also evolves a T" kernel, which represents a successively improved estimate of the optimal incoherent kernel of the loxicoherent system being generated by the homotopy, following the same T" notation as has been used throughout this description of the invention.

Before being introduced into FIG. 37A, the nth version of T" preferably undergoes a scaling and mapped sign adjustment, to be explained shortly, which is reflected notationally by adding a breve diacritic to the symbol used to designate the interim working incoherent kernel, this rescaled interim kernel thus being denoted $\breve{T}_n"$.

As a point of nomenclature, it should be noted that FIG. 37B uses a subscript index of 0 to designate the initial version of $\hat{T}$, even though $\hat{T}_0$ is obtained from the l=1 rotated system in the FIG. 11A notation. A slightly different indexing convention has been used in previous equations, wherein a subscript 1 on the analogous quantity $\hat{T}_1$ (or a superscript, in the case of $\hat{T}^{(1)}$) is used to indicate that $\hat{T}_1$ is a component of the first rotated system. Our change of notation here to use 0 as a subscript on $\hat{T}_0$ in FIG. 37B reflects a convention in which the subscript represents the homotopy step number. Under this latter convention the first (n=1) iteration of the homotopy is considered to commence when FIG. 37A is first applied, with the preceding calculation of $\hat{T}_0$ being regarded as an initialization step. $\hat{T}$ may be updated in later iterations, as indicated by the n subscript in $\hat{T}_n$, but in some embodiments $\hat{T}$ is kept at $\hat{T}_0$ throughout the homotopy. It should also be noted that FIG. 37B initializes the working estimate of the dose kernel T" to the $\tilde{T}$ component of the first rotated system. As previously discussed, the T" of a loxicoherent system and the $\tilde{T}$ of a rotated system are conceptually different (but related) quantities, and the working version of the former quantity (denoted T"$_n$ before rescaling and mapped sign adjustment) evolves away from $\tilde{T}$ as the homotopy proceeds (and n increases). In the context of this homotopy embodiment, the quantity denoted T" should be regarded as a working or interim kernel candidate; one that only evolves to a useful dose kernel of a loxicoherent system (for which we have used the notation T" elsewhere in this description of the invention) at the termination of the homotopy.

During the nth iteration of the homotopy, the eigenfunctions $T_n'$ of $\widetilde{TCC_n^{(r)}}$ constitute a working estimate of the filter kernels of the desired efficient loxicoherent system, though during early iterations the number $K_n$ of retained eigenfunctions will typically be far larger than the desired final number of kernels $R^{(+)} + R^{(-)}$. After $\widetilde{TCC^{(r)}}$ is obtained for the nth iteration via FIG. 37A, its eigenfunctions provide the $T_n'$ filter kernel estimates for that iteration. The nth iteration then continues with the application of FIG. 37C to obtain the dose kernel estimate $T_n"$; this is the version of T" that will be used in FIG. 37A during the (n+1)th iteration. The derivation of the equation of FIG. 37C is closely analogous to that of FIG. 22J.

When the homotopy iterations commence with the n=1 iteration of the equation of FIG. 37A, the value of γ has been initialized to 0, meaning that the last term in FIG. 37A drops out, since $\sin(\pi\gamma_0/2)=0$. Moreover, $\cos(\pi\gamma_0/2)=1$, and since the number of retained Mercer terms $K_0$ in the first line of FIG. 37A is set very large, the $T'_{0,k}$ kernels will collectively be able to entirely exhaust $\hat{T}_0$ to a very good approximation, and it then follows that the second term in the first line in FIG. 37A (i.e. $\breve{T}"_0 (f_1-f_2)\Sigma_{k=1}^{K_0} T'_{0,k}(f_1)T'^*_{0,k}(f_2)$) will approximately cancel the first term in the second line $$\left(\text{i.e. } \breve{T}"_0(f_1 - f_2)\widehat{T}_0\left(\frac{f_1 + f_2}{2}\right)\right).$$

As FIG. 37D points out, this effectively means that only the first term in the equation of FIG. 37A is present at the start of the homotopy. Thus, when the homotopy commences, $\widetilde{TCC^{(r)}}$ will simply be equal to the Mercer expansion of $\hat{T}_0$, which is essentially equivalent to $\hat{T}_0$ itself, since $K_0$ is large.

In conjunction with the dose kernel $T_0"$, $\widetilde{TCC^{(r)}}$ thus provides at the beginning of the homotopy a reasonably accurate but not very efficient set of filter kernels T' for the next (generally higher-order) loxicoherent system, these initial filters being the large set of $T'_{0,k}$ kernels (the eigenfunctions of $\hat{T}_0$, which are $K_0$ in number) that allow the loxicoherent system to approximately reproduce the optimal rotated system, though in an inefficient manner. As the homotopy proceeds, the number of retained filter kernels $K_n$ is steadily reduced to improve efficiency, while the presence of the T" kernel in the loxicoherent system is exploited to retain accuracy in the face of reductions in the $K_n$ count, often even improving accuracy over that achieved by the first (optimal) rotated system at the start of the homotopy. In particular, FIG. 37A (whose essential goal is to produce T' kernels for a higher-order loxicoherent system; these kernels being the eigenfunctions of $\widetilde{TCC^{(r)}}$) is structured so that T" will provide this accuracy improvement during each efficiency-tightening homotopy iteration in much the same way that T" was shown in FIGS. 29A-29E to provide the constituent T' kernel of the first loxicoherent system with a strong accuracy and efficiency advantage over conventional coherent kernels. In particular, it was shown in conjunction with FIGS. 29A-29E that the T' kernel of the first loxicoherent system can essentially capture all points within the dominant fin of the pure-OCS $TCC^{(r)}$, with this fin being located where the dose kernel T" attains its peak value of 1. Conventional coherent kernels were shown to be very inefficient by comparison, since each single coherent kernel is essentially able to extract only a single point of the fin. It was further shown that if a coherent kernel attempted to instead extract multiple points along the fin, such a coherent kernel would actually introduce an even larger error in its matching to $TCC^{(r)}$ at points away from the fin. However, the first loxicoherent system includes a T" kernel which is typically very small at points away from the fin. As was discussed, this means that the T" kernel suppresses the poor match to $TCC^{(r)}$ that the T' kernels of the first loxicoherent system would otherwise be engendering away from the fin, allowing the first system to essentially capture all of the fin with just a single T' kernel. This behavior suggests a strategy that is used in constructing the FIG. 37 homotopy to extract efficient higher order loxicoherent systems, as will now be discussed.

After the first loxicoherent kernel is extracted, $TCC^{(r)}$ will typically no longer have a fin at Δf=0, but it will still have relatively substantial content along "diagonal" contours of constant Δf. FIG. 37C ensures that the T" dose kernel will be strongly peaked in such regions (particularly when the number of loxicoherent systems that have already been extracted is modest compared to the number of already-extracted coherent kernels). This makes it possible for a relatively small final number $K_{n_{Final}}$ of T' filter kernels to capture (in conjunction with T") a significant portion of the remaining content along the sub-dominant diagonals of $TCC^{(r)}$ where T" is peaked. (Note, however, that the efficiency improvement achieved by the final output system after completion of each full homotopy procedure will typically diminish as the count of already-extracted loxicoherent systems goes up.) The rescaled version $\breve{T}_n"$ of $T"_n$ that appears in FIG. 37A is designed to facilitate this desirable behavior; in particular, $\breve{T}_n"$ is scaled to lie substantially in the range of 0 to 1. This is done, as shown in FIG. 37E, by reversing the sign of every element of $T"_n$ that has a negative real part (and then normalizing the peak to 1). Once $\breve{T}_n"$ is formed as a revision to $T"_n$ in this way, it is necessary to make the complementary changes in $TCC^{(r)}$; in particular the elements in every Δf diagonal of $TCC^{(r)}$ are multiplied by −1 if the corresponding element of $T"_n$ was multiplied by −1 when forming $\breve{T}_n"$. The resulting revised version of $TCC^{(r)}$ is denoted $T\breve{C}C_n^{(r)}$, and its mathematical definition is reiterated in the first two lines of FIG. 37A. By reversing their element signs jointly, $\breve{T}_n"$ and $T\breve{C}C_n^{(r)}$ are made to maintain a relationship equivalent to that existing between $T"_n$ and $TCC^{(r)}$, even after the former intensity kernel has been rescaled (as $\breve{T}_n"$) to become a substantially non-negative quantity. This maintained relationship is shown in the last line of FIG. 37E. In addition, $\breve{T}_n"$ is further scaled to have a peak value of magnitude 1, and to compensate for this the T' kernels are scaled in the opposite direction so as to maintain a consistent level in the overall triple products that comprise the loxicoherent system. $\breve{T}_n"$ thus represents in FIG. 37A a working version of the intensity kernel T", except scaled to a range substantially between 0 and 1. As previously discussed, content in $TCC^{(r)}$ will tend to be concentrated along a relatively small set of diagonal Δf contours, and the evolving loxicoherent system will tend to give $\breve{T}_n"$ a value near 1 in these large-error regions in order that the concentrated $TCC^{(r)}$ content be optimally extracted (with optimality provided by FIG. 37C). The second line of FIG. 37A (which makes a larger contribution where $\breve{T}_n"$ is large) then helps ensure that the T' eigenfunctions of $\widetilde{TCC^{(r)}}$ will tend to reproduce this content. In particular, when $K_n$ is set slightly lower than $K_{n-1}$ to begin the nth step of the homotopy, the relatively large value attained by $\breve{T}_n"$ in regions of large residual $TCC^{(r)}$ will cause the remaining T' eigenfunctions ($K_n$ in number) to reconfigure themselves to better represent this dominant $TCC^{(r)}$ content, since the second line of FIG. 37A represents a substantial portion of the matrix being eigendecomposed. (Even though fewer T' eigenfunctions are retained for this purpose, it is the most dominant eigenfunctions that are retained, at least in the simplest embodiment.) If $\widetilde{TCC^{(r)}}$ were given by the second line of FIG. 37A alone, such a reconfiguration might not proceed very far, since a large reconfiguration would usually entail large mismatches in regions where this second line is small, as may be understood from previous discussion which showed that retained eigenfunctions/Mercer-terms are not well suited to simultaneously reproduce regions where $TCC^{(r)}$ is large and regions where $TCC^{(r)}$ is small. (In other words, as has been shown in FIG. 29, a reduced number of purely Mercer terms simply cannot reproduce $TCC^{(r)}$ well in all regions.) However, in these difficult regions $\breve{T}_{n-1}"$ will be set close to zero by FIG. 37C, and the first line of FIG. 37A therefore sets $\widetilde{TCC^{(r)}}$ approximately equal to its own Mercer expansion in those regions, and this Mercer expansion is by definition close to $\widetilde{TCC^{(r)}}$ itself. More precisely, $\widetilde{TCC^{(r)}}$ becomes equal in these regions to the Mercer expansion of $\widetilde{TCC^{(r)}}$ in the previous homotopy iteration, and since the homotopy only advances slowly, this lightly-changed content is easily matched in the next iteration. $\widetilde{TCC^{(r)}}$ will differ from the true residual TCC in those regions, but that departure will not further degrade the accuracy of the fitted loxicoherent system, since T" will be correspondingly small there as well. Moreover, since the strong content in the true $TCC^{(r)}$ is largely concentrated in regions of the domain where the second line of FIG. 37A is large, the loxicoherent system can provide a reasonably efficient content extraction even though these regions of large T" will typically be fairly small in area. In view of the role $\breve{T}"$ plays in projecting $TCC^{(r)}$ into certain portions of the homotopy matrix (i.e., in the second line of FIG. 37A), while screening other matrix portions from these changes (first line), $\breve{T}"$ can be referred to as a screener-projector function.

Early in the homotopy, $\gamma_n$ will be approximately 0, and the last line of FIG. 37A will therefore be approximately equal to the product of $\breve{T}_{n-1}"$ and $\hat{T}_{n-1}$. In regions of peak T", the first factor $\breve{T}_{n-1}"$ will be approximately 1, giving the product a value close to $\hat{T}_{n-1}$. The last line of FIG. 37A will therefore act to concentrate that content of $\hat{T}$ which lies within high-T" regions into those next-iteration T' kernels which remain as $K_n$ is reduced, since the retained kernels are those which are most dominant (with some exceptions yet to be discussed). In other words, as fewer kernels are retained, FIG. 37A will inherently cause a greater portion of $\hat{T}$ in regions where T" is significant to be concentrated into these remaining T' kernels, as will happen when the updated versions of these T' kernels are obtained from the next iteration of $\widetilde{TCC^{(r)}}$. This process is interrupted, however, because in a preferred embodiment, γ is increased to its final value of 1 in significantly fewer iterations than are used overall to reduce $K_n$ to its final value of $R^{(+)}+R^{(-)}$. For example, one might typically step γ from its initial to its final value during the first ⅓rd of the homotopy iterations, i.e. to fully transition γ to 1 by step n=$K_{n,final}$/3. Once γ reaches 1, FIG. 37A will eventually act to concentrate content of $TCC^{(r)}$ rather than $\hat{T}$ into a steadily reduced set of T' kernels (in regions of large T"), since the last line of FIG. 37 becomes equal to $\breve{T}_{n-1}" T\breve{C}C_n^{(r)}$ when γ=1.

After a new set of eigenfunctions $T_{n+1,k}'$ of $\widetilde{TCC^{(r)}_{n+1}}$ are calculated, T" may then be updated using FIG. 37C. In a preferred embodiment, a normalized version of the updated T" will next be created per FIG. 37E, denoted $\breve{T}_{n+1}"$. While $\breve{T}_{n+1}"$ will be normalized to have a peak magnitude of 1, its value at secondary peaks will typically decrease after $K_n$ is decreased from its previous value of $K_{n-1}$, if such a decrease was made during the immediately preceding evaluation of FIG. 37A. It can therefore be advantageous to execute the next (i.e. n+2) iteration of FIG. 37A without decreasing K, since the subsequent iteration of FIG. 37C may then be able to restore the scope of the large T" regions. As a rule of thumb, $K_n$ may be decreased in every other iteration of FIG. 37A.

In a preferred embodiment, the reduction in $K_n$ that is carried out during the homotopy is not effected in a direct and literal way, as will now be explained. At the beginning of the homotopy, $K_n$ is typically a large number. However, as $K_n$ becomes a relatively small number, a reduction in $K_n$ that was effected in the direct way of entirely deleting one or more of the few remaining T' eigenfunctions would represent a substantial jolt to the structure of $\widetilde{TCC^{(r)}}$, and this jolt may represent a larger change than is desirable in a single homotopy step. It is therefore preferable to reduce $K_n$ by a more sophisticated method than simple reduction of the number of retained terms in the Mercer series expansion of $\widetilde{TCC^{(r)}}$. In particular, $K_n$ may instead be employed as a parameter of a weighting function, such that the eigenfunctions T' of $\widetilde{TCC^{(r)}}$ are effectively removed in a continuous way as $K_n$ is reduced (i.e. by increasingly de-weighting them in the Mercer expansion of $\widetilde{TCC^{(r)}}$, rather than by deleting these eigenfunctions outright. FIG. 37F shows how FIG. 37A may be modified to do this using a weighting function that takes the form of a shifted half-Gaussian. This may be further modified to take into account degeneracies in the eigenvalues.

It is also not necessary that the k=1, 2, ... $K_n$ eigenfunctions T' of $\widetilde{TCC^{(r)}}$ be included in the FIG. 37A or 37E Mercer series terms in the standard ordering that is conventionally used for Mercer series (which is to order the terms by the magnitude of their absorbed eigenvalues). Instead, it may be preferable to order them (at least partially) by the error with which their associated triple product T"T'T'* matches to $TCC^{(r)}$, so that the least valuable eigenfunctions are deleted when $K_n$ is reduced.

Another useful heuristic that may be employed in the homotopy involves consideration of the parity of the eigenfunctions of $\widetilde{TCC^{(r)}}$. With a symmetric lithographic system these eigenfunctions are symmetric, with roughly half the eigenfunctions being of even symmetry and the other half of odd symmetry. Antisymmetric eigenfunctions have a zero at the origin, and this can be disadvantageous in the usual case where the lithographic masks of interest produce a strong zero order, as will be discussed. This problem can be dealt with separately from the homotopy by employing what we refer to as a DC-monolinear system, to be described below. Alternatively, one may address this issue by inhibiting the presence of odd-symmetry eigenfunctions in the $K_{n,final}$ kernels. For example, in the common case where $K_{n,final}$ is 2, one may wish to ensure that at least one of the final two kernels has even symmetry. One heuristic for doing so is to slightly de-weight the odd-symmetry eigenfunctions when reconstructing $\widetilde{TCC^{(r)}}$ following each iterative reduction of K; for example, the amount of de-weighting might be inversely proportional to the total number of iterations in the homotopy. One way to choose the constant of proportionality in such a de-weighting is to set this constant to be just large enough that the dominant eigenfunction of $\widetilde{TCC^{(r)}}$ has even symmetry when the homotopy commences. Application of such a procedure may sometimes suggest (e.g. when the dominant eigenfunction is already even before de-weighting is applied) that the de-weighting heuristic would provide little advantage in a particular case, i.e. that it could be skipped.

Yet another useful heuristic to employ with the homotopy is to embed the homotopy in outer loops; e.g., to loop through the homotopy twice. With such a procedure the T' solution obtained at the end of the first set of homotopy iterations is not used as the final solution. Instead, a second cycle of homotopy loops is undertaken, in which $K_n$ is reset from $K_{n,final}$ back to its initial large value $K_0$, but where the other parameters and kernels appearing in FIG. 37A are not reset, but are instead kept at the values attained at the end of the first cycle of loops. As previously discussed, each cycle of homotopy loops tends to concentrate large-$TCC^{(r)}$ content into the retained eigenfunctions (while avoiding mismatches in less concentrated regions through evolution of T"). When the cycles of homotopy are repeated it is sometimes possible to "sweep" slightly more $TCC^{(r)}$ content into the retained T' kernels.

It is also possible to recast the homotopy used in the second (or subsequent) cycle of loops in a form that yields a new modifying factor to improve the output of the first (or previous) cycle, instead of having the new cycle directly evolve the result of the previous cycle. When doing so it can be useful to adopt a more aggressive form for the corrective homotopy factor whose role is to improve $\widetilde{TCC^{(r)}}$ in regions where T" has large magnitude (where in its previously discussed form this corrective homotopy factor is the square-bracketed quantity in FIG. 37A). In yet another embodiment the more aggressive form can also be employed in a first (or only) cycle of homotopy loops, resulting in a modified version of FIG. 37A, to be discussed.

FIG. 37G considers the corrective factor in question more specifically (in the regime where y has reached 1). The first and second lines of FIG. 37G note that the Sign(T") factor which appears in the definition of $T\overset{\smile}{C}C^{(r)}$ (i.e. in FIG. 37E) as a multiplying factor can also be placed in the denominator, if we exclude for the moment the case where T" is exactly 0. If we then consider that the homotopy is structured (per FIG. 37A) to propagate this $T\overset{\smile}{C}{}^{(r)}$ factor into the retained eigenelements of $\widetilde{TCC^{(r)}}$ (particularly in regions where T" is large), and further that the loxicoherent system has a structure which multiplies the Mercer products of the retained eigenelements by T", we see that if the $T\overset{\smile}{C}C^{(r)}$ factor is successfully propagated into the retained eigenelements, the multiplication by T" will reproduce $TCC^{(r)}$ if $T\overset{\smile}{C}C^{(r)}$ is given the form shown as the last line in FIG. 37G, where the sign of T" in the denominator is replaced by T" itself, so that this denominator would ideally be cancelled by the multiplying T" kernel in the loxicoherent system, if fully propagated into the retained $\widetilde{TCC^{(r)}}$ eigenelements. From this point of view the previous less aggressive form for $T\overset{\smile}{C}C^{(r)}$ shown in the first line of FIG. 37G (and used previously in FIG. 37E) can be understood as a highly regularized version of the more aggressively correcting form shown in the last line of FIG. 37G.

To use this more aggressive form of $\overset{\smile}{T}\overset{\frown}{C}C^{(r)}$ in a second (or subsequent) cycle of homotopy loops that yield an improving factor for the output of a previous cycle of loops, we can set $K_{n_{Final}}$ to 1 during the second cycle, and then multiply the retained eigenelements of the earlier cycle by the single output eigenelement of the second cycle, thus obtaining improved T' kernels for the loxicoherent system as a whole. When setting out the homotopy for such an improving factor it is useful to employ the notation shown in FIG. 37H. The first two lines of FIG. 37H introduce the symbol B to denote the Mercer product of the retained eigenelements from the previous cycles of homotopy; factor B (which is a function of $\bar{f}$ and $\Delta f$) is left unchanged in the set of cycles to follow. (It should be noted that while B will be described for convenience as the solution from a previous cycle of homotopy loops, the method to improve B that is currently being described can, in general, be used to improve a solution B obtained by any method.) The homotopy equation for the subsequent cycle of loops to improve B (to be explained shortly) will preferably include the aggressive form of $\overset{\smile}{T}\overset{\frown}{C}C^{(r)}$ shown in the last line of FIG. 37G, and since this aggressive form can also be used in the first (or only) set of cycles, it is worth noting that the homotopy equations to follow can be adapted to the case where no previous cycles are involved by simply setting B to 1, as expressed by the 3rd and 4th lines of FIG. 37H. In either case, the interim loxicoherent system that is formed during each loop of the new homotopy will be given by the product of B with both the current T", and the Mercer product of the retained eigenelements of the current $\widehat{TCC^{(r)}}$ (i.e., the currently retained eigenelements of the second cycle homotopy matrix). The product of the first two of these factors is denoted C, as expressed in the last line of FIG. 37H.

FIG. 37I shows the result of replacing the $\overset{\smile}{T}\overset{\frown}{C}C^{(r)}$ term used in FIG. 37A with the aggressive variant given by FIG. 37G, and with the latter being further adapted for use in a second (or subsequent) cycle of homotopy loops by replacing T" in the denominator with C. In addition, to avoid extreme ill-conditioning in cases where C approaches 0, the reciprocal of C has been passed through a sigmoid function which limits the value of the reciprocal to a saturated level denoted t (not to be confused with the spatial domain kernels t' and t"), where t might be set to e.g. 100 times the reciprocal of the maximum value of C. Any of the well-known standard forms of sigmoid function may be used, such as the hyperbolic tangent function shown in FIG. 37J.

FIG. 37K shows another homotopy embodiment that is designed to improve the output of a previous set of homotopy cycles, in which the rescaled T" used in FIG. 37I to form the screener-projector term (and also used previously as the screener-projector in FIG. 37A, where it was denoted $\check{T}$) is replaced by a similarly rescaled C. This rescaled C can be considered to include a factor of C in its numerator that may be used to cancel the factor C which appears in the denominator of $\overset{\smile}{T}\overset{\frown}{C}C^{(r)}$ when the aggressive variant is used. Since the denominator is canceled there is no need to regularize it with a sigmoid function, and FIG. 37K shows the form that the homotopy matrix then assumes. It will be clear to those skilled in the art that other functions can usefully serve as suitable screener-projector functions if rescaled to the range 0-to-1; for example, instead of using T" or C, one can alternatively use the point-by-point maximum of $TCC^{(r)}$ and C, or the point-by-point square root of the summed squares of $TCC^{(r)}$ and C.

A useful heuristic during homotopy cycles of the kind under consideration (i.e., that provide a modification to a previously obtained solution B) is to replace (at the end of every loop) each eigenvector T' of the homotopy matrix with an optimal linear combination of the eigenvector and a constant vector (using the same optimal coefficients for all eigenvectors); this has the benefit of guaranteeing that the solution improves on the solution B from the previous cycle of loops (or at least does not degrade it), while at the same time improving the eigenvectors of the homotopy matrix as well (though usually by only a small amount). In mathematical terms, the set of linear combinations that serve as new eigenvectors (referred to as a remapping) is made optimal if the coefficients (denoted $\alpha$ and $\beta$) of the linear combination are chosen to minimize the matching error $E_{Remap}$ that is defined in FIG. 37L. In FIG. 37L the kth eigenvalue of $\widehat{TCC^{(r)}}$ is denoted $\lambda_k$, and the kth eigenvector $\Omega_k$. Since the allowed remappings include the case where $\beta=0$ and $\alpha=\sqrt{K/\Sigma\lambda_k}$, i.e. a remapping which sets the output of the current homotopy to unity (thereby preserving the solution from the previous cycle of loops), and since the allowed remappings further include the case $\alpha=0$ and $\beta\beta 1$ which leaves the eigenelements unchanged, the remapping solution that minimizes $E_{Remap}$ will ensure a solution that is at least as good as that provided by the direct eigenelements of $\widehat{TCC^{(r)}}$, and also at least as good as that from the previous cycle of loops; in practice this solution will generally be better than the latter and slightly better than the former, at least in the early loops. In straightforward fashion it can be shown that the optimal $\alpha$ and $\beta$ are solutions to the simultaneous equations given in FIG. 37L, whose coefficients are defined in FIG. 37M. These FIG. 37L equations are cubic, but since there are only two unknowns they can be solved to global optimality quite rapidly by standard numerical methods. A further simplification can optionally be made to FIG. 37A by treating $\alpha$ and $1-\beta$ as small quantities whose high powers can be neglected.

It will be clear to those skilled in the art that the approach described in FIGS. 37L-37N can further be used to remap the homotopy matrix eigenvectors with other combining vectors besides a neutral unity vector, thereby further improving convergence speed. One can, for example, replace (in each iteration) the first homotopy eigenvector by an optimal linear combination of that vector with the first eigenvector of $TCC^{(r)}*Sigmoid[1/C,t]$, taking into account (with optimal weighting) the matrix composed of the Mercer products of the remaining homotopy eigenvectors.

Figure 38:
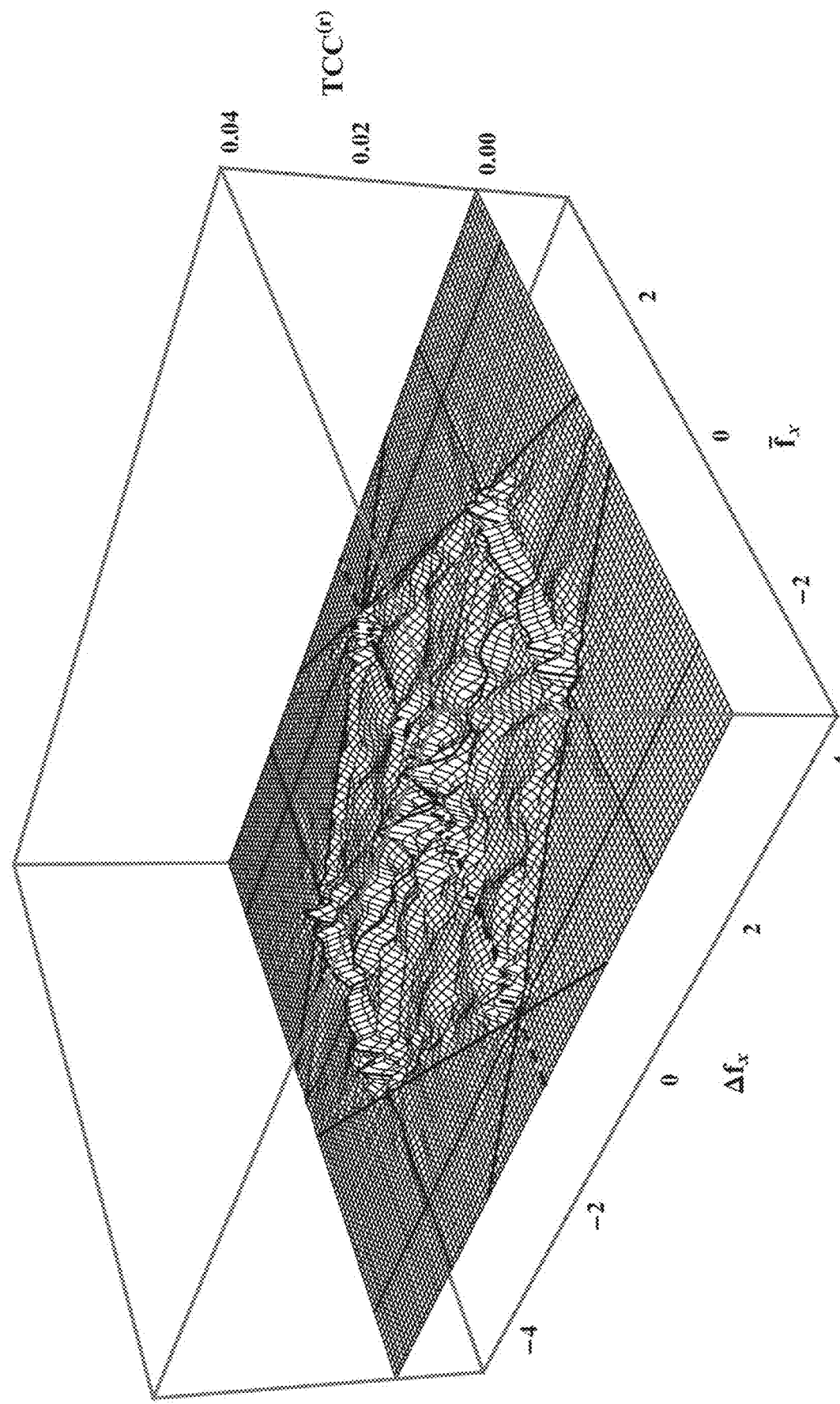
FIG. 38 plots the reduced level of residual TCC error when a higher-order loxicoherent system obtained in accordance with the invention by a homotopy method is used to model the example residual TCC error shown in FIG. 24, with the latter error having already been reduced by application of a first-order loxicoherent system.

The above-described refinement procedures and heuristics can improve the kernels of high-order loxicoherent systems, but the unadorned homotopy method of FIGS. 37A-37F can provide highly efficient loxicoherent systems even without such improvements. For example, FIG. 38 shows the result of extracting a second loxicoherent system for the C-quad test case, obtained using the basic homotopy method of FIGS. 37A-37F with 40 iterations (without adding any of the above refinements). More specifically, FIG. 38 shows the residual $TCC^{(r)}$ error that remains after a homotopy-derived second loxicoherent system is extracted from the $TCC^{(r)}$ of FIG. 24, which, as has been discussed, itself represents the greatly reduced TCC$^{(r)}$ that remains after extraction of a first loxicoherent kernel from the 24-OCS-kernel TCC$^{(r)}$ of FIG. 14.

It is seen that an appreciable further reduction in TCC$^{(r)}$ is obtained in progressing from FIG. 24 to FIG. 38 via the extraction of a second loxicoherent system. This process may be iterated to extract still higher order loxicoherent systems. The homotopy solution for each loxicoherent system may be further refined by the optimization methods described above, but this has not been done in the example of FIG. 38.

A point to be noted here is that the computational cost of the homotopy method follows the same scaling law as the eigendecomposition used to find standard OCS kernels. (The computational cost of eigendecomposition is generally considered to be cubic in the grid-point length of the eigenvectors.) It can be appreciated that the homotopy method does entail a large relative numerical factor in its cost when compared to simple OCS decomposition, namely the number of homotopy iterations that are undertaken (typically of order 20 to 50). However, current computational lithography practice accepts even larger relative factors in certain computations that exhibit this same scaling, in particular during OPC preparations when so-called "storm analyses" are carried out, in which large numbers of TCC decompositions are assessed in an effort to find focal-plane and image-plane settings that best match calibration data. Such storm analyses do not require inclusion of high order loxicoherent terms, and the cost of subsequently adding high order loxicoherent terms to the final TCC decomposition (which makes use of the focus and image-plane settings obtained from the storm analysis) will only be moderate in terms of precompute time. (And, of course, the total precompute time is quite small compared to the subsequent cost of carrying out OPC, and in the latter dominant calculation the high order loxicoherent systems provided by the homotopy can significantly improve compute time.)

Discussed now is an additional specialized extension of the loxicoherent kernels to the case of $\Delta f \neq 0$.

Figure 39A:
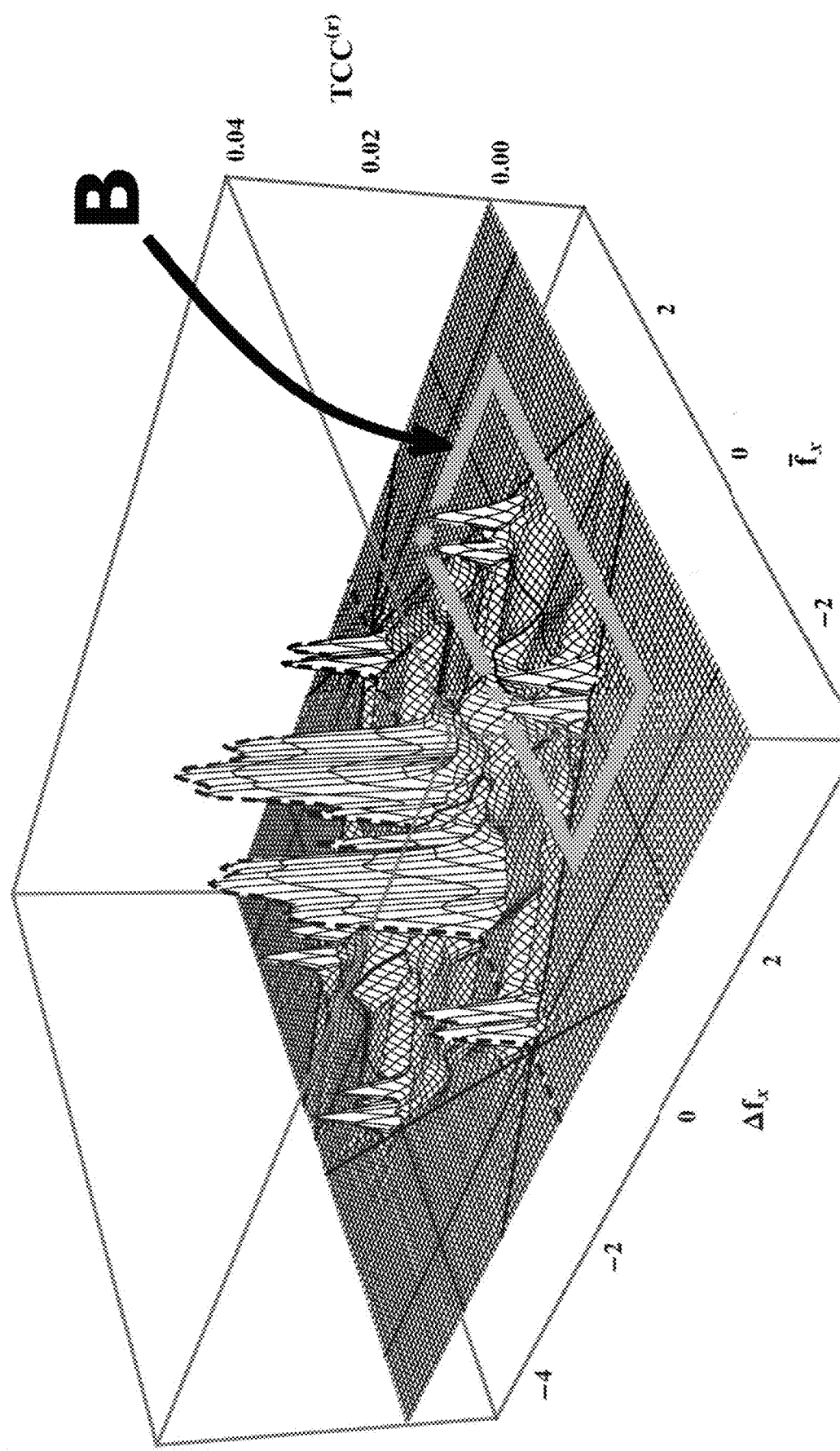

While it has been demonstrated that the $\Delta f=0$ case is particularly important because of the large slope-discontinuity that arises when the pupils in the Hopkins diagram are fully overlapped, there is, in addition, a weaker discontinuity that is generally present in very different regions of the Hopkins domain, namely the regions near $|\Delta f|=2NA$ in direction cosine units (or $2NA/\lambda$ in reciprocal pitch units), corresponding to intensity frequencies where the two pupils in the Hopkins diagram just become fully separated. Though milder than the primary discontinuity at $\Delta f=0$, this weaker discontinuity may give rise to a non-negligible TCC residual that is well-separated from the DC fin, such as that region outlined as 'B' in FIG. 39A, where the plotted residual TCC is that shown previously in FIG. 14, corresponding to a C-quad source. In FIG. 39A the strong content in the $\Delta f=0$ fin is seen to be supplemented by "horn-shaped" content near $|\Delta f|=2NA=2.7$ in direction-cosine units, marked (in its positive portion) as region "B". Although the term "fin" seems less apt as a descriptor for this high frequency content than it was for the near-DC fin associated with the first loxicoherent system, we may refer in general to any region of substantial TCC$^{(r)}$ content that is located away from $\Delta f=0$ as a "non-DC fin", particularly when the content in question is both diagonally oriented (i.e. associated with a particular value of $|\Delta f|$) and is a consequence of a discontinuity involving the lithographic optical system, as will be seen to be the case here. In brief, the residual content in region B arises because a circular pupil has no corners, so that the overlap area in the Hopkins diagram drops precipitously as the separation of $f_1$ and $f_2$ reaches the bandlimited value, a behavior that is difficult for smooth OCS kernels to track. This gives rise to an accuracy loss whose behavior and mitigation are described in further detail below.

In most cases this non-DC fin near the band limit is only modestly reduced by the first loxicoherent system. For example, if one compares the post-OCS TCC$^{(r)}$ shown in FIG. 39 (and shown previously in FIG. 14) to the reduced TCC$^{(r)}$ that results after the addition of the first loxicoherent system, this latter TCC$^{(r)}$ having been shown in FIG. 24, one sees that a substantial portion of the non-DC fin near the bandlimit (where $|\Delta f| \approx 2.7$) remains after the first loxicoherent system has been extracted. It may further be observed in the FIG. 24 plot that the non-DC fin, though modestly attenuated by the first loxicoherent system, has taken on a fairly significant magnitude in a relative sense compared to the content remaining in TCC$^{(r)}$ at other frequency pairs (even though its magnitude is of course small compared to that of the removed DC fin). Roughly speaking, the non-DC fin is reduced by the primary loxicoherent system because the T″ constituent incoherent kernel provides a least-squares optimal reduction in TCC$^{(r)}$ over the full Hopkins domain, as has been discussed, but this reduction is locally less strong than the complete elimination of the DC fin peak that is provided by the T′ constituent coherent kernel. A more thorough reduction of the non-DC peak near the band limit can be achieved by direct application of higher-order loxicoherent systems, as will be discussed.

The nature of the slope-discontinuity that arises when the difference frequency reaches the $|\Delta f|=2NA$ band limit is a consequence of the geometry that the Hopkins diagram assumes at such frequencies, with the two pupils in such a Hopkins diagram being depicted in FIG. 39B. (For simplicity FIG. 39B does not show the source.) When the difference frequency approaches the band limit, i.e. when $\Delta f$ is just smaller than the cutoff at $\Delta f=2NA$, the two lens pupils in a Hopkins diagram are seen to intersect in a zone which has quite narrow width, since within the overlap zone the curved rim of each pupil will be almost perpendicular to the axis of separation, due to the circular shape of the pupils. Lithographic sources are generally considered to be rendered with a small but finite amount of blur, so their intensity profile can be considered very smooth on the scale of the sharp lens pupil aperture, even in the case of sources that are normally considered to comprise discrete poles. As $\Delta f$ approaches arbitrarily close to the 2NA cutoff, it is therefore reasonable to consider the source intensity to be locally constant within the vanishingly small overlap zone, at least as a limiting case. This means that the TCC (if non-zero) will essentially be given by the relative area of the overlap zone, i.e. the area of the overlap zone as normalized by the total source area.

From the geometry of the Hopkins diagram, it then readily follows that as $\Delta f$ approaches the 2NA cutoff, the TCC will be approximately proportional to the 3/2 power of the small quantity $2NA-\Delta f$, as long as this quantity is positive, i.e., as long as $\Delta f$ is just within the band limit, rather than being just outside it. Referring to FIG. 40, it can more specifically be shown from simple trigonometry that as $2NA-\Delta f$ becomes small (while remaining positive), the TCC will be given by the upper line of FIG. 40A, where the factor S absorbs the source intensity within the overlap zone and the normalization constant, which is essentially the ratio of the total source area to the pupil area. Per FIG. 40B, it then follows that the second derivative of the TCC with respect to $\Delta f$ is inversely proportional to the ½ power of $(2NA-\Delta f)$ as the band limit is approached. Thus, as with the dominant crease at $\Delta f=0$, the TCC will exhibit a slope discontinuity at the $\Delta f=2NA$ band limit, since the second derivative with respect to $\Delta f$ becomes infinite at the bandedge, as noted in FIG. 40C. The singularity implicit in FIG. 40B is weaker than that governing the $\Delta f=0$ crease (FIG. 5A), and as a result the residual TCC error found near $\Delta f=2NA$ will tend to be small compared to that present in the dominant $\Delta f=0$ fin, as may be seen in the example of FIG. 14. However, as FIG. 24 illustrates, the residual error near $\Delta f=2NA$ can become significant in a relative sense after the first loxicoherent system has been extracted.

The $TCC^{(r)}$ rise near $\Delta f=2NA$ can be reduced using higher order loxicoherent systems, as obtained for example by the homotopy method previously described, or by the methods of FIG. 34. Such a reduction may be seen in FIG. 38, where the remaining error content near $\Delta f=2NA$ is seen to be smaller than in FIG. 24, thanks to the extraction of a second loxicoherent system. The homotopy method used to obtain this second system was not specifically focused on the content near $\Delta f=2NA$; for directed reduction of specific content the method of FIGS. 34J-34M would be more suitable.

Loxicoherent systems have thus far been described which can efficiently capture portions of the TCC that are recalcitrant to extraction with prior art OCS/Mercer kernels, such as the slope discontinuity near $\Delta f=0$ that arises from the sharp pupil edge, or the weaker slope discontinuity that occurs as $\Delta f$ approaches the band limit, or, more generally, any Toeplitz-like content that is diagonally oriented in the $f_1$, $f_2$ space. Beyond this, it can also be advantageous to deploy specialized non-OCS systems in accordance with the invention that address portions of the TCC whose significance is amplified by the typical character of lithographic patterns, as will now be discussed. In particular, the strong predominance of the zero (i.e. DC) order in the spatial frequency spectrum of most IC levels (which has been illustrated for a metal level in the log-scale plot of FIG. 27A, and which can often become even more pronounced than in the FIG. 27A example when negative-tone processes are used) will be shown with reference to FIG. 41 to amplify the significance of $TCC^{(r)}$ regions in which one frequency coordinate of the doubled domain has magnitude close to zero. Such regions are well-suited to extraction by loxicoherent systems in general, but one can also deploy a specialized system according to the invention, referred to as a "DC-monolinear system", which will extract these regions even more thoroughly, as will now be explained.

FIG. 41A shows how the frequency-domain Hopkins equation governing the residual (shown previously in FIG. 20C) can be discretized for use in computation, using a grid of frequencies that are evenly spaced (with a gridstep $\delta f$), and with the two frequencies of the doubly-dimensioned Hopkins domain being indexed by variables j and k. (FIG. 41A follows a common convention in using the symbol "N" to denote the number of gridpoints used in an FFT; it will be clear to those skilled in the art that this meaning is very different from that of the quantity designated "N" in e.g. FIG. 20I.) As has been discussed, the image contribution from $TCC^{(r)}$ will generally involve all pairs of sampled mask frequency harmonics, i.e. all j,k combinations of amplitude pairs $M(j\delta f)M^*(k\delta f)$. However, other things being equal, the FIG. 41A double summation will tend (for most IC levels) to be dominated to a degree by pairs in which j and/or k is 0, since such pairs include the dominant mask zero order. Thus, with many IC levels it is regions $TCC^{(r)}[j\delta f, 0]$ and $TCC^{(r)}[0, k\delta f]$ within the residual TCC that make the largest contribution to the image (or at least make a very substantial contribution), with the equivalent regions in the continuous domain being $TCC^{(r)}[f_1, 0]$ and $TCC^{(r)}[0, f_2]$, as noted in FIG. 41B. The strong intensity contribution from these regions is not a consequence of an inherently large $TCC^{(r)}$ magnitude due to poor OCS extraction (as in the case with the $\Delta f=0$ fin), but rather it is a consequence of these regions being strongly sampled (in many cases) by the interfering mask frequency pairs $M(f_1) M^*(f_2)$. For this reason we will refer to $TCC^{(r)}[j\delta f, 0]$ and $TCC^{(r)}[0, k\delta f]$ as "critical pair" regions (and likewise $TCC^{(r)}[f_1, 0]$ and $TCC^{(r)}[0, f_2]$ in the continuous case). The single function $TCC^{(r)}[f, 0]$ will similarly be referred to as the "critical axis" function, or simply as the critical axis of the residual TCC.

Strictly speaking, the continuous $TCC^{(r)}[f_1, 0]$ and $TCC^{(r)}[0, f_2]$ regions have measure 0 within the doubly-dimensioned Hopkins domain, and their discrete $TCC^{(r)}[j\delta f, 0]$ and $TCC^{(r)}[0, k\delta f]$ counterparts constitute only a single row and column of the discretized $TCC^{(r)}$ matrix operator (referring to the 1D pattern case for simplicity; it will be clear to those skilled in the art that these matrix elements are stacked in a more complicated but still readily referenceable way within the TCC matrix operator for 2D patterns). However, when one is employing both OCS systems and loxicoherent systems to reduce $TCC^{(r)}$ over the entire domain, it can be productive to dedicate kernel convolutions to the full elimination of $TCC^{(r)}$ along the critical j=0 row and k=0 column (though, as will be discussed, a preferred DC-monolinear embodiment of the invention provides reduction over the entire doubled domain). Often the $M(j\delta f) M^*(k\delta f)$ products will fall off substantially at even the j=±1 and k=±1 pixels adjacent to the critical row/column, since the integral of even the lowest-order (but non-DC) Fourier transform kernel over the entire optical ambit will not involve the steady secular accumulation of amplitude that will typically be present in the DC integral (i.e. it will instead be oscillatory at a higher integer harmonic). However, in preferred embodiments the spatial domain convolutions of e.g. FIG. 1C are calculated over a wider OPC frame than is covered by the Fourier harmonics used to calculate the TCC (i.e., the mask frame is typically somewhat larger than the ambit, as has been discussed), and convolutions that are extended in this way can be essentially equivalent to interpolating within the central j=0 row or k=0 column of the frequency domain TCC. It is therefore important to take the finite width of the central row and column into account (though at a minimum one need only do so to achieve an appropriate scaling factor). We will express such width cross-sections using a window function P(f). It will be seen that P(f) constitutes one of the two kernels that are present in each DC-monolinear system. In the simplest case, P may be a rect function whose value is 1 when $|f|<\delta f/2$, and 0 otherwise. Alternatively, P(f) may be considered to have the form of the averaged cross-sectional width exhibited by typical mask content M(f) near the DC peak. Beyond this, the shape of P(f) may, in a more sophisticated embodiment, be instead chosen in a way that provides optimal $TCC^{(r)}$ reduction over the full doubled domain, along with complete elimination of the critical row/column. With any of these embodiments, the shape of the P(f) kernel will be strongly different from that of the other DC-monolinear kernel (which is $TCC^{(r)}[0,f]$ or its conjugate, as will be shown), allowing the DC-monolinear system to more precisely target the critical regions of $TCC^{(r)}$ than can prior art OCS systems, which are each formed as a bilinear product of two copies of the same kernel function.

In the simple embodiment where P(f) serves as a narrow window function that targets the critical pair region, the contribution that the critical row/column pair makes to the image intensity is given by the first line of FIG. 41C, where the first term in square brackets is the j=0 row contribution, and the second term the k=0 column contribution. In other words, when P(f) is defined to be a simple binary aperture function that excludes all portions of the residual TCC outside the critical pair region, FIG. 41C expresses the contribution that the critical pair region of $TCC^{(r)}$ makes to the FIG. 20C intensity residual. In the most general case the square-bracketed expression would become locally incorrect in the central {0,0} pixel where the critical row and column intersect. However, we will assume in a preferred embodiment that kernels to extract these critical row/columns are determined after at least one loxicoherent system has been extracted from the TCC; as a result, $TCC^{(r)}[0, 0]$ will be exactly 0 since it falls on the (former) ridge of the extracted DC fin, allowing the central row/column intersection region to be neglected. The case of nonzero $TCC^{(r)}[0, 0]$ will be considered below. In practice the FIG. 41 systems are better behaved numerically when $TCC^{(r)}[0, 0]=0$, making it preferable to employ them in conjunction with a first loxicoherent system (of e.g. the FIG. 20B form) to ensure suppression of $TCC^{(r)}[0, 0]$.

When the equation in the first line of FIG. 41C is split into a sum of separate double integrals involving the two terms in the square bracketed expression, the resulting two double integrals are complex conjugates of one another, assuming that all previously extracted OCS and loxicoherent systems have maintained the Hermitian character of $TCC^{(r)}$. The intensity contribution from the critical-pair portion of $TCC^{(r)}$ is then given by the second line of FIG. 41C. If all quantities are Fourier inverse-transformed back to the spatial domain (with spatial domain quantities being represented by lower case symbols as usual), we arrive at the multiplied pair of mask convolutions shown in the last line of FIG. 41C. In physical terms, the DC-monolinear system produces its output by interfering the outputs of two constituent coherent systems, one with aperture transmission P(f) and the other with aperture transmission $TCC^{(r)}[f,0]$. Since the output interference modulation is essentially the product of one portion of the mask spectrum with another portion of the mask spectrum (due to use of two different constituent aperture filters), the output of the DC-monolinear system is a nonlinear function of the input mask spectrum, with this output being controlled by two distinct kernel functions. In these respects the DC-monolinear system resembles the other forms of loxicoherent system that are employed in the various embodiments of the invention, but the DC-monolinear system is unique in using two constituent systems that are both coherent.

The FIG. 41C expression has the same computational cost as each loxicoherent system in the basic embodiment of FIG. 20H (the latter being used by the primary system that extracts the Δf=0 fin), i.e. the same cost as each single e term of the second sum in FIG. 20H. However, this cost may be cut by almost a factor of two if one can accept the approximation that p(x) is approximately constant, which may be moderately accurate under conditions of e.g. uniform pattern content in a bright background mask, since the frequency domain window P(f) can, in many such cases, be considered to have a width of only 1 grid pixel. Even when the shape of p(x) is optimized explicitly, one can, for conceptual purposes, often consider the second term in the last line of FIG. 41C to exhibit only a modest and secondary variation over typical simulation fields, for mask types and IC content commonly encountered. Thus, it is usually the first term that provides the most substantive contribution, and we may loosely regard the entire system as making an almost linear contribution to the intensity through the first term alone, rather than making the usual quadratic (and typically bilinear) contribution. (Of course, strictly speaking the FIG. 41C system is fully quadratic in m(x), with the second term merely exhibiting lesser variability with many masks.) Since the magnitude of the second quasi-constant term can be deemed roughly equal to the DC amplitude transmitted by the simulation frame, we refer to the FIG. 41C system as a "DC-Monolinear System". In physical terms, the two interfering constituent coherent systems become equivalent to a holographic rendering of a transmitted amplitude, with a plane wave being used as reference if p(x) is constant.

As a point of terminology, it should be noted that in the spatial domain the "DC-monolinear system" is considered to include the mask pattern factor m(x), as shown in the last line of FIG. 41C. However, in the frequency domain one can define the "DC-Monolinear System" to be the square bracketed expression in the first line of FIG. 41C, which does not include the mask spectrum M(f). This difference is nothing more than an arbitrary choice of nomenclature.

In a preferred embodiment, P(f) is not merely specified as a window function; instead it is determined as an optimal kernel for the DC-monolinear system, following a similar approach to that used for the primary loxicoherent system (in the preferred embodiment discussed in connection with FIG. 22). In the FIG. 22 embodiment, one of the two kernels in the primary loxicoherent system (namely T') is preferably chosen to exactly match the dominant Δf=0 fin, with the T" kernel then being chosen to optimally match $TCC^{(r)}$ throughout the Hopkins domain. Similarly, in a preferred embodiment, the DC-monolinear system exactly matches the critical row/column of $TCC^{(r)}$ by using the function $TCC^{(r)}[f,0]$ as one kernel, after which a second P(f) kernel may preferably be chosen to optimally match $TCC^{(r)}$ across the rest of the doubled domain, by using a procedure analogous to that carried out in FIGS. 22H-22J to obtain T"'. To accomplish this, the first line of FIG. 41D shows an error metric $E_{DC-mono}$ that should be minimized to optimally match the DC-monolinear system to $TCC^{(r)}$ (the DC-monolinear system being the quantity shown in square brackets), where now P(f) is allowed to be complex-valued. The criterion for minimizing $E_{DC-mono}$ is that if one introduces a first-order variation e in the value of P(f) at an arbitrary location $f_{per}$, in the frequency domain, there should be no first-order change in $E_{DC-mono}$ if P(f) has the optimal shape, a requirement expressed in the second line of FIG. 41D.

Following straightforward algebraic manipulations, we then arrive at the solution shown in FIG. 41E. In a preferred embodiment the DC-monolinear system is applied after the primary loxicoherent system, in which case $TCC^{(r)}[0, 0]=0$ when FIG. 41E is used. It follows from FIG. 41E that P(0)=1 in this case, and the DC-monolinear system shown in square brackets in the first line of FIG. 41D (whose spatial domain equivalent-with included mask content m(x)—is shown as the last line of FIG. 41C) will then exactly match the critical row/column of $TCC^{(r)}$, and moreover will simultaneously provide a least-squares optimal reduction in $TCC^{(r)}$ throughout the Hopkins domain.

As with the simpler embodiment in which the p(x) kernel of the DC-monolinear system contributes a uniform planewave reference to an output holographic interference pattern, the preferred embodiments of the invention that are based on a least-squares optimal p(x) will likewise produce a holographic interference pattern as output. In both cases this holographic output is an interference rendering of the mask amplitude that is transmitted through a constituent coherent system (in preferred embodiments, a first constituent coherent system), wherein the pupil aperture transmission of this first constituent system is the critical axis function $TCC^{(r)}[f, 0]$. However, in preferred embodiments that use an optimal p(x), the reference beam is itself a coherently transmitted mask amplitude, namely a mask amplitude that is imaged through a second constituent coherent system, in particular a second constituent coherent system having aperture transmission P(f). In physical holographic systems the intensities of the direct object beam and the direct reference beam are often separated from the holographic interference pattern using simple angular divergence, but to carry out dimensional compensation in masks it is only necessary to determine the holographic rendering computationally, and thus the DC-monolinear system can simply be defined as the interference of the object and reference amplitudes after they are transmitted from the two constituent coherent systems, as in the last line of FIG. 41C. Moreover, since both of these interfering waves will typically have a complex and deeply structured form, there is little point in identifying one wave as the reference and the other as the object; FIG. 41C can more straightforwardly be described as an interference between the mask amplitudes transmitted by two constituent coherent systems, a description that applies even in the special case of constant p(x), if one of the constituent system apertures passes only the zero order.

The advantage provided by the FIG. 41C system in exactly matching the critical-pair region of $TCC^{(r)}$ when $TCC^{(r)}[0, 0]=0$ is magnified by the fact that a Mercer term [i.e. an OCS-like term of the form $\Psi(f_1)\Psi^*(f_2)$] will usually have considerable difficulty extracting this region when $TCC^{(r)}[0, 0] \neq 0$. This difficulty arises because one or the other $\Psi$ kernels in the OCS system will drive the product almost to zero in these regions, as shown in FIG. 41F. Note that $TCC^{(r)}[0, 0]$ will in fact be exactly zero by construction after a first loxicoherent system has been extracted, and in a preferred embodiment the DC-monolinear system is used in conjunction with a primary loxicoherent system. Even in the alternative case when all previously extracted systems have been OCS, it is often true that $TCC^{(r)}[0, 0]$ (which is the value of $TCC^{(r)}$ at the center of the $\Delta f=0$ fin) will be smaller than at most other frequencies along the fin. However, in situations where only OCS systems have been extracted, it may still be the case that $TCC^{(r)}[0, 0]$, though small compared to other $TCC^{(r)}$ values along the fin, will nonetheless have appreciable magnitude compared to the value of $TCC^{(r)}$ at points away from the fin, including points in the critical-pair j,k=0 row/column. In such cases one can, as an alternative, supplement the already-extracted OCS kernels with the essentially Mercer kernel shown in FIG. 41G. The FIG. 41G kernel (denoted $\psi^{Critical}_{Pair}$ in the spatial domain and $\Psi^{Critical}_{Pair}$ in the frequency domain) will fully extract the critical-pair row/column of $TCC^{(r)}$, as does FIG. 41C. However, the FIG. 41C system provides a more accurate matching than the FIG. 41G system, since it does not introduce erroneous TCC content outside the critical row/column. (In fact, FIG. 41C will improve the fit to $TCC^{(r)}$ in these regions via FIG. 41E, thanks to its use of two kernels $[TCC^{(r)}(0,f)$ and P(f)] which are strongly distinct from one another.) Nonetheless, FIG. 41G might expediently be employed in an OCS-only extraction strategy, since FIG. 41G is relatively easy to implement in prior art OPC codes that only support OCS kernels.

A related side point may be made in this context, namely that the invention permits an embodiment as yet unmentioned which, while not particularly accurate, is (like FIG. 41G) relatively easy to implement in prior art OPC codes. In particular, in one embodiment of the invention a purely incoherent system is fit to the $TCC^{(r)}$ that remains after the coherent system set has been extracted. Technically speaking, such an incoherent system qualifies as a limiting-case loxicoherent system, specifically a loxicoherent system in which the constituent coherent system is given such a large and open aperture as to essentially pass on an unaltered copy of the transmitted mask intensity to the constituent incoherent system. However, for computational purposes the constituent coherent system may then be omitted since it essentially acts as a null system, and therefore this embodiment may be implemented as a somewhat modest modification to an OCS code, namely a modification which allows the kernel convolution to operate on a squared amplitude transmission rather than an amplitude transmission.

A further point to be noted here is that the FIGS. 41C and 41G kernels can readily be applied to the 4D $TCC^{(r)}$ that governs the imaging of 2D patterns, even though as written these equations follow the practice (employed generally in our description of the invention) of only displaying a 1D pattern coordinate x for simplicity.

With a partial exception to be discussed, the same comment about 2D suitability applies to the other novel TCC decomposition systems of the invention. For the most part, 2D loxicoherent correction of the 4D residual TCC error can be carried out using the same procedures that have, for the sake of simplicity, been described above using nominal 1D notation. Generalizing the various kernels used by these procedures (such as the T' and T" functions) from 1D to 2D is largely straightforward, and should be considered implicit in the above equations. In 2D the arguments of these functions (such as $f_1$, $f_2$, $\Delta f$, or $\bar{f}$) become two-element vectors, i.e. these spatial frequency arguments have x and y components in the 2D case, so that T' and T" become functions with 2D domains, and $TCC^{(r)}$ becomes a function with 4D domain, with an x and a y dimension being present in each relevant component or sub-manifold of the doubly dimensioned Hopkins domain. The arguments of the spatial-domain functions $\psi$, t' and t" that appear in e.g. FIGS. 22H and 22I likewise have x and y components in the 2D case. Ordinarily the associated x and y coordinate axes would be chosen as those of the x and y design coordinates with which IC patterns are customarily laid out. The equations and formulas used to obtain these kernels can in general be immediately extended to 2D by using the 2D versions of the various operations involved. However, the fundamental physical mechanism underlying the slope-discontinuity in the TCC that drives $TCC^{(r)}$ does include a complicating behavior with 2D patterns that is not seen in 1D. As will be discussed, this complicating behavior causes the fin cross-section (which is characterized by the T" function) to have a potential azimuthal dependence at frequencies away from the fin peak that may not be captured as rapidly with a single kernel as is possible with 1D patterns, even after T" is made a 2D function (i.e. a function of $\Delta f_x$ and $\Delta f_y$).

Compensation of this off-peak azimuthal dependence can be effected in a direct way by dedicating separate kernels to different azimuthal zones, as will be explained.

It should be noted that the slope discontinuity and resulting fin structure in $TCC^{(r)}$ arise for the same reasons with 2D patterns as have been illustrated above using 1D examples for simplicity. When these examples are extended to 2D, the fin structure can be observed in the full four dimensions of the TCC (though the 4D fin-like error predominance is difficult to convey graphically), indicating that the loxicoherent correction can usefully be applied with 2D patterns for the same reasons as with 1D patterns. It may be seen that most terms on the right side of the second line of FIG. 5A are independent of the orientation chosen as "x" (though in the context of IC mask design "x" customarily denotes the axis designated as horizontal in the IC design layout), the one exception being the mildly-varying polar cosine factor |cos θ$_f$|. This means that the "crease" discontinuity in the TCC will generally have substantial magnitude independent of the x,y orientation chosen for Δf in the second derivative. While FIG. 5A is only exact in the idealized regime of aberration-free scalar imaging, a generic Gibbs-like fin or spike of error will nonetheless be generally found across all azimuths of a realistically calculated 4D residual TCC. This fin structure is strongly peaked across two dimensions because of the expanded TCC dimensionality, i.e. the error spike takes the form of a higher-dimensioned fin whose maximal ridge (i.e. peak) is a fully 2D locus that spans both $\bar{f}_x$ and $\bar{f}_y$ in the case of general 2D patterns, and this fin will typically be narrow in cross-section throughout the 2D neighborhood spanned by Δf$_x$ and Δf$_y$ that surrounds each point along the 2D peak of the fin. (Here we continue to use terms like "ridge" and "fin" that appropriately conveyed the character of these shapes in the previously shown 2D TCC examples, even though such simple descriptors are not literally applicable to the more complex 4D versions.)

Figure 42A:
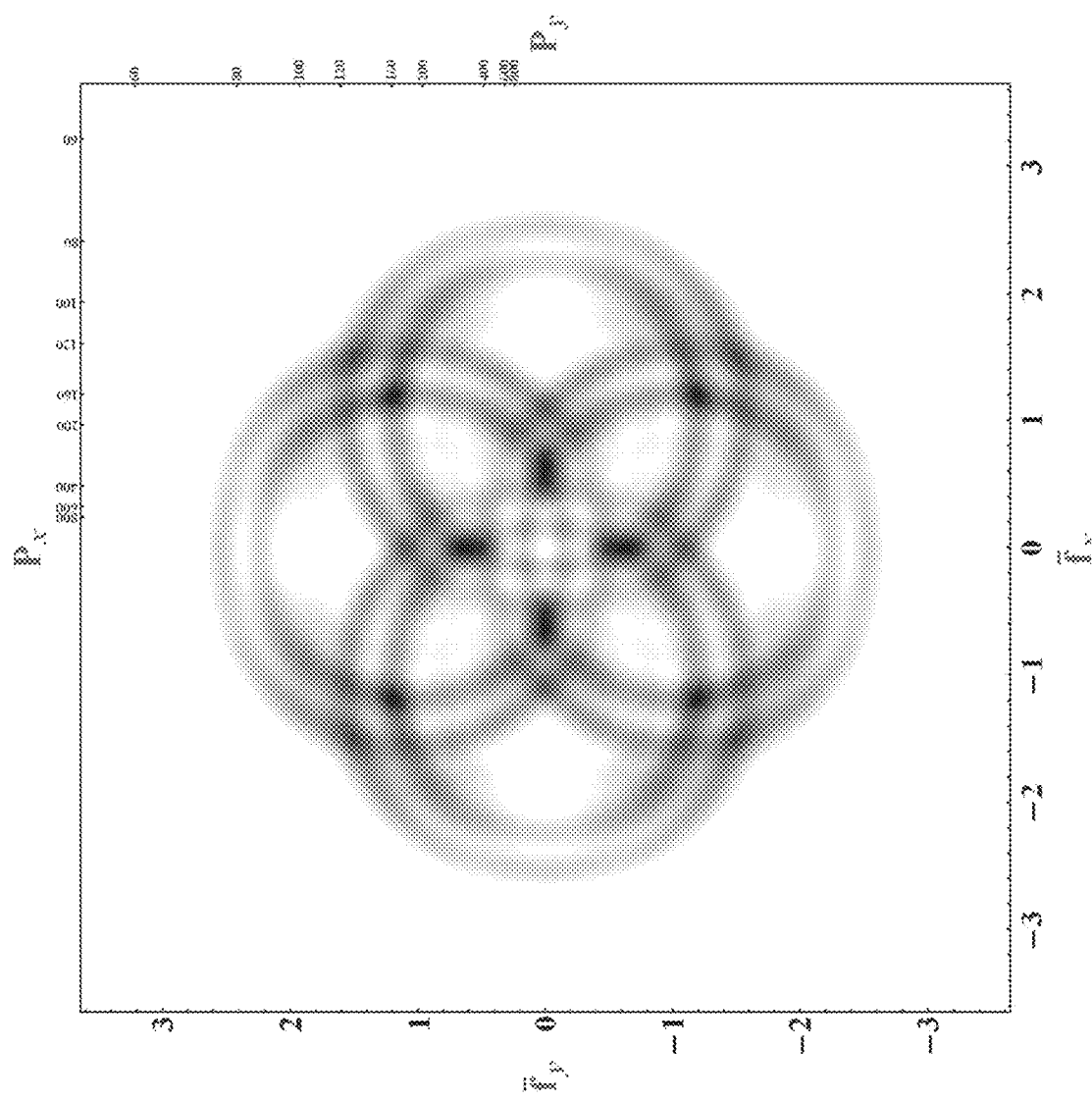
FIGS. 42A-42C referred to collectively as FIG. 42 show example plots of the 2D peak or ridge of the predominant residual error in the 4D TCC that governs the imaging of 2D mask patterns, in the case of a C-quad source example. These plots illustrate that the regions of worst error within this peak arise from epicycloid-like behavior involving the projection lens pupil and the source poles.

Considering first the extended shape and dimensionality of the "ridgeline" or peak of the fin when patterns are 2D, FIG. 42A shows a density plot of the 2D fin peak TCC$^{(r)}$($\bar{f}$, $\bar{f}$) in the case of the C-quad source example previously discussed, with the plotted residual error being the peak in TCC$^{(r)}$ that remains after 24 conventional OCS systems have been extracted. Here $\bar{f}$ is a two-dimensional spatial frequency that has x and y components, with these Cartesian components serving as the plot axes in FIG. 42A. The spatial frequency components are given in direction cosine units (including a multiplying factor equal to the coupling index of 1.44), and the right and upper plot axes also show the interference pitch P (in nanometers) associated with each direction cosine, i.e. P=λ/$\bar{f}$. Note that even though TCC$^{(r)}$ is considerably smaller in some regions of FIG. 42A than in others, every point in the plot that falls within the system bandpass is a point on the 2D peak (i.e. maximal "ridge") of TCC$^{(r)}$ within the overall 4D domain of the TCC, with this "ridgeline" being the two dimensional locus plotted in the figure, so that TCC$^{(r)}$ falls off rapidly in the unseen 2D manifold perpendicular to the two plotted f dimensions (this unseen manifold being the {Δf$_x$,Δf$_y$} manifold). The 2D space of FIG. 42A thus represents the full two-dimensional extent of the more limited 1D ridgeline along the fin peak that was shown dashed in FIG. 14. The dashed trace along the FIG. 14 1D fin peak is in fact a cutline trace along the x axis of FIG. 42A.

Figure 42B:
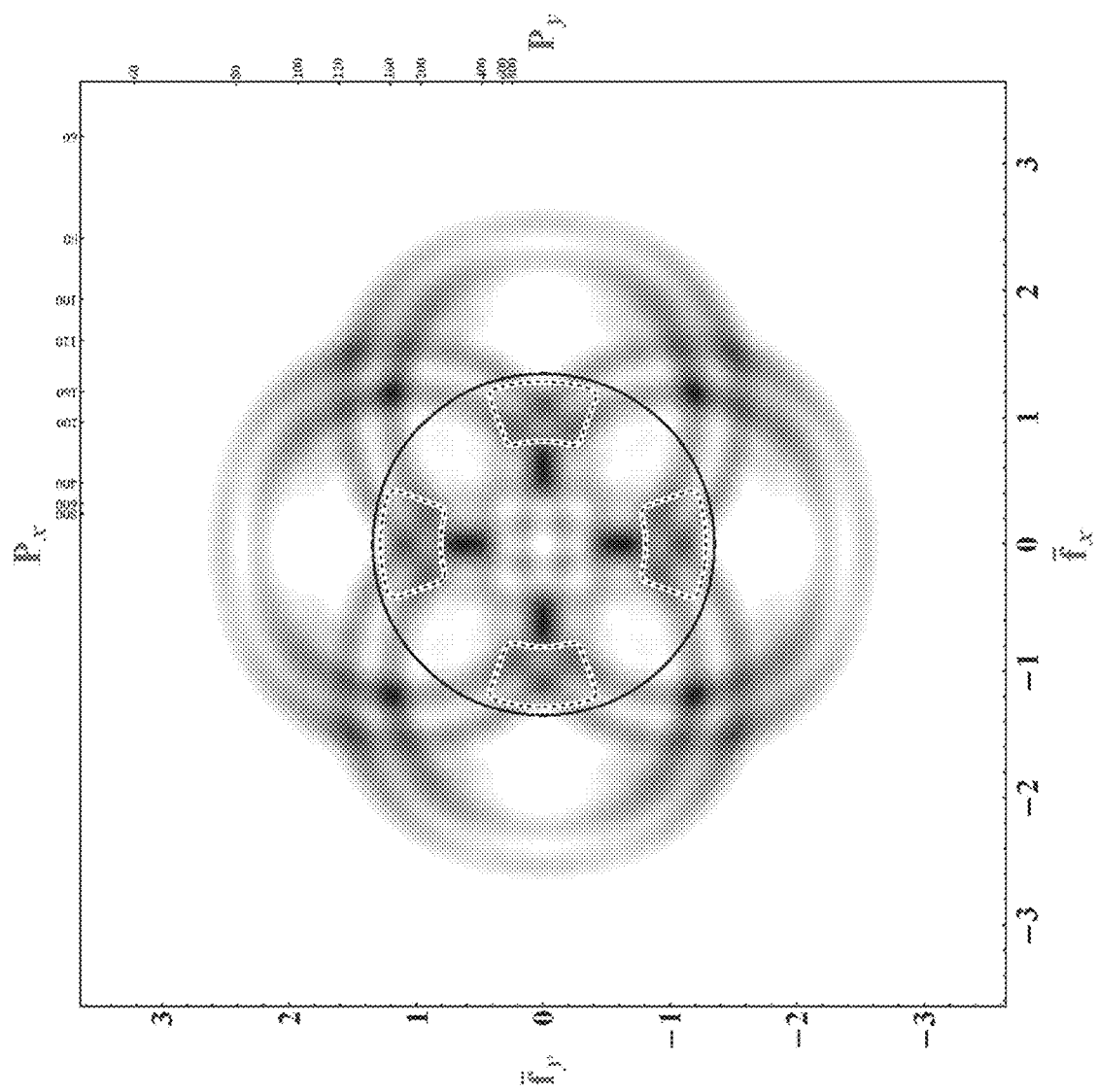

The full TCC at each of the frequency pairs whose post-OCS TCC$^{(r)}$ is plotted (i.e. depicted as a graylevel density) in FIG. 42A can be calculated from a Hopkins construction in which the two pupil apertures are made coincident, in accordance with the fin-peak condition that Δf equals 0 in both its x and y components. While each such point is generally a local peak or spike of TCC$^{(r)}$ within the unseen 2D Δf manifold orthogonal to the plotted point, it is clear from FIG. 42A that the height of this 2D fin peak varies considerably over the 2D $\bar{f}$ manifold. In particular, the locations of largest error (which in 1D would be "summits" along the "ridgeline") are seen to take the form of 4 pairs of double-concentric near-circular rings (in this non-limiting example). FIG. 42B shows that these double-concentric near-circles are centered on the four poles of the C-quad source, whose locations are indicated in FIG. 42B using dashed lines, with the centered lens aperture also being inserted as a black circle. Since Δf equals 0 in both its x and y components at every point in FIGS. 42A and 42B, each plotted point is associated with a Hopkins diagram in which the two pupil circles are coincident. Moreover, since the source position in a Hopkins construction does not change as the pupil offsets (i.e. frequencies) are changed, the source that is shown in FIG. 42B can be considered to be the source in the Hopkins diagram that is associated with each plotted point, with the two coincident pupil circles of each diagram being centered on the plotted point in question. At $\bar{f}_x$,$\bar{f}_y$ spatial frequencies in which the coincident pupil edges happen to intersect an edge of one of the four source poles, the rapid variation in the TCC becomes particularly large, and therefore tends to be particularly difficult for the OCS systems to match. Note that even though source blur generally leaves the pole edges much less sharp than the lens aperture, it is often the case that source shapes contain regions of very rapid intensity variation, e.g. pole edges, albeit blurred, and when these edge regions are roughly coincident with the OCS-problematic sharp pupil aperture in the Hopkins construction, the fin peak becomes particularly pronounced. Qualitatively speaking, this effect explains the general character of the T' filter function, causing certain $\bar{f}$ frequencies along the 2D fin peak to contribute more to TCC$^{(r)}$ than do other frequencies.

The locus of such particularly problematic $\bar{f}$ points, e.g. points where TCC$^{(r)}$ is pronounced due to coincidence of the pupil edges with any one of the source pole edges or corners in, e.g., FIG. 42, will take on the appearance of nested generalized epicycloid-like curves, where each such curve in a nested pair takes on the rough appearance of a circle if the associated source pole is small, and/or roughly circular. We may envision each epicycloid-like curve as being formed by tracing the center of the pupil circle (actually the pair of aligned pupil circles) as the pupil circle is "rolled" around the source pole perimeter (i.e., with the pupil circle being "in contact" with the source pole perimeter). In the case of the innermost curve of the nested pair, we should envision this "rolling" construction as being carried out with the bulk of the source pole positioned inside the aligned pupil circles.

Figure 42C:
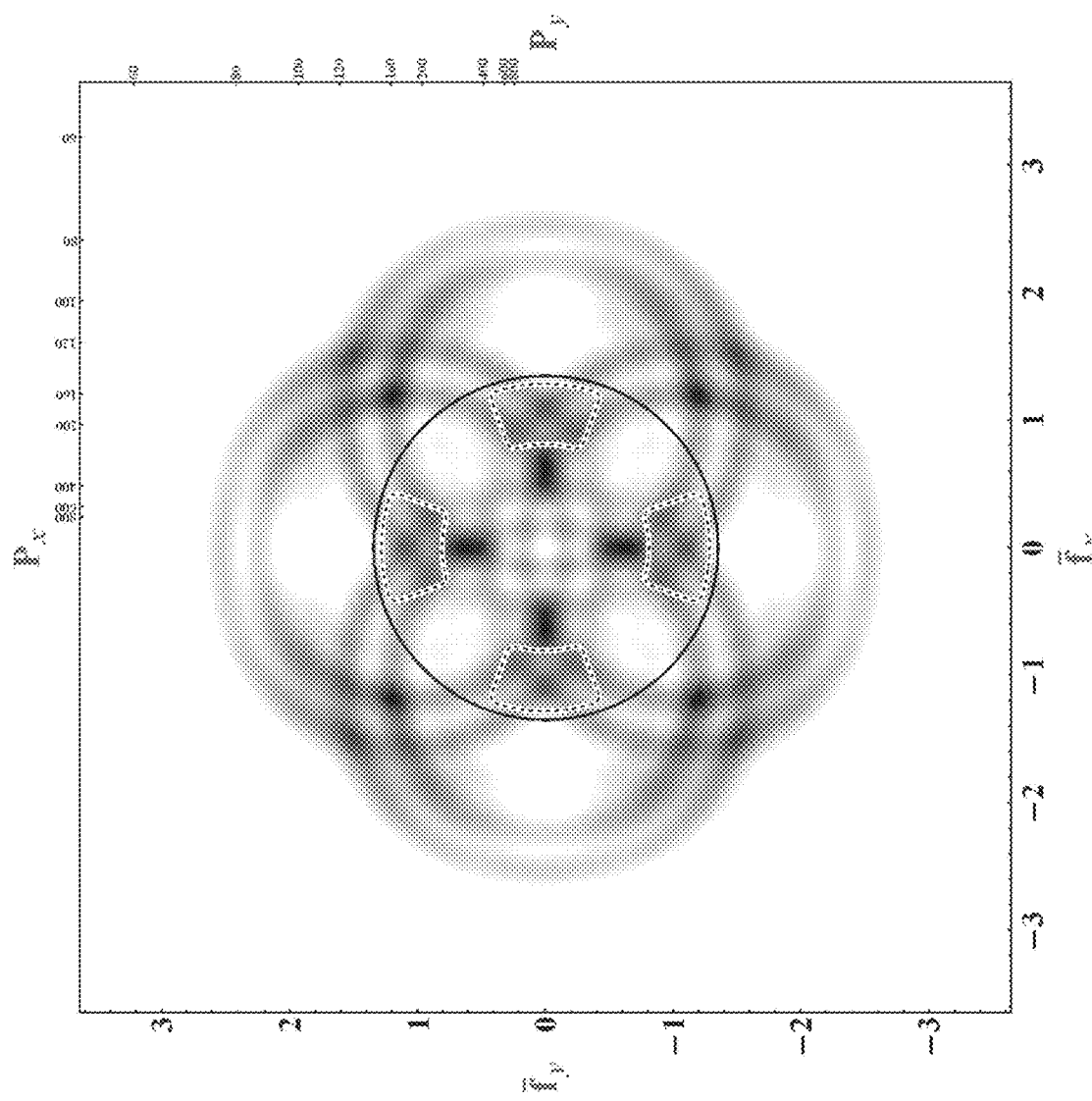

FIG. 42C shows one Hopkins diagram from such a rolling sweep, namely the Hopkins diagram for the {$\bar{f}_x$,$\bar{f}_y$} frequency pair that is labeled U (with Δf$_x$=Δf$_y$=0). The diagram is shown superimposed on the same plot of the 2D fin peak that appears in FIGS. 42A and 42B. As discussed, this 2D peak in the TCC error arises from the behavior of the Hopkins imaging configuration when the two interfering frequencies f$_1$ and f$_2$ become equal (i.e. to frequency U in the FIG. 37C example). The ring-like "summit" regions of the peak where the TCC$^{(r)}$ error is particularly large can be seen in the figure to arise from the difficulty that the truncated OCS/Mercer series has in capturing the rapid transition that occurs when source points at the steep edge of a source pole diffract the frequency in question (e.g. U) to the sharp edge of the pupil (with example point U being chosen somewhat arbitrarily as the frequency on one such ring that happens to have maximum $\bar{f}_y$ value). Each inner ring constitutes half the locus of frequencies in this category that are associated with one of the poles, where the inner ring can essentially be constructed by "rolling" the pupil circle around the pole, in the manner suggested by FIG. 42C, with the ring being traced out by the center of the pupil circle.

Similarly, the outer epicycloid-like curve is essentially formed by tracing the center of the pupil circle as the pupil circle is rotated around the source pole perimeter with the source pole outside the pupil circle, i.e. each pronounced outer circle "summit" within the 2D $TCC^{(r)}$ ridgeline peak is formed by the trace of the pupil center while the pupil circle is "rolled" in wheel-like fashion around the outside of the pole. $TCC^{(r)}$ tends to be particularly large for points at which multiple epicycloid traces intersect, i.e. where multiple source pole edges intersect the pupil aperture in this way.

The same sort of epicycloid-like processes are found to govern the shape of the fin peak with other source shapes. Though not quantitatively precise, this construction provides a quick rough determination of the spatial frequencies that will exhibit problematic accuracy in an OCS calculation.

Since FIG. 42A is a plot of $TCC^{(r)}(\bar{f},\bar{f})$ for a 2D spatial frequency $\bar{f}=\{\bar{f}_x, \bar{f}_y\}$, the previous discussion in connection with FIG. 22G shows that the square root of this plotted quantity will provide an optimal T'($\bar{f}$). T' as calculated in this way will exhibit all the strength seen previously in the 1D examples provided above, and essentially the only impact from considering 2D spatial frequencies is that T' becomes a numerical function of two arguments, $\bar{f}_x$ and $\bar{f}_y$. One can similarly apply FIG. 22J to calculate the incoherent kernel T"($\Delta f$), and, per the earlier discussion of this kernel and the related rotated system kernel $\hat{T}$ (e.g. in connection with FIG. 17B), such a procedure essentially determines T" as a mean cross-section of the fin. However, the fact that the integrals in FIG. 22J are merging content across a 2D subspace means that the reduction of the 2D fin's varying 2D cross-section to a single function may average over a greater share of the off-peak peripheral structure present in $TCC^{(r)}$ than occurs with a 1D slice of the fin (since each T" off-peak value is a 2D average rather than a 1D average). Nonetheless, FIG. 22J will continue to extract the critical central fin itself; this is a key benefit, since, in 2D as well as 1D, this central fin is the dominant error component in $TCC^{(r)}$ before the first loxicoherent system has been extracted. It is in the weak fine structure away from the fin that the convergence provided by a single T" kernel can be less complete in 2D than 1D, an effect whose mitigation will now be discussed.

The weak off-peak fine structure in T" and the averaging behavior of FIG. 22J may be conveniently be investigated by first choosing 0 as the value of parameter p in FIG. 22J, and further by making the explanatory approximations in the denominator that $$\left|T_1'\left[\bar{f}+\frac{\Delta f}{2}\right]T_1'^*\left[\bar{f}-\frac{\Delta f}{2}\right]\right| \cong |T_1'[\bar{f}]|^2$$

and $$D\left[\bar{f}+\frac{\Delta f}{2}\right]D\left[\bar{f}-\frac{\Delta f}{2}\right] \cong D[\bar{f}]^2.$$

Both approximations are reasonable in the critical region near the fin. Given these investigational simplifications, FIG. 22J may be understood as simply calculating the T" kernel for each value of $\Delta f$ as an average of $TCC^{(r)}$ (as windowed by D) over all in-window $\bar{f}$ values along the contour parallel to the $\bar{f}$ axis at which $\Delta f$ takes on the specified value, where it is understood that with 2D patterns the $\bar{f}$ "axis" actually refers to the 2D sub-manifold spanned by axes $\{\bar{f}_x, \bar{f}_y\}$. In other words, T" is simply an averaged 2D cross-section of $TCC^{(r)}$ in the difference-frequency directions, with this average being made over all $\{\bar{f}_x, \bar{f}_y\}$ frequencies within window D. The cross-sectional "axis" $\Delta f$ similarly refers to the 2D sub-manifold $\{\Delta f_x, \Delta f_y\}$ when 2D patterns are considered, and the value of T" at each 2D difference frequency $\{\Delta f_x, \Delta f_y\}$ will then approximately be an average of the 4D $TCC^{(r)}$ function over all possible $\{\bar{f}_x, \bar{f}_y\}$ coordinates.

Figure 43A:
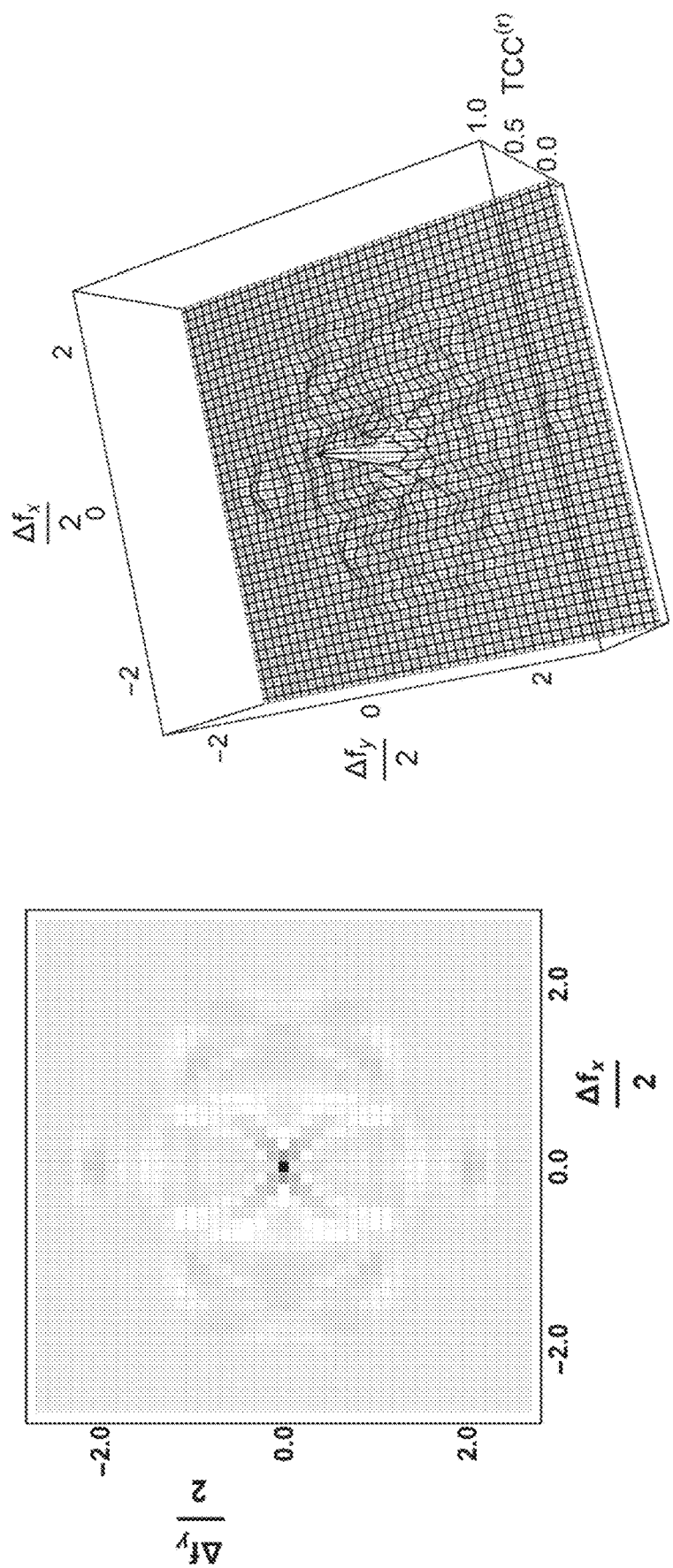
Figure 43C:
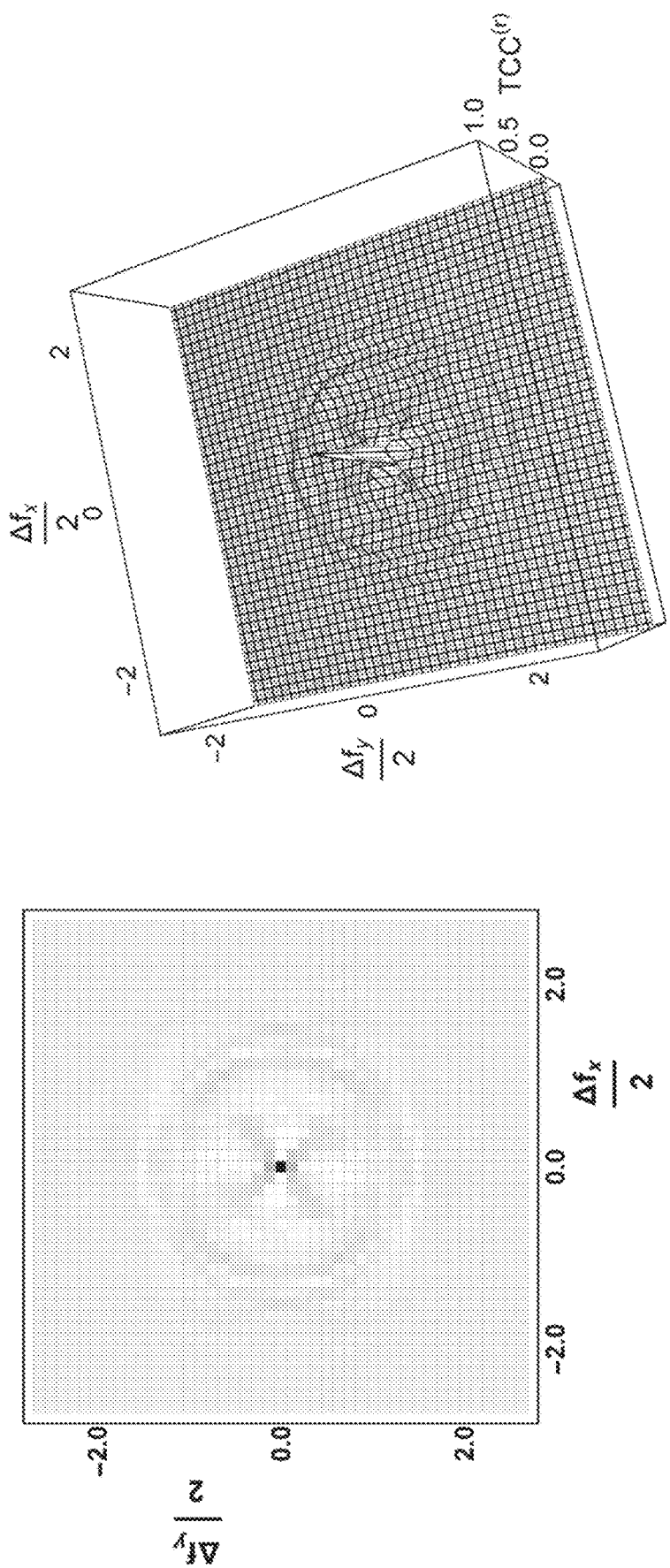

FIG. 43 shows three plots of such f-averaged $TCC^{(r)}$ cross-sections, namely FIGS. 43A, 43B, and 43C, with three different options having been used for window D in the three plots. Each plot can be interpreted as showing a different determination of the T" kernel, in each case plotting the T" kernel or averaged cross-section over the full 2D $\Delta f$ sub-manifold. The three plots will be used to explain how azimuthal variation in the cross-section can largely be eliminated. In each of the three cases both a density plot and a surface plot of the averaged cross-section are shown for clarity.

As noted above, an averaged cross-section like those in FIG. 43 may be used to calculate T" with reasonable accuracy, but for ordinary computational purposes one would need to use a D window in doing so that spans a reasonable portion of the $TCC^{(r)}$ content. However, in FIG. 43A we have chosen for explanatory reasons to use a window D that (quite unusually) only includes a single point; in particular, FIG. 43A shows the cross-section of $TCC^{(r)}$ at the $\bar{f}$ location of maximum error, which in this example occurs at a spatial frequency of about 0.7 in direction cosine units. (This position of maximum error is located along the $\bar{f}_x$ axis.) Because of the point-like D window employed, there is actually no averaging in the FIG. 43A cross-section; in this extreme example the plotted analogue of T" is simply the cross-section of the fin peak at its highest point (where "analogue" has been added as a qualifier to reflect the fact that a very unusual choice of D has been made). This T" cross-sectional plot shows a strong central spike corresponding to the dominant fin, and one finds that the fin's central spike is successfully reproduced in this way (i.e. taking the form of a narrow spike at the center of a 2D $\Delta f$ cross-section) with virtually any choice of D. The FIG. 43A cross-section also shows a weak fine structure away from the fin, and in this example the fine structure is seen to comprise faint "spokes" or "arms" oriented at roughly 45° in the x,y domain, along with some vaguely ring-like peripheral content. FIG. 43B shows as a comparison the T" cross-section as averaged along the x-axis, obtained by including all $\bar{f}$ points along the x axis in the D window used for FIG. 43B. Such a 1D-extended window choice makes FIG. 43B (or, more precisely, the x-axis of FIG. 43B) a reasonable choice for T" in the case of 1D patterns (though it should be noted that FIG. 43B is calculated with a different field size and gridding from the example 1D T" plot previously exhibited in FIG. 32, and in addition FIG. 43B uses a different choice for parameter p). FIG. 43B thus employs a cross-section averaging that is suitable for constructing T" in a 1D pattern context, and as such the FIG. 43B T" kernel might be applied in practice to particular 1D frequencies like that used in the single-frequency cross-section of FIG. 43A (which is a worst-case 1D frequency in terms of $TCC^{(r)}$ error). The FIG. 43B kernel will be scaled to exactly match the peak point of the fin at the FIG. 43A frequency (since the loxicoherent structure guarantees this for all peak frequencies, in preferred embodiments), but will only fit the off-peak $TCC^{(r)}$ in the two directions ($\Delta f_x$ and $\Delta f_y$) orthogonal to this point to the extent that the FIG. 43B cross-section has a similar shape to the specific local cross-section of FIG. 43A.

FIG. 43B is in fact seen to bear a general resemblance to the single-frequency cross-section of FIG. 43A, as expected from the Gibbs-like behavior involved, but FIG. 43B does show non-negligible differences in its fine structure. However, in this context our earlier highly successful 1D pattern results (e.g. FIG. 28) indicate very favorable prospects for 2D correction, since our earlier results have shown that a T" kernel calculated by using a wide 1D window in FIG. 22J (this window being broadly equivalent for purposes of discussion to that used in FIG. 43B) is able to very substantially reduce the image error at all 1D spatial frequencies, including the frequency of worst-case error at which the un-averaged FIG. 43A cross-section was extracted. In other words, the performance results reported in FIG. 28 illustrate how well an x-averaged T" can improve image accuracy at every individual frequency along the x axis. This robustness is primarily the result of successfully reproducing the strong central peak of the cross-section. However, besides reproducing this central peak, the averaged FIG. 43B fine-structure away from the peak is also seen to retain a non-negligible degree of correlation with the peripheral fine-structure in $TCC^{(r)}$ cross-sections at specific problematic frequencies like that of FIG. 43A. This partial matching in the periphery of the fin cross-section improves the accuracy of the loxicoherent system beyond that obtained by matching the central peak, even though the averaging in FIG. 43B has e.g. blurred the definition of the diagonal arms that are more prominent in FIG. 43A than in FIG. 43B, and has removed some of the azimuthal variation seen in the FIG. 43A peripheral rings. Despite this blurring of the periphery from averaging, the use of a wide enough D window to give T" coverage over the entire (1D) band limit is found to give good results at every specific frequency within the window.

FIG. 43C shows the T" result obtained using a 2D averaging window whose shape has been specialized for explanatory purposes. In particular, the 2D window used to obtain FIG. 43C only extends across the full bandwidth of $\tilde{f}$ in the radial direction, while azimuthally the window function D merely spans an arc of 22.5°. More specifically, the averaging window D in FIG. 43C is a 2D pie-slice whose upper radial boundary is the x-axis, and whose lower radial boundary extends into the third quadrant (i.e. towards negative y) through an angle of 22.5°. The mean orientation of this window has thus been rotated out of alignment with the x axis by 12.25°, for reasons that will be discussed. The T" function in FIG. 43C continues to show the same key central peak as FIGS. 43A and 43B. Moreover, despite being more extensively averaged, the peripheral content in FIG. 43C is for the most part only moderately attenuated relative to that in FIG. 43B, and the shape of this peripheral content remains fairly similar. We have seen that when T" for the first loxicoherent system is obtained by averaging over a 1D window (as in FIG. 43B), T" nonetheless proves able to correct a very large portion of the TCC residual error at every 1D spatial frequency (including the worst-case frequency of the FIG. 43A un-averaged cross-section). This implies that the variation in T" across these 1D frequencies, as exemplified by the noticeable deviation of the periphery in FIG. 43A from the FIG. 43B averaged result, is not large enough to eliminate the strong correction provided by an averaged T" function. The FIG. 43A to 43B variation is larger than the change between FIGS. 43B and 43C, i.e. larger than the change incurred in expanding the 1D linear widow used in FIG. 43B to fill the 2D pie-slice used in FIG. 43C. Broadly speaking, this indicates high potential accuracy during 2D correction with a single T" kernel. However, the window used in FIG. 43C only covers a 22.5° azimuthal range, and close inspection of FIG. 43C shows that the weaker off-peak content is rotated slightly (clockwise) relative to that in FIG. 43B, due to the rotated orientation of the D window away from the x axis in the former case. (Of course, the difference between FIGS. 43C and 43B is not purely one of azimuthal rotation, but this rotation is the only observed consequence of the expanded averaging used in FIG. 43C that has no analogue in 1D expanded averaging.) In FIG. 43C this azimuthal change is only a weak cosinusoidal effect, but such an azimuthal averaging would be more significant if the D window were extended to cover a full 180° half-plane, or a full 90° quadrant, although extraction of the dominant central peak would not be greatly affected by a wider averaging. (Lithographic sources are usually bilaterally symmetric, and the c-quad source example used here is also symmetric between x and y.)

The observed azimuthal variation is a consequence of the wider set of positional combinations available in the 4D TCC, since it is not possible for a single T" function to cover these combinations as comprehensively as is possible in the case of 1D patterns (2D TCC), even though T' and T" do increase their dimensionality to become 2D functions when applied to 2D patterns. For example, a slice of the 2D T" that is taken along the x axis will function in the role of a one-dimensional T" kernel for the set of 1D patterns in which $\tilde{f}$ is oriented along the x axis [with the Δf axis of T"(Δf) then being parallel in terms of x,y azimuth to the 1D frequency axis $\tilde{f}$ of these patterns, i.e. both frequency arguments are oriented along x since the 1D patterns are vertically extended], but this same one-dimensional T" slice must also provide an axis of correction for f displacements along other non-parallel azimuths. For small changes in azimuth the associated variation is only cosinusoidal, i.e. quadratic, and is therefore small, but it becomes more significant over the full angular domain.

Based on these considerations, one exemplary approach for generalizing the loxicoherent correction to 2D has four basic elements, namely: fin sectoring, exploitation of intermediate-range spatial homogeneity in IC patterns, weights to exploit frequency domain inhomogeneity, and use of higher-order loxicoherent systems to cover a broad azimuth in the 2D mask plane. These four elements will now be discussed in more detail.

1) Fin Sectoring:

By azimuthally sectoring the fin shape function it is possible to almost entirely recover in 2D the strong 1D performance demonstrated above, by calculating separate T" kernels that correct one azimuthal sector of the fin at a time, although this approach may require as many as four loxicoherent systems to achieve about the same jump in accuracy as each single loxicoherent system in the 1D case. While sectoring may not always be the most efficient 2D strategy, it has the advantage of being able to provide a clear extrapolation from 1D to 2D in the form of the 4-for-1 substitution that occurs when the full azimuth is divided into 4 sectors, as will now be discussed.

Suitably sectored kernels may be obtained by calculating T" using sector-shaped window functions D in FIG. 22J, with these sectors preferably being pie-slice-shaped regions in the $\{f_x, f_y\}$ domain in order to minimize the azimuthal variation across the sector breadth. While FIG. 43C was generated using an asymmetrically oriented sector in order to highlight the azimuthal variation effect, actual mitigation of this azimuthal variation is preferably accomplished using sectors that are symmetrically spread and oriented relative to the x and y axes. Since the azimuthal effect will tend to introduce only a slow, cosinusoidal variation across a sector, it is possible to employ sectors of non-negligible angular breadth without incurring a severe azimuthal blurring of the fine structure. For example, FIG. 43C has shown that averaging over a sector extending below the x axis by 22.5° will only give rise to a small skew in orientation into the third quadrant, indicating that a symmetrically oriented sector extending for ±22.5° about the x axis (i.e. with a total width of 45°) will only give rise to a mild azimuthal blurring. Since lithographic sources are often considered to have bilateral symmetry during the operations where OCS is employed, each sector may be extended along both positive and negative radial directions (and asymmetries are usually small even when included, making the averaging from a positive/negative-extended sector window acceptable in the context of a loxicoherent contribution whose total magnitude is itself a small fraction of the overall intensity). As will be discussed, each such sector effectively gives rise to its own loxicoherent system under this procedure. Since the azimuthal variation across each individual sector is small, the four systems that exhaust the full 360° fin azimuth will together accomplish much the same result as a single 1D system of the FIG. 20H form. The computational overhead associated with even these four sectored loxicoherent systems is far smaller than would be needed to achieve the same accuracy gain using additional OCS kernels (see e.g. FIG. 28).

When the fin is sectored, the T" kernel that is obtained with each single sector window D(f) will, by construction, only extract $TCC^{(r)}$ within the 4D domain $D(f_1)D(f_2)$. The set of such domains obtained from all sectors will be disjoint in the 4D space if the individual D functions are disjoint in the 2D f subspace of the fin, as will be the case when the fin is divided into separate azimuthal sectors. Moreover, even though the various D windows are applied to the same overall fin structure, i.e. potentially to a single common T' function per FIG. 22G, the actual fin content T'×D within a sector will be disjoint from the fin content within every other sector when the windows are disjoint, making T'×D effectively equivalent to a sector-specific T', i.e. creating separated effective T' functions whose windowing boundaries are built-in. This means that both the T' and T" functions for each sector are equivalent to the kernels of a sector-specific loxicoherent system that is completely independent from the systems for the other sectors, with the ensemble of such disjoint systems serving to exhaust the 2D fin in much the same way as does the first 1D loxicoherent system, though in the full 4D space there are distant peripheral regions outside the ensemble window formed by the $D(f_1)D(f_2)$ products.

Figure 44A:
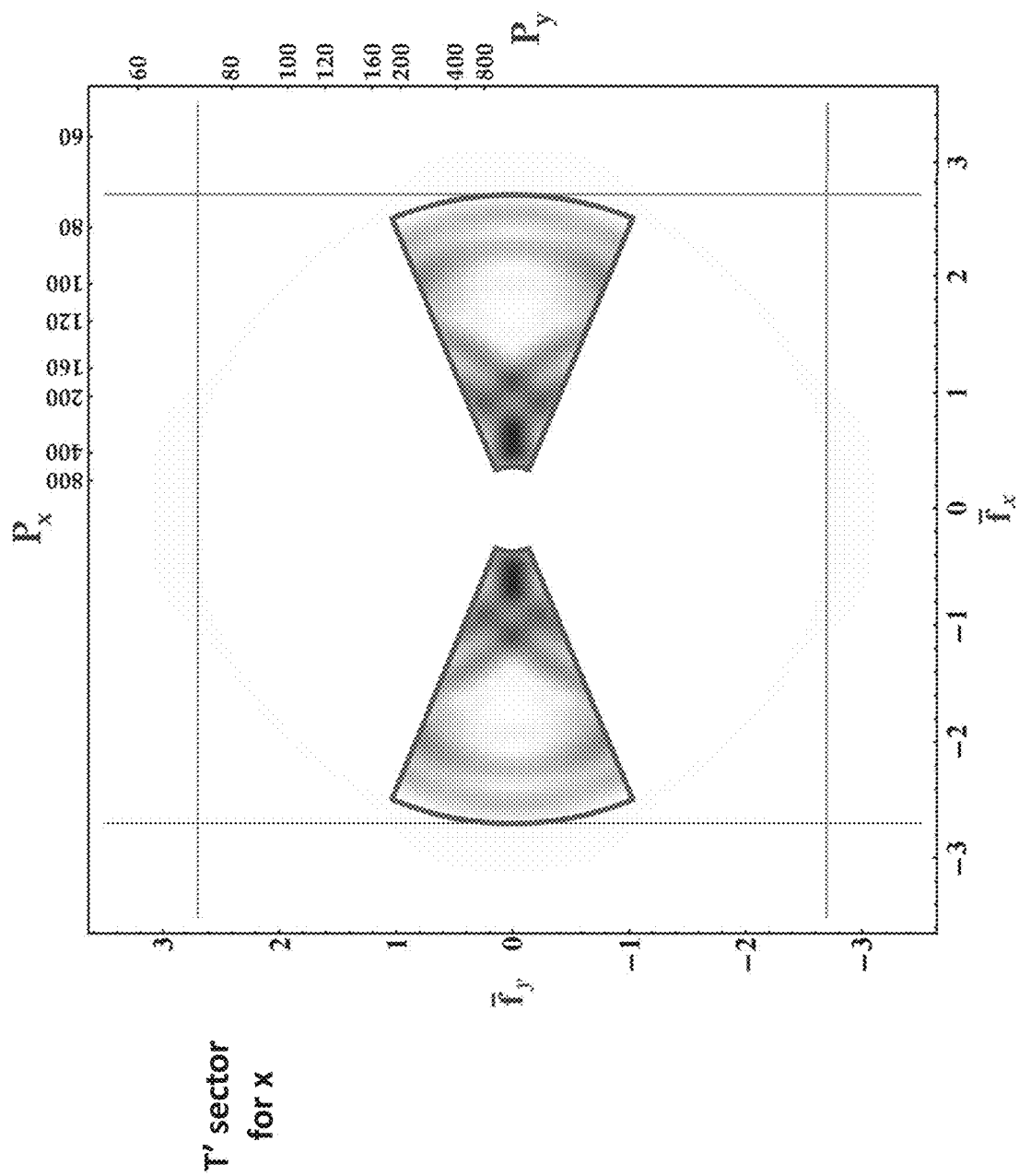
Figure 44B:
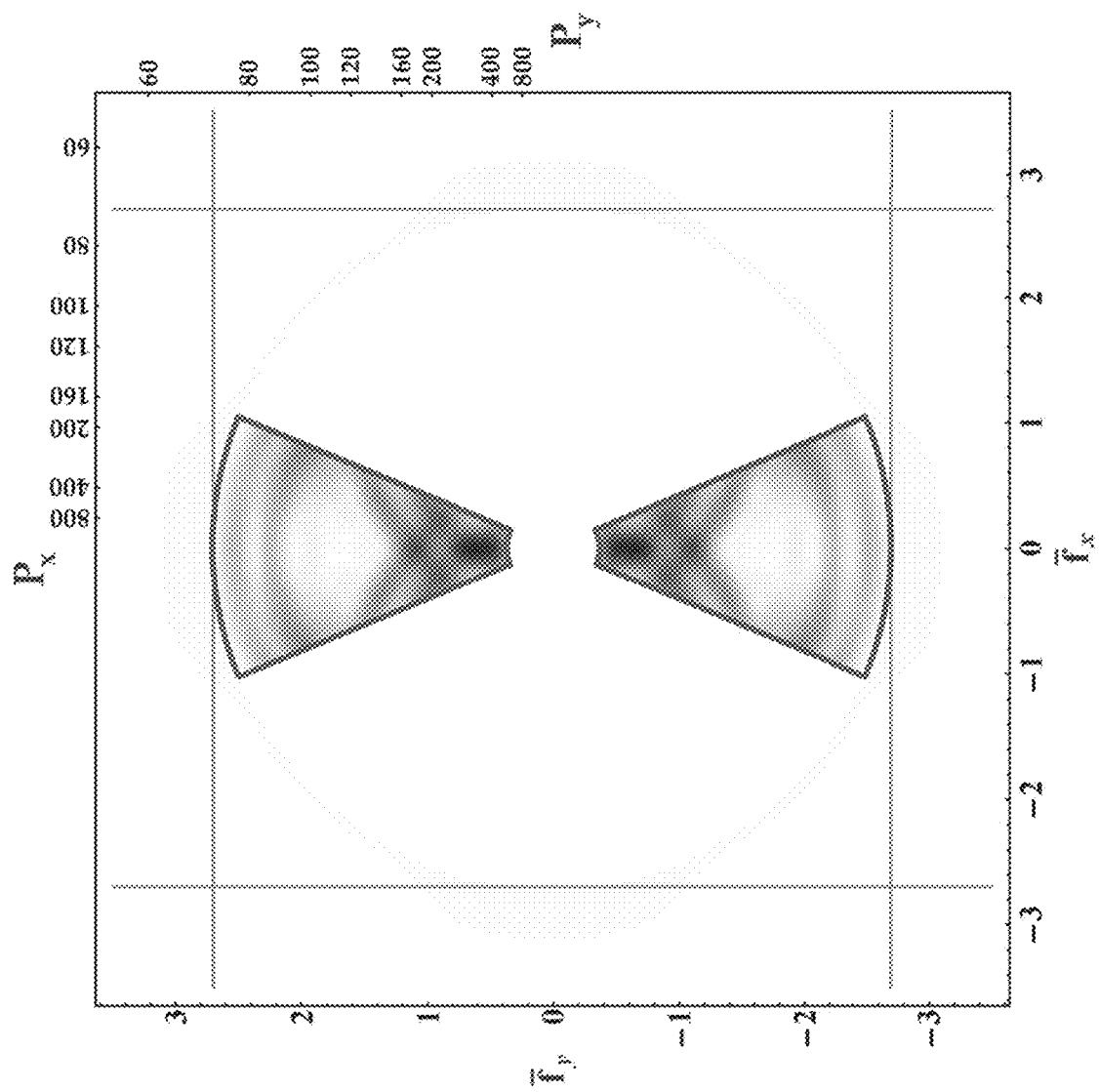
Figure 44C:
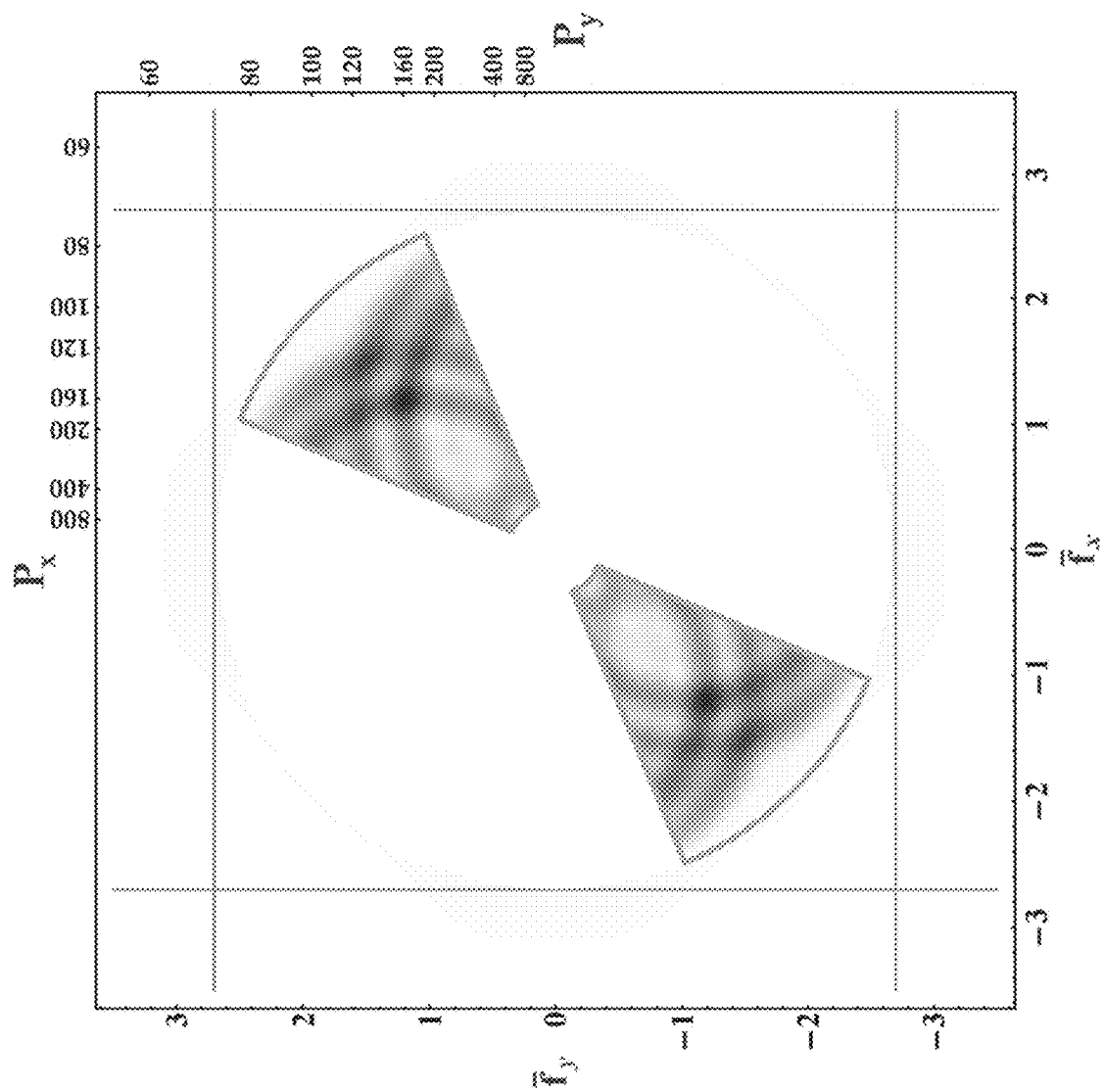

FIG. 44 shows an example of four effective T' functions that are constructed by the sectoring method, using windows D that select from the FIG. 41A fin (which per FIG. 22G is technically the square of T' throughout the bandpass) a quartet of appropriate azimuthal sectors that are built into the corresponding disjoint T' functions. Since the C-quad source used in this example has x-y symmetry (i.e. mirror symmetry about the ±45° diagonals), the kernels for the FIGS. 44B and 44D sectors can be obtained by simple geometrical rotation of the kernels for the FIGS. 44A and 44C sectors. Use of the FIG. 44 kernels in loxicoherent systems to extract the dominant fin entails eight additional convolutions, rather than only the two convolutions that are needed for the 1D case. Per the discussion above in connection with FIG. 43, the use of only four sectors to subdivide the azimuth is generally sufficient to strongly mitigate the generic azimuthal dependence of T" in the 4D case. However, if desired, a finer azimuthal segmentation may be used to reduce the quasi-cosinusoidal azimuthal variation seen in the 2D fin cross-section to an arbitrarily low level. One trade-off is that two new convolutions are needed for each added sector, although four sectors will typically prove sufficient. (Sources that strongly depart from the usual bilateral symmetries may require more sectors, if the TCC [more specifically $TCC^{(r)}$] has correspondingly strong asymmetries.) Since x and y oriented spatial frequencies are usually the most critical, one also has the option of dispensing with the sectors for the ±45° orientations. Further, as will be discussed, it may be sufficient to reproduce only the narrow central spike in such cross-sections, and in addition weights can be incorporated.

A further improvement may be obtained by jointly optimizing the T" kernels of all sectors collectively, instead of optimizing each T" kernel separately to minimize the TCC residual left by the loxicoherent system of its individual sector. This may be accomplished by procedures that are discussed in more detail below, including the use of window functions D that do not fall entirely to zero outside their particular sector.

2) Exploit IC Pattern Intermediate-Range Spatial Homogeneity:

The local fin 2D cross-section has been seen to have a narrow central spike whenever the fin peak is large, as a consequence of FIGS. 5 and 7. This central spike is ubiquitous throughout the full x,y azimuth of the 2D fin; for example, it is seen to be present in FIGS. 43A, 43B, and 43C. The peripheral structure is more variable, but has much lower magnitude. A significant improvement over OCS can thus be obtained from one added loxicoherent system that uses a single averaged T" function to successfully capture this narrow spike, even if the fine structure varies azimuthally. Moreover, accuracy is in practice further aided by the spatial scales involved. After the first loxicoherent system is extracted, the remaining TCC error will typically attain its greatest magnitude at frequencies which are slightly offset from the removed central peak. $TCC^{(r)}$ content at these azimuthally varying small-Δf frequencies will determine the long-range falloff of the t" function in the spatial domain, and different azimuthal weightings will give rise to different falloff behaviors. Per FIG. 20H, this long-range falloff governs an intensity contribution at image position x that is given by a (relatively) long-range integration over the neighborhood of x with kernel t". Here "long-range" should be understood as being comparable to the so-called optical diameter, which might typically be of order 2 microns. In the general context of advanced IC design such a range might be regarded as only "intermediate" in scale, but it is still many times larger than critical IC feature spacings, and in modern IC layouts the feature content in a given layout is often required to be fairly homogenous (with much repetitive content, and with many varieties of shape constructs being prohibited in order to ensure printability). Moreover, IC layout content is nowadays usually required to be uniform in density at intermediate scales, with "dummy" fill features being added where necessary to improve uniformity. This pattern homogeneity and density uniformity makes the loxicoherent contributions in FIG. 20H less sensitive to modest changes in the shape and scale of the integrating t" kernel, so long as t" remains large compared to the size and spacing of typical IC features. Layout homogeneity and uniformity at intermediate scale therefore reduce the impact of variations in the shape of the central fin spike, and thus improve the practical accuracy provided by a single averaged T" rendition.

3) Weights to Exploit Frequency-Domain Inhomogeneity:

The above-mentioned intermediate-scale spatial homogeneity in modern IC layouts often manifests itself as repetitions and near-repetitions of preferred device constructs, and in many cases these repeated patterns are at least mildly extended in either the horizontal or vertical direction in the layout, even though the patterns involved usually cannot be regarded as fully one-dimensional. Both tendencies give rise to a strong concentration of energy into spatial frequencies that lie along the $f_x$ and $f_y$ axes. Moreover, there will usually be certain frequency harmonics along x and y that are strongly favored in a given layout, while others will only contain weaker residual content, due e.g. to "forbidden pitch" design rules. Both kinds of inhomogeneity in the diffracted spectrum are clearly seen in the FIG. 27B example, and the particular metal level clips that give rise to the FIG. 27B example spectrum turn out to exhibit more diversity than is found in most IC levels. In many cases the electrically consequential edges and separations that define the so-called critical dimensions of the IC are likewise aligned with the x and y axes. With some layouts the ±45° meridians are also prominent in the diffracted spectrum.

When T" kernels of broad (or full 360°) azimuthal coverage are being employed, this strong variability in pattern significance can be exploited by using D windows that are not binary. In other words, rather than merely sectoring the $TCC^{(r)}$ domain using binary D functions with value 1 inside the sector and 0 outside, the function $D(\vec{f})$ can give preferential weight to spatial frequencies along preferred design axes, thereby achieving greater accuracy in the calculated intensity components that are of greatest practical interest. In many cases it is preferable to apply weights of this kind in combination with the item 1 sectoring method listed above. The advantage provided by the weights is synergistically enhanced in situations where the item 2 benefit from intermediate-range spatial homogeneity is also present. D functions can also be modified to exhibit stronger correlation with circuit design constructs that are deemed particularly important (e.g. critical pitches as a simple example). Note that window function D was introduced to prevent ill-conditioning in the T" solution, whereas the weights being described here are intended to ensure that azimuthal blur is minimal at spatial frequencies that make a critical contribution to pattern images. Referring to FIG. 45, we may distinguish these different purposes by introducing a separate weighting function $\Gamma(f_1, f_2)$ that is distinct from window D, as shown in FIG. 45. One suitable form for $\Gamma(f_1, f_2)$ is the geometric mean of the expected pattern energy levels at frequencies $f_1$ and $f_2$ (obtained, for example, from sample clips, as in the FIG. 27 example), added to a uniform base weight.

D windows of more complicated form than simple 0-or-1 indicator functions (i.e. more complicated than simple apertures which fully separate the different sectors) are also beneficial when jointly optimizing the T" kernels of different sectors together, as will be discussed.

4) Address Broad Azimuth Using Higher-Order Loxicoherent Systems:

The azimuthal T" sectors described above in item 1 of the present list involve the use of multiple loxicoherent systems to thoroughly exhaust the dimensionally expanded domain of averaging that must be accommodated during calculation of a T" kernel for 2D patterns, avoiding the need to cover this content with a single D window that extends over the full 360° azimuth (with associated azimuthal rotation/blurring of peripheral cross-section content). While the sectoring method is explicitly designed to address the azimuthal averaging effect, other more general methods can be employed to extract $TCC^{(r)}$ content over the full 360° azimuth using multiple loxicoherent systems. In particular, a series of higher order loxicoherent systems can be obtained by successive applications of the homotopy method discussed in connection with FIG. 37, or by the methods discussed in connection with FIGS. 34 and 35. All of these methods apply in 2D as well as 1D.

The four methods just described for handling the added dimension of averaging that arises in calculating the T" kernel for 2D patterns can all be used in conjunction with one another. This illustrates a more general point, namely that the various forms of loxicoherent system disclosed in the invention [e.g., fin-targeted to extract the Δf=0 dominant residual (FIG. 22), higher-order systems to target non-DC diagonals (FIG. 34 or 35), homotopy-derived (FIG. 37), DC-monolinear (FIG. 41), azimuthal fin-sectored (FIG. 44), or content-based frequency weighted (FIG. 45)] can fruitfully be used in combination with one another, as well as in conjunction with N standard OCS systems as described in FIGS. 20H and 20I. In these various loxicoherent systems the T" constituent incoherent kernels are usually chosen to provide a least-squares optimal reduction in $TCC^{(r)}$ over the doubled domain, as has been discussed. In a preferred embodiment the P kernels of DC-monolinear systems are also chosen in this way.

An additional refinement when multiple loxicoherent systems are employed is to improve accuracy by choosing the multiple T" and P kernels to be jointly optimal in a least-squares sense, rather than merely optimizing them for the performance of the individual systems in which they are constituent. Such a procedure may be further understood with reference to FIG. 46, which considers as an example the joint least-squares optimization of the T" kernels in two loxicoherent systems that together attempt to match $TCC^{(r)}$, with these two systems being designated "A" and "B". In this simple example the two systems A and B both employ the basic structure of FIG. 20B, but it will be clear to those skilled in the art how the procedure can be extended to cover more complex system embodiments, and the use of more than two loxicoherent systems.

For the simple two-system example, the equation of FIG. 46A in FIG. 46 expresses the total squared error (denoted $E_{Multisystem}$) in matching $TCC^{(r)}$. The squared error is summed over the full doubled domain, but the error at different frequency pairs may be given different weights during this integration; weights are defined by the weighting function Γ shown in the first line of FIG. 46A, as has been discussed previously in connection with FIG. 45. The second line of FIG. 46A shows the residual TCC that is being matched by the A and B pair of loxicoherent systems, and these two systems themselves are shown in the third line (in brackets). The T' constituent coherent kernels for the A and B systems can include window functions (denoted D in previous equations), but these are not explicitly shown in FIG. 46A.

The constituent incoherent systems $T_A$ and $T_B$ can be chosen to minimize $E_{Multisystem}$ by steps very similar to those used to obtain FIG. 22J. In order to display the resulting solutions for $T_A''$ and $T_B''$, it is convenient to introduce two simplifying notations. First, FIG. 46B introduces the symbol $\hat{T}(\vec{f}, \Delta f)$ to represent computationally a constituent coherent system $T'(f_1)T'^*(f_2)$. In this example two such systems are present, namely $\hat{T}_A$ and $\hat{T}_B$. (Note that coherent systems $\hat{T}$ are not equivalent to rotated system kernels $\widetilde{T}$, though they are represented by visually similar symbols.) Second, FIG.

46C introduces a kind of weighted dot product notation involving the integration of multiplied functions along the $\bar{f}$ axis in the doubled domain. In particular, for two arbitrary frequency-domain functions denoted F and G, whose arguments span the full dimensionality of the doubled domain (e.g. $f_1$ and $f_2$, or $\bar{f}$ and $\Delta f$), this dot product (using weight function $\Gamma$) is denoted $F \circ G$, and is defined by the integral on the right side of FIG. 46C. Using this notation, the optimal values for $T_A''$ and $T_B''$ at each difference frequency are given by the solution to the pair of ordinary linear simultaneous equations shown in FIG. 46A. These equations generalize in the obvious way to increased numbers of jointly optimized systems, and can of course be solved very rapidly to obtain values for $T_A''$ and $T_B''$ on a sequence of grid points.

Joint optimization of T" kernels can be useful when azimuthal sectoring is employed (e.g., as discussed in connection with FIG. 44). For example, it can be advantageous to jointly optimize the four T" kernels in the loxicoherent systems of the sectors shown in FIGS. 44A-44D by using the four-variable analogue of FIG. 46A, but in doing so one should make a modification to the windows that define these sectors. In particular, the sector windows should be modified in a way that prevents singularities in the simultaneous equations of FIG. 46A (extended to the four variable case), for example by using D window functions for each sector that do not fall entirely to zero outside the sector boundaries. As a more specific non-limiting example, instead of entirely suppressing to zero the $TCC^{(r)}$ content outside the sector, as do the simple aperture-like windows depicted in FIGS. 44A-44D, the D functions chosen for joint sector optimization might provide a non-disjoint aperturing of $TCC^{(r)}$ to a relative value of e.g. ⅕ outside their sector, while continuing to have full value within their sector. D should then be rescaled in order that the 2D fin peak be properly divided by the four sectors in combination, and since each sector contains a product of two D functions, an interior-to-exterior ratio of 5:1 requires that the D window have transmission $\sqrt{5/8}$ within the sector, and $\sqrt{1/8}$ outside the sector. When using this embodiment it is also useful to include a weighting function $\Gamma$, of the kind discussed in connection with FIG. 45.

The various novel decomposition systems described herein may all be optionally improved with numerical refinement. This would typically use the T' as optimization variables (e.g. in a gridded representation), with optimization being applied either to individual systems in sequence, or to multiple systems jointly. During each iteration of such an optimization the T" kernels may be set using e.g. FIG. 45 or 46D.

Beyond the FIG. 46 method or other numerical refinement steps to optimally employ the multiple kernels and systems of the invention jointly, a synergistic combination of the loxicoherent systems with additional variant coherent systems may also be desirable. The potential gain here need not be hampered by the fact that OCS exhaustion of the TCC function inevitably becomes slower after the initial OCS kernels have been extracted. This is because the additional variant coherent kernels can be generated, in accordance with the invention, from the $TCC^{(r)}$ that remains after at least one loxicoherent system has already been extracted, resulting in a $TCC^{(r)}$ for extraction of new coherent kernels which lacks the dominant fin that is present when additional coherent kernels are found to provide only a diminished benefit during prior art OCS. Per the discussion of FIG. 29 above, this fin has been shown to present an obstacle to the efficient extraction of coherent systems in the context of the standard OCS procedure. Subtraction of the fin from the residual may constitute a "disruptive reset" of $TCC^{(r)}$ to a condition that no longer approaches the OCS-unproductive asymptotic regime described in FIG. 29. Thus, in some cases it may be possible to achieve an additional rapid increase in convergence by re-diagonalizing the residual after the loxicoherent-targeted structure has been removed, and then employing the resulting coherent kernels as new OCS terms. However, it should be noted that the TCC residual will generally not be positive semi-definite after the fin is removed. In practice an optimum strategy can involve a mix of multiple kernel types, both new and traditional.

Another variant of the loxicoherent methodology that can be implemented in the invention is the use of heuristic kernels in the loxicoherent systems employed, or the use of kernels that are empirically calibrated. Such kernels may be used either as an alternative to the kernels derived from physical optics that have been disclosed thus far, or as a supplement to the physical kernels.

As discussed above, it is standard practice during OPC to account for resist effects using model forms whose coefficients and parameters are empirically calibrated. The individual terms of these models are often chosen on quasi-heuristic or phenomenological grounds to mimic the known characteristics of physical processes that take place within the photoresist, e.g. using convolutions of Gaussian kernels with the exposing image to mimic the diffusion of acid catalysts within the exposed resist. The loxicoherent systems described thus far have been chosen to match the physical TCC, e.g., to match the parts of the physical TCC that conventional OCS systems do not capture. However, phenomenological parametric adjustments can be added to these kernel functions, with the parameters and weights being set during resist model calibration. Loxicoherent systems using adjustable kernels of a purely phenomenological character can also be deployed by means of such a calibration procedure, and the calibration may be made against rigorously calculated optical images instead of resist measurements.

In the embodiments discussed thus far, the invention employs a highly efficient means to calculate the intensity of lithographic images. In doing so it maintains a computational scaling that is almost linear with the area of the image field, this scaling being dictated by the near-linear scaling of FFTs. Mask design tools that use the prior art OCS method also achieve near-linear scaling with area, and are likewise limited by the scaling of FFTs, but use of loxicoherent systems makes the overall constant of proportionality for this scaling considerably smaller, due to the greatly reduced number of convolutions that are needed to achieve a given accuracy level in the calculated image.

Thus far the invention has generally been discussed in the context of embodiments that provide mask shapes whose dimensional compensation is determined by OPC. Ordinarily, the only optical calculation with significant computational cost that must be undertaken during OPC is the determination of image intensity. This is because OPC typically carries out mask adjustments using a low-cost iterated feedback scheme. As has been discussed, such a feedback scheme typically involves either closing adjustable mask edge fragments inward, or extending them outward, according to whether the intensity at sampled positions along the target contour sought for the printed image either exceeds, or falls short of, the anchor value, with the sampled positions being e.g. the points along the target contour that are closest to the midpoints of the adjustable fragments.

However, in current practice an alternative to OPC has gained popularity as a way to design lithographic masks that can print IC shapes with greater fidelity and with decreased sensitivity to processing fluctuations, namely the class of methods sometimes referred to as Inverse Lithography Technology (ILT), or as mask optimization. ILT obtains lithographic mask designs as the solution to a formal nonlinear optimization problem (or sequence of such problems), in which the optimization variables that define the mask edge positions are not simply tied to individual neighboring intensity sample points, as in OPC, but are instead numerically optimized in terms of their collective global impact on lithographic constraints and objectives, i.e. mask edge variables are optimized against quantitative metrics that express lithographic goals or requirements. These constraints and objectives may reflect standard lithographic metrics, or they may have a more phenomenological character, e.g., being barrier terms that downweight undesirable image conditions. In many cases these metrics are derived from the exposing intensity, though some metrics may express mask manufacturability limitations by directly downweighting or penalizing unresolvable separations (spacings) between edge variables at the mask level, or by constraining these unmanufacturable spacings out.

When choosing the adjustments that will be made to an interim mask solution in the next iteration, feedback-based methods (like those used in OPC) are guided by the intensity pattern that the interim solution produces (or they may be guided by the resist response that is itself driven by the intensity pattern). However, optimization-based methods typically make use of gradient information as well; in other words, the mask adjustments made during ILT are typically driven by the derivatives of intensity-based constraints and metrics with respect to the problem variables, as well as by the constraint and metric values themselves. As far as the latter non-derivative inputs are concerned, it will be assumed that the bottleneck computational cost involved in calculating the intensity-driven metric and constraint values is the basic cost of calculating the intensity image itself, though in practice the intensity-based resist models that may be used during both OPC and ILT entail non-negligible cost. Nonetheless, these resist-model compute costs are common to both prior art OCS decomposition and the novel loxicoherent decompositions employed by the present invention, and are usually smaller than the cost of the common intensity calculation. Though some resist model regression functions are, like the optical model, gated in compute time by frame-scale convolutions, the convolution count in such resist models is fairly small, e.g. 5 to 10. The basic step of calculating the optical image is often the computational bottleneck, both in OPC, and in evaluation of the lithographic metrics that are the basis of ILT optimization formulations. The present invention can significantly improve the speed and accuracy of this calculation, for either OPC or ILT, achieving a near-linear scaling with the area of the simulation frame.

However, one consideration for carrying out ILT in the present invention, which does not arise with OPC, is that methods for solving nonlinear optimization problems typically employ derivative information to adjust the variables, i.e. gradients. Use of derivatives would seem at first glance to entail the computation of a considerably larger volume of information than mere computation of the intensity-driven lithography metrics alone, since these derivatives must be taken with respect to every mask variable, and the number of mask variables is itself proportional to problem area (with the cost of computing each such derivative being of the same order as the compute cost of the metrics themselves). Fortunately, as will now be discussed, there are embodiments of the invention that can obtain the derivatives with respect to all problem variables (of the relevant loxicoherent contributions to quantities of interest) with near-linear area scaling overall. Using methods already known in the art, the invention can also obtain with near-linear scaling the necessary derivative information for the contributions made by the coherent system set. The loxicoherent systems used by the invention can significantly reduce the total number of decomposition systems that are needed to meet a given accuracy target, thereby significantly reducing the overall compute time required for ILT mask design.

This desirable scaling is achievable with loxicoherent systems under a broad range of approaches to optimized mask design. One such approach formulates the optimization problem as the unconstrained minimization of a so-called "cost function", where this cost function is typically a heuristic amalgamation of a number of diverse lithographic desideratum, these latter being expressed as either metrics of solution quality, and/or as penalties on conditions of lithographic print failure or excessive process sensitivity. In another inverse lithography approach the optimization problem is formulated as one of constrained maximization (or minimization), in which one lithographic quality metric is designated as an objective to be maximized subject to constraints involving other lithographic metrics, with each such constraint reflecting a different lithographic requirement (or the constraint may reflect a single specific application of a general requirement at one of multiple locations in the image, each such location generating its own constraint to express the requirement). The overall mask design process can also involve solving a sequence of optimization problems in which the constraint set and objective choice are changed from problem to problem.

Mask optimization generally requires a larger number of adjustment iterations to converge than does OPC, particularly when the more sophisticated ILT formulations and flows are used. In OPC procedures the lengths of adjustable edge fragments are usually held fixed, with the lengths of the interleaved connector edges then being automatically determined once the excursions/retractions of the adjustable edge fragments have been set. With this OPC methodology the connector edges are not shifted in and out, and thus the connector edges do not represent adjustable degrees of freedom during OPC. In contrast, ILT formulations typically allow the lengths and positions of all mask edges to change during mask optimization, resulting in a higher variable count than in OPC. The gain in lithographic image quality that comes from designing mask shapes with ILT instead of OPC is often increased when very fine fragments are used, i.e. when edges are more densely fragmented than is useful with OPC; however, fine fragmentation further increases variable density. For these reasons ILT formulations are numerically more intensive than OPC, with constrained ILT formulations being particularly costly in compute time. Because of these higher compute costs, ILT is not commonly applied at full chip scale, and applications of ILT over relatively large areas will typically use simpler cost function formulations.

The above-described aspects of the cost function and constrained formulation approaches are known in the prior art. In general, at least some of the lithographic metrics involved in either approach are nonlinear in the problem variables, placing these optimization tasks in the category of so-called nonlinear programming problems.

Constrained nonlinear optimization problems are formally more complicated than unconstrained problems. However, many methods for constrained nonlinear optimization include inner loops in which an interim combined quantity is maximized in an unconstrained way with respect to the problem variables, with this interim combined quantity being formed as an amalgamation of the problem objective with barrier or penalty terms that initially serve as approximate surrogates for the problem constraints, with these barrier or penalty terms then being evolved during optimization (in outer loops) to ultimately enforce the constraint requirements in an exact way. During the inner loops the combined quantity is maximized without explicit constraint (with the exception that some methods explicitly impose the variable bounds during this maximization).

The inner loop maximizations are carried out on the basis of calculated gradients, with second-order information often being built-up and exploited during the course of maximization by means of e.g. the so-called BFGS method. (This inner-loop maximization is operationally almost identical to minimization of a cost function.) Then, during outer loops, the penalty or barrier terms are adjusted on the basis of the preceding maximization results in such a way as to ensure that succeeding unconstrained maximization solutions conform steadily more closely to the solution of the true constrained optimization problem. Convergence may be achieved, for example, if the combined quantity evolves to equivalence with a maximized Lagrangian of the standard kind, i.e. if the penalties vanish for constraints that are not binding, but act as constraint terms in an ordinary Lagrangian for those constraints which are binding on the solution.

For example, when the so-called Augmented Lagrangian method is used to solve a constrained optimization problem, the combined quantity to be maximized may be formed by adding certain quadratic terms to the usual linear constraint terms of an ordinary Lagrangian, in order to improve convergence. Referring to FIG. 47, the Augmented Lagrangian (AL) may in general be defined according to FIG. 47A, where $C_0$ denotes the objective to be maximized, and where P is shaped in a specialized way that also expresses a penalty or barrier. (It will be clear to those skilled in the art that this meaning for the symbol "P" as used in FIG. 47 is very different from that discussed in connection with FIG. 41, where "P" designated a window function or kernel in a DC-monolinear system.) The ith penalty term $P_i$ in the AL sum is associated with the ith constraint in the problem formulation. Qualitatively, $P_i$ detracts from the AL when the ith constraint $c_i(\vec{e})$ is violated, or more precisely (particularly when the outer loops have not yet approached convergence), when the ith constraint is merely close to being violated. Here $\vec{e}$ denotes the list of problem variables, which may, for example, comprise a list of horizontal and vertical coordinates of adjustable edge fragments in polygonal mask openings. For purposes of explanation it may be supposed that the mask polygons are of the so-called Manhattan kind, in which all edges are either vertical or horizontal. In the context of ILT optimization one can, for simplicity, use the term "edges" to refer to both the adjustable edge fragments in the mask polygons, and to the feature edges of the IC design shapes. As discussed, adjustment of the edge position variables will cause changes in the mask edge spacings and separations, i.e., the dimensions and separations of the mask features (and therefore their relative positions) will be adjusted, allowing these shapes to be dimensionally compensated. Assume that $\lambda_i$ is the current estimate of the Lagrange multiplier for the ith constraint, and $v_i$ is a penalty parameter. The $\lambda_i$ and $v_i$ are updated during outer loop iterations. Specific procedures for updating and initializing the multiplier estimates and penalty parameters are discussed in D. P. Bertsekas, *Nonlinear Programming* (Athena Scientific, 1995), chapter 4. Bertsekas shows in detail how the AL may be structured in such a way that it can be evolved to a true Lagrangian when outer loop convergence is complete, at which point the AL will become equivalent to a standard Lagrangian with valid $\lambda_i$ multipliers. In practice the solution may be deemed acceptable before full convergence has occurred.

A convenient convention in such a procedure is to reformulate all constraints $c_i$ to have 0 as the acceptable lower limit, as shown in FIG. 47B (e.g. by inclusion of a constant offset in the definition of each $c_i$, if needed). When the constraint functions $c_i$ are formulated in this way, a suitable structure for the penalty function P is given in FIG. 47C. Once $c_i$ is known, $P_i$ can be evaluated via FIG. 47C at almost no computational cost; thus the main computational cost in evaluating the ith term in the FIG. 47A sum lies in evaluating $c_i$. In general, the key subset of the problem constraints that express overall lithographic performance requirements in terms of optical intensity can generally be cast as a list of constraints in the FIG. 47B form, whose number will scale linearly with the total mask area being optimized. Moreover, each single such constraint can generally be derived from the optical intensity at a small fixed number of points, and with only a small fixed number of operations being needed to evaluate $c_i$ once these intensities are known. Those of ordinary skill in the art will appreciate that many standard lithographic requirements and objectives can be formulated in this way, such as constraints on image slope, integrated process window, MEEF sensitivity, and suppression of bright or dark printing artifacts. These constraints may be supplemented by a small quasi-fixed number of constraints that each depend on a larger number of intensities, but in general the total constraint count will be proportional to the mask area being optimized in the current optimization run (which would typically be the area of a simulation frame). Additional geometrical constraints not involving the intensity may be included to ensure that the final mask solution is manufacturable, and these constraints (along with the contributions of their derivatives to the AL gradient) may be obtained with near-linear scaling using, for example, the method described in U.S. Pat. No. 8,719,735, Optimizing Lithographic Mask for Manufacturability in Efficient Manner, M. Sakamoto et al., incorporated by reference herein.

When the optimization problem is formulated using constraints of this kind, the time needed to evaluate the sum in the FIG. 47A Augmented Lagrangian will scale linearly with mask area, once the intensity at relevant sample points is known. Objectives to serve as $C_0$ can be formulated to express a wide variety of quality metrics, and in most cases $C_0$ can be evaluated in a compute time that, at worst, scales near-linearly with mask area. Examples of objectives with this desirable scaling include integrated process window, RMS exposure latitude, and worst-case MEEF. In general, worst-case or first-to-fail metrics that involve gating patterns are common in lithography, and these can formulated via the $c_i$ constraints and the $C_0$ objective by using infinity-norms, which can be introduced into constrained formulations using well-known methods involving auxiliary variables.

Further reference in this regard can be made to U.S. patent application Ser. No. 14/185,440, filed Feb. 20, 2014, "Mask That Provides Improved Focus Control Using Orthogonal Edges", Jaione Tirapu Azpiroz, Alan E. Rosenbluth, Timothy A. Brunner, (now U.S. Pat. No. 9,310,674, issued Apr. 12, 2016), incorporated by reference herein.

If the coherent and loxicoherent system counts (e.g. N and L in FIG. 22H or 22I) are held fixed, the compute time needed to obtain the image intensity across a regular grid of sample points (i.e. at the gridpoints of an intensity "bitmap") will scale near-linearly with mask area, i.e. with the so-called N log N scaling of the FFTs used to carry out the FIG. 20H or 20I convolutions. (Here N is proportional to mask area; it is customary to use the symbol "N" in describing this FFT-based scaling, and it will be clear to those skilled in the art that this meaning of "N" is distinct from that used in e.g. FIG. 20H.) The intensity at any off-grid sample point can then be obtained to high accuracy by interpolating to the bitmap using a short-range interpolating function, which entails only a small fixed number of operations. This interpolating function can be a piecewise bilinear 2D triangle function if linear interpolation is used, or a 2D form of the well-known Keys' cubic interpolator if cubic interpolation is chosen. In a typical formulation the ith constraint may involve the intensity at a small fixed number of sample points, and for purposes of explanation we will assume that the functional expression which combines these intensity values within the function $c_i(\vec{e})$ is linear, though the method of the invention supports more general forms, as will be discussed. Under these conditions $c_i$ can be evaluated as a weighted sum of the intensity values of a small number of pixel values in the intensity bitmap, with these weights subsuming the necessary interpolation coefficients as well as the constraint's linear coefficients.

The AL can then be written in the form shown in FIG. 47D, where the i=0 term should be understood to represent the objective function, as will be discussed. An index s has been introduced in FIG. 47D to identify the particular bitmap pixel (i.e. gridded intensity value) to which a given weight applies, with the weight taken on in the ith constraint by the sth intensity pixel being denoted $f_{s,i}$. The range on the sum over s is listed as "sparse", to indicate that few intensity pixels will participate in any single constraint, so that the sum can be evaluated for each constraint by considering only the small fixed number of intensity pixels that are relevant to that particular constraint, with all of these pixels typically being in some small local neighborhood of the intensity bitmap. Evaluation of all the $c_i$, and thus evaluation of the AL itself, can then be accomplished with linear area scaling, since the number of constraints scales linearly with area. Near-linear scaling of the overall AL evaluation is thus maintained when the intensity calculation step is included in the assessment, since it has been established that the invention can obtain the intensity bitmap using efficient loxicoherent systems with a compute cost exhibiting near-linear scaling. It should be mentioned that FIG. 47D incorporates some notational simplification for clarity that does not impact this overall conclusion. For example, the i=0 term in FIG. 47D should be understood to be the $C_0$ objective, with $P_0$ then being the identity function. FIG. 47D omits auxiliary variables for simplicity, as might be used to define infinity-norm metrics, and it considers only intensity-based constraints; however near-linear scaling can still be achieved when e.g. mask manufacturability constraints are included. More specifically, the AL may also include constraints to ensure that the mask is manufacturable, e.g. that no parallel edges in the mask design are positioned so close to one another that the mask cannot be fabricated. Such constraints and their calculation are described in U.S. Pat. No. 8,719,735, and the totality of these constraints (as well as the associated gradient) may be calculated with near-linear scaling using the methods described therein. While FIG. 47D is written with a nominally linear dependence of the $c_i$ on the sampled intensities, near-linear scaling is still achievable when the constraint functions include a variety of nonlinear structural forms, e.g., if the constituent intensities are passed through an analytic nonlinear transforming function to which the chain rule can be applied. This allows phenomenological resist models to be considered, for example.

Though the outer loops of the constrained nonlinear optimization procedure use, e.g., the Bertsekas method to adjust the $\lambda_i$ and $v_i$ multiplier and penalty parameters (in order to ensure that the objective is properly constrained at termination only by those $c_i$ that are truly binding), each interim optimization that is carried out during one cycle of inner loops will maximize the AL (as an unconstrained quantity) by adjusting only e.g. the mask and auxiliary variables, holding the $\lambda_i$ and $v_i$ fixed at their current values. Multiple adjustment steps are taken in converging to the AL maximum during each cycle of inner loops, with each step (i.e. a set of changes to the variable values $\vec{e}$) being chosen based on a calculation of the AL and its gradient, and with second-derivative information also being incorporated using e.g. a so-called BFGS estimate. Calculation of the AL gradient might appear to entail a more challenging scaling than calculation of the AL itself, since calculation of the gradient requires the derivative of the AL with respect to each problem variable. However, it is known in the art that the AL gradient can be calculated with near-linear area scaling if the intensity is calculated by OCS, and it will now be shown how the contribution to the AL gradient from a loxicoherent system can likewise be obtained with a computational cost that scales near-linearly with mask area.

For simplicity the case of so-called Manhattan masks will be considered, in which the edges of the mask patterns have either a horizontal or vertical orientation against the x and y design axes of the IC layout. If the qth edge amongst all polygons is vertical, the associated mask variable $e_q$ will designate the x coordinate of the edge, and $e_q$ will similarly designate the y coordinate if the qth edge is horizontal. For simplicity the discussion to follow will consider the case in which the qth edge is vertical. (As mentioned, the edges referred to in this ILT context are the edges of the polygons that are to be written on the mask; these edges might be referred to as mask fragments or fragment connectors in an OPC context.) FIG. 47E expresses the contribution made by a loxicoherent system to the derivative of the AL with respect to mask variable $e_q$; in particular, FIG. 47E shows the contribution to the qth element of the AL gradient that is made when a loxicoherent system contribution from FIG. 20H or 20I is used in the determination of the sampled intensities. Such an intensity sample may be denoted $I_s$, i.e. $I_s$ denotes the intensity $I(x_s)$ at sample position $x_s$. (Note that FIG. 47E follows our usual simplifying convention of omitting the y coordinate for brevity when indicating position variables.) In practice the $I_s$ sample values would preferably be obtained by discrete FFT-based calculations as discussed above, but it is useful to first present the loxicoherent convolutions as idealized continuous integrals, and this has been done in FIG. 47E. The AL itself would preferably be evaluated before its gradient, and subsequent to this evaluation the derivative of all $P_i$'s with respect to their $c_i$ argument (at their current $c_i$ values) can be evaluated in a time proportional to mask field area (once the intensity samples have been obtained, at computational cost governed by FFT scaling), since the $P_i$'s are elementary quadratic functions. The ith such derivative of the penalty function itself (with respect to $c_i$) is denoted $\dot{P}_i$.

The working mask solution (whose transmission is m(x)) couples into the FIG. 47E derivative via a convolution with the t' kernel. As a derivative, FIG. 47E essentially gives (as a ratio) the differential response of the AL (or more precisely the differential contribution of the loxicoherent system to the AL) that results from a differential adjustment of the qth mask edge. If the mask polygons correspond to clear openings in an opaque film, a differential outward translation of the qth edge will introduce a new filament of transmission along the edge, and the resulting contribution to the convolution of t' with the mask content will consist of an added "sliver" or spike of shape t' that is centered at edge location $e_q$. More specifically, when the 2D character of the polygon is taken into account, and supposing for the sake of clarity that the qth edge is vertical, the differential contribution to the convolution of t'(x,y) with m(x,y) as evaluated at output point $\{x_k, y_k\}$ will be given by the integral with respect to y' of $e(x_k-e_q, y_k-y')$, with y' running along the length of the infinitesimally displaced edge. As previously noted, it is convenient to suppress the explicit 2D character of the loxicoherent kernels, so t' along the qth edge will be written as $t'(x_k-e_q)$ for simplicity. Since the loxicoherent system involves the absolute square of the t' convolution, its derivative will be proportional to twice the real part of the product of this convolution with the differential edge integral, as shown in FIG. 47F. Current mask technologies provide a number of different polarity options for the patterned mask films, i.e. for the transmissions of both the patterned apertures in the mask, and for the mask background, though masks whose {aperture,background} transmissions closely approximate simple {1,0} binary levels are the most common type. To allow for arbitrary transmission options, FIG. 47F includes a factor $\Delta\tau$ that represents the change in point-transmission at an edge location when a mask edge is differentially translated outward. Further, a factor $\xi_q$ is included to account for the fact that a differential positive increase in the $e_q$ variable may correspond to either an inward retraction of the edge or to an outward excursion; $\xi_q$ is thus +1 for rightward and upper edges, and −1 for leftward and lower edges. The AL itself should preferably be calculated before its gradient, and this means that the convolution of t' with m which appears in FIG. 47F (evaluated at the point $x=x_k$) will already have been evaluated when FIG. 47F is considered. As shown in FIG. 47G, it is convenient to denote this convolution as K, folding in the factor $\Delta\tau^*$ for simplicity.

The steps in FIGS. 47E-47G have been presented in terms of continuous convolutions and associated integrals, but at this point it is convenient to discretize these integrals as quadrature summations across the same grid that is used to calculate the AL. FIG. 47H does this, for example replacing the FIG. 47G continuous integral (having integration variable y') of kernel t'(x,y') [which is written as t'(x) for simplicity] along the qth edge by a summation of gridded t' values that are weighted by quadrature coefficients g, using a summation index denoted r. Since t' is smooth, its value at any point along the qth edge can be accurately interpolated as a weighted sum of the t' values at nearby gridpoints, with closely neighboring points within the edge making use of the same set of gridpoints for this interpolation. In particular, the same set of t' gridpoint values will be used in the short-range interpolation throughout the entire subset of points along the edge which share the same nearest pixel boundary (considering all pixel boundaries that the edge crosses). All points within each such subset share the same set of nearest gridpoint neighbors, so that any differences that exist between the interpolated values of t' at these different points in the subset will be due entirely to changes in the interpolation weights from point to point. In FIG. 47H the edge integral is approximated as a summation over r, and this sum can be formed by grouping sets of points that share the same nearest pixel boundary, and then integrating the varying interpolation coefficients along the edge segment for each group. Alternatively, the quadrature coefficients g can combine conventional quadrature weights with the interpolation weights for all gridpoints near the edge which contribute to these interpolations. The gridpoints involved are specified by index r.

Without loss of generality, it can be assumed that the summation over r is sparse and independent of mask field area, which strictly speaking would mean assuming that all edges are bounded in length by some fixed number of grid pixels that is independent of the size of the simulation field. Edge lengths (which in an OPC context would be referred to as edge fragment lengths) are in fact typically made finer than the resolution of the exposure tool, in order to ensure that the position of the developed resist edge is finely controllable along its contour via adjustment of the mask edge segments (i.e. fragments). This means that the range of r can be assumed to have a relatively short upper limit since the range of r applies only to an individual mask segment, or more generally that the length of edge q (and therefore the range of r) will not (on average) increase with the total area of the mask region being optimized. An exception to this general rule may arise with pattern regions that are entirely one-dimensional over an extended distance, in which case mask edges may preferably be highly extended, so that their length may even exceed the width of the optimization frame. However, in such situations the total number of edges will increase sub-linearly with area, leaving the total computational burden unchanged from that in the more usual scenario. For simplicity FIG. 47H assumes a short edge length, and so writes the limit on the r sum as "sparse", indicating sparse coverage and a limited total count.

FIG. 47H is nominally eight dimensional, in that it consists of four nested sums which each run over 2D grids whose x and y coordinates have been suppressed in the written form of the equation for simplicity (this notational simplicity in the equations having been followed by default throughout this invention description). However, despite the nominal complexity of FIG. 47H, the invention is able to evaluate it with a short fixed sequence of operations that each exhibit linear or near-linear area scaling, thus achieving near-linear scaling overall, as will now be discussed. Referring to FIG. 47I, the first operation in this sequence is to carry out the summation over the constraints i, providing what will be referred to as a summed constraint coefficient map G that is indexed by bitmap coordinates s. Although the original summation over s in FIGS. 47D-47H is short range (or, more particularly, sparse), reflecting the fact that the interpolations needed to obtain any one of the few intensity values that drive the ith constraint will only involve a small number of pixels in the intensity bitmap (as discussed above), the s summation in FIG. 47I is no longer sparse. This is because the summation over i for a particular s value is preferably carried out after investing logarithmic compute time in inverting the map between i and the particular s value, i.e. identifying the sparse set of constraints within the overall range of i whose intensity interpolations involve pixel s. The resulting set of s values will then generally cover the entire bitmap after all constraints have been dealt with, but the i summation for each particular s value only involves a small number of constraints, whose count does not increase with field size. Thus, constraint coefficient map G can be calculated for all values of s with near-linear area scaling. As discussed, the $c_i$ constraints also include the objective $C_0$, and map G therefore collapses into a single gridded function the terms which quantitatively express the lithographic goals and requirements of the problem formulation.

Next, an FFT-based discrete convolution is used to calculate the quantity $\overset{v}{T}$ that is defined in FIG. 47J as the convolution of constraint coefficient map G with a gridding of the intensity kernel t" of the loxicoherent system; and one can refer to $\overset{v}{T}$ as an adjoint constraint map. FFTs allow this discrete convolution to attain near-linear scaling. We then calculate the product of $\overset{v}{T}$ with convolution K; more specifically, we calculate the product of $\overset{v}{T}$ with the real part of K, and with the imaginary part, to obtain the quantities denoted U' and U" that are shown in FIG. 47K. The summations over index k in FIG. 47K then become convolutions with a gridding of the mask filter kernel t' of the loxicoherent system, and these convolutions can be evaluated using FFTs to obtain gradient map components H' and H", as shown in FIG. 47L.

The summation over r in FIG. 47L amounts to an integration along an edge that has been reduced to a summation over the edge-neighboring gridpoints within a coarsely rendered bitmap of the AL gradient (with this gradient bitmap being the sum of H' and H" components). As discussed above, the r summation is short-range, so that evaluation of FIG. 47L for each single edge involves only a small number of operations whose size is independent of mask area. Since the total number of edge variables is proportional to mask area, FIG. 47L can thus be used to calculate the AL gradient with near-linear scaling. It does so as the endpoint of a staged calculation which provides maps H' and H" of the gradient contributions on a grid of points. The individual elements of the gradient are then obtained by short-range integrations within the summed maps. More specifically, the r summand in FIG. 47L uses interpolation to approximate the integration over edge q, with the integrated quantity being the differential change in the AL that would be introduced by an "elemental" integrand consisting of a differential excursion of an infinitesimally short (i.e. "point-like") edge fragment that might conceptually be introduced locally at some point along edge q, with the total sum over r then representing the total contribution from all points along the edge, i.e. the sum represents the total differential change in the AL contribution from the loxicoherent system that would be produced by an infinitesimal shift in position of the entire qth edge.

FIG. 47L thus provides the loxicoherent contribution to the gradient of the AL that is produced by all constraints which depend on image intensity; more specifically, it provides the loxicoherent contribution from these intensity-dependent constraints to the gradient element that corresponds to the qth edge. Constraints to ensure mask manufacturability will also make a contribution to the AL derivative when taken with respect to any mask edges that approach non-manufacturability, and these gradient contributions may be calculated with near-linear scaling by using methods described in U.S. Pat. No. 8,719,735, as noted above. The AL gradient vector should then be extended to include the derivatives with respect to any auxiliary variables that may have been used in the problem formulation, e.g. to express infinity-norm metrics. Calculation of such derivatives is generally elementary. The sum in FIG. 47L has fixed range, and since the total number of edges scales linearly with mask area, the total computational burden in evaluating FIG. 47L for all elements of the gradient vector achieves near-linear scaling. It will be clear to those skilled in the art that variations of this procedure can also be employed with the other novel decomposition systems of the invention besides that of FIG. 20B, such as those described in FIGS. 34, 35, and 41.

Successive calculations of the AL and its gradient may be used during inner-loop steps to adjust the edge and auxiliary variables according to standard algorithms that are designed to drive the AL to a maximum, as described above. During outer loops, the Bertsekas procedure iterates these maximizations in conjunction with adjustments to the λ and ν parameters in order to drive the solution to the true optimum of the constrained problem formulation. Once the objective has been maximized without constraint violation, and with valid multipliers λ, the $e_q$ and auxiliary variables will essentially maximize the standard (non-augmented) Lagrangian, and an optimum solution will have been attained.

Typically the total number of inner loop steps in the full optimization (summed over all outer loops) may be regarded as being roughly independent of mask area, with total iteration counts being, for example, in the range of 20 to 200 depending on problem difficulty and the accuracy sought, and with the number of outer loops being in the range of perhaps 3 to 10. Since the expected number of iterations is limited, the solution algorithm can be expected to achieve near-linear scaling overall.

Also, since each inner loop maximization is operationally analogous to minimization of a cost function, it will be clear to those skilled in the art that near-linear scaling can also be achieved when loxicoherent systems are incorporated into an optimization approach for designing masks that is based on cost functions rather than constrained formulations.

Like the Augmented Lagrangian, cost functions are typically formed as a sum of terms that express different lithographic goals and requirements, and, from a mathematical point of view, minimizing an objective that is formulated as a cost involves only a trivial sign change from the case of maximizing a function that expresses merit (i.e. benefit). The operations discussed in connection with FIG. 47 are essentially unchanged if $C_0$ and $c_i$ are terms in a cost function instead of an AL. In general, formulations that involve unconstrained minimization of a cost function and formulations that employ constraints will both generally require steps in which a "merit function" is maximized during their solution (or, near-equivalently, minimized as a cost function). In the unconstrained case, this maximization (e.g. of the sign-reversed cost function) yields the final solution, while in the constrained case such maximizations are carried out many times before the final solution is obtained (e.g. during inner loops, with the merit function being an Augmented Lagrangian). This conclusion continues to hold true with more complicated optimization flows in which a series of optimization problems are solved: The solution procedure for each such problem will generally have as a key step the maximization of a merit function which is the sum of terms that express lithographic goals and requirements (alternatively this key step may involve a near-equivalent cost minimization), with many of these merit function terms being driven by the image intensity. As a point of terminology, it should be noted that the term "merit function" has a number of different meanings in the optimization literature. As used here in the description of the presently preferred embodiments of this invention, "merit function" is essentially synonymous with "objective function" in the context of unconstrained cost function formulations, while in the case of constrained formulations it refers to, e.g., the Augmented Lagrangian (but not the objective function $C_O$ of the constrained problem). In the former case a cost function can be regarded as a merit function that is negatively signed to express demerit. In general, the computational bottleneck step in solving either kind of problem is that of maximizing a merit function.

With any of these approaches, the computational cost of carrying out the optical portion of the ILT calculation will be proportional to the number of kernel convolutions used in the image decomposition. Because the loxicoherent systems of the invention allow a given accuracy target to be reached using fewer kernels, the invention allows overall ILT runtime to be significantly reduced.

Reduced runtime makes ILT at full-chip scale more practical, whereas under the runtime limitations of standard OCS the use of ILT is often restricted to lithographically difficult areas in the layout, or to critical circuit modules. This is particularly true where more complex ILT formulations are concerned, e.g. constrained formulations in which an Augmented Lagrangian is repeatedly re-minimized during an outer sequence of loops, as opposed to one-time minimization of a cost function.

If compute costs do permit an Augmented Lagrangian methodology to be applied at full-chip scale, it becomes worthwhile to apply a technique described in U.S. Pat. No. 9,310,674, in which mask features are provided with simpler shapes than are usually required for ILT, while at the same time a high level of image quality is maintained without significant degradation from the reduced density of edge variables. This shape simplification leads to masks of lower cost, and to masks that can be more tightly specified. Thus, one embodiment of the invention is a photomask for optical lithography whose aperture shapes remain dimensionally compensating after a reduction in the number of aperture edges. These simplified aperture shapes can be partitioned into a reduced number of elementary mask exposures ("shots") when the mask is fabricated, thereby lowering mask cost.

As will be reviewed and improved upon here, this shape simplification technique provides fine fragmentation where dense degrees of freedom are needed to optimally control the binding constraints that gate the objective (i.e. in order to optimally control lithographically challenging regions of the layout), while at the same time applying coarser fragmentation elsewhere. In general only a small fraction of the problem constraints will turn out to be binding, but this small subset is not known in advance, and for this reason the simplification of edge fragmentation is carried out dynamically, as will be discussed.

Since binding constraints only arise sparsely, the dynamic fragmentation technique will only need to apply dense fragmentation sparingly, allowing the overall fragmentation count in the full layout to be significantly reduced, assuming that the associated optimization methodology can be applied over a large portion of the chip area. However, a complex constrained ILT formulation is involved (as will be discussed), and as a result the total number of iteration adjustments that are needed to converge the mask solution will typically be roughly an order of magnitude larger than is needed with OPC, and full-chip compute time even for OPC is already quite costly, if current OCS decomposition is used. However, the novel loxicoherent systems of the invention can significantly decrease the compute time needed to apply constrained ILT formulations at full-chip scale.

Modern IC masks are written using electron-beam ("e-beam") tools that expose a resist-coated mask blank. Current e-beam mask-writers are almost always of the so-called Variable Shaped Beam (VSB) type, which can flash the blank with a sequence of elemental shapes, with these elemental shapes being formed by varying the cross-sectional shape of the beam ("footprint") during each flash, with the allowed beam shapes typically consisting of rectangles whose length and width are adjustable, or 45° triangles. Each flashed e-beam exposure of an elemental shape is referred to as a "shot". Considering the case of Manhattan masks for simplicity, each feature (e.g. Manhattan polygon) in the mask layout is partitioned into rectangles (i.e. rectangular shots) in order to write the mask. The total time needed to write the mask is strongly correlated with the total number of rectangles in the partitioned layout (this total being referred to as the "shot count"). Reduction of the shot count will lower the cost of the mask, due partly to a reduction in mask-writer utilization, and partly to an easing of fabrication stringency that occurs when write-time is shortened. The quality that can be achieved in lithographic masks is partly gated by inevitable imperfections in the control of mask positioning over the full duration of the mask writing session, and to imperfect stability in the resist response over this time interval. Shorter write times from reduced shot count therefore make it easier to meet specifications for mask pattern positioning and sizing.

Shot count is correlated with the number of edge fragments in the mask layout, and U.S. Pat. No. 9,310,674 teaches how the number of edge variables can be dynamically pruned in an Augmented Lagrangian formulation, without significantly compromising solution quality. Standard methods for adjusting the $\lambda$ and $\nu$ parameters (discussed in connection with FIG. 47A) during outer loops will continue to successfully converge the AL to the true Lagrangian of the constrained problem if the variable set is adjusted after a working AL solution has been maximized at the end of each outer loop cycle, as discussed in U.S. Pat. No. 9,310,674. If fragment density at the beginning of the full set of loops is initialized at the relatively high levels that are conventionally employed during ILT (since dense fragmentation maximizes the lithographic performance benefit that ILT provides), the fragment count within most portions of the layout can safely be reduced between successive outer loops, but high fragment density must be maintained in mask regions that prove critical to lithographic performance. For example, if maximization of lithographic process window is the objective of the problem formulation, the most critical layout regions will be those which first fail as process fluctuations reach the boundaries of the process window. U.S. Pat. No. 9,310,674 shows how a process window maximization goal can be quantitatively represented by a $C_O$ objective function that is defined in terms of auxiliary variables, with these auxiliary variables then being driven to represent the process window attained by a lithographic image by means of a set of $c_i$ constraints that are applied at a large number of sample points within the image. In virtually all cases only a small fraction of these $c_i$ constraints will prove to be binding on the process window. Adjustments at other sampled image locations will only influence the binding constraints at the level of weak long-range tails in an optical proximity response, and these weak impacts are relatively easy to correct using even a pruned variable set, if this pruning is carried out in accordance with the invention.

For this reason the quality of the final solution will usually not be significantly degraded if very short connector edges in non-critical mask polygons are deleted from the interim working solution, with the two parallel edges that the deleted edge formerly connected then being merged into a new single edge during subsequent refinement of the working solution. This change in the set of edge variables may be carried out after the AL has been converged to a maximum at the end of one cycle of inner loops, i.e. at the termination of each outer loop, with the new variable set being used during the next outer loop. The length threshold for deletion of short edges is referred to as a deletion threshold.

Such a deletion process to reduce fragment density would become deleterious in layout regions that prove critical to lithographic performance, e.g. in regions that turn out to gate the achieved process window. U.S. Pat. No. 9,310,674 teaches that large fragment density can be recovered in critical areas by using a gradient map to create new fragments where needed. The gradient maps considered in U.S. Pat. No. 9,310,674 are based on OCS kernels (referred to therein as SOCS kernels), but similar considerations apply with gradient maps that contain contributions from the loxicoherent systems of this invention (e.g. per FIG. 47L), as will now be explained. The AL will be maximized at the conclusion of an outer loop cycle, and the integral of the gradient map along the full length of any edge will therefore be zero (assuming that the position of each edge is defined by an independent problem variable). However, this zeroed net derivative will generally result from a balancing of regions of positive derivative along the edge with regions of negative derivative. Edges containing a contiguous region of sufficiently large (in magnitude) positive or negative derivative should preferably be split in two, with the original controlling variable for the edge being replaced by new variables that control the positions of the newly created edges during the next cycle of loops. In particular, the original edge variable can be replaced by a new variable for each newly independent section of the now-split edge, and also a new variable for the newly introduced edge that connect the two split sections. The threshold on integrated derivative magnitude that governs this edge creation step is referred to as an insertion threshold.

This approach can be extended by further changing the variable set in a way that aligns the corners of parallel edges which approximately face each other from opposite sides of mask shapes. It is known that when mask shapes are partitioned into shots for the VSB mask-writer (e.g. when Manhattan shapes are partitioned into elemental exposed rectangles), it is efficient to capture a portion of the shape by using a rectangle which has an edge that crosses from one corner of the shape to a shape corner on the opposite side, so long as these two corners share a common coordinate value. For example, if a shape contains two vertical edges that approximately face each other across the shape, and if both of these edges have bottom endpoints that share the same y coordinate value, it will be efficient when partitioning the shape into rectangular shots to include a rectangle whose edge spans the shape horizontally across the locations of the two bottom endpoints. If, on the other hand, the y coordinates of these two endpoints were instead shifted slightly apart, an extra sliver region within the shape would thereby be delineated, requiring the insertion of an additional narrow rectangular shot to fully partition the shape. Shot count is therefore reduced by aligning the endpoints of edges that partially face each other across shapes, but such alignment is undesirable at the sparse set of critical locations that bind the solution, where a large density of adjustable degrees of freedom should be maintained.

A strategic alignment of edge endpoints where appropriate (i.e. non-critical) can be obtained by using an improved version of the above-described methodology for dynamically adjusting edge fragmentation. More specifically, to obtain a mask exhibiting reduced shot count while providing strong lithographic performance, the required performance goals and requirements can be specified in a constrained problem formulation that is solved using an Augmented Lagrangian method, with the set of edge variables being redefined at the commencement of each cycle of outer loops (optionally excluding the first outer loop cycle) in such a way as to lock into alignment the coordinates of suitable edge endpoints. In particular, the endpoint coordinates that are suitable for locking may first be adjusted for exact equalization, and then kept equal by using a single common variable to control the coordinate of both endpoints during the next set of inner loops. In a preferred embodiment the endpoints of parallel edges within each shape that partially face each other across the shape may be brought into alignment whenever the difference between the coordinate values of the two endpoints is lower than a threshold (referred to as a locking threshold). The common coordinate given to the newly locked endpoints can be initially set to the midpoint of their coordinate values prior to locking, as weighted by the lengths of the corresponding two connector edges that also intersect the endpoints of the two facing edges (e.g., so that if the endpoint of one facing edge has a long edge connecting to it, while the edge that connects to the aligned endpoint of the other facing edge is short, it is appropriate to apportion a larger share of the equalization adjustment to the latter endpoint when bringing the two endpoints into exact alignment). Since the endpoint coordinates are controlled by the positions of the two connecting edges, alignment of the endpoints can then be maintained by using a single common variable to control the future excursion adjustments that are made to both connector edges during later optimization loops, instead of assigning independent variables to each connector.

In order that the solution provide strong lithographic performance, it is desirable that coupled endpoints be unlocked in regions that prove critical, e.g. in the vicinity of a sample point constraint that turns out to be binding at the solution. After the AL is maximized at the end of an outer loop cycle, its derivative with respect to each problem variable will be zero. This means that where two endpoint coordinates of facing edges have been locked to a common value, the total integrated gradient along the lengths of the two edges that connect to these locked endpoints will be zero. However, this zero-valued total will generally result from a positive integral along one connector being canceled by a negative integral along the other. The endpoints should preferably be uncoupled during the next set of loops if the magnitude of the integrated gradient along each single connector exceeds a threshold (referred to as an unlocking threshold). The thresholds used for locking and unlocking, or for edge insertion and edge deletion, can be set by experimentation with small layout areas, or these thresholds may be chosen in such a way as to maintain a target edge variable count during the loops, or to progress toward such a target. Since the deletion and locking thresholds are preferably small, the thresholding tests for insertion and unlocking can be applied with reasonable accuracy to candidate pairs of connected edges or facing edges where deletion of the connector, or locking of the endpoints, is pending but has not yet been executed, i.e. to pairs that meet the criteria for deletion or locking. If these candidates also meet the criteria for insertion or unlocking, the deletion or locking step should not actually be carried out.

By using loxicoherent systems to speed the execution of each iteration loop, the above procedure can feasibly be applied over a larger portion of the full layout, leading to a significant reduction in the total shot count within the layer, ultimately providing a mask whose shapes can be written in a shorter time with greater fabrication stability, while still providing strong dimensional compensation.

In addition to its use for overall mask design, the various ILT methodologies described above can further be used to improve the reconciliation or 'stitching' of mask features at the boundaries of regions. Another ILT application is in so-called 'hot spot correction', where direct optimization and enforcement of lithographic metrics is used to improve problematic areas of a first-pass mask that has been designed on a preliminary basis by a simpler method like OPC, for example using subsequent ILT to improve mask shapes where the dimensional compensation achieved by the simpler method has been founding wanting, e.g. found to be overly sensitive to process variability, or found to be significantly obstructed by mask manufacturability rules. Since use of the computationally intensive ILT methodology is reserved for areas of greatest need, a very advantageous compromise can be made between the compute cost of mask design and the lithographic performance obtained.

It will also be clear to those skilled in the art that the invention can increase the speed of other standard computational lithography applications besides OPC and ILT, such as mask design verification.

More generally, the embodiments of this invention can be expected to have utility whenever the determination of partially coherent lithographic images is required over large areas, a task for which prior art coherent system decomposition may be considered to have only limited suitability. As discussed, lithographic sources do generally come closer to the coherent limit than the incoherent limit, since their directional content tends to be somewhat sparse, and this does increase the convergence accuracy of coherent decomposition. Nonetheless, lithographic sources typically contain sufficiently extended content as to require some tens of coherent systems in order to match the images they produce even to the 1% level (see, e.g., FIG. 28). OCS essentially deals with this complex non-coherent behavior by the largely generic approach of least-squares fitting a series of Mercer terms to the exact TCC (via eigendecomposition). As has been discussed, each loxicoherent system will also generally allow determination of a least-squares optimal fitting kernel, but loxicoherent systems go beyond this in offering a rich variety of different structural forms which may be strategically selected from in order to explicitly match various distinctive TCC content that is characteristic of a given partially coherent imaging system; e.g., allowing, as non-limiting examples, the choice of the FIG. 20B form to match the fin-like residual that is typically dominant in the TCC error that remains after extraction of coherent systems, or the use of the FIG. 20I or 35A-35C forms to match low-frequency off-diagonal content in the residual TCC, or the use of the FIG. 34L form to match residual TCC content arising at the bandedge of the circular pupil, or the use of the FIG. 41C form to match critical-axis content in the TCC that is heavily sampled by typical lithographic masks. In many of these cases the loxicoherent systems can use one (or more) constituent kernels to closely match distinctive TCC content that is recalcitrant to matching by OCS (or can even exactly match this content), while simultaneously providing a least-squares optimal minimization of residual TCC error over the full Hopkins domain using another constituent kernel, thereby significantly easing a computational bottleneck in accurately providing dimensionally compensated mask shapes.

The embodiments of this invention thus provide in one aspect thereof a tool configured to input integrated circuit (IC) circuit patterns so as to form one or more IC fabrication masks, where the tool includes and encompasses a method and structure and computer program for implementing a decomposition-based analysis of data representing a mask. The tool produces an output database or output data stream in which the dimensions of the mask shapes are compensated on the basis of the image content in the vicinity of each shape when the mask is projected during optical lithography. The tool superimposes a sum of images from a set of coherent systems and a sum of images from a set comprised of at least one loxicoherent system. Each loxicoherent system is a compound system comprising a paired coherent system and incoherent system that act in sequence, with the output of the constituent coherent system being input as a self-luminous quantity to the constituent incoherent system, and with the output of the incoherent system then serving as the output of the loxicoherent system.

It is again noted that the novel loxicoherent decomposition systems that are a feature of this invention are not coherent systems. The decomposition systems of the invention produce intensities which are linearly summed to match the partially coherent image intensity of interest, where each loxicoherent system presents a richer structure than does a prior art coherent/Mercer system. The loxicoherent systems are in essence compound systems, giving rise to a compounded behavior that is fundamentally nonlinear. In most embodiments the constituent systems of the loxicoherent system operate in sequence, with the output of a constituent coherent system, or the summed output from a plurality of constituent coherent systems, being passed as an internal input to a constituent incoherent system, whose output serves as the image contribution of the loxicoherent system as a whole. The nonlinear effect of this sequential operation cannot generally be matched by a coherent system, and, for that matter, it is impossible for any coherent system to even match the behavior of the constituent incoherent system alone, except in "pathological cases". Thus, the systems used in this invention would not be classified as being coherent systems per se. However, it is pointed out that the term "loxicoherent system" also covers the DC-monolinear embodiment. In this embodiment the constituent kernels produce amplitudes which interfere with one another to produce the output intensity of the DC-monolinear system. This interference process is represented computationally by a multiplication (and not a sum), and is therefore fundamentally nonlinear. Thus, the combined behavior of the two constituent DC-monolinear kernels is inherently quite different from the prior art behavior exhibited by e.g. two coherent systems whose output is summed per the OCS procedure. However, the order in which the two constituent kernels of the DC-monolinear system are applied does not affect the output, whereas most of the other novel systems employed by the invention require that their constituent systems by applied in the proper sequence.

There is also one aspect of DC-monolinear systems to which the term "coherent" might be applied in a certain sense, but the coherent behavior involved is distinctly different from that of coherent OCS systems. A DC-monolinear system will exhibit a coherent aspect (in one sense of the term) in cases where its constituent spatial domain kernel $p(x)$ can be considered roughly constant. In preferred embodiments the frequency domain kernel $P(f)$ will tend to have a narrow peak at the origin which will bear qualitative resemblance to a delta-function, and to the extent that p(x) can then be considered roughly constant, one might reasonably regard the computational output of the full DC-monolinear system as being somewhat analogous to a near-linear calculation of a coherent amplitude, as previously discussed. Nonetheless, such behavior would be quite different from that of the coherent systems in prior art OCS, because OCS systems produce their output intensity as the square of a coherent amplitude, i.e. computationally the OCS systems are represented in their intensity output by a quadratic (and thus nonlinear) function of the amplitude, even though the dependence is linear before being squared. Moreover, it is also true, of course, that both kernels used by a DC-monolinear system will be quite different from the kernels of any OCS system appearing in a Mercer series decomposition of the TCC. Further, in preferred embodiments the p(x) kernels of DC-monolinear systems are chosen to minimize the RMS error in matching $TCC^{(r)}$ over the full doubled domain (e.g. by using FIG. 41E), and in such cases p(x) will typically deviate fairly substantially from a constant amplitude.

In general, the novel decomposition systems used by all embodiments of this invention are clearly distinguishable from conventional systems/approaches at least in view of the fact that all such disclosed decomposition systems use more than one distinct kernel function, reflecting the fact that these novel decomposition systems are compound systems whose output combines the outputs from a plurality of constituent systems in a nonlinear fashion.

Figure 18:
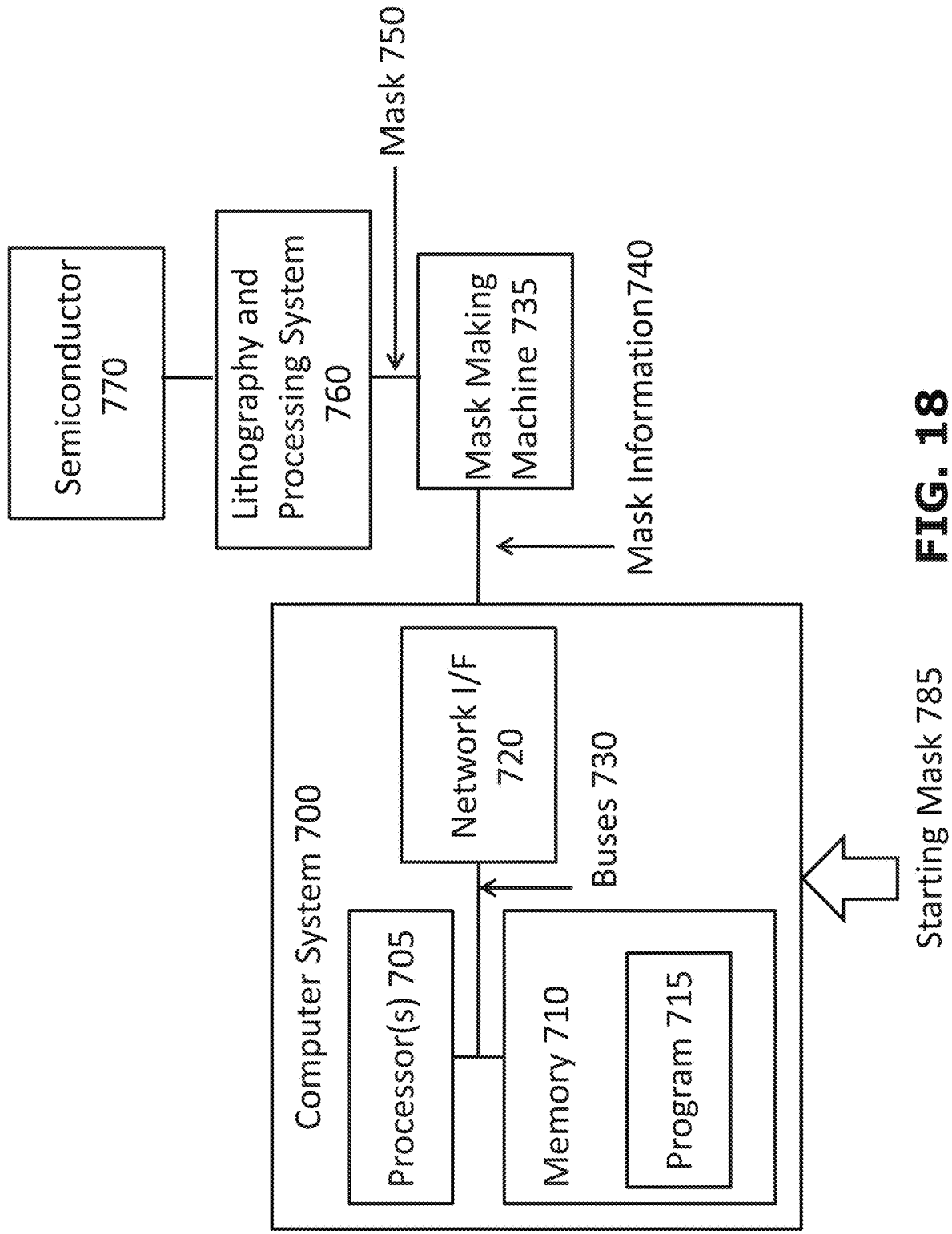
FIG. 18 is a simplified block diagram of one exemplary embodiment of a data processing system connected with a mask making machine and a lithography and wafer processing system in accordance with the invention.

FIG. 18 shows an exemplary embodiment of the present invention. A system includes a tool that facilitates fabrication of masks for optical lithography, where the tool can be embodied at least in part as a computer system 700 having one or more processors 705, one or more memories 710, and one or more network interfaces 720, interconnected using one or more buses 730. The one or more processors 705 can implement the processors #1-#F in FIG. 30A that operate in parallel to execute the Group 1300 operations shown in FIG. 30C. The one or more memories 710 include a computer program 715 defined to cause the computer system to perform one or more of the operations described herein. An input to the computer system 700 includes a starting mask 785 (also shown in FIG. 19) which may be represented as a set of desired semiconductor device shapes. In one embodiment the mask information 740 (which can be referred to as well as a 'final mask 795' as in FIG. 19) obtained by execution of the computer program 715 is output by the tool to a mask making machine 735 via link 745. The mask making machine 735 makes a physical mask 750 from the mask information 740. The mask making machine 735 can, in some non-limiting embodiments, be an e-beam mask writer of the Variable Shaped Beam (VSB) type that was discussed above. The photomask 750 is provided to and used by a lithography and processing system 760 to create device and other shapes on a semiconductor 770, such as a semiconductor wafer or substrate. The computer program 715 thus contains instructions to implement the method according to the present invention as shown in, for example, FIG. 30. Data representing a mask of interest that is created by the use of the tool can be stored in the memory 710 or in some other memory, and the mask data created by the tool in accordance with the embodiments of this invention can then be subsequently read-out and processed during an IC fabrication operation. This data that can be stored and read out as needed can be considered to represent, for example, a data assemblage or a data structure or structures that is stored on some non-transitory and computer-readable storage medium.

Figure 19:
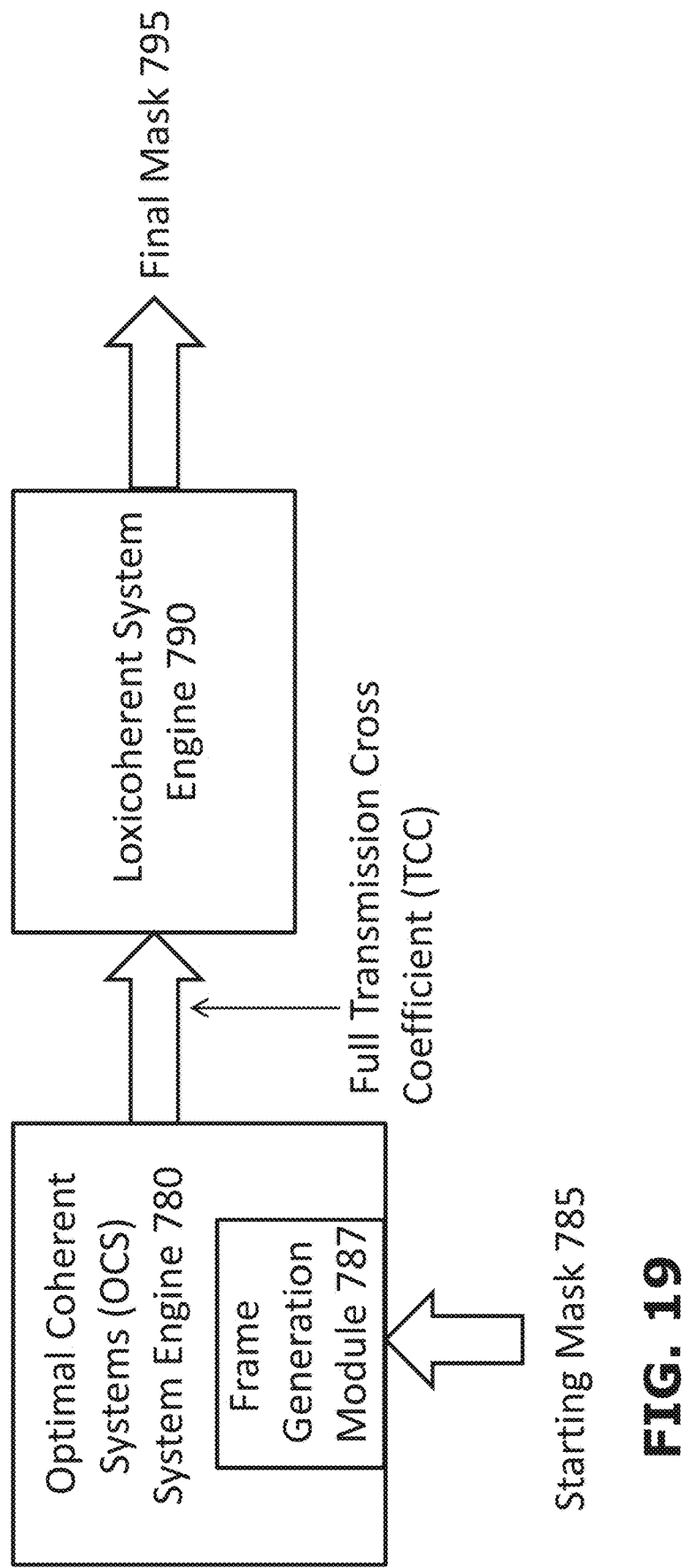
FIG. 19 is a diagram of a non-limiting example of an apparatus that includes an OCS system engine, and where the OCS system in turn includes a frame generation module and that has an output connected to an input of a loxicoherent system engine in accordance with embodiments of this invention.

FIG. 19 is a diagram of an exemplary non-limiting embodiment of the mask making tool in accordance with this invention that in this case comprises an apparatus that includes an OCS system engine 780 that receives the starting mask 785 which is typically the set of desired shapes for the printed semiconductor devices. The starting mask 785 can be organized into separated regions of mask content, and the OCS engine 780 can include a frame generation function/module 787 configured to partition each region into overlapped frames of mask data (see, for example, blocks 1102A, 1102B and 1102C of FIG. 30A). The OCS engine 780 outputs a full TCC to an input of a loxicoherent system engine 790 that is constructed and operated in accordance with embodiments of this invention to provide a final mask 795. In this embodiment the OCS engine 780 and the loxicoherent system engine 790 operate in sequence with the OCS engine operating first. The engines 780 and 790 can be constructed from hardware that is configured so as to execute the operations described above and that are shown generally in FIG. 30. For example, the OCS system engine 780 can be configured with specialized circuitry that executes at least the blocks 1202-1214 shown in FIG. 30B, and the loxicoherent system engine 790 can be configured with specialized circuitry that executes at least the blocks of the step Group 1300 shown in FIG. 30C. For example, the loxicoherent system engine 790 can contain an array of the parallel connected frame processors as in FIG. 30A and possibly also other circuitry (e.g., dedicated logic elements and state machines) configured to perform, e.g., as in FIG. 30C: determining loxicoherent system contributions to the image intensity at target edge positions by applying the intensity kernels to squared mask transmissions that have been filtered by the mask filters; determining the image intensity at target edge positions by adding the loxicoherent contributions to the sum of intensities from the preferred coherent systems; moving mask fragments adjacent to target edge positions whose intensity is lower than the intensity at the edge of the anchoring feature in a direction towards the 'darker' side of the adjacent target edge; moving mask fragments adjacent to target edge positions whose intensity is higher than the intensity at the edge of the anchoring feature in a direction towards the 'brighter' side of the adjacent target edge; transferring to others of the parallel connected processors (those handling adjacent frames that are overlapped by this guard band) the iterated positions of fragments within the guard band of the frame being processed, and using position data from the guard bands of other frames that have similarly been transferred from the adjacent-frame processors to unify and harmonize the positions of fragments in the exterior guard band of the frame being processed before commencing the next iteration cycle; and terminating the adjustment cycles when the intensities at all target edge positions match that of the anchoring feature to within a tolerance.

In some embodiments the data processing system or systems and CPU(s) and memory and storage device(s) can be instantiated in whole or in part as one or more virtual computing systems in a cloud computing environment.

In a further embodiment of the present invention a method, for example as in FIG. 30, may be provided as a service to a mask designer for obtaining, characterizing, and verifying a mask design.

In general any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this disclosure a computer readable storage medium may be any tangible medium that can contain, or store a program for use by or in connection with an instruction execution system, apparatus, or device.

A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as C++ or the like and conventional procedural programming languages, such as the "C" programming language or similar programming languages. The program code may execute entirely on a single local computer, partly on the local computer, as a stand-alone software package, partly on the local computer and partly on a remote computer or entirely on the remote computer or server. In the latter scenario, the remote computer may be connected to the local computer through any type of network, including a LAN or a WAN, or the connection may be made to an external computer (for example, through the Internet using an Internet Service Provider).

Aspects of the mask design and configuration tool that provides a mask having dimensionally compensated shapes that is a feature of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

As such, it should be realized that a computer readable medium can present a tangible carrier for information that is recorded or otherwise impressed on or in the computer readable medium, where the information is configured to cause a programmable device to implement the tool that includes in part the loxicoherent system methods, apparatus and routines of this invention. The resulting combination of the tangible, non-transitory computer readable medium and the information stored therein or thereon is clearly, in at least one aspect thereof, an article of manufacture. The article of manufacture, which can be a component part of the tool in accordance with this invention as depicted in FIGS. 18 and 19, is usefully configured to aid in converting and transforming a first object, i.e., the initial or starting mask 785, which may be represented as the set of desired semiconductor device shapes, into a second object, i.e., the final mask 795 that can be used during the fabrication of semiconductor circuits and structures.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent mathematical expressions may be used by those skilled in the art. However, all such and similar modifications of the teachings of this invention will still fall within the scope of this invention.

What is claimed is:

1. A computer-controlled tool configured to process input data representing integrated circuit patterns of a semiconductor fabrication mask to be used in projection lithography, comprising:
    at least one data processor configured to apply a dimensional compensation to circuit pattern shapes based on an intensity pattern produced in a projected lithographic image, where the intensity pattern is determined by
        performing an optimal coherent systems process on the input data using coherent optimal coherent systems kernels derived from at least one Hopkins bilinear transmission cross coefficient; and
        performing a decomposition process on at least a portion of the input data using at least one compound loxicoherent system in which a constituent coherent system is paired with a constituent incoherent system to form the at least one compound loxicoherent system, and where at least one kernel decomposition is made along an axis that is slanted between two domains of a Hopkins bilinear model to determine an aperture of the incoherent system.

2. The computer-controlled tool as in claim 1, where an input for both the constituent coherent system and the constituent incoherent system is a frame of integrated circuit shapes constituting a portion of a mask region from the input data.

3. The computer-controlled tool as in claim 1, where, in the at least one compound loxicoherent system, the constituent coherent system and the constituent incoherent system act in sequence, where an output of the constituent coherent system is input as a self-luminous quantity to the constituent incoherent system with which the constituent system is paired, and where an output of the constituent incoherent system is an output of the at least one compound loxicoherent system.

4. The computer-controlled tool as in claim 1, where lens apertures of coherent systems used in the optimal coherent systems process are Fourier transforms of optimal coherent systems kernels obtained by carrying out an eigendecomposition process on a full transmission cross coefficient.

5. The computer-controlled tool as in claim 4, where respective lens apertures of the constituent coherent and incoherent systems in each compound system of the at least one compound loxicoherent system are obtained by
    isolating a residual transmission cross coefficient that remains after a chosen set of coherent kernels, of the coherent systems used in the optimal coherent systems process, are extracted from the at least one Hopkins bilinear transmission cross coefficient; and
    performing at least one decomposition process on the residual transmission cross coefficient using the at least one compound loxicoherent system.

6. The computer-controlled tool as in claim 4, where a first loxicoherent system of the at least one compound loxicoherent system is selected to match portions of the at least one Hopkins bilinear transmission cross coefficient that are recalcitrant to matching by a paired optimal coherent systems component.

7. A computer-implemented method to process data representing a semiconductor fabrication mask, comprising:
    performing an optimal coherent systems process on the data using optimal coherent systems kernels derived from at least one Hopkins bilinear model; and
    performing a decomposition process on at least a portion of the data using at least one loxicoherent kernel, in which at least one kernel decomposition is made along an axis that is slanted between two domains of the Hopkins bilinear model.

8. The method as in claim 7, where an input for the at least one loxicoherent kernel is a frame of integrated circuit shapes constituting a portion of a mask region from the data.

9. The method as in claim 7, where lens apertures of coherent systems used in the optimal coherent systems process are Fourier transforms of optimal coherent systems kernels obtained by carrying out an eigendecomposition process on a full transmission cross coefficient.

10. The method as in claim 9, where at least one lens aperture of the at least one loxicoherent kernel is obtained by
    isolating a residual transmission cross coefficient that remains after a chosen set of coherent kernels, of the coherent systems used in the optimal coherent systems process, are extracted from the at least one Hopkins bilinear model; and
    performing at least one decomposition process on the residual transmission cross coefficient using the at least one loxicoherent kernel.

11. The method as in claim 9, where a first loxicoherent kernel of the at least one loxicoherent kernel is selected to match portions of the at least one Hopkins bilinear model that are recalcitrant to matching by a paired optimal coherent systems component.

12. A data assemblage stored on or in a non-transitory computer-readable storage medium, the data assemblage representing mask data for use in fabricating an integrated circuit, the data assemblage being created by a process that comprises performing an optimal coherent systems process on the mask data using optimal coherent systems kernels derived from at least one Hopkins bilinear model;

and performing a decomposition process on at least a portion of the mask data using at least one loxicoherent kernel, in which at least one kernel decomposition is made along an axis that is slanted between two domains of the Hopkins bilinear model.

13. The data assemblage as in claim 12, where an input for the at least one loxicoherent kernel is a frame of integrated circuit shapes constituting a portion of a mask region from the mask data.

14. The data assemblage as in claim 12, where lens apertures of coherent systems used in the optimal coherent systems process are Fourier transforms of optimal coherent systems kernels obtained by carrying out an eigendecomposition process on a full transmission cross coefficient.

15. The data assemblage as in claim 14, where at least one lens aperture of the at least one loxicoherent kernel is obtained by isolating a residual transmission cross coefficient that remains after a chosen set of coherent kernels, of the coherent systems used in the optimal coherent systems process, are extracted from the at least one Hopkins bilinear model; and performing at least one decomposition process on the residual transmission cross coefficient using the at least one loxicoherent kernel.

16. The data assemblage as in claim 14, where a first loxicoherent kernel of the at least one loxicoherent kernel is selected to match portions of the at least one Hopkins bilinear model that are recalcitrant to matching by a paired optimal coherent systems component.

* * * * *